United States Patent
Shirata et al.

(10) Patent No.: US 12,160,984 B2
(45) Date of Patent: *Dec. 3, 2024

(54) RADIO WAVE ABSORBER

(71) Applicant: FUJIFILM Corporation, Tokyo (JP)

(72) Inventors: Masashi Shirata, Minami-ashigara (JP); Hirokazu Hashimoto, Minami-ashigara (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/518,825

(22) Filed: Nov. 4, 2021

(65) Prior Publication Data

US 2022/0061198 A1    Feb. 24, 2022

Related U.S. Application Data

(63) Continuation of application No. PCT/JP2020/018479, filed on May 7, 2020.

(30) Foreign Application Priority Data

May 14, 2019    (JP) .................. 2019-091319

(51) Int. Cl.
| | |
|---|---|
| H05K 9/00 | (2006.01) |
| H01F 1/11 | (2006.01) |
| H01F 1/113 | (2006.01) |
| H01F 1/34 | (2006.01) |
| H01F 1/37 | (2006.01) |

(52) U.S. Cl.
CPC ............. H05K 9/0083 (2013.01); H01F 1/11 (2013.01)

(58) Field of Classification Search
CPC ... H01F 1/11; H01F 1/113; H01F 1/37; H01F 1/34; H01F 1/348; H01F 1/36; H05K 9/0075; H05K 9/0083; H01Q 17/004
See application file for complete search history.

(56) References Cited

U.S. PATENT DOCUMENTS

| | | | |
|---|---|---|---|
| 10,622,127 B2 | 4/2020 | Sakane et al. | |
| 10,919,778 B2 | 2/2021 | Sakane et al. | |
| 2003/0044623 A1 | 3/2003 | Sakurai et al. | |
| 2003/0044633 A1 | 3/2003 | Nagaraj et al. | |
| 2003/0079893 A1 | 5/2003 | Hasimoto et al. | |
| 2004/0036645 A1 | 2/2004 | Fujieda et al. | |
| 2004/0227663 A1 | 11/2004 | Suzuki et al. | |
| 2005/0282043 A1 | 12/2005 | Yamazaki et al. | |
| 2007/0131894 A1 | 6/2007 | Takada et al. | |
| 2007/0241962 A1 | 10/2007 | Shinoda et al. | |
| 2010/0060539 A1 | 3/2010 | Suetsuna et al. | |
| 2010/0238063 A1 | 9/2010 | Ohkoshi et al. | |
| 2012/0100064 A1 | 4/2012 | Ohkoshi et al. | |
| 2012/0105185 A1 | 5/2012 | Oda et al. | |
| 2013/0140076 A1 | 6/2013 | Lee et al. | |
| 2015/0187380 A1 | 7/2015 | Shirata | |
| 2017/0275438 A1 | 9/2017 | Kobayashi et al. | |
| 2018/0009677 A1 | 1/2018 | Aga et al. | |
| 2018/0370197 A1 | 12/2018 | Nagamune et al. | |
| 2019/0051436 A1 | 2/2019 | Imaoka et al. | |
| 2019/0215994 A1 | 7/2019 | Hiroi et al. | |
| 2019/0312356 A1 | 10/2019 | Fujita et al. | |
| 2019/0380232 A1 | 12/2019 | Machinaga et al. | |
| 2020/0008328 A1 | 1/2020 | Hiroi et al. | |
| 2020/0227833 A1 | 7/2020 | Hiroi et al. | |
| 2020/0335247 A1 | 10/2020 | Hosoya et al. | |
| 2021/0151895 A1 | 5/2021 | Ohkoshi et al. | |
| 2021/0166849 A1 | 6/2021 | Hashimoto | |
| 2021/0194147 A1 | 6/2021 | Nagano | |
| 2022/0039301 A1 | 2/2022 | Hashimoto | |
| 2022/0059945 A1 | 2/2022 | Hashimoto | |
| 2022/0059946 A1 | 2/2022 | Hashimoto | |
| 2022/0061198 A1 | 2/2022 | Shirata et al. | |
| 2022/0167535 A1 | 5/2022 | Nakai et al. | |
| 2022/0376402 A1 | 11/2022 | Hashimoto | |

FOREIGN PATENT DOCUMENTS

| | | |
|---|---|---|
| CN | 102473514 A | 5/2012 |
| CN | 102473519 A | 5/2012 |
| CN | 107032776 A | 8/2017 |
| CN | 107227023 A | 10/2017 |
| CN | 107406272 A | 11/2017 |
| CN | 108370654 A | 8/2018 |
| CN | 109265155 A | 1/2019 |
| DE | 37 29 693 A1 | 5/1988 |
| EP | 2 708 513 A1 | 3/2014 |
| EP | 3 435 386 A1 | 1/2019 |
| EP | 3 573 439 A1 | 11/2019 |
| EP | 3 643 752 A1 | 4/2020 |
| EP | 3 943 451 A1 | 1/2022 |
| JP | 57-180206 A | 11/1982 |

(Continued)

OTHER PUBLICATIONS

Sadhana et al., "Structural and magnetic properties of nanocrystalline BaFe12O19 synthesized by microwave-hydrothermal method", Appl Nanoscience, pp. 247-252. (Year: 2012).*
Machine translation of JP2007-250823A, 11 pages. (Year: 2007).*
Machine translation of JP-05206676-A, 11 pages (Year: 1993).*
Sadhana et al., "Structural and magnetic properties of nanocrystalline BaFe12O19 synthesized by microwave-hydrothermal method", Appl Nanoscience, pp. 247-252. (Year: 2012).*
Kolev et al., "Thermal Treatment Influence on the Magnetic Properties and Degree of Orientation of BaFe12O19 Films", J Supercond Nov Magn, 25:2819-2824. (Year: 2011).*

(Continued)

*Primary Examiner* — Matthew E. Hoban
*Assistant Examiner* — Lynne Edmondson
(74) *Attorney, Agent, or Firm* — Sughrue Mion, PLLC

(57) ABSTRACT

There is provided a radio wave absorber including a powder of a hexagonal ferrite; and a binder, in which the radio wave absorber has a squareness ratio in a range of 0.40 to 0.60.

19 Claims, No Drawings

(56) References Cited

FOREIGN PATENT DOCUMENTS

| | | | |
|---|---|---|---|
| JP | 63-155700 A | | 6/1988 |
| JP | 64-707 A | | 1/1989 |
| JP | 05206676 A | * | 8/1993 |
| JP | 7-30279 A | | 1/1995 |
| JP | 8-340191 A | | 12/1996 |
| JP | 9-115708 A | | 5/1997 |
| JP | 11-354972 A | | 12/1999 |
| JP | 2000-228599 A | | 8/2000 |
| JP | 2000-232294 A | | 8/2000 |
| JP | 2001-156487 A | | 6/2001 |
| JP | 2002-118008 A | | 4/2002 |
| JP | 2002-185180 A | | 6/2002 |
| JP | 2002-217586 A | | 8/2002 |
| JP | 2003-282319 A | | 10/2003 |
| JP | 2003-332784 A | | 11/2003 |
| JP | 2004-96084 A | | 3/2004 |
| JP | 2004-296541 A | | 10/2004 |
| JP | 2005-33156 A | | 2/2005 |
| JP | 2005-231931 A | | 9/2005 |
| JP | 2007-129179 A | | 5/2007 |
| JP | 2007-250823 A | | 9/2007 |
| JP | 2008-21990 A | | 1/2008 |
| JP | 2008-63199 A | | 3/2008 |
| JP | 2008-169378 A | | 7/2008 |
| JP | 4173424 B2 | | 10/2008 |
| JP | 2008-300801 A | | 12/2008 |
| JP | 2010-77198 A | | 4/2010 |
| JP | 2010-114407 A | | 5/2010 |
| JP | 2010-184840 A | | 8/2010 |
| JP | 2010-260766 A | | 11/2010 |
| JP | 2010-283301 A | | 12/2010 |
| JP | 4674380 B2 | | 4/2011 |
| JP | 2011-93762 A | | 5/2011 |
| JP | 2011-178654 A | | 9/2011 |
| JP | 2012-9797 A | | 1/2012 |
| JP | 5161813 B2 | | 3/2013 |
| JP | 2013-526775 A | | 6/2013 |
| JP | 2013-239637 A | | 11/2013 |
| JP | 5481538 B2 | | 4/2014 |
| JP | 2015-127985 A | | 7/2015 |
| JP | 2016-204499 A | | 12/2016 |
| JP | 2018-56492 A | | 4/2018 |
| JP | 2018-110167 A | | 7/2018 |
| JP | 2018-147999 A | | 9/2018 |
| JP | 2018-154541 A | | 10/2018 |
| JP | 2019-12799 A | | 1/2019 |
| JP | 6521415 B2 | | 5/2019 |
| JP | 2019-104954 A | | 6/2019 |
| KR | 10-0675514 B1 | | 1/2007 |
| WO | 2016/117648 A1 | | 7/2016 |
| WO | 2018/084234 A1 | | 5/2018 |
| WO | 2018/168859 A1 | | 9/2018 |
| WO | 2018/235952 A1 | | 12/2018 |
| WO | 2019/004104 A1 | | 1/2019 |
| WO | 2019/017471 A1 | | 1/2019 |
| WO | 2019/131675 A1 | | 7/2019 |

OTHER PUBLICATIONS

International Search Report issued Aug. 18, 2020 in International Application No. PCT/JP2020/018479.
Written Opinion of the International Searching Authority issued Aug. 18, 2020 in International Application No. PCT/JP2020/018479.
International Preliminary Report on Patentability issued Nov. 16, 2021 in International Application No. PCT/JP2020/018479.
Extended European Search Report dated Jun. 13, 2022 from the European Patent Office in EP Application No. 20806133.3.
Office Action issued Nov. 28, 2022 in Korean Application No. 10-2021-7035736.
Office Action issued Oct. 25, 2022 in Japanese Application No. 2021-519388.
International Search Report issued Jun. 30, 2020 in International Application No. PCT/JP2020/011872.
Written Opinion of the International Searching Authority issued Jun. 30, 2020 in International Application No. PCT/JP2020/011872.
International Preliminary Report on Patentability issued Nov. 16, 2021 in International Application No. PCT/JP2020/011872.
Extended European Search Report issued Jul. 1, 2022 in European Application No. 20806852.8.
Notice of Reasons for Refusal dated Oct. 25, 2022 from the Japanese Patent Office in Japanese Application No. 2021-519287.
Office Action dated Dec. 13, 2022 from the Korean Intellectual Property Office in KR Application No. 10-2021-7034485.
Japanese Office Action dated Apr. 18, 2023 in Japanese Application No. 2021-519287.
International Search Report dated Aug. 25, 2020 in International Application No. PCT/JP2020/018621.
Written Opinion of the International Searching Authority dated Aug. 25, 2020 in International Application No. PCT/JP2020/018621.
International Preliminary Report on Patentability dated Nov. 16, 2021 in International Application No. PCT/JP2020/018621.
Extended European Search Report dated May 30, 2022 in European Application No. 20805058.3.
Notice of Reasons for Refusal dated Jun. 21, 2022 from the Japanese Patent Office in Japanese Application No. 2021-519405.
Japanese Office Action dated Dec. 20, 2022 in Japanese Application No. 2021-519405.
Korean Office Action dated Dec. 19, 2022 in Korean Application No. 10-2021-7036224.
Office Action issued Jun. 29, 2023 in Korean Application No. 10-2021-7036224.
International Search Report issued Aug. 25, 2020 in International Application No. PCT/JP2020/018622.
Written Opinion of the International Searching Authority issued Aug. 25, 2020 in International Application No. PCT/JP2020/018622.
International Preliminary Report on Patentability issued Nov. 16, 2021 in International Application No. PCT/JP2020/018622.
Extended European Search Report dated May 30, 2022 in EP Application No. 20806265.3.
Office Action dated Jun. 21, 2022 issued from the Japanese Patent Office in JP Application No. 2021-519406.
Korean Office Action dated Dec. 19, 2022 in Korean Application No. 10-2021-7036117.
International Search Report dated Oct. 20, 2020 issued by the International Searching Authority in Application No. PCT/JP2020/029622.
Written Opinion dated Oct. 20, 2020 issued by the International Searching Authority in Application No. PCT/JP2020/029622.
International Preliminary Report on Patentability dated Feb. 8, 2022 with a Translation of the Written Opinion of the International Searching Authority in Application No. PCT/JP2020/029622.
Extended European Search Report dated Sep. 30, 2022 in EP Application No. 20852946.1.
Office Action dated Feb. 14, 2023 from the Japanese Patent Office in JP Application No. 2021-539210.
Office Action dated Mar. 21, 2023 from the Korean Intellectual Property Office in KR Application No. 10-2022-7004173.
International Search Report dated Aug. 13, 2019 from the International Searching Authority in International Application No. PCT/JP2019/022347.
Written Opinion dated Aug. 13, 2019 from the International Bureau in International Application No. PCT/JP2019/022347.
International Preliminary Report on Patentability dated Mar. 2, 2021 from the International Bureau in International Application No. PCT/JP2019/022347.
Extended European Search Report issued Oct. 1, 2021 in European Application No. 19854513.9.
Notification of Reason for Refusal dated Jan. 14, 2022 from the Korean intellectual Property Office in KR Application No. 10-2021-7004268.
International Search Report dated Dec. 8, 2020 in International Application No. PCT/JP2020/033846.

(56) References Cited

OTHER PUBLICATIONS

Written Opinion of the International Searching Authority dated Dec. 8, 2020 in International Application No. PCT/JP2020/033846.
International Preliminary Report on Patentability dated Apr. 5, 2022 in International Application No. PCT/JP2020/033846.
Extended European Search Report dated Oct. 24, 2022 in European Application No. 20871943.5.
Korean Office Action dated Apr. 7, 2023 in Korean Application No. 10-2022-7009991.
European Office Action dated Apr. 14, 2023 in European Application No. 20871943.5.
Office Action issued Aug. 3, 2023 in Chinese Application No. 202080035152.9.
Office Action issued Jul. 25, 2023 in Japanese Application No. 2021-539210, corresponding to U.S. Appl. No. 17/666,894.
Office Action issued Sep. 25, 2023 in Korean Application No. 10-2022-7004173, corresponding to U.S. Appl. No. 17/666,894.
Office Action issued Aug. 22, 2023 in European Application No. 20806852.8.
Communication dated Dec. 15, 2023, issued in Chinese Application No. 202080033792.6.
Office Action issued Sep. 26, 2023 in Japanese Application No. 2021-519287.
Office Action issued Mar. 6, 2024 in Chinese Application No. 202080035479.6.
Communication dated Apr. 2, 2024, issued in Chinese Application No. 202080056518.0.
Office Action issued Dec. 21, 2023 in U.S. Appl. No. 17/173,437.
Clarivate Analytics machine translation of JP 5161813 B2 to Hitomi et al. published Mar. 13, 2013 (Year: 2013), 20 pages total.
Vinnik et al. "Growth of lead and aluminum substituted barium hexaferrite single crystals from lead oxide flux", Materials Science Forum, vol. 843, pp. 3-9. Published online Dec. 28, 2015 (Year: 2015), 7 pages total.
Shono et al. "Magneto-optical properties of magnetoplumbites BaFe12O19, SrFe12-xAlxO19 and PbFe12O19", Japanese Journal of Applied Physics, vol. 21, No. 10, pp. 1451-1454. Oct. 1982 (Year: 1982), 5 pages total.
Naoufal et al. "synthesis, structure and catalytic properties of Fe-substituted barium hexaaluminates", Catalyst Letters, 54, 1998, 141-148. Sep. 1998 (Year: 1998), 8 pages total.

Luo et al. "Physical and magnetic properties of highly aluminum doped strontium ferrite nanoparticles prepared by auto-combustion route", Journal of Magnetism and Magnetic Materials, 324, 2012, 2602-2608. published online Mar. 15, 2012 (Year: 2012), 7 pages total.
Notice of Allowance issued Apr. 22, 2024 in U.S. Appl. No. 17/518,889.
Office Action issued Oct. 28, 2023 in Chinese Application No. 202080035150.X.
Office Action dated Dec. 14, 2023 in European Application No. 20 806 133.3.
Office Action issued May 6, 2024 in United States U.S. Appl. No. 17/517,910.
Office Action issued May 9, 2024 in United States U.S. Appl. No. 17/697,268.
B.D. Cullity, et al., "Introduction to Magnetic Materials," 2nd Edition 2009 by the Institute of Electrical and Electronics Engineers, John Wiley & Sons, Inc., 2009, pp. 1-550 (550 pages total).
Retno Rahmawati, et al., "Optimization of Frequency and Stirring Rate for Synthesis of Magnetite ($Fe_3O_4$) Nanoparticles by Using Coprecipitation—Ultrasonic Irradiation Methods," Science Direct, Procedia Engineering 170, Elsevier Ltd, 2017, pp. 55-59 (5 pages total).
Md Jafar Sharif, et al., "Enhanced Magnetization in Highly Crystalline And Atomically Mixed bcc Fe—Co Nanoalloys Prepared by Hydrogen Reduction of Oxide Composites," Nanoscale, 2013, vol. 5, pp. 1489-1493 (5 pages total).
Office Action dated Jan. 12, 2024 in U.S. Appl. No. 17/518,889.
Korean Office Action dated Oct. 31, 2023 in Application No. 10-2022-7009991, corresponding to U.S. Appl. No. 17/697,268.
Office Action issued Jun. 25, 2024 in U.S. Appl. No. 17/503,509.
Office Action issued Jul. 3, 2024 in U.S. Appl. No. 17/173,437.
Office Action issued May 8, 2024 in European Application No. 20 806 852.8 corresponding to U.S. Appl. No. 17/503,509.
Office Action issued Jul. 23, 2024 in European Application No. 20 805 058.3.
Office Action issued Aug. 27, 2024 in U.S. Appl. No. 17/697,268.
Communication dated Jul. 20, 2024 issued by the Intellectual Property Office of the P.R.China in Chinese application No. 202080033792.6, corresponding to U.S. Appl. No. 17/503,509.

* cited by examiner

RADIO WAVE ABSORBER

CROSS-REFERENCE TO RELATED APPLICATIONS

This application is a Continuation of PCT International Application No. PCT/JP2022/027638 filed on Jul. 14, 2022, which claims priority under 35 U.S.C § 119(a) to Japanese Patent Applications No. 2021-117018 filed on Jul. 15, 2021 and No. 2021-177736 filed on Oct. 29, 2021. Each of the above application(s) is hereby expressly incorporated by reference, in its entirety, into the present application.

BACKGROUND OF THE INVENTION

1. Field of the Invention

The present invention relates to a quality management method for a specific cell for a medical treatment or drug discovery, which includes managing an expression behavior of a related gene group that is characteristic of the specific cell. The present invention also relates to a method of producing a specific cell using the above-described quality management method.

2. Description of the Related Art

In recent years, with the progress of regenerative medicine technology and cell therapy technology, various kinds of cell therapy using autologous, allogeneic, or heterologous cells, and the development of cell products for research have been actively carried out. For example, the mesenchymal stem cell (MSC) is expected as a cell source useful for cell therapy. The mesenchymal stem cells can be collected from various body tissues and have been reported to be isolated from the bone marrow tissue (Prockop, D. J., 1997, Science. 276: 71-4), the adipose tissue (Zuk, P. A. et al., 2002, Mol Biol Cell. 13: 4279-95), the muscle tissue (Cao et al., 2003, Nat Cell Biol. 5: 640-6), the synovial tissue (De Bari, C. et al., 2001, Arthritis Rheum. 44: 1928-42), the periosteal tissue (Fukumoto, T. et al., 2003, Osteoarthritis Cartilage. 11: 55-64), and the like. In particular, it has been reported that the synovium-derived mesenchymal stem cell has a high proliferation ability and high chondrogenesis ability as compared with mesenchymal stem cells derived from various mesenchymal tissues such as bone marrow (Sakaguchi, et al., 2005, Arthritis Rheum. 52: 2521-9).

In addition, JP5928961B and JP5656183B disclose methods of medically treating articular cartilage injury and meniscus injury by using synovium-derived mesenchymal stem cells.

On the other hand, in the quality management of a cell product, it is known that it is extremely difficult to ensure the equivalency or identity of each lot. This is mainly due to the fact that the cell itself that constitutes the product is not a perfect uniform constituent, and thus it is difficult to specify the characteristics thereof. Therefore, in managing the quality of products, not only a quality test of the final product has been carried out but also a QMS concept, which had been applied to medical devices, has been incorporated to record and control raw materials for manufacturing, material management, manufacturing process management, and a process management test, whereby the management was carried out in terms of the entire process.

However, in association with the progress in science and technology, the importance of identifying and describing the characteristics of the cell itself as the final product has increased. As a cell quality management method, for example, a method that uses the expression of several specific proteins as an indicator (JP2018-117582A) and the like have been reported, which have not yet reached a sufficiently satisfactory level.

SUMMARY OF THE INVENTION

In the related art, as described in JP2018-117582A, a method of managing expression levels of several specific proteins in the quality management of a cell product is disclosed. However, the above-described method has been revealed not to be sufficient as a method of identifying and managing cells which is crude, and as a result, have a problem that it is not possible to sufficiently manage the equivalency and homogeneity of cell products.

An object to be achieved by the present invention is to provide such a quality management method for a cell that enables the sorting-out of a cell having drug efficacy, and a method of producing a cell using the quality management method.

As a result of diligent studies to achieve the above object, the inventors of the present invention succeeded in sorting out a cell while separating and managing similar cell populations, by carrying out the management of the expression behavior pattern of the related gene group that is characteristic of the cell population. The present invention has been completed based on the above findings.

That is, according to the present invention, the following inventions are provided.

<1> A method that is a quality management method for a specific cell, the method comprising:
  evaluating a correlation relationship between an expression pattern of a gene group obtained by measuring an expression state of a related gene group that is characteristic of the specific cell and an expression pattern that serves as a reference; and
  determining the cell to be usable in a case where the correlation relationship is equal to or higher than a certain level.

<2> The method according to <1>, in which the cell is determined to be usable in a case where a coefficient of correlation or a coefficient of determination between the expression pattern of the gene group obtained by measuring the expression state of the related gene group that is characteristic of the specific cell and the expression pattern that serves as the reference, or the coefficient of correlation and the coefficient of determination are evaluated, and the coefficient of correlation or the coefficient of determination is equal to or higher than a certain level.

<3> The method according to <1> or <2>, in which the related gene group that is characteristic of the specific cell is composed of 10 to 2,000 genes.

<4> The method according to <1> or <3>, in which the related gene group that is characteristic of the specific cell is selected from at least one or more among an immunity-related gene group, an inflammation-related gene group, an angiogenesis-related gene group, a neuranagenesis-related gene group, a chondrogenesis-related gene group, an osteogenesis-related gene group, an adipogenesis-related gene group, a fibrosis-related gene group, an immunogenicity-related gene group, a migration-related gene group, an adhesion-related gene group, a senescence-related gene group, a mesenchymal stem cell marker-related gene group, a surface marker-related gene group, a growth factor-related gene group, and a chemokine- or cytokine-related gene group.

<5> The method according to any one of <1> to <4>, in which in a case where the coefficient of correlation or the coefficient of determination is evaluated, the coefficient of correlation or the coefficient of determination is calculated by carrying out any one of;
  (i) replacing a missing value, which is for a gene of which an expression level cannot be measured, with a lower limit value of measurement,
  (ii) replacing a missing value, which is for a gene of which an expression level cannot be measured, with a minimum value among measured values, or
  (iii) carrying out processing for a missing value, which is for a gene of which an expression level cannot be measured, according to the following expression: read count of each gene+(1×gene length/average of gene lengths).
<6> The method according to any one of <1> to <5>, in which the cell is at least one kind of cell selected from the group consisting of a somatic stem cell, an induced pluripotent stem cell, an embryonic stem cell, a differentiated cell derived from a somatic stem cell, a differentiated cell derived from an induced pluripotent stem cell, and a differentiated cell derived from an embryonic stem cell.
<7> The method according to any one of <1> to <6>, in which the specific cell is a mesenchymal stem cell.
<8> The method according to any one of <1> to <7>, in which the specific cell is a cell that is used as a therapeutic drug for arthrosis.
<9> The method according to any one of <1> to <8>, in which the cell is a cell that is used as a therapeutic drug for a meniscus or a therapeutic drug for osteoarthritis.
<10> The method according to any one of <1> to <7>, in which the cell is a cell for drug discovery.
<11> A method of producing a specific cell comprising:
  obtaining a cell population including a candidate of a specific cell; and
  sorting out a cell that satisfy a reference from the cell population with the method according to any one of <1> to <10>.

According to the present invention, since a distinguishment from similar cells is possible, it is possible to carry out quality management that clearly indicates the equivalency and homogeneity of cells, which cannot be sufficiently ensured with the expression of drug efficacy alone.

DESCRIPTION OF THE PREFERRED EMBODIMENTS

Hereinafter, the contents of the present invention will be described in detail. It is noted that in the present specification, "to" is used to mean that numerical values described before and after "to" are included as a lower limit value and an upper limit value, respectively.

The quality management method for cells for a medical treatment or drug discovery according to an embodiment of the present invention is a method including managing an expression behavior of a related gene group that is characteristic of the specific cell.

Managing an expression behavior of a related gene group that is characteristic of the cell is a quality management of finding a gene expression pattern peculiar to a cell population including molecules non-acting on the mechanism, where the molecules are not necessarily directly essential for the drug efficacy of the cell and identifying a cell from a crude population with the pattern.

In the present invention, the quality management described above makes it possible to manage the equivalency and the homogeneity of the cell population. In the present invention, it is possible to carry out quality management of a cell, which ensures equivalency, and homogeneity, and thus it is possible to provide a cell therapy product.

<Cell>

The cell is not particularly limited; however, it is possible to preferably use at least one kind of cell selected from the group consisting of a somatic stem cell, an induced pluripotent stem cell (an iPS cell), an embryonic stem cell (an ES cell), a differentiated cell derived from a somatic stem cell, a differentiated cell derived from an induced pluripotent stem cell, and a differentiated cell derived from an embryonic stem cell.

As the somatic stem cell, it is possible to use somatic stem cells that are present in bone marrow, blood, skin (epidermis, dermis, and subcutaneous tissue), adipose, hair follicle, brain, nerve, liver, pancreas, kidney, muscle, or other tissues. As the somatic stem cell, a mesenchymal stem cell can be preferably used.

The mesenchymal stem cells are known to be present in bone marrow, synovium, periosteum, adipose tissue, muscle tissue, and the like, and they are known to have the ability to be differentiated into osteoblasts, chondrocytes, adipocytes, and muscle cells. Among the above-described mesenchymal stem cells, a synovium-derived mesenchymal stem cell is known to have a high chondrogenesis ability.

The "induced pluripotent stem cell (iPS cell) is a cell having pluripotency (multiple differentiation potency) and proliferation ability, which is prepared by reprogramming a somatic cell by introducing reprogramming factors or the like. The somatic cell to be used for preparing an iPS cell is not particularly limited and may be a differentiated somatic cell or may be an undifferentiated stem cell.

A basic method for a preparation method for an iPS cell is a method of introducing four transcription factors, Oct3/4, Sox2, Klf4, and c-Myc, into a cell by using a virus. It has been reported that human iPS cells have been established by introducing four factors, Oct4, Sox2, Lin28, and Nanog. It has also been reported that iPS cells are established by introducing the three factors excluding c-Myc, two factors of Oct3/4 and Klf4, or only Oct3/4. In addition, a method of introducing a protein, which is an expression product of a gene, into a cell has also been reported. Regarding the gene introduction method as well, techniques using a retrovirus, a lentivirus, an adenovirus, a plasmid, a transposon vector, or an episomal vector have been developed.

The embryonic stem cell (the ES cell) can be established, for example, by culturing an early embryo before implantation, an inner cell mass constituting the early embryo, a single blastomere, or the like. As the early embryo, an early embryo prepared by nuclear transplantation of a nucleus of a somatic cell may be used. As the early embryo, a parthenogenetic embryo may be used. Some ES cells are available from conservation institutions or are commercially available. For example, human ES cells are available from the National Research Institute for Child Health and Development (for example, SEES1-7), the Institute for Frontier Medical Sciences, Kyoto University (for example, KhES-1, KhES-2, and KhES-3), the WiCell Research Institute, and ESI BIO.

The origin of cells is not particularly limited, and it is possible to use cells of mammals such as a human, a monkey, a mouse, a rat, a guinea pig, a rabbit, a cat, a dog, a horse, a cow, a sheep, a goat, and a pig.

In a case where cells that are managed in the method according to the embodiment of the present invention are used for a medical treatment, the cells may be autologous cells or may be heterologous cells, where autologous cells are preferable.

In the present invention, a differentiated cell derived from a somatic stem cell, a differentiated cell derived from an induced pluripotent stem cell, or a differentiated cell derived from an embryonic stem cell may be used.

The conditions and operations of the culture method for inducing differentiation for obtaining a differentiated cell are known in the related technical field.

As a culture medium for inducing the differentiation of stem cells, a basal medium which contains components (inorganic salts, carbohydrates, hormones, essential amino acids, non-essential amino acids, vitamins, fatty acids, and the like) necessary for survival and proliferation of stem cells is used, an example of which is a culture medium that is obtained by adding at least one differentiation-inducing factor depending on the cell to be targeted for differentiation induction, to Dulbecco's Modified Eagle Medium (D-MEM), Minimum Essential Medium (MEM), RPMI 1640, Basal Medium Eagle (BME), Dulbecco's Modified Eagle Medium: Nutrient Mixture F-12 (D-MEM/F-12), Glasgow Minimum Essential Medium (Glasgow MEM), or Hank's balanced salt solution. Examples of the adipocyte differentiation-inducing factor for include dexamethasone (DEX), 3-isobutyl-1-methylxanthine (IBMX), indomethacin (IDM), insulin (Ins), troglitazone, and biotin. Examples of the osteoblast differentiation-inducing factor include dexamethasone (DEX), hydrocortisone, β-glycerophosphate, ascorbic acid, BMP4, and BMP2. Examples of the chondrocyte differentiation-inducing factor include TGF-β3, dexamethasone (DEX), and ascorbic acid diphosphate. In addition, in order to increase the cell proliferation rate, in the culture medium, a growth factor such as a basic fibroblast growth factor (bFGF) or an epithelial cell growth factor (EGF), tumor necrosis factor (TNF), vitamins, interleukins, insulin, transferrin, heparin, heparan sulfate, collagen, bovine serum albumin (BSA), fibronectin, progesterone, selenite, a B27-supplement, an N2-supplement, an ITS-supplement, or the like may be added as necessary, and an antibiotic (penicillin, streptomycin, or the like) may be added. Each component of the culture medium is used after being sterilized by a suitable method. In addition, in addition to those described above, it is preferable that serum (for example, 10% fetal bovine serum (FBS)) is contained at a content of 1% to 20%.

A culture medium for differentiation induction, to which a differentiation-inducing factor for a target cell has been added, is commercially available, and the culture medium of these commercially available products may be used.

The culture temperature for proliferation and induction of differentiation of stem cells varies depending on the origin of the cells; however, it is preferably 30° C. to 40° C. and more preferably 36° C. to 38° C., for example, in a case where the origin thereof is a human. In addition, the concentration of $CO_2$ gas is, for example, preferably about 1% to 10% and more preferably about 2% to 5%.

The checking of the differentiation induction into the target cell can be carried out according to a known method depending on the kind of the differentiated cell. For example, the checking of the differentiation induction into the adipocyte can be carried out by a method of staining cells with Oil Red O, a method of measuring an amount of triglyceride in cells, a method of measuring an expression level of peroxisome a proliferator-activated receptor-γ (PPARγ) gene in cells, or the like. The checking of the differentiation induction into the osteoblast can be carried out by a method of quantifying the amount of calcium deposition of cells, a method of staining cells with alkaline phosphatase, a method of measuring the alkaline phosphatase activity of cells, a method of measuring the expression level of Osterix in the cells, or the like. The checking of the differentiation induction into the chondrocyte can be carried out by a method of quantifying the amount of glycosaminoglycan in cells, a method of staining cells with Alcian blue, a method of measuring the expression level of collagen type II in cells, or the like.

<Managing Expression Behavior of Related Gene Group that is Characteristic of Specific Cell>

In the present invention, the expression behavior of a related gene group that is characteristic of the specific cell is managed.

The related gene group that is characteristic of the specific cell is preferably composed of 10 to 5,000 genes. It is more preferably composed of 10 to 2,000 genes. The lower limit of the number of genes may be 20 or more, 30 or more, 40 or more, 50 or more, 100 or more, 200 or more, 300 or more, or 500 or more. The upper limit of the number of genes may be 4,000 or less, 3,000 or less, 2,000 or less, or 1,500 or less.

The related gene group that is characteristic of the specific cell is not particularly limited and can be appropriately selected depending on the kind of the cell. As an example, in a case where the cell is a mesenchymal stem cell, the related gene group can be selected from, for example, at least one or more (for example, may be 2, 3, 4, 5, 6, 7, 8, 9, 10, 11, 12, 13, 14, 15, or 16 gene groups among the following gene groups) among an immunity-related gene group, an inflammation-related gene group, an angiogenesis-related gene group, a neuranagenesis-related gene group, a chondrogenesis-related gene group, an osteogenesis-related gene group, an adipogenesis-related gene group, a fibrosis-related gene group, an immunogenicity-related gene group, a migration-related gene group, an adhesion-related gene group, a senescence-related gene group, a mesenchymal stem cell marker-related gene group, a surface marker-related gene group, a growth factor-related gene group, and a chemokine- or cytokine-related gene group.

The various gene groups described above can be collected, for example, by using a commercially available panel, document information, microarray data, and a known database (for example, Ontology database (http://www.informatics.jax.org/vocab/gene_ontology/or the like). In addition, genes having a high frequency of appearance can be selected from the collected gene group and used.

In the quality management of a cell according to the embodiment of the present invention, a correlation relationship between an expression pattern of a gene group obtained by measuring an expression state of a related gene group that is characteristic of the specific cell and an expression pattern that serves as a reference is evaluated, and the cell is determined to be usable in a case where the correlation relationship is equal to or higher than a certain level. Preferably, it can be determined that a cell is usable in a case where a coefficient of correlation or a coefficient of determination between the expression pattern of the gene group obtained by measuring the expression state of the related gene group that is characteristic of the specific cell and the expression pattern that serves as the reference, or the coefficient of correlation and the coefficient of determination are evaluated, and the coefficient of correlation or the coefficient of determination is equal to or higher than a certain level.

The measuring method for the expression state is not particularly limited; however, it can be carried out by measuring the mRNA amount. The measurement of the mRNA amount is not particularly limited as long as it is a method that makes it possible to measure a desired amount of mRNA, where a known method can be appropriately selected and used among the known methods. For example, an RNA sequencing method (RNA-Seq), an RT-PCR method, a real-time RT-PCR method, or the like can be used.

Various methods can be adopted as a method of calculating the coefficient of determination, which is not particularly limited. As an example, a method that uses an RSQ function adopted in Microsoft Excel (registered trade name) can be used. In a case of returning, according to the RSQ function, a value (coefficient of determination) obtained by squaring r with respect to a regression line obtained by using (x, y) pairs of the total gene group, which consists of an expression level y of a certain gene in a first target sample, and n expression level x of the same gene in a second target sample, the value can be used as a coefficient of determination between the two target samples.

Various methods can be adopted as a method of calculating the coefficient of correlation, which is not particularly limited. As an example, a method that uses a CORREL function adopted in Microsoft Excel (registered trade name) can be used. In a case of returning, according to the CORREL function, a value of a coefficient of correlation with respect to (x, y) pairs of the total gene group, which consists of an expression level y of a certain gene in a first target sample, and n expression level x of the same gene in a second target sample, the value can be used as a coefficient of correlation between the two target samples.

In a case where the coefficient of correlation or the coefficient of determination is evaluated, it is preferable that the coefficient of correlation or the coefficient of determination is calculated by carrying out any one of;
  (i) replacing a missing value, which is for a gene of which an expression level cannot be measured, with a lower limit value of measurement,
  (ii) replacing a missing value, which is for a gene of which an expression level cannot be measured, with a minimum value among measured values, or
  (iii) carrying out processing for a missing value, which is for a gene of which an expression level cannot be measured, according to the following expression: read count of each gene÷(1×gene length/average of gene lengths).

The RNA sequencing method (RNA-Seq) is one of the methods for quantifying a gene expression level using a sequencer. The flow of analysis is as follows: (1) a read output from a sequencer is subjected to a quality control, (2) the read is mapped to a reference sequence, and (3) a totalization is carried out on how many reads are mapped to what gene regions. The number of reads totalized for each gene region in this manner can be regarded as the relative expression level of the gene. That is, the read count of each gene is an output result that is generally obtained by gene expression analysis and is a value totalized for each gene region.

The threshold value of the coefficient of determination or the coefficient of correlation can be selected from, for example, 0.70, 0.71, 0.72, 0.73, 0.74, 0.75 or more, 0.76 or more, 0.77 or more, 0.78 or more, 0.79 or more, 0.80 or more, 0.81 or more, 0.82 or more, 0.83 or more, 0.84 or more, 0.85 or more, 0.86 or more, 0.87 or more, 0.88 or more, 0.89 or more, and the like, depending on the cell types to be distinguished.

<Method of Producing Cell for a Medical Treatment or Drug Discovery and Use of Cell>

According to the present invention, by using the quality management method of a cell according to the embodiment of the present invention after obtaining a cell population including candidates of cells for a medical treatment or drug discovery, it is possible to produce a cell for a medical treatment or drug discovery by sorting out a specific cell that satisfy a reference from the cell population with the method.

The cell of which the quality has been confirmed by the present invention can be used for regenerative medicine or basic research (for example, drug discovery). For example, the cell of which the quality has been confirmed by the present invention can be used as a transplantation material for the intended purpose of the medical treatment of injuries or damages in biological tissues and the beautification. In an example of the present invention, the cell is a cell that is used as a therapeutic drug for arthrosis. For example, the cell may be a cell that is used as a therapeutic drug for a meniscus or a therapeutic drug for osteoarthritis.

As an example, a case where a synovium-derived mesenchymal stem cell is used as a therapeutic drug for arthrosis (such as a therapeutic drug for osteoarthritis) or a therapeutic drug for a meniscus will be described below.

The synovial tissue can be collected from the joint under anesthesia. The excised synovial tissue is subjected to an enzyme treatment with a protease such as collagenase or trypsin, and the cells subjected to the enzyme treatment are filtered through a mesh filter. The nucleated cells recovered by the above method are sorted out according to the quality management in the method according to the embodiment of the present invention, and the sorted cells can be used for a medical treatment.

The synovium-derived mesenchymal stem cell can be cultured and proliferated in ex vivo without being induced to differentiate in advance with a differentiation medium. The undifferentiated synovium-derived mesenchymal stem cell proliferated in this way can be transplanted to a patient. In order to achieve an efficient medical treatment, it suffices that the mesenchymal stem cell is transplanted such that the number of cells is preferably $5\times10^7$ cells or more and more preferably $1\times10^8$ cells or more per cartilage defective part or meniscus defective part having a size of about 10 cm².

In another example of the present invention, the cell can be used for drug discovery. As an example, the drug efficacy or toxicity of a candidate drug can be evaluated using cells of which quality is managed by the method according to the embodiment of the present invention, and the candidate drug can be screened. For example, the cell characteristics in a case where a candidate drug is brought into contact with cells are compared with those in a case where the candidate drug is not brought into contact with the cells, whereby the drug efficacy or toxicity of the candidate drug can be evaluated.

The present invention will be further specifically described with reference to Examples; however, the present invention is not limited by Examples.

EXAMPLES

In Examples 1 to 5 below, the expression of the related gene group, which characterizes a cell population, was selected regardless of the essentiality for drug efficacy, and the expression pattern of the gene group of the cell population was used to verify the classified management of the cell population from the correlation.

Example 1: Cell Preparation and mRNA Sample
Preparation of Each Cell Example 1-1: MSC Cell and Preparation of mRNA
Thereof (1) Cell The following cells were prepared.
Synovial MSC: Preparation (4 Lots) of Synovial Stem Cells (Commercially Available)

Frozen synovium-derived stem cells (Cryopreserved Synoviocytes, Normal, P1, model number: CDD-H-2910-N, lot: ST1414, ST1420, ST1434, ST1462) purchased from Articular Engineering, LLC were used.

L Bone Marrow MSC: Preparation (3 Lots) of Bone Marrow-Derived Mesenchymal Stem Cells (Manufactured by Lonza Group AG)

Bone marrow-derived mesenchymal stem cells (Mesenchymal Stem Cells cryo amp, model number: PT-2501, lot: 18TL241909, 0000494678, 19TL155677) purchased from Lonza Group AG were used.

J Bone Marrow MSC: Preparation (3 Lots) of Bone Marrow-Derived Mesenchymal Stem Cells (Manufactured by Japan Tissue Engineering Co., Ltd.)

Bone marrow-derived mesenchymal stem cells (lot: BKXH) prepared by Japan Tissue Engineering (J-TEC) Co., Ltd. were used.

F Bone Marrow MSC: Preparation (3 Lots) of Bone Marrow-Derived Mesenchymal Stem Cells (Manufactured by FF)

Bone marrow-derived mesenchymal stem cells (MSC) isolated from bone marrow fluid (Whole Bone Marrow, Fresh, 10 mL, model number: ALL-ABM001, lot: 3024624, 3024625) purchased from AllCells, LLC were used.

REC-MSC: Preparation (3 Lots) of Bone Marrow-Derived Mesenchymal Stem Cells (REC: Manufactured by PuREC Co., Ltd.)

This was purchased from PuREC Co., Ltd. Ultra-high-purity human mesenchymal stem cells (REC) (model number: 387-16591, lot: 050780614, 200370207, 111090605) were used.

iPSC-MSC: Preparation (1 Lot) of iPSC-Derived Mesenchymal Stem Cells (Manufactured by FUJIFILM Cellular Dynamics, Inc.)

An iCell mesenchymal stem cell (model number: R1098, lot: 0004) purchased from FUJIFILM Cellular Dynamics, Inc. was used.

L Adipose MSC: Preparation (3 Lots) of Adipose-Derived Mesenchymal Stem Cells (Manufactured by Lonza Group AG)

Adipose-derived mesenchymal stem cells (Adipose-Derived Stem Cells (amp), model number: PT-5606, lot: 18TL241909, 0000494678, 19TL155677) purchased from Lonza Group AG were used.

(2) Culture Medium

20 µg/mL of gentamycin sulfate ("GENTACIN Injection 60" manufactured by Takata Seiyaku Co., Ltd.) as an antibiotic and bovine fetal serum (manufactured by Selborne Biological Services, model number: FBS-04) were added to a basal medium "MEMα (containing L-alanyl-L-glutamine, phenol red, sodium pyruvate) (model number: 289-33365, lot: SKH9471)" so that the final concentration of the bovine fetal serum was 15% (v/v), thereby obtaining culture media which were subsequently used. Hereinafter, the above-described culture medium is referred to as a culture medium.

(3) Isolation of Bone Marrow-Derived Mesenchymal Stem Cell from Bone Marrow Fluid (Bone Marrow Fluid-Derived Mesenchymal Stem Cell Manufactured by AllCells, LLC)

The purchased bone marrow fluid (lot: 3024624, 3024625) was centrifuged at 1,000 rpm for 10 minutes to isolate mesenchymal stem cells, blood plasma was removed, a culture medium was added so that the amount thereof was 10 times the amount of the culture medium before the removal of the blood plasma, the seedling was carried out in a flask to 0.20 mL/cm$^2$, and culturing was carried out in an incubator at 37° C. in a 5% $CO_2$ atmosphere. The culture medium was exchanged every 3 or 4 days, and the cells were cultured for 12 to 13 days after seeding and then detached with a 0.05% trypsin-ethylenediaminetetraacetic acid (EDTA) solution (hereinafter, referred to as trypsin, Life Technologies, model number: 25300). After the detachment, trypsin was neutralized with an equal amount of the culture medium, followed by transferring to a tube prepared separately. The culture flask was further washed with an equal amount of the culture medium, which was subsequently added to the tube, and the remaining cells were recovered. The tube was centrifuged at 200×g for 5 minutes, and the supernatant was removed. An appropriate amount of the culture medium was added to the remaining pellet, and cell counting was carried out using a hemocytometer. The seedling was carried out in a flask so that the final concentration was 0.20 to 0.50×10$^4$ cells/cm$^2$, and the culturing was carried out in an incubator at 37° C. and in a 5% $CO_2$ atmosphere. The culturing was carried out for 3 days or 4 days, and when 60% or more of the bottom surface of the flask was filled with cells, subculturing was repeated in the same operation as described above, the cells at the end of the second passage were centrifuged and adjusted to 100×10$^4$ cells/mL with a cryopreservation solution mixed with the culture medium so that the final concentration of dimethyl sulfoxide (Sigma-Aldrich Co., LLC, model number: D2650) was 10% (v/v).

(4) Culturing of Mesenchymal Stem Cell and Gene Extraction

Although a different culture medium was recommended for each of the prepared mesenchymal stem cells (the above-described 7 kinds, a total of 17 lots), each kind of the cells was cultured using the culture medium described in the above-described section of (2) in order to reduce the influence of the culture medium on the gene analysis. Each frozen stock of MSC was thawed in a water bath at 37° C., followed by centrifugation at 200×g for 5 minutes, the cryopreservation solution was removed, each culture medium was added thereto, the seedling was carried out in a flask so that the final concentration was 0.25 to 0.50×10$^4$ cells/cm$^2$, and the culturing was carried out in an incubator at 37° C. and in a 5% $CO_2$ atmosphere for 3 or 4 days. When 60% or more of the bottom surface of the flask was filled with cells, subculturing was carried out twice by the method described above. To the recovered cells, a lysis buffer obtained by adding DTT (Wako, 047-08973) to a QIAGEN RNeasy (QIAGEN, 74104) RLT Buffer was added, and stirring was carried out by pipetting to prepare a lysate, and the lysate was stored at −80° C. The RNA extraction was carried out according to the protocol of QIAGEN N.V. The nucleic acid concentration of the obtained aqueous RNA solution was measured, and the dilution was carried out as necessary.

Example 1-2: Preparation of Non-MSC Cell and mRNA Thereof (1) Cell

The following cells were prepared.

Fibroblast (FB) CC-2509, manufactured by Lonza Group AG

Pulmonary artery endothelial cell (PAEC), PCS-100-022, ATCC

Visceral adipocyte (WP) C-12732, PromoCell GmbH

Chondrocyte (CH) C-12710, PromoCell GmbH

Hematopoietic progenitor cell (CD34 cell) C-12921, PromoCell GmbH

T cell 2W-200, Lonza Group AG

B cell, PCS-800-018, ATCC

Monocyte (CD14 cell) C-12909, PromoCell GmbH

Peripheral blood-derived iPSC cell (iPSC)

(2) Preparation of Cells Other than Mesenchymal Stem Cell and Gene Extraction

The fibroblast, the pulmonary artery endothelial cell, the visceral adipocyte, the chondrocyte, the hematopoietic progenitor cell, and the monocyte were subjected to cell counting, where for the monocyte, a frozen vial thereof had been thawed in a water bath at 37° C. and the cells had been slowly added to 10 mL of a heated culture medium of MEMα/15% FBS/20 µg/mL GENTACIN. After centrifugation (300× G, 5 minutes, room temperature), the supernatant was removed as much as possible, a lysis buffer obtained by adding DTT (Wako, 047-08973) to a QIAGEN RNeasy (QIAGEN, 74104) RLT Buffer was added, and stirring was carried out by pipetting to prepare a lysate. 350 µL of each lysate was transferred to a 1.5 mL tube and subjected to RNA extraction.

The T cells were thawed in a water bath at 37° C. and transferred to a 50 ml conical tube. A heated RPMI/NEAA/1 mmol/L Sodium Pyruvate/2 mmol/L L-Alanine & L-Glutamine/10 mmol/L HEPES/10% FBS/20 U/mL DNase I (1 mL) was slowly added thereto. 1 mL of the above-described heated culture medium was added to the empty vial. Then, a few droplets of this rinsing liquid were added to a 50 mL tube, and stirring was carried out gently, and then these operations were repeated over 1 to 2 minutes to add the entire amount thereof. A few droplets of the above-described culture medium were added thereto, and stirring was carried out gently, and then these operations were repeated to add the above-described culture medium over a few minutes until the final volume reached 50 mL. After cell counting, centrifugation (300× G, 5 minutes, room temperature) was carried out to remove the supernatant as much as possible, and RLT/DTT+ was added, followed by stirring with pipetting. 350 µL of each lysate was transferred to a 1.5 mL tube and subjected to RNA extraction.

For the B cells, a frozen vial thereof was thawed in a water bath at 37° C. and the cells were slowly added to a heated HBSS/10 & HSA (5 mL) and then counted. After centrifugation (300× G, 5 minutes, room temperature), the supernatant was removed as much as possible, and RLT/DTT+ was added, followed by stirring with pipetting. 350 µL of each lysate was transferred to a 1.5 mL tube and subjected to RNA extraction.

The iPS cells were cultured on a 6-well plate, the supernatant was removed, and then RLT/DTT+350 µL/well was added to the cells, followed by being dissolved with pipetting. The lysate from one well was placed in one 1.5 mL tube and subjected to RNA extraction.

Regarding any kind of cells, the number of cells used for one RNA extraction was set not to exceed 4×10$^6$ cells. In addition, in a case where RNA extraction was not carried out immediately after the preparation of the lysate, it was stored at −80° C. and then thawed on ice on the day of RNA extraction and used for RNA extraction. The RNA extraction was carried out according to the protocol of QIAGEN N.V. The nucleic acid concentration of the obtained aqueous RNA solution was measured, and the dilution was carried out as necessary.

Example 2: Preparation of Gene Expression Pattern Panel (1) Selection of Gene Group that is Characteristic of MSC It is known that the amplicon sequence can be measured with high accuracy in a case where the number of genes is 1,200 genes or less. Therefore, the genes that are involved in the function or state of MSC, or used as markers are narrowed down to 1,200 genes, and a high-throughput evaluation system is constructed. As the items for evaluating the function or state of MSC, 16 items were selected as the items involved with MSC with reference to commercially available panels for gene expression analysis (Table 1).

Regarding a method for selecting a gene, commercially available panels (manufactured by Thermo Fisher Scientific, Inc., Illumina, Inc., QIAGEN N.V., and Bio-Rad Laboratories Inc.), documents, microarray data, and the Ontology database (http://www.informatics.jax.org/vocab/gene_ontology/) were used to select genes having a high appearance frequency in terms of each item of the 16 items.

TABLE 1

MSC-related items in commercially available panel and number of target genes

| | Item | Number of genes (array) | Number of target genes |
|---|---|---|---|
| Function | 1. Immunity | 1093 | 300 |
| | 2. Anti-inflammation | | 300 |
| | 3. Angiogenesis | 169 | 100 |
| | 4. Neuranagenesis | 177 | 100 |
| | 5. Chondrogenesis | (30) | 100 |
| | 6. Osteogenesis | 84 | 100 |
| | 7. Adipogenesis | 84 | 100 |
| | 8. Fibrosis suppression | 84 | 100 |
| State | 9. Immunogenicity | — | 100 |
| | 10. Migration | 84 | 100 |
| | 11. Adhesion/engraftment | 96 | 100 |
| | 12. Senescence | 163 | 100 |
| Others | 13. MSC | 84 | 100 |
| | 14. Surface marker | 84 | 100 |
| | 15. Growth factor | 84 | 100 |
| | 16. Chemokine/cytokine | 84 | 100 |
| | Total (including overlapping genes) | 2688 | 2000 |
| | Total (without overlapping genes) | 1677 | (1200) |

As a result, based on the 26 kinds of commercially available panels, the 294 reports of documents, the Ontology database, and the microarray data, the order of priority was assigned to the genes according to the frequency of appearance thereof to select genes. As a result of sorting out the overlapping genes for each item, a total of 1,107 genes could be extracted. In addition, 92 genes were selected from the microarray data. For the remaining one gene, GAPDH was selected as a house keeping gene, thereby setting a total of 1,200 genes. A method of selecting genes for each item and the selected genes are shown below.

<1> Selection of Osteogenesis-Related Gene

A total of the following 477 kinds of genes were extracted from: 84 kinds from "Osteogenesis PCR Array", PAHS-049Z, manufactured by QIAGEN N.V.; 392 kinds from the Ontology database (osteogenesis); and 92 kinds from the 23 reports of documents relating to MSC and osteogenesis. The 11 kinds of differentiation prediction markers were added and subjected to the assignment of the order of priority in descending order of the appearance frequency to select 96 genes.

<2> Selection of Adipogenesis-Related Gene

A total of the following 354 kinds of genes were extracted from: 84 kinds from "Adipogenesis PCR Array", PAHS-026Z, Manufactured by QIAGEN N.V.; 270 Kinds from the Ontology database (adipogenesis); and 97 kinds from the 23 reports of documents relating to MSC and adipogenesis. The 9 kinds of differentiation prediction markers were added and subjected to the assignment of the order of priority in descending order of the appearance frequency to select 101 genes.

<3> Selection of Chondrogenesis-Related Gene

Since there was no commercially available panel relating to cartilage, the selection was carried out based on the ontology database, cartilage markers of R&D systems, documents, and cartilage substrates. A total of the following 398 kinds of genes were extracted from: 214 kinds from the Ontology database (chondrogenesis); 30 kinds from the web site of R&D systems; 249 kinds from the papers (52 reports) relating to MSC and chondrogenesis; and 14 kinds from the cartilage substrates. The order of priority was assigned in descending order of the appearance frequency to select 119 genes.

<4> Selection of Immunity-Related Gene

A total of the following 512 kinds of genes were extracted from: the genes selected from the following three kinds of commercially available panels (84 kinds from "Innate & Adaptive Immune Response PCR Array", PAHS-052Z, manufactured by QIAGEN N.V.; 96 kinds from "TaqMan™ Array Human Immune Response", #4414073, manufactured by Thermo Fisher Scientific, Inc.; and 401 kinds from "AmpliSeq for Illumina Immune Response Panel", #20019169, manufactured by Illumina, Inc.); and 107 kinds from the 15 reports of documents relating to MSC and immunity. The order of priority was assigned in descending order of the appearance frequency to select 282 genes.

<5> Selection of Inflammation-Related Gene

A total of the following 1,257 kinds of genes were extracted from: 798 kinds from the following 6 kinds of commercially available panels ("Inflammatory Cytokines & Receptors PCR Array", PAHS-011Z, manufactured by QIAGEN N.V.; "Inflammatory Response and Autoimmunity 384H", PAHS-3803Z, manufactured by QIAGEN N.V.; "Inflammation 20-Plex Human ProcartaPlex™ Panel", EPX200-12185-901, manufactured by Thermo Fisher Scientific, Inc.; "AmpliSeq for Illumina RNA Inflammation Response Research Panel", #20020496, manufactured by Illumina, Inc.; "Bio-Plex Pro Human Inflammation Assay Kit", #171AL001M, manufactured by Bio-Rad Laboratories Inc.; and "Bio-Plex Pro™ Human Cytokine Screening 48-Plex panel", Ser. No. 12/007,283, manufactured by Bio-Rad Laboratories Inc.); 715 kinds from the Ontology database (inflammatory response); and 110 kinds from the 29 reports of documents relating to MSC and anti-inflammation. The order of priority was assigned in descending order of the appearance frequency to select 303 genes.

<6> Selection of Angiogenesis-Related Gene

A total of the following 647 kinds of genes were extracted from: 166 kinds from the following 3 kinds of commercially available panels ("Angiogenesis PCR Array", PAHS-024Z, manufactured by QIAGEN N.V.; "Angiogenic Growth Factors PCR Array", PAHS-072Z, manufactured by QIAGEN N.V.; and "TaqMan™ Array Human Angiogenesis", #4414071, manufactured by Thermo Fisher Scientific, Inc.); 531 kinds from the Ontology database (angiogenesis); and 179 kinds from the 15 reports of documents relating to MSC and angiogenesis. The order of priority was assigned in descending order of the appearance frequency to select 121 genes.

<7> Selection of Neuranagenesis-Related Gene

A total of the following 380 kinds of genes were extracted from: 246 kinds from the following 3 kinds of commercially available panels (84 kinds from "Neurogenesis PCR Array", PAHS-404Z, manufactured by QIAGEN N.V.; 84 kinds from "Neurotrophin and Receptors PCR Array", PAHS-031Z, manufactured by QIAGEN N.V.; and 92 kinds from "TaqMan™ Array Human Neurotransmitters", #4414094, manufactured by Thermo Fisher Scientific, Inc.); 80 kinds from the Ontology database (nerve development); and 92 kinds from the 16 reports of documents relating to MSC and neuranagenesis. The order of priority was assigned in descending order of the appearance frequency to select 109 genes.

<8> Selection of Fibrosis-Related Gene

A total of the following 346 kinds of genes were extracted from: 84 kinds from "Fibrosis PCR Array", PAHS-026Z, manufactured by QIAGEN N.V.; 268 kinds from the Ontology database; collagen metabolic process (GO: 0032963), fibroblast proliferation (GO: 0048144), connective tissue replacement (GO: 0097709), and fibroblast migration (GO: 0010761); and 59 kinds from the 19 reports of documents relating to MSC and fibrosis. The order of priority was assigned in descending order of the appearance frequency to select 112 genes.

<9> Selection of Immunogenicity-Related Gene

Since there was no commercially available panel for immunogenicity, a total of 42 genes were selected from the 20 reports of documents.

<10> Selection of Migration-Related Gene

A total of the following 199 kinds of genes were extracted from: 84 kinds from "Cell motility PCR Array", PAHS-128Z, manufactured by QIAGEN N.V.; 925 kinds from the Ontology database; negative regulation of cell migration (GO: 0030336), positive regulation of cell migration (GO: 0030335), regulation of cell migration (GO: 0030334), and mesenchymal stem cell migration (GO: 1905319); and 137 kinds from the 15 reports of documents relating to MSC and migration. However, since the number of genes from the ontology was large, genes that appeared only in the ontology were excluded. The order of priority was assigned in descending order of the appearance frequency to select 137 genes.

<11> Selection of Adhesion-Related Gene

A total of the following 138 kinds of genes were extracted from: 92 kinds from "TaqMan™ Array, Human Extracellular Matrix & Adhesion Molecules", #4418778, manufactured by Thermo Fisher Scientific, Inc.; 952 kinds from the Ontology database; cell adhesion mediated by integrin (GO: 0033627), negative regulation of cell adhesion (GO: 0007162), positive regulation of cell adhesion (GO: 0045785), regulation of cell adhesion (GO:0030155), and other 14 items; 78 kinds from the 16 reports of document relating to MSC and adhesion/engraftment; and 34 kinds as the adhesive molecules. However, since the number of genes from the ontology was large, genes that appeared only in the ontology were excluded. The order of priority was assigned in descending order of the appearance frequency to select 95 genes.

<12> Selection of Senescence-Related Gene

A total of the following 493 kinds of genes were extracted from: 163 kinds from the following 2 kinds of commercially available panels (84 kinds from "Aging PCR Array", PAHS-178Z, manufactured by Qiagen N.V., and 84 kinds from "Cellular Senescence PCR Array", PAHS-050Z, manufactured by Qiagen N.V.); 153 kinds from the Ontology database; cell aging (GO: 0007569); and 273 kinds from the 20 reports of documents relating to MSC and senescence. The order of priority was assigned in descending order of the appearance frequency to select 113 genes.

<13> and <14> Selection of Growth Factor and Cytokine-Related Gene

Since the genes in the items of the growth factor and the cytokine were similar, the selection was carried out collectively.

A total of the following 350 kinds of genes were extracted from: 144 kinds from the following 2 kinds of commercially available panels (84 kinds from "Growth Factor PCR Array", PAHS-041Z, manufactured by QIAGEN N.V., and (84 kinds from "Cytokines and Chemokines PCR Array", PAHS-150Z, manufactured by QIAGEN N.V.); 205 kinds from the 15 reports of documents relating to growth factors and cytokines secreted by MSC; and furthermore, 38 kinds of cytokines that were detected with LAS-3000 (GE Healthcare Technologies Inc.) from the supernatant of the MSC obtained by subculturing each of the J bone marrow MSC, the F bone marrow MSC, and the iPSC-MSC to P6 by the above method, where the supernatant had been subjected to an operation according to the protocol with a Proteome profiler Human XL Cytokine Array Kit (model number: ARY022) manufactured by R&D Systems, Inc. The order of priority was assigned in descending order of the appearance frequency to select 177 genes.

<15> Selection of MSC Marker-Related Gene

A total of the following 212 kinds of genes were extracted from: 84 kinds from "Mesenchymal Stem Cell PCR Array", PAHS-082Z, manufactured by QIAGEN N.V.; and 165 kinds from the 16 reports of documents relating to the MSC marker. The order of priority was assigned in descending order of the appearance frequency to select 110 genes.

<16> Selection of Surface Marker-Related Gene

From 90 kinds from "Cell Surface Markers PCR Array", PAHS-055Z, manufactured by QIAGEN N.V.), 101 kinds from the candidate gene group that had not been selected as the MSC markers, and furthermore, the data obtained by comprehensively analyzing 242 kinds of surface markers in the MSC obtained by subculturing each of the J bone marrow MSC, the F bone marrow MSC, and the iPSC-MSC to P6 by the above method, by using a Lyoplate™ Human Cell Surface Marker Screening Panel (model number: 560747) manufactured by Becton, Dickinson and Company, the priority was set from the two viewpoints of those having a high positive rate (50% or more) and those having a large difference in value between samples (50% or more). The operation was carried out according to the protocol, and the detection was carried out with Attune NxT, manufactured by Thermo Fisher Scientific, Inc. A total of 348 kinds of genes were extracted. The order of priority was assigned in descending order of the appearance frequency to select 87 genes.

<Selected 1,200 Genes>

ABCB1 (ATP-binding cassette, sub-family B (MDR/TAP), member 1A), Abl1 (c-abl oncogene 1, non-receptor tyrosine kinase), ACACB (acetyl-Coenzyme A carboxylase beta), Acan (aggrecan), ACHE (acetylcholinesterase), Ackr2 (atypical chemokine receptor 2), ackr3 (atypical chemokine receptor 3), ACLY (ATP citrate lyase), ACTA2 (Actin, alpha 2, smooth muscle, aorta), ACTB (actin, beta), ACTG2 (actin, gamma 2, smooth muscle, enteric), ACTN3 (actinin alpha 3), ACTR2 (ARP2 actin-related protein 2), ACTR3 (ARP3 actin-related protein 3), Acvr1 (activin A receptor, type 1), Acvr2a (activin receptor IIA), Acvr2b (activin receptor IIB), ADAMTS1 (a disintegrin-like and metallopeptidase (reprolysin type) with thrombospondin type 1 motif, 1), ADAMTS5 (a disintegrin-like and metallopeptidase (reprolysin type) with thrombospondin type 1 motif, 5 (aggrecanase-2)), Adgrb1 (adhesion G protein-coupled receptor B1), Adig (adipogenin), Adipoq (adiponectin, C1Q and collagen domain containing), Adora1 (adenosine A1 receptor), Adora2a (adenosine A2a receptor), Adrb2 (adrenergic receptor, beta 2), Afap1l2 (actin filament associated protein 1-like 2), Ager (advanced glycosylation end-product specific receptor), AgRP (Agouti related protein), AGT (angiotensinogen (serpin peptidase inhibitor, clade A, member 8)), Ahsg (alpha-2-HS-glycoprotein), Aif1 (allograft inflammatory factor1), Aimp1 (aminoacyl tRNA synthetase complex-interacting multifunctional protein 1), Akt1 (thymoma viral proto-oncogene 1), Akt3 (thymoma viral proto-oncogene 3), Alcam (activated leukocyte cell adhesion molecule), Alox15 (arachidonate 15-lipoxygenase), Alox5 (arachidonate 5-lipoxygenase), Alox5ap (arachidonate 5-lipoxygenase activating protein), Alp1 (alkaline phosphatase, liver/bone/kidney), AMOT (Angiomotin), Ang (Angiogenin), ANGEL2 (angel homolog 2), ANGPT1 (angiopoietin 1), ANGPT2 (angiopoietin 2), ANGPT4 (angiopoietin 4), ANGPTL1 (Angiopoietin-like 1), ANGPTL3 (Angiopoietin-like 3), ANGPTL4 (Angiopoietin-like 4), ANPEP (Alanyl (membrane) aminopeptidase), Anxa1 (annexin A1), ANXA3 (annexin A3), ANXA5 (annexin A5), Anxa6 (annexin A6), Aoah (acyloxyacyl hydrolase), Aoc3 (amine oxidase, copper containing 3), APAF1 (apoptotic peptidase activating factor 1), APBA1 (amyloid beta (A4) precursor protein binding, family A, member 1), APBA2 (amyloid beta (A4) precursor protein-binding, family A, member 2), Apoa1 (apolipoprotein A-I), APOE (apolipoprotein E), Areg (Amphiregulin), ARF6 (ADP-ribosylation factor 6), ARG1 (arginase, liver), ARG2 (arginase type II), Arhgap29 (Rho GTPase activating protein 29), ARHGAP35 (Rho GTPase activating protein 35), ARL6IP6 (ADP-ribosylation factor-like 6 interacting protein 6), Artn (Artemin), Atm (ataxia telangiectasia mutated), Atrn (attractin), AURKB (aurora kinase B), Axin1 (axin 1), Axl (AXL receptor tyrosine kinase), B2M (beta-2 microglobulin), B3gat1 (beta-1,3-glucuronyltransferase 1), B4GALNT1 (beta-1,4-N-acetyl-galactosaminyltransferase 1), B4galt1 (UDP-Gal:betaGlcNAc beta 1,4-galactosyltransferase, polypeptide 1), BAIAP2 (brain-specific angiogenesis inhibitor 1-associated protein 2), BCAR1 (breast cancer anti-estrogen resistance 1), BCL2 (B cell leukemia/lymphoma 2), Bcl6 (B cell leukemia/lymphoma 6), Bdkrb1 (bradykinin receptor, beta 1), Bdkrb2 (bradykinin receptor, beta 2), BDNF (Brain-derived neurotrophic factor), Bglap (bone gamma carboxyglutamate protein), BGN (biglycan), BMI1 (Bmi1 polycomb ring finger oncogene), Bmp1 (bone morphogenetic protein 1), Bmp2 (bone morphogenetic protein 2), Bmp3 (bone morphogenetic protein 3), Bmp4 (bone morphogenetic protein 4), Bmp5 (bone morphogenetic protein 5), Bmp6 (bone morphogenetic protein 6), Bmp7 (bone morphogenetic protein 7), Bmpr1a (bone morphogenetic protein receptor, type 1A), Bmpr1b (bone morphogenetic protein receptor, type 1B), Bmpr2 (bone morphogenetic protein receptor, type II (serine/threonine kinase)), Bsg (basigin), BST1 (bone marrow stromal cell antigen 1), BTC (Betacellulin), Btk (Bruton agammaglobulinemia tyrosine kinasc), BTLA (B and T lymphocyte associated), Btn2a2 (butyrophilin, subfamily 2, member A2), C1qa (complement component 1, q subcomponent, alpha polypeptide), C1QC (complement component 1, q subcomponent, C chain), CIR (complement component 1, r subcomponent A), CIS (complement component 1, s subcomponent 1), C2cd4a (C2 calcium-dependent domain containing 4A), C3 (complement component 3), C3ar1 (complement component 3a receptor 1), Cadm1 (cell adhesion molecule 1), CALB1 (calbindin 1), Caler (calcitonin receptor), Calr (calreticulin), Camp (cathelicidin antimicrobial peptide), CAPN2 (calpain 2), Casp1 (caspase 1), CASP3 (Caspase 3, apoptosis-related cysteine peptidase), CAV1 (caveolin 1), CBLN2 (cerebellin 2 precursor protein), CCL1 (chemokine (C-C motif) ligand 1), CCL11 (chemokine (C-C motif) ligand 11), CCL13 (chemokine (C-C motif) ligand 13), CCL15 (chemokine (C-C motif) ligand 15), CCL16 (chemokine (C-C motif) ligand 16), CCL17 (chemokine (C-C motif) ligand 17), CCL18 (chemokine (C-C motif) ligand 18), CCL19 (chemokine (C-C motif) ligand 19), CCL2 (chemokine (C-C motif) ligand 2), Cc120 (chemokine (C-C motif) ligand 20), CCL21 (chemokine (C-C motif) ligand 21), CCL22 (chemokine (C-C motif) ligand 22), CCL23 (chemokine (C-C motif) ligand 23), CCL24 (chemokine (C-C motif) ligand 24), CCL25 (chemokine (C-C motif) ligand 25), CCL26 (chemokine (C-C motif) ligand 26), CCL27 (chemokine (C-C motif) ligand 27), CCL3 (chemokine (C-C motif) ligand 3), CCL4 (chemokine (C-C motif) ligand 4), CCL5 (chemokine (C-C motif) ligand 5), CCL7 (chemokine (C-C motif) ligand 7), CCL8 (chemokine (C-C motif) ligand 8), Cen1 (cellular communication network factor 1), Ccn2 (cellular communication network factor 2), Ccn3 (cellular communication network factor 3), Cen4 (cellular communication network factor 4), Cend1 (cyclin D1), Ccr1 (chemokine (C-C motif) receptor 1), CCR10 (chemokine (C-C motif) receptor 10), CCR2 (chemokine (C-C motif) receptor 2), CCR3 (chemokine (C-C motif) receptor 3), CCR4 (chemokine (C-C motif) receptor 4), CCR5 (chemokine (C-C motif) receptor 5), CCR6 (chemokine (C-C motif) receptor 6), CCR7 (chemokine (C-C motif) receptor 7), CCR8 (chemokine (C-C motif) receptor 8), CCR9 (chemokine (C-C motif) receptor 9), Ccr12 (chemokine (C-C motif) receptor-like 2), CD14 (CD14 antigen), CD151 (CD151 antigen), CD160 (CD160 antigen), CD163 (CD163 antigen), CD164 (CD164 antigen), CD165 (CD165 antigen), CD180 (CD180 antigen), CD19 (CD19 antigen), CD1B (CD1b molecule), CD1C (CD1c molecule), CD1D (CD1d molecule), CD2 (CD2 antigen), CD200 (CD200 antigen), CD209 (CD209 molecule), CD22 (CD22 molecule), CD226 (CD226 molecule), CD24 (CD24 molecule), CD244 (CD244 molecule, natural killer cell receptor 2B4), CD247 (CD247 molecule), CD248 (CD248 antigen, endosialin), CD27 (CD27 molecule), CD274 (CD274 antigen), CD276 (CD276 antigen), CD28 (CD28 antigen), CD33 (CD33 antigen), CD34 (CD34 antigen), CD36 (CD36 molecule), CD37 (CD37 molecule), CD38 (CD38 antigen), CD3D (CD3d molecule), CD3E (CD3 antigen, epsilon polypeptide), CD3G (CD3g molecule), CD4 (CD4 antigen), CD40 (CD40 antigen), CD40lg (CD40 ligand), CD44 (CD44 antigen), CD47 (CD47 antigen (Rh-related antigen, integrin-associated signal transducer)), CD48 (CD48 antigen), CD52 (CD52 molecule), CD53 (CD53 molecule), CD55 (CD55 molecule), CD58 (CD58 molecule), CD59 (CD59 molecule), CD6 (CD6 molecule), CD63 (CD63 molecule), CD68 (CD68 antigen), CD69 (CD69 molecule), CD70 (CD70 antigen), CD74 (CD74 antigen), CD79A (CD79a molecule, immunoglobulin-associated alpha), CD79B (CD79b molecule, immunoglobulin-associated beta), CD80 (CD80 antigen), CD83 (CD83 molecule), CD86 (CD86 antigen), CD8A (CD8 antigen, alpha chain), CD8B (CD8b molecule), CD9 (CD9 antigen), CD93 (CD93 antigen), CD99 (CD99 antigen), CDH1 (cadherin 1), CDH11 (cadherin 11), CDH2 (cadherin 2), CDH3 (cadherin 3), CDH4 (cadherin 4), CDH5 (Cadherin 5, type 2 (vascular endothelium)), CDK4 (cyclin-dependent kinase 4), CDK6 (cyclin-dependent kinase 6), CDKN1A (cyclin-dependent kinase inhibitor 1A (P21)), CDKN1B (cyclin-dependent kinase inhibitor 1B), CDKN1C (cyclin-dependent kinase inhibitor 1C (P57)), CDKN2a (cyclin dependent kinase inhibitor 2A), CDKN2b (cyclin dependent kinase inhibitor 2B), CDKN2D (cyclin dependent kinase inhibitor 2D), CEACAM1 (carcinoembryonic antigen-related cell adhesion molecule 1), CEACAM3 (CEA cell adhesion molecule 3), CEACAM5 (CEA cell adhesion molecule 5), CEACAM6 (CEA cell adhesion molecule 6), CEACAM8 (CEA cell adhesion molecule 8), Cebpa (CCAAT/enhancer binding protein (C/EBP), alpha), Cebpb (CCAAT/enhancer binding protein (C/EBP), beta), Cebpd (CCAAT/enhancer binding protein (C/EBP), delta), CFD (complement factor D (adipsin)), Cfh (complement component factor h), CFI (complement component factor i), CFL1 (cofilin 1, non-muscle), CHAD (chondroadherin), Chadl (chondroadherin-like), CHAT (choline acetyltransferase), CHEK1 (checkpoint kinase 1), Chek2 (checkpoint kinase 2), CHI3L1 (chitinase 3 like 1), Chrd (chordin), CHRM2 (cholinergic receptor, muscarinic 2, cardiac), Chrna7 (cholinergic receptor, nicotinic, alpha polypeptide 7), CHRNB2 (cholinergic receptor, nicotinic, beta polypeptide 2 (neuronal)), Chst11 (carbohydrate sulfotransferase 11), Chst4 (carbohydrate sulfotransferase 4), CIITA (class II transactivator), Clcf1 (cardiotrophin-like cytokine factor 1), CLEC11A (Stem cell growth factor), CLSTN2 (calsyntenin 2), Clu (clusterin), Cmklr1 (chemokine-like receptor 1), Cnmd (chondromodulin), CNTF (Ciliary neurotrophic factor), COL10A1 (collagen, type X, alpha 1), COL11A1 (collagen, type XI, alpha 1), COL11A2 (collagen, type XI, alpha 2), COL12A1 (collagen, type XII, alpha 1), COL14A1 (collagen, type XIV, alpha 1), COL15A1 (collagen, type XV, alpha 1), COL16A1 (collagen, type XVI, alpha 1), COL18A1 (Collagen, type XVIII, alpha 1), COL1A1 (collagen, type I, alpha 1), COL1A2 (collagen, type I, alpha 2), COL2A1 (collagen, type II, alpha 1), COL3A1 (collagen, type III, alpha 1), COL4A2 (collagen, type IV, alpha 2), COL4A3 (Collagen, type IV, alpha 3 (Goodpasture antigen)), COL4A6 (collagen, type IV, alpha 6), COL5A1 (collagen, type V, alpha 1), COL6A1 (collagen, type VI, alpha 1), COL8A1 (collagen, type VIII, alpha 1), COL9A1 (collagen, type IX, alpha 1), COL9A2 (collagen, type IX, alpha 2), COL9A3 (collagen, type IX, alpha 3), Comp (cartilage oligomeric matrix protein), Cr2 (complement receptor 2), Creb1 (cAMP responsive element binding protein 1), CRK (v-crk avian sarcoma virus CT10 oncogene homolog), Crp (C-reactive protein, pentraxin-related), Crppa (CDP-L-ribitol pyrophosphorylase A), CryAB (crystallin, alpha B), CSF1 (colony stimulating factor 1 (macrophage)), CSF2 (colony stimulating factor 2 (granulocyte-macrophage)), CSF3 (colony stimulating factor 3 (granulocyte)), Cst3 (Cystatin C), Ctbp1 (C-terminal binding protein 1), Ctbp2 (C-terminal binding protein 2), CTLA4 (cytotoxic T-lymphocyte-associated protein 4), Ctnnal1 (catenin (cadherin associated protein), alpha-like 1), CTNNB1 (catenin (cadherin associated protein), beta 1), CTNND1 (catenin (cadherin associated protein), delta 1), CTTN (cortactin), Cx3cl1 (chemokine (C-X3-C motif) ligand 1), Cx3cr1 (chemokine (C-X3-C motif) receptor 1), CXCL1 (chemokine (C-X-C motif) ligand 1), CXCL10 (chemokine (C-X-C motif) ligand 10), CXCL11 (chemokine (C-X-C motif) ligand 11), CXCL12 (chemokine (C-X-C motif) ligand 12), CXCL13 (chemokine (C-X-C motif) ligand 13), CXCL16 (chemokine (C-X-C motif) ligand 16), CXCL2 (chemokine (C-X-C motif) ligand 2), CXCL3 (chemokine (C-X-C motif) ligand 3), CXCL5 (chemokine (C-X-C motif) ligand 5), CXCL6 (Granulocyte chemotactic protein2), CXCL8 (C-X-C motif chemokine ligand 8), CXCL9 (chemokine (C-X-C motif) ligand 9), CXCR1 (chemokine (C-X-C motif) receptor 1), CXCR2 (chemokine (C-X-C motif) receptor 2), CXCR3 (chemokine (C-X-C motif) receptor 3), CXCR4 (chemokine (C-X-C motif) receptor 4), CXCR5 (chemokine (C-X-C motif) receptor 5), CXCR6 (chemokine (C-X-C motif) receptor 6), Cybb (cytochrome b-245, beta polypeptide), Cygb (cytoglobin), Cyp26b1 (cytochrome P450, family 26, subfamily b, polypeptide 1), DAPK3 (death-associated protein kinase 3), DCN (decorin), Ddit3 (DNA-damage inducible transcript 3), Ddr2 (discoidin domain receptor tyrosine kinase 2), DDX58 (DEAD/H box helicase 58), DIAPH1 (diaphanous related formin 1), Dio2 (deiodinase, iodothyronine, type II), Dkk1 (dickkopf WNT signaling pathway inhibitor 1), Dlk1 (delta like non-canonical Notch ligand 1), Dlx5 (distal-less homeobox 5), DLX6 (distal-less homeobox 6), DPF1 (D4, zinc and double PHD fingers family 1), DPF3 (D4, zinc and double PHD fingers, family 3), DPP4 (dipeptidylpeptidase 4), Dpt (dermatopontin), DRD2 (dopamine receptor D2), DSCAM (DS cell adhesion molecule), E2f1 (E2F transcription factor 1), EBI3 (Epstein-Barr virus induced gene 3), EDIL3 (EGF-like repeats and discoidin I-like domains 3), EDN1 (endothelin 1), Efemp1 (epidermal growth factor-containing fibulin-like extracellular matrix protein 1), EFNB2 (Ephrin-B2), EGF (epidermal growth factor), Egfr (epidermal growth factor receptor), Egr2 (early growth response 2), Elane (elastase, neutrophil expressed), Elf3 (E74-like factor 3), ENC1 (ectodermal-neural cortex 1), Eng (endoglin), Enpp3 (ectonucleotide pyrophosphatase/phosphodiesterase 3), ENTPD1 (ectonucleoside triphosphate diphosphohydrolase 1), EP300 (E1A binding protein p300), EPAS1 (endothelial PAS domain protein 1), Epcam (epithelial cell adhesion molecule), Epha2 (Eph receptor A2), Ephb2 (Eph receptor B2), Ephb3 (Eph receptor B3), Ephx2 (epoxide hydrolase 2, cytoplasmic), Epo (erythropoietin), Epyc (cpiphycan), ERBB2 ("V-erb-b2 erythroblastic leukemia viral oncogene homolog 2, neuro/glioblastoma derived oncogene homolog (avian)"), EXT1 (exostosin glycosyltransferase 1), EZR (ezrin), F2 (coagulation factor II), F2r (coagulation factor II (thrombin) receptor), F2rl1 (coagulation factor II (thrombin) receptor-like 1), F3 (coagulation factor III), F8 (coagulation factor VIII), Fabp4 (fatty acid binding protein, adipocyte), FAP (fibroblast activation protein), FAS (Fas (TNF receptor superfamily member 6), Fas1 (Fas ligand (TNF superfamily, member 6), FASN (fatty acid synthase), Fbxo5 (F-box protein 5), Fcer1a (Fc receptor, IgE, high affinity I, alpha polypeptide), FCER1G (Fc receptor, IgE, high affinity I, gamma polypeptide), Fcgr1a (Fc fragment of IgG receptor 1a), FCGR3B (Fc fragment of IgG receptor IIIa), FGF1 (fibroblast growth factor 1), FGF10 (fibroblast growth factor 10), FGF19 (Fibroblast growth factor 19), FGF2 (fibroblast growth factor 2), FGF4 (Fibroblast growth factor 4), FGF6 (Fibroblast growth factor 6), FGF7 (Fibroblast growth factor 7), FGF9 (Fibroblast growth factor 9 (glia-activating factor)), FGFR1 (fibroblast growth factor receptor 1), FGFR2 (fibroblast growth factor receptor 2), FGFR3 (fibroblast growth factor receptor 3), FGFR4 (fibroblast growth factor receptor 4), FLRT3 (fibronectin leucine rich transmembrane protein 3), FLT1 (FMS-like tyrosine kinase 1), FLT3LG (FMS-like tyrosine kinase 3 ligan), FMOD (fibromodulin), FN1 (fibronectin 1), FOXC2 (forkhead box C2), FOXD1 (forkhead box D1), FOXO1 (forkhead box O1), FOXO3 (forkhead box O3), FOXP3 (forkhead box P3), Fpr1 (formyl peptide receptor 1), Fpr2 (formyl peptide receptor 2), Frzb (frizzled-related protein), FUT1 (Fucosyltransferase 1 (galactoside 2-alpha-L-fucosyltransferase, H blood group)), FUT4 (fucosyltransferase 4), FZD9 (Frizzled family receptor 9), GABRA5 (gamma-aminobutyric acid (GABA) A receptor, subunit alpha 5), GABRB2 (gamma-aminobutyric acid (GABA) A receptor, subunit beta 2), GABRB3 (gamma-aminobutyric acid (GABA) A receptor, subunit beta 3), GAD1 (glutamate decarboxylase 1), GADD45A (growth arrest and DNA-damage-inducible 45 alpha), Gal (galanin and GMAP prepropeptide), GALNT5 (polypeptide N-acetylgalactosaminyltransferase 5), GATA2 (GATA binding protein 2), GATA3 (GATA binding protein 3), GATA4 (GATA binding protein 4), GBX2 (gastrulation brain homeobox 2), Gdf10 (growth differentiation factor 10), GDF15 (Growth differentiation factor 15), GDF5 (growth differentiation factor 5), GDF6 (growth differentiation factor 6), GDF7 (Growth differentiation factor 7), GDNF (Glial cell derived neurotrophic factor), Ghsr (growth hormone secretagogue receptor), GLB1 (galactosidase, beta 1), Gli1 (GL1-Kruppel family member GLI1), GNLY (granulysin), GPC3 (glypican3), GPC4 (glypican4), GPI (Glucose-6-phosphate isomerase), Gpm6b (glycoprotein m6b), Gpr17 (G protein-coupled receptor 17), Gpx4 (glutathione peroxidase 4), Grem1 (gremlin 1, DAN family BMP antagonist), Grn (granulin), GTF3A (General transcription factor IIIA), GUSB (glucuronidase, beta), Gypa (glycophorin A), GZMB (granzyme B), H2ac21 (H2A clustered histone 21), HAPLN1 (hyaluronan and proteoglycan link protein 1), HAS1 (hyaluronan synthase 1), HAT1 (Histone acetyltransferase 1), Havcr2 (hepatitis A virus cellular receptor 2), Hbegf (heparin-binding EGF-like growth factor), Hck (hemopoietic cell kinase), HDAC1 (Histone deacetylase 1), Hdac5 (histone deacetylase 5), Hdac7 (histone deacetylase 7), Hdac9 (histone deacetylase 9), Hes1 (hes family bHLH transcription factor 1), Hgf (hepatocyte growth factor), Hif1a (hypoxia inducible factor 1, alpha subunit), HLA-A (major histocompatibility complex, class I, A), HLA-B (major histocompatibility complex, class I, B), HLA-C (major histocompatibility complex, class I, C), HLA-DMA (major histocompatibility complex, class II, DM alpha), HLA-DMB (major histocompatibility complex, class II, DM beta), HLA-DOA (major histocompatibility complex, class II, DO alpha), HLA-DOB (major histocompatibility complex, class II, DO beta), HLA-DPA1 (major histocompatibility complex, class II, DP alpha 1), HLA-DPB1 (major histocompatibility complex, class II, DP beta 1), HLA-DQA1 (major histocompatibility complex, class II, DQ alpha 1), HLA-DQA2 (major histocompatibility complex, class II, DQ alpha 2), HLA-DQB1 (major histocompatibility complex, class II, DQ beta 1), HLA-DQB2 (major histocompatibility complex, class II, DQ bete 2), HLA-DRA1 (major histocompatibility complex, class II, DR alpha), HLA-DRB1 (major histocompatibility complex, class II, DR bete 1), HLA-DRB5 (major histocompatibility complex, class II, DR beta 5), HLA-E (major histocompatibility complex, class I, E), HLA-F (major histocompatibility complex, class I, F), HLA-F-AS1 (HLA-F antisense RNA 1), HLA-G (major histocompatibility complex, class I, G), Hmga2 (high mobility group AT-hook 2), Hmox1 (heme oxygenase 1), HNF1A (HNF1 homeobox A), HPSE (Heparanasc), Hras (Harvey rat sarcoma virus oncogene), HSD11B1 (hydroxysteroid 11-beta dehydrogenase 1), HSF1 (heat shock factor 1), HSPA9 (heat shock protein 9), Hspd1 (heat shock protein 1 (chaperonin)), Ibsp (integrin binding sialoprotein), ICAM1 (intercellular adhesion molecule 1), ICAM2 (intercellular cell adhesion molecule), ICAM5 (intercellular adhesion molecule 5, telencephalin), ICOS (inducible T cell co-stimulator), ICOSLG (icos ligand), ID1 (inhibitor of DNA binding 1, HLH protein), ID2 (inhibitor of DNA binding 2), ID4 (inhibitor of DNA binding 4), IDO1 (indoleamine 2,3-dioxygenase 1), IDO2 (indoleamine 2,3-dioxygenase 2), IFI27 (interferon, alpha-inducible protein 27), IF135 (interferon-induced protein 35), IFI44L (interferon-induced protein 44 like), IF16 (interferon alpha inducible protein 6), IFIH1 (interferon induced with helicase C domain 1), IFIT1 (interferon-induced protein with tetratricopeptide repeats 1), IFIT2 (interferon-induced protein with tetratricopeptide repeats 2), IFIT3 (interferon-induced protein with tetratricopeptide repeats 3), IFITM1 (interferon induced transmembrane protein 1), IFITM2 (interferon induced transmembrane protein 2), IFNA1 (interferon alpha 1), IFNA17 (interferon alpha 17), IFNA2 (Interferon, alpha 2), IFNAR1 (interferon (alpha and beta) receptor 1), IFNB1 (interferon beta 1, fibroblast), Ifng (interferon gamma), Ifngr1 (interferon gamma receptor 1), Ifngr2 (interferon gamma receptor 2), IGF1 (insulin-like growth factor 1), IGF1R (insulin-like growth factor I receptor), IGF2 (insulin-like growth factor 2), IGF2R (insulin-like growth factor 2 receptor), IGFBP1 (insulin-like growth factor binding protein 1), IGFBP2 (insulin-like growth factor binding protein 2), IGFBP3 (insulin-like growth factor binding protein 3), IGFBP4 (insulin-like growth factor binding protein 4), IGFBP5 (insulin-like growth factor binding protein 5), IGFBP6 (insulin-like growth factor binding protein 6), IGFBP7 (insulin-like growth factor binding protein 7), Igsfl1 (immunoglobulin superfamily, member 11), Ihh (Indian hedgehog), IL10 (interleukin 10), IL10RA (interleukin 10 receptor, alpha), IL11 (Interleukin 11), IL12A (interleukin 12a), IL12B (interleukin 12b), IL13 (interleukin 13), IL13RA2 (interleukin 13 receptor subunit alpha 2), IL15 (interleukin 15), IL16 (interleukin 16), IL17a (interleukin 17A), IL17b (interleukin 17B), IL17c (interleukin 17C), IL17d (interleukin 17D), IL17f (interleukin 17F), IL17ra (interleukin 17 receptor A), IL17rb (interleukin 17 receptor B), IL17rc (interleukin 17 receptor C), IL17re (interleukin 17 receptor E), IL18 (interleukin 18), IL18r1 (interleukin 18 receptor 1), IL18rap (interleukin 18 receptor accessory protein), IL1a (interleukin 1 alpha), IL1b (interleukin 1 beta), IL1f10 (interleukin 1 family, member 10), IL1r1 (interleukin 1 receptor, type I), IL1r2 (interleukin 1 receptor, type II), IL1rap (interleukin 1 receptor accessory protein), IL1rl1 (interleukin 1 receptor-like 1), IL1rl2 (interleukin 1 receptor-like 2), IL1rn (interleukin 1 receptor antagonist), IL2 (interleukin 2), IL21 (interleukin 21), IL22 (interleukin 22), IL22ra2 (interleukin 22 receptor, alpha 2), IL23a (interleukin 23, alpha subunit p19), IL23r (interleukin 23 receptor), IL24 (Interleukin 24), IL25 (interleukin 25), IL27 (interleukin 27), IL2ra (interleukin 2 receptor, alpha chain), IL2RB (interleukin 2 receptor, beta chain), IL2RG (interleukin 2 receptor, gamma chain), IL3 (interleukin 3), IL31ra (interleukin 31 receptor A), IL33 (interleukin 33), IL34 (interleukin 34), IL3RA (interleukin 3 receptor, alpha chain), IL4 (interleukin 4), IL5 (interleukin 5), IL5ra (interleukin 5 receptor, alpha), IL6 (interleukin 6), IL6R (interleukin 6 receptor, alpha), IL6ST (interleukin 6 signal transducer), IL7 (interleukin 7), IL7R (interleukin 7 receptor), IL9 (interleukin 9), ILK (integrin linked kinase), INHBA (Inhibin, beta A), INHBE (inhibin subunit beta E), INS (Insulin), INSC (INSC spindle orientation adaptor protein), INSR (insulin receptor), Irak2 (interleukin-1 receptor-associated kinase 2), IRF1 (interferon regulatory factor 1), IRF3 (interferon regulatory factor 3), IRF4 (interferon regulatory factor 4), IRF7 (interferon regulatory factor 7), IRF9 (interferon regulatory factor 9), IRS1 (insulin receptor substrate 1), IRS2 (insulin receptor substrate 2), ITGA1 (integrin a1), ITGA10 (integrin, alpha 10), ITGA11 (integrin alpha 11), ITGA2 (integrin alpha 2), ITGA2b (integrin alpha 2b), ITGA3 (integrin a3), ITGA4 (integrin alpha 4), ITGA5 (integrin alpha 5), ITGA6 (integrin alpha 6), ITGA7 (integrin alpha 7), ITGA8 (integrin alpha 8), ITGA9 (integrin alpha 9), ITGAD (integrin, alpha D), ITGAE (integrin alpha E, epithelial-associated), ITGAL (integrin alpha L), ITGAM (integrin alpha M), ITGAV (integrin alpha V), ITGAX (integrin alpha X), ITGB1 (integrin beta 1 (fibronectin receptor beta)), ITGB2 (integrin beta 2), ITGB3 (integrin beta 3), ITGB4 (integrin beta 4), ITGB5 (integrin b5), ITGB6 (integrin beta 6), ITGB7 (integrin beta 7), ITGB8 (integrin subunit beta 8), Itih4 (inter alpha-trypsin inhibitor, heavy chain 4), JAG1 (jagged 1), JAG2 (jagged 2), JAK1 (Janus kinase 1), JAK2 (Janus kinase 2), JAKMIP3 (janus kinase and microtubule interacting protein 3), JCAD (junctional cadherin 5 associated), JUN (jun proto-oncogene), KAT2B (K(lysine) acetyltransferase 2B), Kdr (kinase insert domain protein receptor), KIF20B (kinesin family member 20B), KIRREL3 (kirre like nephrin family adhesion molecule 3), Kit (KIT proto-oncogene receptor tyrosine kinase), KITLG (kit ligand), KLF15 (Kruppel-like factor 15), KLF2 (Kruppel-like factor 2 (lung)), KLF3 (Kruppel-like factor 3 (basic)), KLF4 (Kruppel-like factor 4 (gut)), KLF5 (Kruppel-like factor 5), Klkb1 (kallikrein B, plasma 1), KLRG1 (killer cell lectin-like receptor subfamily G, member 1), Kng1 (kininogen 1), KRT1 (keratin 1), KRT18 (keratin 18), KRT8 (Keratin 8), L1CAM (L1 cell adhesion molecule), LAMA1 (laminin, alpha 1), LAMA2 (laminin, alpha 2), LAMA3 (laminin, alpha 3), LAMA4 (laminin, alpha 4), LAMB1 (laminin B1), Lamp1 (lysosomal-associated membrane protein 1), Lamp2 (lysosomal-associated membrane protein 2), Lamtor2 (late endosomal/lysosomal adaptor, MAPK and MTOR activator 2), Lbp (lipopolysaccharide binding protein), Lep (leptin), Lgals1 (lectin, galactose binding, soluble 1), LGALS3 (lectin, galactose binding, soluble 3), Lgals9 (lectin, galactose binding, soluble 9), LIF (leukemia inhibitory factor), LIMK1 (LIM-domain containing, protein kinase), LIPE (lipase, hormone sensitive), Lmna (lamin A), LMNB1 (lamin B1), LMNB2 (lamin B2), LOX (lysyl oxidase), Lp1 (lipoprotein lipase), Lrp1 (low density lipoprotein receptor-related protein 1), Lrp5 (low density lipoprotein receptor-related protein 5), LRRTM2 (leucine rich repeat transmembrane neuronal 2), LSAMP (limbic system-associated membrane protein), LSM5 (LSM5 homolog, U6 small nuclear RNA and mRNA degradation associated), Lta (lymphotoxin A), Ltbp1 (latent transforming growth factor beta binding protein 1), Ly86 (lymphocyte antigen 86), Ly96 (lymphocyte antigen 96), Lyn (LYN proto-oncogene, Src family tyrosine kinase), LYZ (lysozyme 1), MAFK (v-maf musculoaponeurotic fibrosarcoma oncogene family, protein K (avian)), MAGEA1 (melanoma antigen, family A, 1), MAGEA10 (melanoma antigen family A, 10), MAGEA12 (MAGE family member A12), MAGEA3 (melanoma antigen, family A, 3), MAGEA4 (melanoma antigen, family A, 4), MAP2 (microtubule-associated protein 2), MAP2K1 (mitogen-activated protein kinase kinase 1), MAPK1 (mitogen-activated protein kinase 1), MAPK14 (mitogen-activated protein kinase 14), MAPK3 (mitogen-activated protein kinase 3), MAPK8 (mitogen-activated protein kinase 8), MAPKAPK2 (MAP kinase-activated protein kinase 2), Matn1 (matrilin 1, cartilage matrix protein), Matn3 (matrilin 3), Matn4 (matrilin 4), MBP (myelin basic protein), MCAM (melanoma cell adhesion molecule), Mdk (midkine), MEF2C (myocyte enhancer factor 2C), Mefv (Mediterranean fever), MEG3 (maternally expressed 3), MET (met proto-oncogene), Mgll (monoglyceride lipase), MICA (MHC class I polypeptide-related sequence A), MICB (MHC class I polypeptide-related sequence B), Mif (macrophage migration inhibitory factor), Mir34a (microRNA 34a), Mki67 (antigen identified by monoclonal antibody Ki 67), Mme (membrane metallo endopeptidase), MMP1 (matrix metallopeptidase 1), MMP12 (matrix metallopeptidase 12), MMP13 (matrix metallopeptidase 13), MMP14 (matrix metallopeptidase 14 (membrane-inserted)), MMP15 (matrix metallopeptidase 15), MMP16 (matrix metallopeptidase 16), MMP2 (matrix metallopeptidase 2), MMP25 (matrix metallopeptidase 25), MMP3 (matrix metallopeptidase 3), MMP7 (matrix metallopeptidase 7), MMP8 (matrix metallopeptidase 8), MMP9 (matrix metallopeptidase 9), Morc3 (microrchidia 3), MPO (myeloperoxidase), Mrap (melanocortin 2 receptor accessory protein), MST1 (macrophage stimulating 1), MSTN (Myostatin), Msx1 (msh homeobox 1), Msx2 (msh homeobox 2), MX1 (MX dynamin-like GTPasc 1), Myc (MYC proto-oncogene, bHLH transcription factor), Myd88 (myeloid differentiation primary response gene 88), MYL9 (myosin, light polypeptide 9, regulatory), MYLK (myosin, light polypeptide kinase), Nampt (nicotinamide phosphoribosyltransferase), Nanog (Nanog homeobox), NCAM (neural cell adhesion molecule 1), NCOA2 (nuclear receptor coactivator 2), Ncor2 (nuclear receptor co-repressor 2), NCR3LG1 (natural killer cell cytotoxicity receptor 3 ligand 1), NDP (Norrie disease (pseudoglioma) (human)), Ndst1 (N-deacetylase/N-sulfotransferase (heparan glucosaminyl) 1), NECTIN2 (nectin cell adhesion molecule 2), NES (Nestin), NETO1 (neuropilin (NRP) and tolloid (TLL)-like 1), Neurog1 (neurogenin 1), NF1 (neurofibromin 1), Nfe2l1 (nuclear factor, erythroid derived 2,-like 1), Nfe2l2 (nuclear factor, erythroid derived 2, like 2), Nfkb1 (nuclear factor of kappa light polypeptide gene enhancer in B cells 1, p105), Nfkbia (nuclear factor of kappa light polypeptide gene enhancer in B cells inhibitor, alpha), Nfkbid (nuclear factor of kappa light polypeptide gene enhancer in B cells inhibitor, delta), NGF (Nerve growth factor (beta polypeptide)), NGFR (nerve growth factor receptor (TNFR superfamily, member 16)), Ninj1 (ninjurin 1), Nlrp12 (NLR family, pyrin domain containing 12), Nlrp3 (NLR family, pyrin domain containing 3), NODAL (Nodal homolog (mouse)), Nog (noggin), NOS1 (nitric oxide synthase 1, inducible), NOS2 (nitric oxide synthase 2, inducible), NOS3 (Nitric oxide synthase 3 (endothelial cell)), NOTCH1 (Notch 1), Nox4 (NADPH oxidase 4), NROB2 (nuclear receptor subfamily 0, group B, member 2), Nr1d1 (nuclear receptor subfamily 1, group D, member 1), NR1H3 (nuclear receptor subfamily 1, group H, member 3), NR3C1 (nuclear receptor subfamily 3, group C, member 1), NRF1 (nuclear respiratory factor 1), NRG1 (Neuregulin 1), NRGN (neurogranin), NRP1 (neuropilin 1), NRP2 (Neuropilin 2), NT5E (5' nucleotidase, ecto), NTF3 (Neurotrophin 3), NTF4 (Neurotrophin 4), NTN4 (netrin 4), Ntrk1 (neurotrophic tyrosine kinase, receptor, type 1), NUDT6 (Nudix (nucleoside diphosphate linked moiety X)-type motif 6), Ogn (osteoglycin), Olr1 (oxidized low density lipoprotein (lectin-like) receptor 1), Orm1 (orosomucoid 1), Orm2 (orosomucoid 2), Osm (oncostatin M), Otor (otoraplin), OXTR (oxytocin receptor), P2rx7 (purinergic receptor P2X, ligand-gated ion channel, 7), Pak1 (p21 (RAC1) activated kinase 1), PAK4 (p21 (RAC1) activated kinase 4), PAM (peptidylglycine alpha-amidating monooxygenase), Parp4 (poly (ADP-ribose) polymerase family, member 4), PCM1 (pericentriolar material 1), PCNA (proliferating cell nuclear antigen), PDCD1 (programmed cell death 1), Pdcd11g2 (programmed cell death 1 ligand 2), PDGFA (platelet derived growth factor, alpha), PDGFb (platelet derived growth factor, B polypeptide), PDGFRA (platelet derived growth factor receptor, alpha polypeptide), PDGFRB (platelet derived growth factor receptor, beta polypeptide), PECAMI (platelet/endothelial cell adhesion molecule 1), PENK (preproenkephalin), PF4 (Platelet factor 4), PGF (Placental growth factor), Pglyrpl (peptidoglycan recognition protein 1), Phex (phosphate regulating endopeptidase homolog, X-linked), PHOX2A (paired-like homeobox 2a), PIGF (phosphatidylinositol glycan anchor biosynthesis, class F), PIGS (Phosphatidylinositol glycan anchor biosynthesis, class S), PIK3CA (phosphatidylinositol-4,5-bisphosphate 3-kinase catalytic subunit alpha), Pik3cd (phosphatidylinositol-4,5-bisphosphate 3-kinase catalytic subunit delta), Pik3cg (phosphatidylinositol-4,5-bisphosphate 3-kinase catalytic subunit gamma), Pknox 1 (Pbx/knotted 1 homeobox), Pla2g2d (phospholipase A2, group IID), Pla2g5 (phospholipase A2, group V), Pla2g7 (phospholipase A2, group VII (platelet-activating factor acetylhydrolase, plasma)), PLAT (plasminogen activator, tissue type), PLAU (plasminogen activator, urokinase), PLAUR (plasminogen activator, urokinase receptor), PLCG1 (phospholipase C, gamma 1), PLD1 (phospholipase D1), PLG (plasminogen), Plin1 (perilipin 1), Pml (PML nuclear body scaffold), POT1 (protection of telomeres 1A), Pou4f1 (POU domain, class 4, transcription factor 1), POU5F1 (POU class 5 homeobox 1), PPARA (peroxisome proliferator activated receptor alpha), Ppard (peroxisome proliferator activator receptor delta), Pparg (peroxisome proliferator activated receptor gamma), Ppargcla (peroxisome proliferative activated receptor, gamma, coactivator 1 alpha), PPARGCIB (peroxisome proliferative activated receptor, gamma, coactivator 1 beta), Ppbp (pro-platelet basic protein), Prdm16 (PR domain containing 16), PRDX4 (peroxiredoxin 4), PRF1 (perforin 1 (pore forming protein)Prg4 (proteoglycan 4 (megakaryocyte stimulating factor, articular superficial zone protein)Prkca (protein kinase C, alpha), Prkcd (protein kinase C, delta), Prkcz (protein kinase C, zeta), PRL (Prolactin), PROCR (protein C receptor, endothelial), PROK1 (Prokineticin 1), PROK2 (Prokineticin 2), PROM1 (Prominin 1), Pspn (Persefin), Ptafr (platelet-activating factor receptor), PTEN (phosphatase and tensin homolog), PTGES (prostaglandin E synthase), Ptgfr (prostaglandin F receptor), Ptgis (prostaglandin 12 (prostacyclin) synthase), Ptgs1 (prostaglandin-endoperoxide synthase 1), Ptgs2 (prostaglandin-endoperoxide synthase 2), Pth1h (parathyroid hormone-like peptide), Ptk2 (PTK2 protein tyrosine kinase 2), Ptn (pleiotrophin), PTPRC (protein tyrosine phosphatase, receptor type, C), PTX3 (pentraxin related gene), Pvr (poliovirus receptor), pxn (paxillin), Pycard (PYD and CARD domain containing), RAB8A (RAB8A, member RAS oncogene family), RAC1 (Rac family small GTPase 1), Rara (retinoic acid receptor, alpha), RASA1 (RAS p21 protein activator 1), RB1 (RB transcriptional corepressor 1), Rb11 (RB transcriptional corepressor like 1), Reg3a (regenerating islet-derived 3 alpha), Reg3g (regenerating islet-derived 3 gamma), Rel (reticuloendotheliosis oncogene), Rela (v-rel reticuloendotheliosis viral oncogene homolog A (avian)), Retn (resistin), RHO (rhodopsin), Rhoa (ras homolog family member A), RHOB (ras homolog family member B), RND3 (Rho family GTPase 3), robo1 (roundabout guidance receptor 1), ROBO3 (roundabout guidance receptor 3), Rock1 (Rho associated coiled-coil containing protein kinase 1), Rock2 (Rho associated coiled-coil containing protein kinase 2), Ror2 (receptor tyrosine kinase-like orphan receptor 2), RORC (RAR-related orphan receptor gamma), ROS1 (Ros1 proto-oncogene), Rpl13a (ribosomal protein L13A), Runx1t1 (RUNX1 translocation partner 1), Runx2 (runt related transcription factor 2), RXRA (retinoid X receptor alpha), S100a8 (S100 calcium binding protein A8 (calgranulin A)), S100a9 (S100 calcium binding protein A9 (calgranulin B)), SIP3 (sphingosine-1-phosphate receptor 3), SIPR1 (Sphingosine-1-phosphate receptor 1), Saa4 (serum amyloid A 4), Scgb1a1 (secretoglobin, family 1A, member 1 (uteroglobin)), SCN1B (sodium channel, voltage-gated, type I, beta), SCN3B (sodium channel, voltage-gated, type III, beta), SDC2 (syndecan2), SDC3 (syndecan3), Sele (selectin, endothelial cell), SELL (selectin, lymphocyte), Selp (selectin, platelet), selplg (selectin, platelet (p-selectin) ligand), SEMA3A (sema domain, immunoglobulin domain (Ig), short basic domain, secreted, (semaphorin) 3A), Sema7a (sema domain, immunoglobulin domain (Ig), and GPI membrane anchor, (semaphorin) 7A), SERPINA1 (serpin family A member 1), SERPINB5 (serpin family B member 5), SERPINC1 (Serpin peptidase inhibitor, clade C (antithrombin), member 1), Serpine1 (serine (or cysteine) peptidase inhibitor, clade E, member 1), SERPINF1 ("Serpin peptidase inhibitor, clade F (alpha-2 antiplasmin, pigment epithelium derived factor), member 1"), Serpinf2 (serine (or cysteine) peptidase inhibitor, clade F, member 2), SERPINH1 (serpin family H member 1), Sfrp1 (secreted frizzled-related protein 1), SFRP5 (secreted frizzled-related sequence protein 5), SH2B2 (SH2B adaptor protein 2), SH3PXD2A (SH3 and PX domains 2A), SHB (src homology 2 domain-containing transforming protein B), SHBG (sex hormone binding globulin), SHH (sonic hedgehog), Shox2 (short stature homeobox 2), Sigirr (single immunoglobulin and toll-interleukin 1 receptor (TIR) domain), SIRT1 (sirtuin 1), SIRT2 (sirtuin 2), SIRT3 (sirtuin 3), SIRT6 (sirtuin 6), SLC17A5 (Solute carrier family 17 (anion/sugar transporter), member 5), SLC1A3 (solute carrier family 1 (glial high affinity glutamate transporter), member 3), Slc2a4 (solute carrier family 2 (facilitated glucose transporter), member 4), Slc3a2 (solute carrier family 3 (activators of dibasic and neutral amino acid transport), member 2), Slc7a5 (solute carrier family 7 member 5), SLC9A6 (solute carrier family 9 (sodium/hydrogen exchanger), member 6), SLIT3 (slit guidance ligand 3), Slitrk6 (SLIT and NTRK-like family, member 6), SMAD1 (SMAD family member 1), SMAD2 (SMAD family member 2), SMAD3 (SMAD family member 3), SMAD4 (SMAD family member 4), SMAD5 (SMAD family member 5), SMAD6 (SMAD family member 6), SMAD7 (SMAD family member 7), Smurf1 (SMAD specific E3 ubiquitin protein ligase 1), SMURF2 (SMAD specific E3 ubiquitin protein ligase 2), SNAI1 (snail family transcriptional repressor 1), Snai2 (snail family zinc finger 2), SNCA (synuclein, alpha), Snx 19 (sorting nexin 19), Socs3 (suppressor of cytokine signaling 3), Socs5 (suppressor of cytokine signaling 5), Sod1 (superoxide dismutase 1, soluble), Sort1 (sortilin 1), Sost (sclerostin), SOX2 (SRY (sex determining region Y)-box 2), SOX4 (SRY (sex determining region Y)-box 4), SOX5 (SRY (sex determining region Y)-box 5), SOX6 (SRY (sex determining region Y)-box 6), SOX9 (SRY (sex determining region Y)-box 9), SP1 (Sp1 transcription factor), Sp7 (Sp7 transcription factor 7), Sparc (secreted acidic cysteine rich glycoprotein), SPG7 (SPG7, paraplegin matrix AAA peptidase subunit), SPHK1 (Sphingosine kinase 1), Spn (sialophorin), SPON2 (spondin 2, extracellular matrix protein), Spp1 (secreted phosphoprotein 1), SPTBN5 (spectrin beta, non-erythrocytic 5), SRC (Rous sarcoma oncogene), Srebf1 (sterol regulatory element binding transcription factor 1), ST3GAL2 (ST3 beta-galactoside alpha-2,3-sialyltransferase 2), ST6GAL1 (beta galactoside alpha 2,6 sialyltransferase 1), Stab1 (stabilin 1), STAT1 (signal transducer and activator of transcription 1), STAT3 (signal transducer and activator of transcription 3), STAT4 (signal transducer and activator of transcription 4), STAT5a (signal transducer and activator of transcription 5A), STAT5b (signal transducer and activator of transcription 5B), STAT6 (signal transducer and activator of transcription 6), STC1 (stanniocalcin 1), STMN3 (stathmin-like 3), HSPA8 (heat shock protein 8), SVIL (supervillin), Syk (spleen tyrosine kinase), SYNGR1 (synaptogyrin 1), TAZ (tafazzin), Tbx2 (T-box 2), TBX21 (T-box 21), Tbx3 (T-box 3), TBX5 (T-box 5), Tcf7l2 (transcription factor 7 like 2, T cell specific, HMG box), Tek (TEK receptor tyrosine kinase), TENM2 (teneurin transmembrane protein 2), TERF1 (telomeric repeat binding factor 1), Terf2 (telomeric repeat binding factor 2), Tert (telomerase reverse transcriptase), TFAM (transcription factor A, mitochondrial), TFRC (transferrin receptor), TGFA (Transforming growth factor, alpha), Tgfb1 (transforming growth factor, beta 1), Tgfb2 (transforming growth factor, beta 2), TGFb3 (transforming growth factor, beta 3), TGFBR1 (transforming growth factor, beta receptor I), TGFBR2 (transforming growth factor, beta receptor II), TGFBR3 (transforming growth factor, beta receptor III), TGIF1 (TGFB induced factor homeobox 1), TGM2 (transglutaminase 2, C polypeptide), Thbs1 (thrombospondin 1), THBS2 (thrombospondin 2), THPO (Thrombopoietin), THY1 (Thy-1 cell surface antigen), TIE1 (Tyrosine kinase with immunoglobulin-like and EGF-like domains 1), TIGIT (T cell immunoreceptor with Ig and ITIM domains), TIMP1 (tissue inhibitor of metalloproteinase 1), TIMP2 (tissue inhibitor of metalloproteinase 2), TIMP3 (tissue inhibitor of metalloproteinase 3), TIMP4 (tissue inhibitor of metalloproteinase 4), Tirap (toll-interleukin 1 receptor (TIR) domain-containing adaptor protein), Tlr1 (toll-like receptor 1), Tlr2 (toll-like receptor 2), Tlr3 (toll-like receptor 3), Tlr4 (toll-like receptor 4), Tlr5 (toll-like receptor 5), Tlr6 (toll-like receptor 6), Tlr7 (toll-like receptor 7), Tlr8 (toll-like receptor 8), Tlr9 (toll-like receptor 9), TMEM33 (transmembrane protein 33), TMSB15A (thymosin beta 15a), TNC (tenascin C), Tnf (tumor necrosis factor), Tnfaip3 (tumor necrosis factor, alpha-induced protein 3), Tnfaip6 (tumor necrosis factor alpha induced protein 6), TNFAIP8 (tumor necrosis factor, alpha-induced protein 8), TNFRSF10C (TNF receptor superfamily member 10c), TNFRSF10D (TNF receptor superfamily member 10c), Tnfrsf11b (tumor necrosis factor receptor superfamily, member 11b), Tnfrsf14 (tumor necrosis factor receptor superfamily, member 14 (herpesvirus entry mediator)), TNFRSF17 (tumor necrosis factor receptor superfamily, member 17), TNFRSF18 (tumor necrosis factor receptor superfamily, member 18), Tnfrsf1a (tumor necrosis factor receptor superfamily, member 1a), Tnfrsf1b (tumor necrosis factor receptor superfamily, member 1b), Tnfrsf4 (tumor necrosis factor receptor superfamily, member 4), TNFRSF9 (tumor necrosis factor receptor superfamily, member 9), Tnfsf10 (tumor necrosis factor (ligand) superfamily, member 10), Tnfsf11 (tumor necrosis factor (ligand) superfamily, member 11), TNFSF13 (tumor necrosis factor (ligand) superfamily, member 13), TNFSF13B (tumor necrosis factor (ligand) superfamily, member 13b), Tnfsf14 (tumor necrosis factor (ligand) superfamily, member 14), Tnfsf15 (tumor necrosis factor (ligand) superfamily, member 15), Tnfsf18 (tumor necrosis factor (ligand) superfamily, member 18), Tnfsf4 (tumor necrosis factor (ligand) superfamily, member 4), Tnfsf8 (tumor necrosis factor (ligand) superfamily, member 8), Tnfsf9 (tumor necrosis factor (ligand) superfamily, member 9), Tollip (toll interacting protein), TRA (T cell receptor alpha locus), Traf6 (TNF receptor-associated factor 6), TRB (T cell receptor beta locus), Trem1 (triggering receptor expressed on myeloid cells 1), Trem2 (triggering receptor expressed on myeloid cells 2), TRIM3 (tripartite motif-containing 3), Trp53 (transformation related protein 53), Trp53bp1 (transformation related protein 53 binding protein 1), Trpv1 (transient receptor potential cation channel, subfamily V, member 1), Tsc2 (TSC complex subunit 2), TSC22D3 (TSC22 domain family, member 3), Tslp (thymic stromal lymphopoietin), Twist1 (twist basic helix-loop-helix transcription factor 1), Twist2 (twist basic helix-loop-helix transcription factor 2), TXNIP (thioredoxin interacting protein), TYMP (Thymidine phosphorylase), Ucp1 (uncoupling protein 1 (mitochondrial, proton carrier)Uts2 (urotensin 2), VASH1 (vasohibin 1), VASP (vasodilator-stimulated phosphoprotein), VCAMI (vascular cell adhesion molecule 1), Vcan (versican), vcl (vinculin), VDR (vitamin D (1,25-dihydroxyvitamin D3) receptor), Vegfa (vascular endothelial growth factor A), VEGFB (Vascular endothelial growth factor B), VEGFC (vascular endothelial growth factor C), VEGFD (vascular endothelial growth factor D), VIM (Vimentin), VPS13A (vacuolar protein sorting 13A), VPS13C (vacuolar protein sorting 13C), Vsir (V-set immunoregulatory receptor), Vten1 (V-set domain containing T cell activation inhibitor 1), VTN (vitronectin), VWASA (von Willebrand factor A domain containing 5A), VWF (Von Willebrand factor), WEE1 (WEE 1 homolog 1 (S. pombe)WIPF1 (WAS/WASL interacting protein family, member 1), Wnt1 (wingless-type MMTV integration site family, member 1), Wnt10b (wingless-type MMTV integration site family, member 10B), Wnt3a (wingless-type MMTV integration site family, member 3A), Wnt5a (wingless-type MMTV integration site family, member 5A), Wnt5b (wingless-type MMTV integration site family, member 5B), Wrn (Werner syndrome RecQ like helicase), Xcl1 (chemokine (C motif) ligand 1), Xcr1 (chemokine (C motif) receptor 1), Ywhaz (tyrosine 3-monooxygenase/tryptophan 5-monooxygenase activation protein, zeta polypeptide), Zfp36 (zinc finger protein 36), ZFP42 (Zinc finger protein 42 homolog (mouse)), Zhx3 (zinc fingers and homeoboxes 3), Zmpste24 (zinc metallopeptidase, STE24), ZNF25 (zinc finger protein 25), ACTC1 (actin, alpha, cardiac muscle 1), AFF3 (AF4/FMR2 family, member 3), AGMO (alkylglycerol monooxygenase), AHNAK2 (AHNAK nucleoprotein 2), AK4 (adenylate kinase 4), AKR1C1 (aldo-keto reductase family 1, member C1), ANKRD1 (ankyrin repeat domain 1 (cardiac muscle)), ANXA10 (annexin A10), B3GALT2 (UDP-Gal:beta-GlcNAc beta 1,3-galactosyltransferase 2), BST2 (bone marrow stromal cell antigen 2), C1orf198 (chromosome 1 open reading frame 198), C2orf88 (chromosome 2 open reading frame 88), CCND2 (cyclin D2), CEMIP (cell migration inducing protein, hyaluronan binding), CHAC1 (ChaC glutathione-specific gamma-glutamylcyclotransferase 1), CHRNA1 (cholinergic receptor, nicotinic alpha 1), CLDN1 (claudin 1), CLDN11 (claudin 11), CNIH3 (cornichon family AMPA receptor auxiliary protein 3), CNN1 (calponin 1, basic, smooth muscle), CSGALNACT1 (chondroitin sulfate N-acetylgalactosaminyltransferase 1), CTSS (cathepsin S), CYPIB1 (cytochrome P450, family 1, subfamily B, polypeptide 1), DAPK1 (death-associated protein kinase 1), DDIT4 (DNA damage inducible transcript 4), DIRAS3 (DIRAS family, GTP-binding RAS-like 3), EBF2 (early B-cell factor 2), ELN (elastin), ESM1 (endothelial cell-specific molecule 1), ETV1 (ets variant 1), FABP3 (fatty acid binding protein 3, muscle and heart), FHL1 (four and a half LIM domains 1), FLG (filaggrin), FOSB (FBJ murine osteosarcoma viral oncogene homolog B), GBP4 (guanylate binding protein 4), GBP5 (guanylate binding protein 5), GFRA1 (GDNF family receptor alpha 1), HAS2 (hyaluronan synthase 2), HHIP (hedgehog interacting protein), H2AC8 (histone cluster 1, H2ac), H2ac7 (histone cluster 1, H2ad), H3C4 (histone cluster 1, H3d), H3C8 (histone cluster 1, H3g), HSPB6 (heat shock protein, alpha-crystallin-related, B6), IL18BP (interleukin 18 binding protein), IL32 (interleukin 32), Acod1 (immunoresponsive 1 homolog (mouse)), KCTD16 (potassium channel tetramerization domain containing 16), KLF10 (Kruppel-like factor 10), KRT34 (keratin 34, type I), KRTAP1-1 (keratin associated protein 1-1), KRTAP1-5 (keratin associated protein 1-5), LMOD1 (leiomodin 1 (smooth muscle)), LRIG3 (leucine-rich repeats and immunoglobulin-like domains 3), LRRC15 (leucine rich repeat containing 15), LRRC17 (leucine rich repeat containing 17), LYPD6B (LY6/PLAUR domain containing 6B), MALL (mal, T-cell differentiation protein-like), MFAP4 (microfibrillar associated protein 4), MKX (mohawk homeobox), MYCTI (myc target 1), NEFM (neurofilament, medium polypeptide), NFASC (neurofascin), NFATC2 (nuclear factor of activated T-cells, cytoplasmic, calcineurin-dependent 2), NTSR1 (neurotensin receptor 1 (high affinity)), OAS1 (2-5-oligoadenylate synthetase 1), PHLDA1 (pleckstrin homology-like domain, family A, member 1), PITX2 (paired-like homcodomain 2), PREX1 (phosphatidylinositol-3,4,5-trisphosphate-dependent Rac exchange factor 1), PSAT1 (phosphoserine aminotransferase 1), PSG9 (pregnancy specific beta-1-glycoprotein 9), RAB27B (RAB27B, member RAS oncogene family), RCAN2 (regulator of calcineurin 2), RDH5 (retinol dehydrogenase 5 (11-cis/9-cis)), RGCC (regulator of cell cycle), RIMS1 (regulating synaptic membrane exocytosis 1), RORA (RAR-related orphan receptor A), RPL12 (Zhang2013 ALT_ACCEPTOR, ALT_DONOR, coding, INTERNAL, intronic best transcript NM_000976), RSAD2 (radical S-adenosyl methionine domain containing 2), SCRG1 (stimulator of chondrogenesis 1), SERPINB2 (serpin peptidase inhibitor, clade B (ovalbumin), member 2), SLAMF8 (SLAM family member 8), SLC14A1 (solute carrier family 14 (urea transporter), member 1 (Kidd blood group)), SLC38A1 (solute carrier family 38, member 1), SYT1 (synaptotagmin I), TFPI2 (tissue factor pathway inhibitor 2), THBS4 (thrombospondin 4), TINAGL1 (tubulointerstitial nephritis antigen-like 1), TMEM130 (transmembrane protein 130), TNMD (tenomodulin), UBD (ubiquitin D), VIT (vitrin), XG (Xg blood group; Xg pseudogene, Y-linked 2), GAPDH (glyceraldehyde-3-phosphate dehydrogenase), CMRF-56

(2) Removal of Specific Gene

Among the genes selected in the section of (1) described above, CMRF-56 was removed because it was a dendritic cell marker. There were 18 genes of which primers were not available from Illumina, Inc. upon placing an order for primers with Illumina, Inc., and thus these genes were removed. These 18 genes are as follows.

HLA-DRB5, NTF4, UTS2, MIF, CD24, CD70, IL17D, C2ORF88, HLA-DQB1, CEMIP, CD165, TRA, TRB, XCL1, ACOD1, CCR10, CXCR3, MIR34A (3) Preparation of Two Kinds of Primer Sets The following two kinds of primer sets were prepared.

A primer set containing highly expressed genes

A primer set in which highly expressed genes have been excluded

Regarding 38 genes among the 1,181 genes excluding CMRF-56 and the above-described 18 genes, the replacement with another gene was examined for high expression. Due to the concern that the proportion of highly expressed genes in the read count would become large in a case where the highly expressed gene is included in the primer set, two kinds of sets of a primer set (for 1,143 genes) containing no highly expressed genes and a primer set (for 1,181 genes) containing highly expressed genes were prepared. The 38 kinds of highly expressed genes are as follows.

ACTB, Ahsg, B2M, Bsg, C3, Calr, CD63, CFL1, Clu, COL6A1

CTNNB1, FASN, FN1, GPC3, GPI, HLA-A, HLA-B, Hspd1, IGFBP3, IGFBP4

IGFBP5, KRT18, KRT8, Lgals1, Mki67, Nfe2l1, SERPINA1, SERPINH1, Slc7a5, Sparc

HSPA8, TFRC, THBS2, TIMP2, TNC, VIM, Ywhaz, GAPDH

Example 3: Measurement of Gene Expression (1) Reverse Transcription

Ampliseq cDNA Synthesis for Illumina (Illumina, Inc. 20022654) was used. According to the manufacturer's protocol, AmpliSeq cDNA Reaction Mix, AmpliSeq RT Enzymer Mix, and the prepared mRNA were mixed. The resultant mixture was set in a thermal cycler and subjected to an RT reaction. (One cycle under a condition of 42° C. for 30 minutes, subsequent one cycle under a condition of 85° C. for 5 minutes, and then maintaining at 10° C. for completion)

(2) PCR Reaction (First Time)

AmpliSeq for Illumina Custom RNA Panel (Illumina, Inc, 20020496) and AmpliSeq for Illumina Library PLUS (Illumina, Inc, 20019102) were used. According to the manufacturer's protocol, AmpliSeq HiFi Mix, AmpliSeq Custom RNA Panel, and cDNA were mixed, and the resultant mixture was set in a thermal cycler and subjected to a PCR reaction. (One cycle under a condition of 99° C. for 2 minutes, holding at 99° C. for 15 seconds, subsequent 15 cycles under a condition of 60° C. for 8 minutes, and then maintaining at 10° C. for completion)

(3) Partial Digestion of Amplicon

AmpliSeq for Illumina Library PLUS (Illumina, Inc. 20019102) was used. A FuPa Reagent was added to the PCR reaction solution, mixed, and then set in a thermal cycler to carry out a reaction. (One cycle under a condition of 50° C. for 10 minutes, one cycle under a condition of 55° C. for 10 minutes, one cycle under a condition of 62° C. for 20 minutes, and then maintaining at 10° C. for completion)

(4) Ligation of Index Adapter

AmpliSeq for Illumina Library PLUS (Illumina, Inc. 20019102) and AmpliSeq for Illumina CD Indexes Set A (Illumina, Inc. 20029105) were used. After the previous step, a Switch Solution, AmpliSeq CD indexes, and DNA Ligase were immediately added in this order. After mixing, the resultant mixture was set in a thermal cycler to carry out a ligation reaction. (One cycle under a condition of 22° C. for 30 minutes, one cycle under a condition of 68° C. for 5 minutes, one cycle under a condition of 72° C. for 5 minutes, and then maintaining at 10° C. for completion)

(5) Purification

An AMPure XP 450 mL Kit (BECKMAN COULTER Inc, A63882) was used. AMPure XP beads were added to the ligation reaction solution, and the resultant mixture was stirred and then allowed to stand at room temperature for 5 minutes. The resultant mixture was set on a magnet stand and allowed to stand for 2 minutes, and then the supernatant was removed. 70% ethanol was added thereto, the resultant mixture was allowed to stand for 30 seconds, and then the supernatant was removed. These operations were repeated twice. Air drying was carried out for 10 minutes.

(6) PCR Reaction (Second Time)

AmpliSeq for Illumina Library PLUS was used. A Lib Amp Mix and Library Amp Primers were mixed, purified, and then added to a sample, followed by stirring. The stirred mixture was set in a thermal cycler, and a PCR reaction was carried out to prepare a library. (One cycle under a condition of 98° C. for 2 minutes, holding at 98° C. for 15 seconds, 7 cycles under a condition of 64° C. for 1 minute, and then maintaining at 10° C. for completion)

(7) Purification

The purification was carried out using an AMPure XP 450 mL Kit. AMPure XP beads were added to the PCR reaction solution, and the resultant mixture was stirred and then allowed to stand at room temperature for 5 minutes. The resultant mixture was set on a magnet stand and allowed to stand for 5 minutes, and then the supernatant was removed. 70% ethanol was added thereto, the resultant mixture was allowed to stand for 30 seconds, and then the supernatant was removed. These operations were repeated twice. The beads were subjected to air drying for 5 minutes. The beads were removed from the magnet stand, and Low TE was added thereto, followed by stirring. The beads were set on a magnet stand and allowed to stand for 5 minutes. The supernatant was recovered and used as an NGS library.

(8) Quantification

A KAPA Library Quantification Kit (KAPA BIOSYSTEMS Inc.) was used. The NGS library was subjected to the concentration adjustment and mixed with a KAPA Master Mix. A standard sample was also mixed with the KAPA Master Mix in the same manner. qPCR was carried out with a CFX96 Real-Time System to carry out quantification.

(9) Sequencing

A PhiX Control kit v3 (Illumina, Inc, TG-110-3001) was used. The library was diluted, and a 0.2 N NaOH solution was added thereto to denatured into ssDNA. HT1 was added thereto. The PhiX control DNA was also denatured in the same manner. Each of these was added to a reagent cartridge of the kit, and sequencing was carried out using MiSeq (Illumina, Inc.).

Example 4: Data Processing of Gene Expression

The read data was imported into CLC Genomics Workbench (QIAGEN N.V.). The homo sapience sequence was used as the sequence information which would be referred to at the time of carrying out the import. The read data has a value of probability of an error for each base. In a case where the read data is imported into CLC Genomics Workbench, the read data is configured to be converted into a Phred Score. The Phred Score is obtained by taking a Log of a value of probability of an error for a base and multiplying it by −10 to carry out scoring (the following expression).

$$\text{Phred Score} = -10 \times \log_{10} P_{err}$$

Quality trimming was carried out using Phred Score. The procedure of the quality trimming is shown below. First, the Phred Score was converted into a p-value (see the following expression).

$$P_{err} = 10^{-phredScore/10}$$

Next, a difference between a limit (0.05) set at the time of trimming and the p-value was calculated, and a cumulative sum of the differences was calculated. In this case, a value of 0 or less was regarded as 0. A read start point after trimming was set as a point at which the cumulative sum first reached 0 or more, and a read end point after trimming was set as a point at which the cumulative sum was maximal.

After the quality trimming, the number of reads was converted into the expression level according to the following procedure. First, a read sequence was aligned with the most similar region on the genome. Next, a read per kilobase million (RPKM) was calculated using the following expression.

$$\text{RPKM} = \text{number of reads mapped to exon region}/[\text{total number of reads mapped on sample(unit: } 1{,}000{,}000) \times \text{length(kb) of exon}]$$

A value obtained by dividing the RPKM by the sum of the RPKM was calculated in terms of transcript per million (TPM).

In a case where TPM was subjected to logarithmic processing, the missing value was processed according to the expression of "read count of each gene+(1×gene length/average of gene length)", and then, RPKM and TPM were calculated.

In addition, in the processing of the missing value, the same analysis results could be obtained even in a case where the detected minimum value was used or the lower limit value of detection was inserted.

Example 5: Analysis of Gene Expression Data

A value obtained by logarithmically processing the TPM value of each gene expression data was used to calculate the coefficient of correlation and the coefficient of determination from the measurement gene group. The coefficient of correlation was calculated using the CORREL function adopted in Microsoft Excel (registered trade name), which is described in the present specification, and the coefficient of determination was calculated using the RSQ function adopted in Microsoft Excel (registered trade name), which is described in the present specification. In addition, the median value of the synovial MSC population, the median value of the L bone marrow MSC population, and the median value of the REC-MSC population, each of which had been obtained by adopting the median value of each cell population, were also calculated. The numerical value of the coefficient of determination is shown in Table 2 in a form of a comparison with the cell value of one lot.

TABLE 2

| | | | Synovial MSC 1 Lot | L bone marrow MSC 1 Lot | L adipose MSC 1 Lot |
|---|---|---|---|---|---|
| MSC cell type | Derived from biological tissue | Cell of identical cell population with different lot | 0.886 | 0.916 | 0.905 |
| | | Median value of synovial MSC population | 0.949 | 0.864 | 0.841 |
| | | Median value of L bone marrow MSC population | 0.821 | 0.961 | 0.823 |
| | | Median value of REC-MSC population | 0.786 | 0.873 | 0.826 |
| | | Median value of L adipose MSC population | 0.821 | 0.833 | 0.960 |
| | Artificial substance | iPSC-MSC | 0.663 | 0.755 | 0.711 |
| Non-MSC cell type | | FB | 0.699 | 0.773 | 0.746 |
| | | WP | 0.720 | 0.699 | 0.719 |
| | | PAEC | 0.462 | 0.503 | 0.503 |
| | | CD34 cell | 0.165 | 0.189 | 0.186 |
| | | CD14 cell | 0.132 | 0.139 | 0.139 |
| | | T cell | 0.100 | 0.122 | 0.126 |
| | | B cell | 0.093 | 0.111 | 0.113 |
| | | iPSC | 0.330 | 0.356 | 0.370 |

As a result, in a case of carrying out quality management for each MSC, it is possible to set a boundary value with respect to another MSC population and a boundary value with respect to a non-MSC population.

It can be seen that in a case of the synovial MSC, a synovial MSC of another lot as the synovial MSC has a coefficient of determination of 0.886 and has a coefficient of determination of 0.949 in terms of the median value of the synovial MSC population. In addition, it can be seen that the coefficient of determination is 0.821, 0.786, 0.821, and 0.663 from the comparison with MSCs derived from other tissues, and the management is possible in a case of adopting a coefficient of determination of 0.83 or more as a threshold value in order to define the synovial MSC in the MSC population. It can also be seen that the coefficient of determination is about 0.093 to 0.720 from the comparison with the non-MSC cell types, and it can be set to about 0.75 in the threshold value management for the biological tissue-derived MSC.

In addition, it can be seen that in a case of the L bone marrow MSC, a synovial MSC of another lot as the bone marrow MSC has a coefficient of determination of 0.916 and has a coefficient of determination of 0.961 in terms of the median value of the bone marrow MSC population. In addition, it can be seen that the coefficient of determination is 0.864, 0.873, 0.833, and 0.755 from the comparison with MSCs derived from other tissues, and the management is possible in a case of employing a coefficient of determination of 0.88 or more as a threshold value in order to define the bone marrow MSC in the MSC population. In addition, it can also be seen that the coefficient of determination is about 0.111 to 0.773 from the comparison with the non-MSC cell types, and it can be set to about 0.78 in the threshold value management for the biological tissue-derived MSC.

In addition, it can be seen that in a case of the L adipose MSC, a synovial MSC of another lot as the adipose MSC has a coefficient of determination of 0.905 and has a coefficient of determination of 0.960 in terms of the median value of the adipose MSC population. In addition, it can be seen that the coefficient of determination is 0.841, 0.823, 0.826, and 0.711 from the comparison with MSCs derived from other tissues, and the management is possible in a case of adopting a coefficient of determination of 0.85 or more as a threshold value in order to define the bone marrow MSC in the MSC population. In addition, it can also be seen that the coefficient of determination is about 0.113 to 0.746 from the comparison with the non-MSC cell types, and it can be set to about 0.75 in the threshold value management for the biological tissue-derived MSC.

In addition, in any of the cases, it was also found that iPSC-MSC has a low coefficient of determination among the MSC cell types, which is a property different from the biological tissue-derived MSC to such an extent that the iPSC-MSC cannot be distinguished from FB (fibroblast). Considering that iPSC-MSC is a cell artificially created by a special differentiation induction and the production process is significantly different, this fact was conceived to be very reasonable results.

In addition, in consideration of the influence caused by including the highly expressed genes, on the measurement results and the subsequent quality management, a primer set (for 1,143 genes) containing no highly expressed genes and a primer set (for 1,181 genes) containing highly expressed genes were prepared, and the analysis was carried out. However, as a result, it was found that the same result can be obtained in a case where any of the primer sets is used, and there is no difference therebetween. From these results, it was found that in the quality management of a cell, managing the pattern of a plurality of gene expression groups peculiar to the cell is extremely useful in certifying the equivalency and homogeneity.

Example 6: Analysis of Entire Gene Expression

The mRNA sample of each cell prepared in Example 1 was subjected to the human transcriptiome sequencing analysis at RIKEN GENESIS CO., LTD. After carrying out the sequence analysis of a specimen with NovaSeq 6000 (Illumina, Inc. 20012850), the read data was analyzed by using DRAGEN ver. 3.7.5 to calculate the gene expression levels of all genes (25, 192 genes) as TPM. The gene names of all the genes (25, 192 genes) are described at the end of the present example.

The combination of the expressions of all of the 25,192 genes described above and the combination of 1,143 genes randomly extracted from the expressions of all of the 25,192 genes were subjected to the same analysis as that of Example 5. It is noted that the detection power was calculated in order to compare the usefulness of gene sets in the quality management of a cell.

Specifically, First, the coefficient of variation of various cells with respect to the median value of the target cell population in each gene set was calculated. Then, the detection power was calculated based on the following expression.

Detection power (sorted 1,143 genes versus random 1,143 genes)={coefficient of variation of "expression of 1,143 genes with primer set excluding highly expressed genes sorted out in Example 2"}/{coefficient of variation of "expression of random 1,143 genes randomly extracted in Example 6"

Detection power (sorted 1,143 genes versus all 25,192 genes)={coefficient of variation of "expression of 1,143 genes with primer set excluding highly expressed genes sorted out in Example 2"}/{"coefficient of variation of "expression of all 25,192 genes acquired in Example 6"

The coefficient of variation obtained as described above and the coefficient of determination obtained in the same manner as in Example 5 are summarized in Tables 3, 4, and 5.

TABLE 3

| | | | Synovial MSC | | | | | | | |
|---|---|---|---|---|---|---|---|---|---|---|
| | | | Coefficient of determination calculated from expression of 1,143 genes with "primer set excluding highly expressed genes" sorted in Example 2 | Coefficient of variation | Coefficient of determination calculated from expression of random 1,143 genes randomly extracted in Example 6 | Coefficient of variation | Coefficient of determination calculated from expression of all 25,192 genes acquired in Example 6 | Coefficient of variation | Detection power (sorted 1,143 genes versus random 1,143 genes) | Detection power (sorted 1,143 genes versus all 25,192 genes) |
| MSC cell type | Derived from biological tissue | Cell of identical cell population with different lot | 0.886 | 7% | 0.950 | 3% | 0.947 | 3% | 2.29 | 2.07 |
| | | Median value of synovial MSC population | 0.949 | 0% | 0.978 | 0% | 0.978 | 0% | N/A | N/A |
| | | Median value of L bone marrow MSC population | 0.821 | 14% | 0.950 | 3% | 0.928 | 5% | 4.67 | 2.62 |
| | | Median value of REC-MSC population | 0.786 | 17% | 0.910 | 7% | 0.912 | 7% | 2.47 | 2.56 |

TABLE 3-continued

Synovial MSC

| | | Coefficient of determination calculated from expression of 1,143 genes with "primer set excluding highly expressed genes" sorted in Example 2 | Coefficient of variation | Coefficient of determination calculated from expression of random 1,143 genes randomly extracted in Example 6 | Coefficient of variation | Coefficient of determination calculated from expression of all 25,192 genes acquired in Example 6 | Coefficient of variation | Detection power (sorted 1,143 genes versus random 1,143 genes) | Detection power (sorted 1,143 genes versus all 25,192 genes) |
|---|---|---|---|---|---|---|---|---|---|
| | Median value of L adipose MSC population | 0.821 | 13% | 0.921 | 6% | 0.919 | 6% | 2.31 | 2.24 |
| Artificial substance | iPSC-MSC | 0.663 | 30% | 0.857 | 12% | 0.866 | 11% | 2.44 | 2.63 |
| Non-MSC cell type | FB | 0.699 | 26% | 0.867 | 11% | 0.882 | 10% | 2.32 | 2.67 |
| | WP | 0.720 | 24% | 0.896 | 8% | 0.886 | 9% | 2.90 | 2.58 |
| | PAEC | 0.462 | 51% | 0.809 | 17% | 0.810 | 17% | 2.97 | 2.99 |
| | CD14 cell | 0.132 | 86% | 0.582 | 41% | 0.596 | 39% | 2.12 | 2.20 |
| | T cell | 0.100 | 89% | 0.541 | 45% | 0.592 | 39% | 2.00 | 2.27 |
| | iPSC | 0.330 | 65% | 0.642 | 34% | 0.678 | 31% | 1.90 | 2.12 |

TABLE 4

L bone marrow MSC

| | | | Coefficient of determination calculated from expression of 1,143 genes with "primer set excluding highly expressed genes" sorted in Example 2 | Coefficient of variation | Coefficient of determination calculated from expression of random 1,143 genes randomly extracted in Example 6 | Coefficient of variation | Coefficient of determination calculated from expression of all 25,192 genes acquired in Example 6 | Coefficient of variation | Detection power (sorted 1,143 genes versus random 1,143 genes) | Detection power (sorted 1,143 genes versus all 25,192 genes) |
|---|---|---|---|---|---|---|---|---|---|---|
| MSC cell type | Derived from biological tissue | Cell of identical cell population with different lot | 0.916 | 5% | 0.953 | 2% | 0.956 | 2% | 1.91 | 2.00 |
| | | Median value of synovial MSC population | 0.864 | 10% | 0.935 | 4% | 0.944 | 4% | 2.37 | 2.85 |
| | | Median value of L bone marrow MSC population | 0.961 | 0% | 0.977 | 0% | 0.979 | 0% | N/A | N/A |
| | | Median value of REC-MSC population | 0.873 | 9% | 0.938 | 4% | 0.949 | 3% | 2.33 | 2.95 |
| | | Median value of L adipose MSC population | 0.833 | 13% | 0.935 | 4% | 0.935 | 5% | 3.15 | 2.96 |
| | Artificial substance | iPSC-MSC | 0.755 | 21% | 0.886 | 9% | 0.893 | 9% | 2.32 | 2.46 |
| | Non-MSC cell type | FB | 0.773 | 20% | 0.898 | 8% | 0.912 | 7% | 2.43 | 2.89 |
| | | WP | 0.699 | 27% | 0.910 | 7% | 0.891 | 9% | 4.00 | 3.03 |
| | | PAEC | 0.503 | 48% | 0.851 | 13% | 0.825 | 16% | 3.71 | 3.04 |
| | | CD14 cell | 0.139 | 85% | 0.589 | 40% | 0.597 | 39% | 2.15 | 2.19 |
| | | T cell | 0.122 | 87% | 0.549 | 44% | 0.597 | 39% | 1.99 | 2.24 |
| | | iPSC | 0.356 | 63% | 0.653 | 33% | 0.681 | 30% | 1.90 | 2.07 |

TABLE 5

| | | | Coefficient of determination calculated from expression of 1,143 genes with "primer set excluding highly expressed genes" sorted in Example 2 | Co-efficient of variation | Coefficient of determination calculated from expression of random 1,143 genes randomly extracted in Example 6 | Co-efficient of variation | Coefficient of determination calculated from expression of all 25,192 genes acquired in Example 6 | Co-efficient of variation | Detection power (sorted 1,143 genes versus random 1,143 genes) | Detection power (sorted 1,143 genes versus all 25,192 genes) |
|---|---|---|---|---|---|---|---|---|---|---|
| | | | L adipose MSC | | | | | | | |
| MSC cell type | Derived from biological tissue | Cell of identical cell population with different lot | 0.905 | 6% | 0.947 | 3% | 0.956 | 2% | 1.70 | 2.40 |
| | | Median value of synovial MSC population | 0.841 | 12% | 0.932 | 5% | 0.938 | 4% | 2.54 | 2.94 |
| | | Median value of L bone marrow MSC population | 0.823 | 14% | 0.939 | 4% | 0.938 | 4% | 3.47 | 3.41 |
| | | Median value of REC-MSC population | 0.826 | 14% | 0.929 | 5% | 0.933 | 5% | 2.69 | 3.00 |
| | | Median value of L adipose MSC population | 0.960 | 0% | 0.980 | 0% | 0.979 | 0% | N/A | N/A |
| | Artificial substance | iPSC-MSC | 0.711 | 26% | 0.876 | 11% | 0.885 | 10% | 2.45 | 2.70 |
| Non-MSC cell type | | FB | 0.746 | 22% | 0.899 | 8% | 0.911 | 7% | 2.72 | 3.22 |
| | | WP | 0.719 | 25% | 0.904 | 8% | 0.894 | 9% | 3.24 | 2.91 |
| | | PAEC | 0.503 | 48% | 0.826 | 16% | 0.822 | 16% | 3.04 | 2.97 |
| | | CD14 cell | 0.139 | 86% | 0.583 | 41% | 0.600 | 39% | 2.11 | 2.21 |
| | | T cell | 0.126 | 87% | 0.535 | 45% | 0.599 | 39% | 1.92 | 2.24 |
| | | iPSC | 0.370 | 61% | 0.671 | 31% | 0.685 | 30% | 1.95 | 2.04 |

As a result, it was found that both in a case of using a set of all 25,192 gene sets and in a case of using a set of 1,143 genes which have been randomly extracted, it is possible to set a boundary value with respect to another MSC population and a boundary value with respect to a non-MSC population in a case of carrying out quality management for each MSC.

For example, it can be seen that in a case of the synovial MSC, a synovial MSC of another lot as the synovial MSC has a coefficient of determination of 0.950 for the random 1,143 genes and 0.947 for all the 25,192 genes, and it has a coefficient of determination of 0.978 for the random 1,143 genes and 0.978 for all the 25,192 genes in terms of the median value of the synovial MSC population. In addition, it can also be seen that the coefficient of determination is 0.950, 0.910, and 0.921 for the random 1,143 genes and is 0.928, 0.912, and 0.919 for all the 25,192 genes from the comparison with MSCs derived from other tissues, and the management is possible in a case of adopting a coefficient of determination of 0.96 or more for the random 1,143 genes and 0.93 or more for all the 25,192 genes as a threshold value in order to define the synovial MSC in the MSC population. In addition, it can also be seen that the coefficient of determination is about 0.541 to 0.896 for the random 1,143 genes and about 0.592 to 0.886 for all of the 25,192 genes from the comparison with the non-MSC cell types, and it can be set to about 0.90 for both the random 1,143 genes and all the 25,192 genes, in the threshold value management for the biological tissue-derived MSC. It can be seen that the threshold value management can be carried out in the same manner in the L bone marrow MSC and the L adipose MSC as well.

On the other hand, it can be seen that in a case where the detection powers are compared, the set of 1,143 genes sorted out in Example 2 has a detection power of 2.07 times to 2.99 times as compared with a case where all the 25,192 genes are used and has a detection power of 1.90 times to 4.67 times as compared with a case where the random 1,143 genes are used, and thus it is a gene set that is capable of showing a difference between various cells with a high detection power.

Actually, it can be also seen that this is an excellent gene set as a gene set for quality management in this cell type from the fact that the coefficient of determination for each cell type is also significantly low as compared with a case where the set of the random 1,143 genes or the set of all the 25,192 genes are used. As a result, it can be seen that the quality management according to the present invention can be realized both in a case of using an entire gene set and in a case of using a set of randomly extracted genes. In addition, it has been verified that more accurate quality management can be carried out in a case of sorting out a more sensitive gene set.

DDX11L1, WASH7P, MIR1302-2, FAM138A, OR4F5, LOC729737, LOC100996522, LOC100132287, LOC100288646, OR4F29, OR4F16, LOC100133331,

LOC100288069, LOC100287934, FAM87B, LINC00115, LOC643837, FAM41C, LOC284600, LOC100130417, SAMD11, NOC2L, KLHL17, PLEKHN1, C1orf170, HES4, ISG15, AGRN, RNF223, C1orf159, LOC254099, MIR200B, MIR200A, MIR429, TTLL10, TNFRSF18, TNFRSF4, SDF4, B3GALT6, FAM132A, UBE2J2, SCNN1D, ACAP3, PUSL1, CPSF3L, GLTPD1, TAS1R3, DVL1, MXRA8, AURKAIP1, CCNL2, LOC148413, MRPL20, ANKRD65, TMEM88B, VWA1, ATAD3C, ATAD3B, ATAD3A, TMEM240, SSU72, C1orf233, MIB2, MMP23B, CDK11B, SLC35E2B, MMP23A, CDK11A, SLC35E2, NADK, GNB1, CALML6, TMEM52, C1orf222, KIAA1751, GABRD, PRKCZ, C1orf86, SKI, MORN1, LOC100129534, RER1, PEX10, PLCH2, PANK4, HES5, LOC115110, LOC100133445, TNFRSF14, LOC100996583, FAM213B, MMEL1, TTC34, ACTRT2, FLJ42875, LOC100996587, PRDM16, MIR4251, ARHGEF16, MEGF6, MIR551A, TPRG1L, WRAP73, TP73, TP73-AS1, CCDC27, SMIM1, LRRC47, CEP104, DFFB, C1orf174, LOC100133612, LOC728716, LOC284661, AJAP1, MIR4417, MIR4689, NPHP4, KCNAB2, CHD5, RPL22, RNF207, ICMT, LINC00337, HES3, GPR153, ACOT7, LOC100130071, HES2, ESPN, MIR4252, TNFRSF25, PLEKHG5, NOL9, TAS1R1, ZBTB48, KLHL21, PHF13, THAP3, DNAJC11, LOC100505887, LOC100996592, CAMTA1, LOC100129476, VAMP3, PER3, UTS2, TNFRSF9, PARK7, ERRFI1, SLC45A1, RERE, ENO1, ENO1-AS1, CA6, SLC2A7, SLC2A5, GPR157, MIR34A, H6PD, SPSB1, LOC100506022, SLC25A33, TMEM201, PIK3CD, C1orf200, CLSTN1, FLJ16126, CTNNBIP1, LZIC, NMNAT1, MIR5697, RBP7, UBE4B, KIF1B, MIR1273D, PGD, APITD1-CORT, APITD1, CORT, DFFA, PEX14, CASZ1, C1orf127, TARDBP, MASP2, SRM, EXOSC10, MTOR, MTOR-AS1, ANGPTL7, UBIAD1, PTCHD2, FBXO2, FBXO44, FBXO6, MAD2L2, DRAXIN, LOC100996614, AGTRAP, C1orf167, LOC100506310, MTHFR, CLCN6, NPPA-AS1, NPPA, NPPB, RNU5E-1, KIAA2013, PLOD1, MFN2, MIIP, TNFRSF8, TNFRSF1B, MIR4632, VPS13D, SNORA59A, DHRS3, AADACL4, AADACL3, C1orf158, PRAMEF12, PRAMEF1, PRAMEF11, HNRNPCL1, PRAMEF2, PRAMEF4, PRAMEF10, PRAMEF7, PRAMEF6, PRAMEF22, PRAMEF23, PRAMEF25, LOC440563, LOC645359, PRAMEF3, PRAMEF5, PRAMEF8, PRAMEF9, PRAMEF13, PRAMEF18, PRAMEF16, PRAMEF21, PRAMEF15, PRAMEF14, PRAMEF19, PRAMEF17, PRAMEF20, LRRC38, PDPN, PRDM2, KAZN, C1orf126, TMEM51, FHAD1, EFHD2, CTRC, CELA2A, CELA2B, CASP9, DNAJC16, AGMAT, DDI2, RSC1A1, PLEKHM2, SLC25A34, TMEM82, FBLIM1, UQCRHL, FLJ37453, SPEN, ZBTB17, C1orf64, HSPB7, CLCNKA, CLCNKB, FAM131C, EPHA2, ARHGEF19, RSG1, FBXO42, SZRD1, SPATA21, NECAP2, CROCCP3, RNU1-1, LOC100506533, LOC100133301, NBPF1, CROCCP2, MSTlP2, RNU1-3, LOC729574, ESPNP, LOC729587, RNU1-4, MST1L, MIR3675, RNU1-2, CROCC, MFAP2, ATP13A2, SDHB, PADI2, LOC400743, PADI1, PADI3, MIR3972, PADI4, PADI6, RCC2, ARHGEF10L, ACTL8, IGSF21, KLHDC7A, PAX7, TAS1R2, ALDH4A1, MIR4695, MIR1290, IFFO2, UBR4, EMC1, MRTO4, AKR7L, AKR7A3, LOC100506730, AKR7A2, PQLC2, CAPZB, LOC644083, MINOS1, C1orf151-NBL1, NBL1, HTR6, TMCO4, RNF186, OTUD3, PLA2G2E, PLA2G2A, PLA2G5, PLA2G2D, PLA2G2F, PLA2G2C, UBXN10, VWA5B1, LOC339505, CAMK2N1, MUL1, FAM43B, CDA, PINK1, DDOST, KIF17, SH2D5, HP1BP3, EIF4G3, MIR1256, ECE1, LOC100506801, NBPF3, ALPL, RAPI-GAP, USP48, LDLRAD2, HSPG2, CELA3B, CELA3A, LINC00339, CDC42, WNT4, MIR4418, ZBTB40, EPHA8, C1QA, C1QC, C1QB, EPHB2, MIR4684, MIR4253, LACTBL1, LOC729059, KDM1A, MIR3115, MIR4419A, LUZP1, HTR1D, LOC100996511, HNRNPR, ZNF436, C1orf213, TCEA3, ASAP3, E2F2, ID3, MDS2, RPL11, TCEB3, LOC100506963, PITHD1, LYPLA2, GALE, HMGCL, FUCA1, CNR2, MIR378F, PNRC2, SRSF10, MYOM3, IL22RA1, IL28RA, LOC284632, GRHL3, STPG1, NIPAL3, RCAN3AS, RCAN3, NCMAP, SRRM1, CLIC4, RUNX3, MIR4425, SYF2, C1orf63, RHD, TMEM50A, RHCE, TMEM57, LDLRAP1, MAN1C1, SEPN1, FAM54B, LOC646471, AUNIP, PAQR7, STMN1, MIR3917, PAFAH2, EXTL1, SLC30A2, TRIM63, PDIK1L, FAM110D, ZNF593, CNKSR1, CATSPER4, CEP85, SH3BGRL3, UBXN11, CD52, AIM1L, ZNF683, LIN28A, DHDDS, HMGN2, RPS6KA1, MIR1976, ARID1A, PIGV, ZDHHC18, SFN, GPN2, GPATCH3, NROB2, NUDC, C1orf172, OSTCP2, TRNP1, FAM46B, SLC9A1, WDTC1, TMEM222, LOC644961, RNU6-48, SYTL1, MAP3K6, FCN3, CD164L2, GPR3, WASF2, AHDC1, FGR, IFI6, FAM76A, STX12, PPP1R8, SCARNA1, THEMIS2, RPA2, SMPDL3B, XKR8, EYA3, PTAFR, DNAJC8, ATPIF1, SESN2, MED18, PHACTR4, RCC1, SNHG3, SNORA73A, RNU105A, TRNAU1AP, SNHG12, SNORD99, SNORA61, SNORA44, SNORA16A, RAB42, TAF12, RNU11, GMEB1, YTHDF2, OPRD1, EPB41, TMEM200B, SRSF4, MECR, PTPRU, MATN1, MATN1-AS1, LAPTM5, MIR4420, SDC3, PUM1, SNORD103A, SNORD103B, SNORD85, NKAIN1, SNRNP40, ZCCHC17, FABP3, SERINC2, LOC149086, LOC284551, TINAGL1, HCRTR1, PEF1, COL16A1, BAI2, MIR4254, SPOCD1, PTP4A2, KHDRBS1, TMEM39B, MIR5585, KPNA6, TXLNA, CCDC28B, IQCC, DCDC2B, TMEM234, EIF3I, MTMR9LP, FAM167B, LCK, HDAC1, MARCKSL1, LOC100128071, TSSK3, BSDC1, ZBTB8B, ZBTB8A, ZBTB8OS, RBBP4, SYNC, KIAA1522, YARS, S100PBP, FNDC5, HPCA, TMEM54, RNF19B, AK2, ADC, TRIM62, ZNF362, PHC2, MIR3605, ZSCAN20, CSMD2, HMGB4, LOC402779, C1orf94, MIR552, GJB5, GJB4, GJB3, GJA4, C1orf212, DLGAP3, LOC653160, ZMYM6NB, ZMYM6, ZMYM1, LOC100996496, SFPQ, ZMYM4, KIAA0319L, NCDN, TFAP2E, PSMB2, C1orf216, CLSPN, EIF2C4, EIF2C1, EIF2C3, TEKT2, ADPRHL2, COL8A2, TRAPPC3, MAP7D1, THRAP3, SH3D21, EVA1B, LOC100127947, STK40, LSM10, OSCP1, MRPS15, CSF3R, GRIK3, MIR4255, LOC728431, ZC3H12A, MEAF6, MIR5581, SNIP1, DNALI1, GNL2, RSPO1, C1orf109, CDCA8, EPHA10, MANEAL, YRDC, C1orf122, MTF1, INPP5B, SF3A3, FHL3, UTP11L, POU3F1, MIR3659, LOC339442, RRAGC, GJA9-MYCBP, MYCBP, GJA9, RHBDL2, AKIRIN1, NDUFS5, MACF1, KIAA0754, BMP8A, PPIEL, PABPC4, SNORA55, HEYL, NT5C1A, HPCAL4, PPIE, BMP8B, OXCT2, TRIT1, MYCL1, MFSD2A, CAP1, PPT1, RLF, TMCO2, ZMPSTE24, COL9A2, SMAP2, ZNF643, ZNF642, EXO5, ZNF684, RIMS3, LOC100130557, NFYC, MIR30E, MIR30C1, KCNQ4, CITED4, CTPS1, SLFNL1-AS1, SLFNL1, SCMH1, FOXO6, EDN2, HIVEP3, GUCA2B, GUCA2A, FOXJ3, RIMKLA, ZMYND12, PPCS, CCDC30, PPIH, YBX1, CLDN19, LEPRE1, C1orf50, LOC100129924, CCDC23, ERMAP, ZNF691, SLC2A1, SLC2A1-AS1, FAM183A, EBNA1BP2, WDR65, TMEM125, C1orf210, TIE1, MPL, CDC20, ELOVL1, MED8, SZT2, HYI, PTPRF, KDM4A, KDM4A-AS1, ST3GAL3, ARTN, IPO13, DPH2, ATP6V0B, B4GALT2, CCDC24, SLC6A9, KLF17, DMAP1, ERI3, RNF220, MIR5584, TMEM53, C1orf228, RNU5F-1, RNU5D-1, KIF2C, RPS8, SNORD55, SNORD46, SNORD38A, SNORD38B, BEST4, PLK3, TCTEX1D4, BTBD19, PTCH2, EIF2B3, HECTD3, UROD, ZSWIM5, LOC400752, HPDL, MUTYH, TOE1, TESK2, CCDC163P, MMACHC, PRDX1, AKR1A1, NASP, CCDC17, GPBP1L1, RPS15AP10, TMEM69, IPP, MAST2, PIK3R3, TSPAN1, POMGNT1, LURAP1, RAD54L, LRRC41, UQCRH, NSUN4, FAAH, LOC729041, DMBX1, MKNK1-AS1, KNCN, MKNK1, MOB3C, ATPAF1, TEX38, KIAA0494-AS1, KIAA0494, CYP4B1, CYP4Z2P, CYP4A11, CYP4X1, CYP4Z1, CYP4A22, PDZKIIP1-AS1, PDZKIIP1, TAL1, STIL, CMPK1, FOXE3, FOXD2-AS1, FOXD2, TRABD2B, SKINTL, SLC5A9, SPATA6, AGBL4, BEND5, ELAVL4, DMRTA2, FAF1, CDKN2C, MIR4421, C1orf185, RNF11, TTC39A, EPS15, OSBPL9, NRD1, MIR761, RAB3B, TXNDC12, KTI12, BTF3L4, ZFYVE9, CC2D1B, ORC1, PRPF38A, ZCCHC11, GPX7, FAM159A, SELRC1, ZYG11B, ZYG11A, ECHDC2, SCP2, MIR1273F, MIR5095, MIR1273G, PODN, SLC1A7, CPT2, C1orf123, MAGOH, LOC100507564, LRP8, SLC25A3P1, DMRTB1, GLIS1, TMEM48, YIPF1, DIO1, HSPB11, LRRC42, LDLRAD1, TMEM59, TCEANC2, MIR4781, CDCP2, CYB5RL, MRPL37, SSBP3, C1orf191, ACOT11, FAM151A, HEATR8, HEATR8-TTC4, TTC4, PARS2, TTC22, C1orf177, DHCR24, TMEM61, BSND, PCSK9, USP24, LOC100507634, MIR4422, LOC100507652, PPAP2B, PRKAA2, C1orf168, C8A, C8B, DAB1, OMA1, TACSTD2, MYSM1, JUN, LOC100131060, HSD52, FGGY, MIR4711, HOOK1, CYP2J2, C1orf87, LOC100996570, NFIA, TM2D1, INADL, MIR3116-1, MIR3116-2, L1TD1, KANK4, USP1, DOCK7, ANGPTL3, LOC100507664, LOC400756, ATG4C, LINC00466, LOC100996301, FOXD3, ALG6, ITGB3BP, EFCAB7, DLEU2L, PGM1, ROR1, UBE2U, CACHD1, MIR4794, RAVER2, JAK1, MIR3671, MIR101-1, AK4, DNAJC6, LEPROT, LEPR, PDE4B, SGIP1, MIR3117, TCTEX1D1, INSL5, WDR78, MIER1, SLC35D1, C1orf141, IL23R, IL12RB2, SERBP1, GADD45A, GNG12, GNG12-AS1, DIRAS3, WLS, MIR1262, RPE65, DEPDC1, LRRC7, PIN1P1, LRRC40, SRSF11, ANKRD13C, HHLA3, CTH, PTGER3, ZRANB2-AS1, ZRANB2, MIR186, ZRANB2-AS2, NEGR1, NEGR1-IT1, LRRIQ3, FPGT-TNNI3K, FPGT, TNNI3K, C1orf173, CRYZ, TYW3, LHX8, SLC44A5, ACADM, RABGGTB, SNORD45C, SNORD45A, SNORD45B, MSH4, ASB17, ST6GALNAC3, ST6GALNAC5, PIGK, AK5, ZZZ3, USP33, FAM73A, NEXN-AS1, NEXN, FUBP1, DNAJB4, GIPC2, MGC27382, PTGFR, IFI44L, IFI44, ELTD1, LPHN2, TTLL7, PRKACB, SAMD13, UOX, DNASE2B, RPF1, GNG5, SPATA1, CTBS, C1orf180, SSX2IP, LPAR3, MCOLN2, MCOLN3, WDR63, MIR4423, SYDE2, C1orf52, BCL10, LOC646626, DDAH1, CYR61, ZNHIT6, COL24A1, ODF2L, CLCA2, CLCA1, CLCA4, CLCA3P, SH3GLB1, SEP15, HS2ST1, LOC339524, LMO4, LOC100505768, PKN2, GTF2B, CCBL2, RBMXL1, GBP3, GBP1, GBP2, GBP7, GBP4, GBP5, GBP6, GBP1P1, LRRC8B, FLJ27354, LRRC8C, LRRC8D, GEMIN8P4, ZNF326, BARHL2, LOC149351, LOC100505840, ZNF644, LOC100996620, HFM1, CDC7, HSP90B3P, TGFBR3, BRDT, EPHX4, BTBD8, KIAA1107, C1orf146, GLMN, RPAP2, GFI1, EVI5, RPL5, FAM69A, SNORD21, SNORA66, DR1, FNBPIL, BCAR3, LOC129046, LOC100131564, DR1, FNBPIL, BCAR3, LOC129046, LOC100132240, MIR760, DNTTIP2, GCLM, ABCA4, ARHGAP29, LOC100505940, ABCD3, F3, MIR378G, SLC44A3, CNN3, LOC729970, ALG14, TMEM56, TMEM56-RWDD3, RWDD3, LOC100996630, FLJ31662, LOC100996635, PTBP2, DPYD, DPYD-AS1, MIR137HG, MIR2682, MIR137, LOC729987, SNX7, LPPR5, LOC100129620, LPPR4, PALMD, FRRS1, AGL, LOC730081, SLC35A3, HIAT1, SASS6, TRMT13, LRRC39, DBT, LOC100506007, RTCA, MIR553, CDC14A, GPR88, LOC100128787, VCAM1, EXTL2, SLC30A7, DPH5, LOC100506051, S1PR1, OLFM3, DNA-JAIP5, COL11A1, RNPC3, AMY2B, ACTG1P4, AMY2A, AMY1A, AMY1B, AMY1C, LOC100129138, PRMT6, NTNG1, VAV3, VAV3-AS1, SLC25A24, NBPF4, LOC400768, NBPF6, FAM102B, HENMT1, PRPF38B, FNDC7, STXBP3, AKNAD1, SRG7, GPSM2, CLCC1, WDR47, TAF13, TMEM167B, SCARNA2, C1orf194, KIAA1324, SARS, CELSR2, PSRC1, MYBPHL, SORT1, PSMA5, SYPL2, ATXN7L2, CYB561D1, AMIGO1, GPR61, GNAI3, MIR197, GNAT2, AMPD2, GSTM4, GSTM2, GSTM1, GSTM5, GSTM3, EPS8L3, CSF1, AHCYL1, STRIP1, ALX3, UBL4B, SLC6A17, KCNC4, LOC440600, RBM15, SLC16A4, LAMTOR5, PROK1, CYMP, KCNA10, KCNA2, KCNA3, CD53, LRIF1, DRAM2, CEPT1, DENND2D, CHI3L2, CHIAP2, CHIA, PIFO, PGCP1, OVGP1, WDR77, ATP5F1, C1orf162, ADORA3, LOC100129269, RAPIA, FAM212B, LOC100506343, DDX20, KCND3, LOC643355, CTTNBP2NL, MIR4256, WNT2B, ST7L, CAPZA1, MOV10, RHOC, PPM1J, FAM19A3, LOC128322, LOC100996702, SLC16A1, AKR7A2P1, LOC100506392, LOC100996251, LRIG2, LOC643441, MAGI3, PHTF1, RSBN1, PTPN22, AP4B1-AS1, BCL2L15, AP4B1, DCLRE1B, HIPK1, OLFML3, SYT6, TRIM33, BCAS2, DENND2C, AMPD1, NRAS, CSDE1, SIKE1, SYCP1, TSHB, TSPAN2, NGF, VANGL1, CASQ2, NHLH2, SLC22A15, MAB21L3, ATP1A1, ATP1A1OS, LOC100506459, CD58, MIR548AC, IGSF3, MIR320B1, CD2, PTGFRN, CD101, TTF2, MIR942, TRIM45, LOC100506478, VTCN1, MAN1A2, LOC100996263, FAM46C, GDAP2, WDR3, SPAG17, TBX15, WARS2, HAO2, HSD3B2, HSD3B1, HSD3BP4, LINC00622, ZNF697, PHGDH, HMGCS2, REG4, NBPF7, ADAM30, NOTCH2, LOC100132913, FAM72B, HIST2H2BA, LOC100996318, FCGRIB, EMBP1, MIR3118-1, ANKRD20A12P, MIR3118-2, MIR3118-3, LOC100130000, LOC100286793, LOC100996473, PPIAL4G, FAM72D, SRGAP2B, LINC00623, LOC730256, PPIAL4B, LOC728875, PFNIP2, LOC653513, NBPF9, PDE4DIP, LOC100996517, NUDT4P1, NOTCH2NL, NBPF10, HFE2, TXNIP, POLR3GL, ANKRD34A, LIX1L, RBM8A, GNRHR2, PEX11B, ITGA10, ANKRD35, PIAS3, NUDT17, POLR3C, RNF115, CD160, PDZK1, GPR89A, GPR89C, PDZK1P1, RNU1-9, NBPF11, LOC100506011, LOC100509195, HYDIN2, LOC100996529, LOC728989, PRKAB2, PDIA3P, FMO5, CHD1L, LINC00624, BCL9, ACP6, GJA5, GJA8, GPR89B, RNU1-6, NBPF24, LOC100505824, MIR5087, LOC100996555, FLJ39739, LOC100132999, PPIAL4A, NBPF14, PPIAL4D, NBPF15, PPIAL4E, NBPF16, PPIAL4F, FLJ37786, LOC645166, RNU1-5, LOC388692, FCGRIC, FAM72C, PPIAL4C, FAM91A2, LOC642441, LOC644634, HIST2H2BF, FCGRIA, HIST2H3D, HIST2H4A, HIST2H3C, HIST2H2AA3, HIST2H2BC, HIST2H2AA4, HIST2H3A, HIST2H4B, HIST2H2BE, HIST2H2AC, HIST2H2AB, BOLA1, SV2A, SF3B4, MTMR11, OTUD7B, VPS45, PLEKHO1, ANP32E, CA14, APH1A, C1orf54, C1orf51, MRPS21, PRPF3, RPRD2, TARS2, ECM1, LINC00568, ADAMTSL4, LOC100996516, MIR4257, MCL1, ENSA, GOLPH3L, HORMAD1, CTSS, CTSK, ARNT, LOC100996521, SETDB1, CERS2, ANXA9, FAM63A, PRUNE, BNIPL, C1orf56, CDC42SE1, MLLT11, GABPB2, SEMA6C, TNFAIP8L2-SCNM1, TNFAIP8L2, LYSMD1, SCNM1, TMOD4, VPS72, PIP5K1A, PSMD4, LOC100507670, ZNF687, PI4 KB, RFX5, SELENBP1, PSMB4, POGZ, CGN, TUFT1, MIR554, SNX27, CELF3, RIIADI, MRPL9, OAZ3, TDRKH, LINGO4, RORC, C2CD4D, LOC100132111, THEM5, THEM4, S100A10, S100A11, LOC100131107, TCHHL1, TCHH, RPTN, HRNR, FLG, FLG-AS1, FLG2, CRNN, LCE5A, CRCT1, LCE3E, LCE3D, LCE3C, LCE3B, LCE3A, LCE2D, LCE2C, LCE2B, LCE2A, LCE4A, C1orf68, KPRP, LCE1F, LCE1E, LCE1D, LCE1C, LCE1B, LCE1A, LCE6A, SMCP, IVL, SPRR4, SPRR1A, SPRR3, SPRR1B, SPRR2D, SPRR2A, SPRR2B, SPRR2E, SPRR2F, SPRR2C, SPRR2G, LELP1, PRR9, LOR, PGLYRP3, PGLYRP4, S100A9, S100A12, S100A8, S100A7A, S100A7L2, S100A7, S100A6, S100A5, S100A4, S100A3, S100A2, S100A16, S100A14, S100A13, S100A1, CHTOP, SNAPIN, ILF2, NPR1, INTS3, SLC27A3, GATAD2B, DENND4B, CRTC2, SLC39A1, CREB3L4, JTB, RAB13, RPS27, NUP210L, MIR5698, TPM3, MIR190B, C1orf189, C1orf43, UBAP2L, HAX1, AQP10, ATP8B2, IL6R, SHE, TDRD10, UBE2Q1, CHRNB2, ADAR, KCNN3, PMVK, PBXIP1, PYGO2, SHC1, CKS1B, MIR4258, FLAD1, LENEP, ZBTB7B, DCST2, DCST1, LOC100505666, ADAM15, EFNA4, EFNA3, EFNA1, SLC50A1, DPM3, KRTCAP2, TRIM46, MUC1, MIR92B, THBS3, MTX1, GBAP1, GBA, FAM189B, SCAMP3, CLK2, HCN3, PKLR, FDPS, RUSC1-AS1, RUSC1, ASH1L, MIR555, POU5F1P4, ASH1L-AS1, MSTO1, YY1AP1, DAP3, MSTO2P, GON4L, SYT11, R1T1, KIAA0907, SNORA42, SCARNA4, RXFP4, ARHGEF2, SSR2, UBQLN4, LAMTOR2, RAB25, MEX3A, LMNA, SEMA4A, SLC25A44, PMF1-BGLAP, PMF1, BGLAP, PAQR6, SMG5, TMEM79, C1orf85, VHLL, CCT3, TSACC, RHBG, C1orf61, MIR9-1, MEF2D, IQGAP3, TTC24, APOAIBP, GPATCH4, HAPLN2, BCAN, NES, CRABP2, ISG20L2, RRNAD1, MRPL24, HDGF, PRCC, SH2D2A, NTRK1, INSRR, PEAR1, LRRC71, ARHGEF11, MIR765, ETV3L, ETV3, CYCSP52, FCRL5, FCRL4, FCRL3, FCRL2, FCRL1, CD5L, KIRREL, KIRREL-IT1, LOC646268, CD1D, LOC100505799, CD1A, CD1C, CD1B, CD1E, OR10T2, OR10K2, OR10K1, OR10R2, OR6Y1, OR6P1, OR10X1, OR10Z1, SPTA1, OR6K2, OR6K3, OR6K6, OR6N1, OR6N2, MNDA, PYHIN1, IFI16, AIM2, CADM3, LOC100131825, DARC, FCER1A, OR10J3, OR10J1, OR 10J5, APCS, CRP, DUSP23, FCRL6, SLAMF8, C1orf204, VSIG8, CCDC19, TAGLN2, IGSF9, SLAMF9, LOC100505633, PIGM, KCNJ10, KCNJ9, IGSF8, ATPIA2, ATPIA4, CASQ1, PEA15, DCAF8, LOC100287049, PEX19, COPA, SUMO1P3, NCSTN, NHLH1, VANGL2, SLAMF6, CD84, SLAMF1, CD48, SLAMF7, LY9, CD244, ITLN1, ITLN2, F11R, TSTD1, USF1, ARHGAP30, PVRL4, KLHDC9, PFDN2, NIT1, DEDD, UFC1, USP21, PPOX, B4GALT3, ADAMTS4, NDUFS2, FCER1G, APOA2, TOMM40L, MIR5187, NR1I3, PCP4L1, MPZ, SDHC, C1orf192, FCGR2A, HSPA6, FCGR3A, FCGR2C, HSPA7, FCGR3B, FCGR2B, RPL31P11, FCRLA, FCRLB, DUSP12, ATF6, OLFML2B, NOSIAP, MIR4654, MIR556, C1orf111, C1orf226, SH2D1B, UHMK1, UAP1, DDR2, HSD17B7, C1orf110, RGS4, RGS5, NUF2, PBX1, LOC100505795, LMXIA, RXRG, LOC400794, LRRC52, MGST3, LOC100505828, ALDH9A1, LOC440700, TMCO1, UCK2, MIR3658, FAM78B, MIR921, FMO9P, POGK, TADA1, ILDR2, MAEL, GPA33, DUSP27, POU2F1, CD247, CREG1, RCSD1, LOC100128751, MPZL1, ADCY10, MPC2, DCAF6, MIR1255B2, GPR161, TIPRL, SFT2D2, ANKRD36BP1, LOC100996595, TBX19, MIR557, LOC100505918, XCL2, XCL1, DPT, LINC00626, ATPIB1, NME7, BLZF1, C1orf114, SLC19A2, LOC100287813, F5, SELP, SELL, SELE, METTL18, C1orf112, SCYL3, KIFAP3, METTL11B, MIR3119-1, MIR3119-2, LOC284688, GORAB, PRRX1, LOC100127910, C1orf129, FMO3, MIR1295A, MIR1295B, FMO6P, FMO2, FMO1, FMO4, TOP1P1, PRRC2C, MYOC, VAMP4, METTL13, DNM3, DNM3OS, MIR214, MIR3120, MIR199A2, LOC100505991, C1orf105, PIGC, SUCO, FASLG, TNFSF18, TNFSF4, LOC100506023, PRDX6, SLC9C2, ANKRD45, LOC730159, KLHL20, CENPL, DARS2, GAS5-AS1, GAS5, SNORD81, SNORD47, SNORD80, SNORD79, SNORD78, SNORD44, SNORD77, SNORD76, SNORD75, SNORD74, ZBTB37, SERPINC1, RC3H1, RABGAP1L, GPR52, CACYBP, MRPS14, TNN, KIAA0040, TNR, RFWD2, SCARNA3, PAPPA2, ASTN1, MIR488, FAM5B, LOC100506128, SEC16B, LOC730102, RASAL2-AS1, RASAL2, LINC00083, TEX35, C1orf220, MIR4424, RALGPS2, ANGPTL1, FAM20B, TOR3A, ABL2, SOAT1, AXDND1, NPHS2, TDRD5, LOC100506206, FAM163A, TOR1AIP2, TOR1AIP1, CEP350, QSOX1, FLJ23867, LHX4, LOC100527964, ACBD6, MIR3121, XPR1, KIAA1614, STX6, MR1, IER5, GM140, CACNA1E, ZNF648, GLUL, TEDDM1, LINC00272, RGSL1, RNASEL, RGS16, LOC284648, RGS8, NPL, DHX9, SHCBP1L, LAMC1, LAMC2, NMNAT2, SMG7-AS1, SMG7, NCF2, ARPC5, RGL1, APOBEC4, GLT25D2, TSEN15, C1orf21, EDEM3, FAM129A, RNF2, TRMT1L, LOC100996636, SWT1, IVNS1ABP, LOC100288079, HMCN1, PRG4, TPR, C1orf27, OCLM, PDC, PTGS2, PLA2G4A, FAM5C, LOC440704, LOC100652834, RGS18, RGS21, RGS1, RGS13, MIR4426, RGS2, UCHL5, TROVE2, GLRX2, CDC73, MIR1278, B3GALT2, KCNT2, MIR4735, CFH, CFHR3, CFHR1, CFHR4, CFHR2, CFHR5, F13B, ASPM, ZBTB41, CRB1, DENND1B, C1orf53, LHX9, NEK7, ATP6V1G3, PTPRC, LOC100131234, MIR181B1, MIR181A1, NR5A2, FAM58BP, C1orf98, ZNF281, KIF14, DDX59, CAMSAP2, GPR25, C1orf106, KIF21B, LOC100506546, CACNA1S, ASCL5, TMEM9, IGFN1, PKP1, TNNT2, LAD1, TNNI1, PHLDA3, CSRP1, RPS10P7, NAV1, MIR5191, MIR1231, IPO9, SHISA4, LMOD1, TIMM17A, RNPEP, ELF3, GPR37L1, ARL8A, PTPN7, PTPRVP, LGR6, UBE2T, PPPIR12B, SYT2, KDM5B, KDM5B-AS1, LOC641515, LOC148709, RABIF, KLHL12, ADIPOR1, CYB5R1, TMEM183A, PPFIA4, MYOG, ADORA1, MYBPH, CHI3L1, CHI1T1, LOC100506775, LOC730227, BTG2, FMOD, PRELP, OPTC, ATP2B4, SNORA77, LINC00260, LAX1, ZC3H11A, ZBED6, SNRPE, LINC00303, SOX13, ETNK2, REN, KISS1, GOLTIA, PLEKHA6, LINC00628, PPPIR15B, PIK3C2B, MDM4, LRRN2, NFASC, CNTN2, TMEM81, RBBP5, DSTYK, TMCC2, NUAK2, KLHDC8A, LEMD1-AS1, LEMD1, MIR135B, CDK18, LOC284578, MFSD4, ELK4, SLC45A3, NUCKS1, RAB7L1, SLC41A1, PM20D1, LOC284581, SLC26A9, LOC100505630, FAM72A, AVPR1B, C1orf186, LOC100505650, CTSE, SRGAP2, IKBKE, RASSF5, EIF2D, DYRK3, MAPKAPK2, IL10, IL19, IL20, IL24, FAIM3, PIGR, FCAMR, C1orf116, YOD1, PFKFB2, C4BPB, C4BPA, CD55, CR2, CR1, CR1L, CD46, MIR29C, MIR29B2, LOC148696, CD34, PLXNA2, LOC100506899, LOC100509303, MIR205HG, MIR205, CAMK1G, LAMB3, MIR4260, GOS2, HSD11B1, TRAF3IP3, C1orf74, IRF6, DIEXF, SYT14, SERTAD4-AS1, SERTAD4, HHAT, KCNH1, RCOR3, TRAF5, LINC00467, RD3, SLC30A1, NEK2, LPGAT1, INTS7, DTL, RPL21P28, MIR3122, PPP2R5A, SNORA16B, TMEM206, NENF, ATF3, FAM71A, BATF3, NSL1, TATDN3, C1orf227, FLVCR1-AS1, FLVCR1, VASH2, ANGEL2, RPS6KC1, LINC00538, PROX1, SMYD2, PTPN14, CENPF, KCNK2, KCTD3, USH2A, ESRRG, GPATCH2, SPATA17, LINC00210, RRP15, LOC728463, TGFB2, LOC643723, LYPLAL1, SLC30A10, EPRS, BPNT1, IARS2, MIR215, MIR194-1, RAB3GAP2, MIR664, SNORA36B, AURKAPS1, MARK1, C1orf115, MARC2, MARC1, HLX, C1orf140, DUSP10, HHIPL2, TAFIA, LOC100506161, MIA3, AIDA, BROX, FAM177B, DISP1, TLR5, SUSD4, C1orf65, CAPN8, CAPN2, TP53BP2, LOC100288102, LOC100287497, LOC100996486, FBXO28, DEGS1, NVL, MIR320B2, CNIH4, WDR26, MIR4742, CNIH3, DNAH14, LBR, ENAH, SRP9, EPHX1, TMEM63A, LEFTY1, PYCR2, LEFTY2, SDE2, H3F3A, ACBD3, MIXL1, LIN9, PARP1, C1orf95, ITPKB, ITPKB-IT1, PSEN2, ADCK3, CDC42BPA, ZNF678, LOC100130093, JMJD4, SNAP47, PRSS38, WNT9A, MIR5008, LOC728728, LOC100996502, WNT3A, LOC100506571, ARF1, MIR3620, C1orf35, MRPL55, GUK1, GJC2, C1orf148, IBA57, C1orf145, OBSCN, TRIM11, TRIM17, HIST3H3, HIST3H2A, HIST3H2BB, MIR4666A, RNF187, BTNL10, RNA5S1, RNA5S2, RNA5S3, RNA5S4, RNA5S5, RNA5S6, RNA5S7, RNA5S8, RNA5S9, RNA5S10, RNA5S11, RNA5S12, RNA5S13, RNA5S14, RNA5S15, RNA5S16, RHOU, DUSP5P1, RNA5S17, RAB4A, SPHAR, CCSAP, ACTA1, NUP133, ABCB10, TAF5L, URB2, GALNT2, PGBD5, COG2, AGT, CAPN9, C1orf198, TTC13, ARV1, FAM89A, MIR1182, TRIM67, LOC149373, C1orf131, GNPAT, EXOC8, SPRTN, EGLN1, SNRPD2P2, TSNAX-DISC1, TSNAX, LINC00582, DISC1, DISC2, SIPA1L2, KIAA1383, NTPCR, PCNXL2, KIAA1804, KCNK1, MIR4427, SLC35F3, MIR4671, COA6, TARBP1, LOC100506795, IRF2BP2, LINC00184, LOC100506810, PP2672, TOMM20, SNORA14B, RBM34, ARID4B, MIR4753, GGPS1, TBCE, B3GALNT2, GNG4, LYST, MIR1537, NID1, GPR137B, ERO1LB, EDARADD, LGALS8, LGALS8-AS1, HEATR1, ACTN2, MTR, RYR2, MIR4428, LOC100130331, ZP4, LOC339535, CHRM3, CHRM3-AS2, RPS7P5, FMN2, GREM2, LOC100506929, RGS7, MIR3123, FH, KMO, OPN3, CHML, WDR64, EXO1, MAP1LC3C, PLD5, LOC100505955, LOC731275, CEP170, SDCCAG8, MIR4677, AKT3, LOC339529, ZNF238, LOC440742, C1orf100, ADSS, C1orf101, DESI2, COX20, HNRNPU-AS1, HNRNPU, EFCAB2, KIF26B, SMYD3, LOC255654, TFB2M, CNST, SCCPDH, LOC100130097, LOC149134, AHCTF1, ZNF695, ZNF670-ZNF695, ZNF670, ZNF669, C1orf229, ZNF124, MIR3916, VN1R5, ZNF496, NLRP3, OR2B11, OR2W5, GCSAML-AS1, OR2C3, GCSAML, OR2G2, OR2G3, OR13G1, OR6F1, OR1C1, OR14A16, OR11L1, TRIM58, OR2W3, OR2T8, OR2L13, OR2L8, OR2AK2, OR2L1P, OR2L5, OR2L2, OR2L3, OR2M1P, OR2M5, OR2M2, OR2M3, OR2M4, OR2T33, OR2T12, OR2M7, OR14C36, OR2T4, OR2T6, OR2T1, OR2T2, OR2T3, OR2T5, OR2G6, OR2T29, OR2T34, OR2T10, OR2T11, OR2T35, OR2T27, OR14I1, LYPD8, SH3BP5L, MIR3124, ZNF672, ZNF692, PGBD2, TUBB8, ZMYND11, DIP2C, MIR5699, C10orf108, LARP4B, LOC100288619, GTPBP4, IDI2, IDI2-AS1, IDI1, WDR37, LINC00200, ADARB2, LOC642422, ADARB2-AS1, LOC282980, LOC399708, PFKP, PITRM1, LOC100507034, KLF6, LOC100652988, LOC100507059, LOC100128356, LOC100216001, LOC338588, AKR1E2, TAKR, AKR1C1, AKR1C2, AKR1C3, AKR1CL1, AKR1C4, UCN3, TUBAL3, NET1, CALML5, LOC100132159, CALML3, ASB13, FAM208B, GDI2, ANKRD16, FBXO18, IL15RA, IL2RA, RBM17, PFKFB3, MIR3155A, MIR3155B, LOC399715, DKFZp667F0711, PRKCQ, LOC439949, LOC100507127, SFMBT2, ITIH5, ITIH2, KIN, ATP5C1, TAF3, FLJ45983, GATA3, LOC100507143, LOC100507163, SFTA1P, LOC254312, CELF2, LOC439950, CELF2-AS1, USP6NL, LOC100507213, ECHDC3, C10orf47, LOC219731, UPF2, DHTKD1, SEC61A2, MIR548AK, NUDT5, CDC123, CAMK1D, MIR4480, MIR4481, MIR548Q, LOC283070, CCDC3, OPTN, MCM10, RNU6-2, UCMA, PHYH, SEPHS1, BEND7, PRPF18, FRMD4A, MIR4293, MIR1265, FAM107B, CDNF, HSPA14, SUV39H2, DCLRE1C, MEIG1, LOC100289151, OLAH, ACBD7, C10orf111, RPP38, NMT2, LOC100192204, FAM171A1, ITGA8, FAM188A, PTER, C1QL3, RSU1, CUBN, TRDMT1, LOC100507347, VIM, ST8SIA6, LOC100128098, PTPLA, STAM, TMEM236, MIR511-1, MRC1, MIR511-2, SLC39A12, LOC100129213, CACNB2, NSUN6, ARL5B, PLXDC2, MIR4675, NEBL, C10orf113, LOC100128511, RNU6-15, C10orf114, MIR1915, SKIDA1, MLLT10, DNAJC1, LOC100507445, EBLN1, LOC100130992, COMMD3-BMI1, COMMD3, BMI1, SPAG6, LOC100499489, LOC100289455, PIP4K2A, ARMC3, MSRB2, PTF1A, C10orf67, MIR1254-2, OTUD1, KIAA1217, MIR603, ARHGAP21, PRTFDC1, ENKUR, THNSL1, GPR158-AS1, GPR158, LOC100507531, MYO3A, GAD2, APBB1IP, LINC00264, LOC731789, PDSS1, ABI1, LINC00202, ANKRD26, YME1L1, MASTL, ACBD5, LRRC37A6P, PTCHD3, RAB18, MKX, ARMC4, MPP7, WAC-AS1, WAC, BAMBI, LOC100507605, C10orf126, LYZL1, LOC387647, SVIL, MIR604, MIR938, KIAA1462, MTPAP, MAP3K8, LYZL2, ZNF438, LOC100507663, ZEB1-AS1, ZEB1, LOC100996668, ARHGAP12, KIF5B, EPC1, CCDC7, C10orf68, ITGB1, NRP1, LOC100505583, PARD3, LOC100505601, CUL2, MIR3611, CREM, CCNY, GJD4, FZD8, MIR4683, ANKRD30A, MTRNR2L7, ZNF248, LOC100419868, ZNF25, ZNF33A, ZNF37A, LOC100129055, HSD17B7P2, SEPT7L, LOC399744, ACTR3BP5, LOC441666, LOC84856, ZNF37BP, ZNF33B, BMS1, MIR5100, RET, CSGALNACT2, RASGEF1A, FXYD4, HNRNPF, ZNF487P, LOC100996605, ZNF239, ZNF485, ZNF32-AS3, ZNF32, ZNF32-AS1, ZNF32-AS2, HNRNPA3P1, LINC00619, LOC100506835, LOC283033, LOC100506853, LOC100130539, CXCL12, TMEM72-AS1, TMEM72, RASSF4, C10orf10, C10orf25, ZNF22, RSU1P2, LOC338579, MIR3156-1, OR13A1, ALOX5, MARCH8, ZFAND4, FAM21C, AGAP4, PTPN20A, BMSIP1, GLUD1P7, FAM35B, SYT15, GPRIN2, PPYR1, LOC643650, LOC728643, ANXA8L1, FAM25B, AGAP10, BMS1P2, FAM35B2, LOC100996567, ANTXRL, ANXA8L2, FAM21B, CTSL1P2, BMS1P6, AGAP9, FAM25G, ANXA8, ZNF488, RBP3, GDF2, GDF10, PTPN20B, FRMPD2P1, BMS1P5, FAM25C, FRMPD2, MAPK8, ARHGAP22, WDFY4, LRRC18, MIR4294, VSTM4, LOC100506733, FAM170B, C10orf128, LOC100506769, C10orf71, DRGX, ERCC6, PGBD3, CHAT, SLC18A3, C10orf53, OGDHL, PARG, AGAP8, LOC728407, TIMM23B, AGAP7, MSMB, NCOA4, TIMM23, LOC100996610, LOC100652748, AGAP6, FAM21A, ASAH2, SGMS1, ASAH2B, A1CF, PRKG1, MIR605, CSTF2T, LOC100506939, DKK1, MBL2, PCDH15, MIR548F1, MTRNR2L5, ZWINT, MIR3924, IPMK, CISD1, UBE2D1, TFAM, BICC1, FAM133CP, LOC100507008, PHYHIPL, FAM13C, SLC16A9, M1, CCDC6, C10orf40, ANK3, CDK1, RHOBTB1, LOC100507058, TMEM26, C10orf107, ARID5B, RTKN2, ZNF365, ADO, EGR2, NRBF2, JMJD1C, MIR1296, LOC84989, REEP3, ANXA2P3, CTNNA3, LRRTM3, DNAJC12, SIRT1, HERC4, MYPN, ATOH7, PBLD, HNRNPH3, RUFY2, DNA2, LOC100996629, SLC25A16, TET1, CCAR1, SNORD98, MIR1254-1, STOX1, DDX50, DDX21, KIAA1279, SRGN, VPS26A, SUPV3L1, HKDC1, HK1, TACR2, TSPAN15, NEUROG3, C10orf35, COL13A1, H2AFY2, AIFM2, TYSND1, SAR1A, PPA1, NPFFR1, LRRC20, EIF4EBP2, NODAL, PALD1, PRF1, ADAMTS14, TBATA, SGPL1, PCBD1, UNC5B, LOC728978, SLC29A3, CDH23, C10orf105, C10orf54, PSAP, CHST3, SPOCK2, ASCC1, ANAPC16, DDIT4, DNAJB12, MICU1, MCU, MIR4676, OIT3, PLA2G12B, P4HA1, NUDT13, ECD, FAM149B1, DNAJC9, DNAJC9-AS1, MRPS16, TTC18, ANXA7, MSS51, PPP3CB, USP54, MYOZ1, SYNPO2L, AGAP5, BMS1P4, GLUDIP3, SEC24C, FUT11, CHCHD1, ZSWIM8, LOC100507331, NDST2, CAMK2G, C10orf55, PLAU, VCL, AP3M1, ADK, KAT6B, DUPD1, DUSP13, SAMD8, VDAC2, COMTD1, ZNF503-AS1, ZNF503, ZNF503-AS2, MIR606, C10orf11, KCNMA1, DLG5, LOC100131132, LOC100128292, POLR3A, RPS24, LOC100132987, LOC283050, ZMIZ1, PPIF, ZCCHC24, EIF5AL1, SFTPA2, SFTPA1, LOC650623, LOC642361, LOC100288974, MBL1P, SFTPD, TMEM254-AS1, TMEM254, PLAC9, ANXA11, LOC439990, LOC100130698, MAT1A, DYDC1, DYDC2, FAM213A, TSPAN14, SH2D4B, NRG3, GH1TM, C10orf99, CDHR1, LRIT2, LRIT1, RGR, LOC170425, FAM190B, GRID1-AS1, GRID1, MIR346, WAPAL, OPN4, LDB3, BMPRIA, MMRN2, SNCG, C10orf116, AGAP11, FAM25A, GLUD1, FAM35A, FAM22A, LOC728190, LOC439994, FAM22D, LOC728218, MIR4678, MINPP1, PAPSS2, ATAD1, CFLIP1, KLLN, PTEN, RNLS, LIPJ, LIPF, LIPK, LIPN, LIPM, ANKRD22, STAMBPL1, LOC100132116, ACTA2, FAS, FAS-AS1, MIR4679-2, MIR4679-1, CH25H, LIPA, IFIT2, IFIT3, IFIT1B, IFIT1, IFIT5, SLC16A12, PANK1, MIR107, FLJ37201, KIF20B, LOC643529, HTR7, RPP30, ANKRD1, LINC00502, NUDT9P1, PCGF5, LOC100188947, HECTD2, PPPIR3C, LOC100507633, TNKS2, FGFBP3, BTAF1, CPEB3, MARCH5, MARK2P9, IDE, KIF11, HHEX, EXOC6, CYP26C1, CYP26A1, MYOF, CEP55, FFAR4, RBP4, PDE6C, FRA10AC1, LGI1, SLC35G1, PIPSL, PLCE1, LOC100128054, NOC3L, TBC1D12, HELLS, CYP2C18, CYP2C19, CYP2C9, CYP2C8, C10orf129, PDLIM1, SORBS1, ALDH18A1, TCTN3, ENTPD1, LOC728558, C10orf131, CC2D2B, CCNJ, MIR3157, ZNF518A, BLNK, DNTT, OPALIN, TLL2, TM9SF3, PIK3AP1, RPL13AP5, MIR607, LCOR, C10orf12, SLIT1, LOC100505540, ARHGAP19-SLIT1, ARHGAP19, FRAT1, FRAT2, RRP12, PGAM1, EXOSC1, ZDHHC16, MMS19, UBTD1, ANKRD2, HOGA1, C10orf62, MORN4, PI4K2A, AVPI1, MARVELD1, ZFYVE27, SFRP5, LOC100505561, GOLGA7B, CRTAC1, R3HCC1L, LOXL4, PYROXD2, MIR1287, HPS1, MIR4685, HPSE2, CNNM1, GOT1, NKX2-3, SLC25A28, ENTPD7, COX15, CUTC, ABCC2, DNMBP, DNMBP-AS1, CPN1, ERLIN1, CHUK, CWF19L1, SNORA12, BLOCIS2, PKD2L1, SCD, LINC00263, WNT8B, SEC31B, NDUFB8, HIF1AN, PAX2, FAM178A, SEMA4G, MIR608, MRPL43, C10orf2, LZTS2, PDZD7, SFXN3, KAZALD1, TLX1NB, TLX1, LBX1, FLJ41350, BTRC, POLL, DPCD, MIR3158-1, MIR3158-2, FBXW4, FGF8, NPM3, MGEA5, LOC100289509, KCNIP2, C10orf76, HPS6, LDB1, PPRC1, NOLC1, ELOVL3, PITX3, GBF1, NFKB2, PSD, FBXL15, CUEDC2, MIR146B, LOC100505761, C10orf95, TMEM180, ACTR1A, SUFU, TRIM8, ARL3, SFXN2, WBP1L, CYP17A1, CYP17A1-AS1, C10orf32, C10orf32-AS3MT, AS3MT, CNNM2, NT5C2, LOC729020, INA, PCGF6, TAF5, USMG5, MIR1307, PDCD11, CALHM2, CALHM1, CALHM3, NEURL, SH3PXD2A, LOC100505839, OBFCI, SLK, COL17A1, MIR936, SFR1, WDR96, MIR609, GSTO1, MIR4482-1, GSTO2, ITPRIP, LOC100505869, CCDC147, SORCS3, SORCS1, XPNPEP1, LOC100505933, ADD3, MXI1, SMNDC1, DUSP5, SMC3, RBM20, LOC282997, PDCD4, MIR4680, BBIP1, SHOC2, RPL13AP6, MIR548E, ADRA2A, GPAM, TECTB, GUCY2GP, ACSL5, ZDHHC6, VTI1A, MIR4295, TCF7L2, HABP2, NRAP, CASP7, PLEKHS1, MIR4483, DCLRE1A, NHLRC2, ADRB1, C10orf118, MIR2110, TDRD1, VWA2, AFAPIL2, ABLIM1, FAM160B1, TRUB1, ATRNL1, GFRA1, CCDC172, PNLIPRP3, PNLIP, PNLIPRP1, PNLIPRP2, C10orf82, HSPA12A, ENO4, KIAA1598, VAX1, MIR3663, KCNK18, SLC18A2, PDZD8, EMX2OS, EMX2, LOC100996346, RAB11FIP2, CASC2, FAM204A, LOC100506126, PRLHR, CACUL1, NANOS1, EIF3A, SNORA19, FAM45A, SFXN4, PRDX3, GRK5, MIR4681, RGS10, TIAL1, BAG3, INPP5F, MCMBP, SEC23IP, MIR4682, PPAPDC1A, WDR11-AS1, WDR11, FGFR2, ATE1, LOC100130887, NSMCE4A, TACC2, BTBD16, PLEKHA1, MIR3941, ARMS2, HTRA1, DMBT1, C10orf120, FLJ46361, CUZD1, FAM24B-CUZD1, FAM24B, LOC399815, FAM24A, C10orf88, PSTK, IKZF5, ACADSB, HMX3, HMX2, BUB3, GPR26, CPXM2, CHST15, OAT, NKX1-2, LHPP, LOC100506255, FAM53B, METTL10, FAM175B, ZRANB1, CTBP2, MIR4296, LOC100169752, TEX36, LOC283038, FLJ37035, C10orf137, MMP21, UROS, MIR4484, BCCIP, DHX32, FANK1, ADAM12, C10orf90, LOC728065, DOCK1, FAM196A, NPS, FOXI2, CLRN3, PTPRE, MKI67, MGMT, EBF3, MIR4297, LOC387723, CTAGE7P, GLRX3, MIR378C, TCERG1L, FLJ46300, PPP2R2D, BNIP3, JAKMIP3, DPYSL4, STK32C, LOC100506057, LRRC27, PWWP2B, C10orf91, INPP5A, NKX6-2, TTC40, LOC100289424, LOC399829, GPR123, KNDC1, UTF1, VENTX, MIR202, ADAM8, TUBGCP2, ZNF511, CALY, PRAP1, FUOM, ECHS1, MIR3944, PAOX, MTG1, SPRN, LOC619207, CYP2E1, SYCE1, SPRNP1, FRG2B, LOC100133161, SCGB1C1, ODF3, BET1L, RIC8A, SIRT3, PSMD13, NLRP6, ATHL1, IFITM5, IFITM2, IFITM1, IFITM3, B4GALNT4, PKP3, SIGIRR, ANO9, PTDSS2, RNHI, HRAS, LRRC56, C11orf35, LOC692247, RASSF7, MIR210HG, MIR210, LOC143666, PHRF1, IRF7, CDHR5, SCT, DRD4, DEAF1, TMEM80, EPS8L2, TALDO1, PDDC1, LOC100506518, NS3BP, CEND1, SLC25A22, PIDD, RPLP2, SNORA52, PNPLA2, EFCAB4A, CD151, POLR2L, TSPAN4, CHID1, AP2A2, MUC6, MUC2, MUC5B, TOLLIP, LOC255512, BRSK2, MOB2, DUSP8, LOC338651, KRTAP5-1, KRTAP5-2, KRTAP5-3, KRTAP5-4, KRTAP5-5, FAM99A, FAM99B, LOC100505570, KRTAP5-6, IFITM10, CTSD, SYT8, TNNI2, LSP1, MIR4298, TNNT3, MRPL23, MRPL23-AS1, H19, MIR675, INS-IGF2, IGF2, MIR483, IGF2-AS, INS, TH, MIR4686, ASCL2, C11orf21, TSPAN32, CD81, TSSC4, TRPM5, KCNQ1, KCNQ1OT1, KCNQ1DN, CDKN1C, SLC22A18AS, SLC22A18, PHLDA2, NAP1L4, SNORA54, LOC100505870, CARS, OSBPL5, MRGPRG, MRGPRG-AS1, MRGPRE, ZNF195, LOC650368, OR7E12P, TRPC2, ART5, ART1, CHRNA10, NUP98, PGAP2, RHOG, STIM1, MIR4687, RRM1, LOC100506082, OR52B4, TRIM21, OR52K2, OR52K1, OR52M1, C11orf40, OR52I2, OR52I1, TRIM68, OR51D1, OR51E1, OR51E2, OR51F1, OR52R1, OR51F2, OR51S1, OR51T1, OR51A7, OR51G2, OR51G1, OR51A4, OR51A2, MMP26, OR51L1, OR52J3, OR52E2, LOC100506101, OR52A5, OR52A1, OR51V1, HBB, HBD, HBBP1, HBG1, HBG2, HBE1, OR51B4, OR51B2, OR51B5, OR51B6, OR51M1, OR51Q1, OR51I1, OR51I2, OR52D1, UBQLN3, UBQLNL, OR52H1, OR52B6, TRIM6, TRIM6-TRIM34, TRIM34, TRIM5, TRIM22, OR56B1, OR52N4, OR52N5, OR52N1, OR52N2, OR52E6, OR52E8, OR52E4, OR56A3, OR56A5, OR52L1, OR56A4, OR56A1, OR56B4, OR52B2, OR52W1, C11orf42, FAM160A2, CNGA4, CCKBR, PRKCDBP, SMPD1, APBB1, HPX, TRIM3, ARFIP2, FXC1, DNHD1, RRP8, ILK, TAF10, TPP1, DCHS1, MRPL17, GVINP1, OR2AG2, OR2AG1, OR6A2, OR10A5, OR10A2, OR10A4, OR2D2, OR2D3, ZNF215, ZNF214, NLRP14, RBMXL2, LOC100506238, MIR302E, SYT9, LOC100506258, OLFML1, PPFIBP2, CYB5R2, OVCH2, OR5P2, OR5P3, OR5E1P, LOC283299, OR10A6, OR10A3, NLRP10, EIF3F, TUB, RIC3, LMO1, STK33, TRIM66, RPL27A, SNORA3, SNORA45, ST5, AKIP1, C11orf16, ASCL3, TMEM9B, NRIP3, SCUBE2, MIR5691, KRT8P41, DENND5A, TMEM41B, IPO7, SNORA23, LOC644656, ZNF143, WEE1, SWAP70, LOC440028, SBF2-AS1, SBF2, ADM, AMPD3, MTRNR2L8, MIR4485, RNF141, MRVI1-AS1, LYVE1, MRVI1, CTR9, EIF4G2, SNORD97, ZBED5, LOC729013, GALNTL4, CSNK2A1P, MIR4299, USP47, DKK3, MICAL2, MICALCL, PARVA, TEAD1, LOC100506305, LOC100506352, RASSF10, ARNTL, LOC100996618, BTBD10, PTH, FAR1, SPON1, RRAS2, COPB1, PSMA1, PDE3B, CYP2R1, CALCA, CALCB, INSC, SOX6, C11orf58, PLEKHA7, OR7E14P, RPS13, SNORD14A, SNORD14B, PIK3C2A, NUCB2, NCR3LG1, KCNJ11, ABCC8, USH1C, OTOG, MYOD1, KCNC1, SERGEF, TPH1, SAAL1, SAA3P, MRGPRX3, MRGPRX4, LOC494141, SAA4, SAA2-SAA4, SAA2, SAA1, HPS5, GTF2H1, MIR3159, LDHA, LDHC, LDHAL6A, TSG101, UEVLD, SPTY2D1-AS1, SPTY2D1, TMEM86A, IGSF22, PTPN5, MRGPRX1, MRGPRX2, ZDHHC13, CSRP3, E2F8, NAV2, NAV2-AS5, NAV2-AS4, MIR4486, LOC100126784, MIR4694, DBX1, HTATIP2, PRMT3, SLC6A5, NELL1, ANO5, SLC17A6, FANCF, GAS2, SVIP, LOC100500938, LUZP2, ANO3, MUC15, SLC5A12, FIBIN, BBOX1, CCDC34, LGR4, LIN7C, BDNF-AS, BDNF, KIF18A, MIR610, METTL15, KCNA4, FSHB, ARL14EP, MPPED2, DCDC5, LOC100508736, DCDC1, DNAJC24, IMMP1L, ELP4, PAX6, DKFZp686K1684, LOC100506675, RCN1, WT1, WT1-AS, EIF3M, CCDC73, PRRG4, QSER1, DEPDC7, TCP11L1, LINC00294, CSTF3, LOC338739, HIPK3, KIAA1549L, C11orf91, CD59, FBXO3, LOC100507109, LMO2, CAPRIN1, NAT10, ABTB2, CAT, ELF5, EHF, APIP, PDHX, MIR1343, LOC100507144, CD44, SLC1A2, PAMR1, FJX1, TRIM44, LDLRAD3, MIR3973, COMMD9, PRR5L, TRAF6, RAG1, RAG2, C11orf74, LRRC4C, LOC100507205, HNRNPKP3, API5, TTC17, MIR670, LOC100507261, LOC100131381, MIR129-2, HSD17B12, ALKBH3, SEC14L1P1, LOC100507300, C11orf96, ACCSL, ACCS, EXT2, ALX4, CD82, TSPAN18, TP53I11, LOC221122, PRDM11, SYT13, CHST1, LOC100507384, DKFZp779M0652, SLC35C1, CRY2, MAPK8IP1, C11orf94, PEX16, GYLTL1B, PHF21A, CREB3L1, DGKZ, MIR4688, MDK, CHRM4, AMBRA1, MIR3160-1, MIR3160-2, HARBI1, ATG13, ARHGAP1, ZNF408, F2, CKAP5, MIR5582, SNORD67, LRP4-AS1, LRP4, C11orf49, ARFGAP2, PACSIN3, DDB2, ACP2, NR1H3, MADD, MYBPC3, SPI1, LOC100507417, MIR4487, SLC39A13, PSMC3, RAPSN, CELF1, PTPMT1, KBTBD4, NDUFS3, FAM180B, C1QTNF4, MTCH2, AGBL2, FNBP4, NUP160, PTPRJ, MIR3161, OR4B1, OR4X2, OR4X1, OR4S1, OR4C3, OR4A47, TRIM51GP, TRIM49B, TRIM64C, FOLH1, LOC440040, OR4C13, OR4C12, LOC441601, LOC646813, OR4A5, OR4C46, TRIM48, TRIM51HP, OR4A16, OR4A15, OR4C15, OR4C16, OR4C11, OR4P4, OR4S2, OR4C6, OR5D13, OR5D14, OR5L1, OR5D18, OR5L2, OR5D16, TRIM51, OR5W2, OR5I1, OR10AG1, OR7E5P, OR5F1, OR5AS1, OR8I2, OR8H2, OR8H3, OR8J3, OR8K5, OR5J2, OR5T2, OR5T3, OR5T1, OR8H1, OR8K3, OR8K1, OR8J1, OR8U1, OR5R1, OR5M9, OR5M3, OR5M8, OR5M11, OR5M10, OR5M1, OR5AP2, OR5AR1, OR9G1, OR9G4, OR5AK2, ORSAK4P, LRRC55, APLNR, TNKS1BP1, SSRP1, P2RX3, PRG3, PRG2, SLC43A3, RTN4RL2, SLC43A1, TIMM10, SMTNL1, UBE2L6, SERPING1, MIR130A, YPEL4, CLP1, ZDHHC5, MED19, TMX2, TMX2-CTNND1, C11orf31, BTBD18, CTNND1, OR9Q1, OR6Q1, OR9I1, OR9Q2, OR1S2, OR1S1, OR10Q1, OR10W1, OR5B17, OR5B3, OR5B2, OR5B12, OR5B21, LPXN, ZFP91-CNTF, ZFP91, CNTF, GLYAT, GLYATL2, LOC100287413, GLYATL1, LOC283194, FAM111B, FAM111A, DTX4, MPEG1, OR5AN1, OR5A2, OR5A1, OR4D6, OR4D10, OR4D11, OR4D9, OSBP, MIR3162, PATL1, OR10V1, OR10V2P, STX3, MRPL16, GIF, TCN1, PLAC1L, MS4A3, MS4A2, MS4A6A, MS4A4E, MS4A4A, MS4A6E, MS4A7, MS4A14, MS4A5, MS4A1, MS4A12, MS4A13, LINC00301, MS4A8B, MS4A15, MS4A10, CCDC86, PTGDR2, ZP1, PRPF19, TMEM109, TMEM132A, SLC15A3, CD6, CD5, VPS37C, PGA3, PGA4, PGA5, VWCE, DDB1, DAK, CYBASC3, TMEM138, TMEM216, CPSF7, SDHAF2, PPP1R32, MIR4488, LRRC10B, SYT7, RPLPOP2, DAGLA, C11orf9, DKFZP434K028, LOC100129473, C11orf10, MIR611, FEN1, FADS1, MIR1908, FADS2, FADS3, RAB3IL1, BEST1, FTH1, LOC100507521, INCENP, SCGB1D1, SCGB2A1, SCGB1D2, SCGB2A2, SCGB1D4, ASRGL1, SCGB1A1, AHNAK, EEF1G, TUT1, MTA2, EML3, ROM1, B3GAT3, GANAB, INTS5, C11orf48, METTL12, SNORA57, C11orf83, UBXN1, LRRN4CL, HNRNPUL2-BSCL2, BSCL2, GNG3, HNRNPUL2, TTC9C, ZBTB3, POLR2G, TAF6L, TMEM179B, TMEM223, NXF1, STX5, WDR74, RNU2-2, SNHG1, SNORD22, SNORD31, SNORD30, SNORD29, SNORD28, SNORD27, SNORD26, SNORD25, SLC3A2, CHRM1, SLC22A6, SLC22A8, SLC22A24, SLC22A25, SLC22A10, SLC22A9, HRASLS5, LGALS12, RARRES3, HRASLS2, PLA2G16, ATL3, RTN3, C11orf95, C11orf84, MARK2, RCOR2, NAA40, RNU6-45, COX8A, OTUB1, MAC-ROD1, FLRT1, STIP1, FERMT3, TRPT1, NUDT22, DNAJC4, VEGFB, FKBP2, PPPIR14B, PLCB3, BAD, GPR137, KCNK4, C11orf20, ESRRA, TRMT112, PRDX5, CCDC88B, RPS6KA4, MIR1237, LOC100996455, SLC22A11, SLC22A12, NRXN2, RASGRP2, PYGM, SF1, MAP4K2, MEN1, CDC42BPG, EHD1, MIR192, MIR194-2, ATG2A, PPP2R5B, GPHA2, C11orf85, BATF2, ARL2-SNX15, ARL2, SNX15, SAC3D1, NAALADL1, CDCA5, ZFPL1, LOC100130348, VPS51, TM7SF2, ZNHIT2, FAU, MRPL49, SYVN1, SPDYC, CAPN1, SLC22A20, POLA2, CDC42EP2, DPF2, TIGD3, SLC25A45, FRMD8, NEAT1, MIR612, MALAT1, SCYL1, LTBP3, LOC254100, SSSCA1, FAM89B, EHBP1L1, KCNK7, MAP3K11, PCNXL3, MIR4690, SIPA1, MIR4489, RELA, KAT5, RNASEH2C, AP5B1, OVOL1, SNX32, CFL1, MUS81, EFEMP2, CTSW, FIBP, CCDC85B, FOSL1, C11orf68, DRAP1, TSGA10IP, SART1, EIF1AD, BANF1, CST6, CATSPER1, GAL3ST3, SF3B2, PACS1, KLC2, RAB1B, CNIH2, YIF1A, TMEM151A, CD248, RIN1, BRMS1, B3GNT1, SLC29A2, LOC100505504, NPAS4, MRPL11, PELI3, DPP3, BBS1, ZDHHC24, ACTN3, CTSF, CCDC87, CCS, RBM14, RBM14-RBM4, RBM4, RBM4B, SPTBN2, C11orf80, RCE1, PC, LRFN4, MIR3163, C11orf86, SYT12, RHOD, KDM2A, ADRBK1, ANKRD13D, SSH3, LOC100130987, POLD4, CLCF1, RAD9A, PPP1CA, TBCID10C, CARNS1, RPS6KB2, PTPRCAP, CORO1B, GPR152, CABP4, TMEM134, AIP, PITPNM1, CDK2AP2, CABP2, GSTP1, NDUFV1, LOC100996505, DOC2GP, NUDT8, TBX10, ACY3, ALDH3B2, FAM86C2P, RNU6-46, UNC93B1, ALDH3B1, NDUFS8, MIR4691, TCIRG1, CHKA, SUV420H1, C11orf24, LRP5, PPP6R3, GAL, MTL5, CPT1A, MRPL21, IGHMBP2, MRGPRD, MRGPRF, TPCN2, MIR3164, MYEOV, LOC100505834, LOC100996515, CCND1, ORAOV1, FGF19, FGF4, FGF3, LOC100127946, ANO1-AS2, ANO1, FADD, PPFIA1, MIR548K, CTTN, SHANK2, SHANK2-AS1, SHANK2-AS3, MIR3664, FLJ42102, DHCR7, NADSYN1, KRTAP5-7, KRTAP5-8, KRTAP5-9, KRTAP5-10, KRTAP5-11, FAM86C1, ZNF705E, DEFB108B, LOC100133315, LOC100129216, RNF121, IL18BP, NUMA1, MIR3165, LRTOMT, LAMTOR1, ANAPC15, FOLR3, FOLR1, FOLR2, INPPL1, PHOX2A, CLPB, PDE2A, MIR139, ARAP1, ARAP1-AS2, STARD10, MIR4692, ATG16L2, FCHSD2, P2RY2, P2RY6, LOC100287837, ARHGEF17, RELT, FAM168A, PLEKHB1, RAB6A, MRPL48, COA4, PAAF1, DNAJB13, UCP2, UCP3, C2CD3, PPME1, P4HA3, PGM2L1, MIR548AL, KCNE3, LIPT2, LOC100287896, POLD3, CHRDL2, MIR4696, RNF169, XRRA1, SPCS2, NEU3, OR2AT4, SLCO2B1, TPBGL, ARRB1, MIR326, RPS3, SNORD15A, SNORD15B, KLHL35, GDPD5, SERPINH1, MAP6, MOGAT2, LOC283214, DGAT2, LOC100506113, UVRAG, WNT11, PRKRIR, LOC100996578, C11orf30, LRRC32, GUCY2EP, TSKU, ACER3, B3GNT6, CAPN5, OMP, MYO7A, GDPD4, PAK1, AQP11, CLNS1A, RSF1, AAMDC, INTS4, NDUFC2-KCTD14, KCTD14, THRSP, NDUFC2, ALG8, LOC100289388, KCTD21, USP35, GAB2, NARS2, TENM4, MIR708, MIR5579, MIR4300, FAM181B, PRCP, C11orf82, RAB30, SNORA70E, LOC100506233, PCF11, LOC100506282, ANKRD42, CCDC90B, DLG2, TMEM126B, TMEM126A, CREBZF, CCDC89, SYTL2, CCDC83, PICALM, EED, C11orf73, CCDC81, ME3, PRSS23, OR7E2P, FZD4, LOC100506368, TMEM135, RAB38, MIR3166, CTSC, GRM5-AS1, GRM5, RNU6-16, TYR, NOX4, FOLH1B, TRIM77P, TRIM49, TRIM64B, TRIM49DP, TRIM49L1, TRIM64, TRIM51EP, TRIM53AP, TRIM49C, UBTFL1, NAALAD2, CHORDC1, MIR4490, MIR1261, FAT3, MTNR1B, SLC36A4, CCDC67, C11orf75, KIAA1731, SCARNA9, SNORA25, SNORA32, SNORD6, SNORA1, SNORA8, SNORD5, SNORA18, MIR1304, SNORA40, TAF1D, C11orf54, MED17, VSTM5, HEPHL1, PANX1, FOLR4, GPR83, MRE11A, MIR548L, ANKRD49, LOC643037, FUT4, PIWIL4, AMOTL1, CWC15, KDM4D, KDM4E, SRSF8, ENDOD1, SESN3, LOC100129203, FAM76B, CEP57, MTMR2, MAML2, LOC100131541, MIR1260B, CCDC82, JRKL, JRKL-AS1, CNTN5, ARHGAP42, TMEM133, PGR, LOC101054525, TRPC6, MIR3920, ANGPTL5, KIAA1377, C11orf70, YAP1, BIRC3, BIRC2, TMEM123, MMP7, MMP20, MMP27, MMP8, MMP10, WTAPP1, MMP1, MMP3, MMP12, MMP13, DCUN1D5, DYNC2H1, MIR4693, PDGFD, DDI1, CASP12, LOC643733, CASP4, CASP5, CASP1, CARD16, CARD17, CARD18, GRIA4, MSANTD4, KBTBD3, AASDHPPT, GUCY1A2, CWF19L2, ALKBH8, ELMOD1, LOC643923, SLN, SLC35F2, RAB39A, CUL5, ACAT1, NPAT, ATM, C11orf65, KDELC2, EXPH5, DDX10, SKCG-1, C11orf87, ZC3H12C, RDX, FDX1, ARHGAP20, C11orf53, C11orf92, C11orf93, MIR4491, POU2AF1, LOC100132078, LOC644277, BTG4, MIR34B, MIR34C, C11orf88, LAYN, SIK2, PPP2R1B, ALG9, FDXACB1, C11orf1, CRYAB, HSPB2, HSPB2-C11orf52, C11orf52, DIXDC1, DLAT, PIH1D2, C11orf57, TIMM8B, SDHD, IL18, TEX12, BCO2, PTS, C11orf34, NCAM1, LOC100288346, TTC12, ANKK1, DRD2, MIR4301, TMPRSS5, ZW10, CLDN25, USP28, HTR3B, HTR3A, ZBTB16, NNMT, C11orf71, RBM7, REXO2, NXPE1, NXPE4, NXPE2, CADM1, LOC283143, BUD13, ZNF259, APOA5, APOA4, APOC3, APOA1, SIK3, PAFAH1B2, SIDT2, LOC100652768, TAGLN, PCSK7, RNF214, BACE1, BACE1-AS, CEP164, DSCAML1, FXYD2, FXYD6-FXYD2, FXYD6, TMPRSS13, IL10RA, TMPRSS4-AS1, TMPRSS4, SCN4B, SCN2B, AMICA1, MPZL3, MPZL2, CD3E, CD3D, CD3G, UBE4A, LOC100131626, ATP5L, MGC13053, MLL, TTC36, TMEM25, IFT46, ARCN1, PHLDB1, TREH, DDX6, CXCR5, BCL9L, MIR4492, UPK2, FOXR1, CCDC84, RPL23AP64, RPS25, TRAPPC4, MIR3656, SLC37A4, HYOU1, VPS11, HMBS, H2AFX, DPAGT1, C2CD2L, HINFP, ABCG4, NLRX1, PDZD3, CCDC153, CBL, MCAM, RNF26, CIQTNF5, MFRP, USP2, LOC100499227, THY1, PVRL1, LOC100507077, TRIM29, OAF, POU2F3, LOC649133, TMEM136, ARHGEF12, GRIK4, TBCEL, TECTA, SC5DL, SORL1, LOC100507165, LOC100507145, MIR100HG, MIR125B1, BLID, MIRLET7A2, MIR100, UBASH3B, CRTAM, C11orf63, BSX, LOC341056, HSPA8, SNORD14E, SNORD14D, SNORD14C, CLMP, MIR4493, LOC100128242, GRAMD1B, SCN3B, ZNF202, OR6X1, OR6M1, TMEM225, OR8D4, OR4D5, OR6T1, OR10S1, OR10G4, OR10G9, OR10G8, OR10G7, VWASA, OR8G2, OR8G1, OR8G5, OR8D1, OR8D2, OR8B2, OR8B3, OR8B4, OR8B8, OR8B12, OR8A1, PANX3, TBRG1, SIAE, SPA17, NRGN, VSIG2, ESAM, MSANTD2, LOC100130428, ROBO3, ROBO4, HEP-ACAM, HEPN1, CCDC15, SLC37A2, TMEM218, PKNOX2, FEZ1, MGC39545, EI24, STT3A, CHEK1, ACRV1, PATE1, PATE2, PATE3, PATE4, HYLS1, PUS3, DDX25, LOC338667, CDON, RPUSD4, FAM118B, SRPR, FOXRED1, TIRAP, DCPS, FLJ39051, ST3GAL4, KIR-REL3, KIRREL3-AS2, MIR3167, KIRREL3-AS3, ETS1, FLI1, FLI1-AS1, KCNJ1, KCNJ5, C11orf45, TP53AIP1, ARHGAP32, BARX2, TMEM45B, NFRKB, PRDM10, LINC00167, APLP2, ST14, ZBTB44, LOC100996646, ADAMTS8, ADAMTS15, C11orf44, LOC100507431, SNX19, NTM, C11orf39, OPCML, SPATA19, LOC283174, MIR4697, LOC646543, IGSF9B, LOC100128239, JAM3, NCAPD3, VPS26B, THYN1, ACAD8, GLB1L3, GLB1L2, B3GAT1, LOC283177, LOC729305, LOC100507548, LOC100288778, FAM138D, IQSEC3, LOC574538, SLC6A12, SLC6A13, KDM5A, CCDC77, B4GALNT3, NINJ2, WNK1, RAD52, LOC100130219, ERC1, LOC100292680, FBXL14, WNT5B, MIR3649, ADIPOR2, CACNA2D4, LRTM2, LOC100271702, DCP1B, CACNA1C, CACNA1C-AS4, CACNA1C-IT3, CACNA1C-AS1, LOC283440, FKBP4, ITFG2, NRIP2, LOC100507424, LOC100996378, FOXM1, RHNO1, TULP3, TEAD4, TSPAN9, PRMT8, LOC100129223, LOC100128816, EFCAB4B, PARP11, LOC100507511, CCND2, C12orf5, FGF23, FGF6, C12orf4, RAD51AP1, DYRK4, AKAP3, NDUFA9, GALNT8, KCNA6, KCNA1, LOC100507560, KCNA5, NTF3, ANO2, VWF, CD9, PLEKHG6, TNFRSF1A, SCNN1A, LTBR, CD27-AS1, CD27, TAPBPL, VAMP1, MRPL51, NCAPD2, SCARNA10, GAPDH, LOC100996356, IFFO1, NOP2, CHD4, LOC100127974, SCARNA11, LPAR5, ACRBP, ING4, ZNF384, PIANP, COPS7A, MLF2, PTMS, LAG3, CD4, GPR162, LEPREL2, GNB3, CDCA3, USP5, TPI1, SPSB2, RPL13P5, DSTNP2, LRRC23, ENO2, ATN1, RNU7-1, C12orf57, PTPN6, MIR200C, MIR141, PHB2, SCARNA12, EMG1, LPCAT3, CIS, CIR, CIRL, CIRL-AS1, RBP5, CLSTN3, PEX5, ACSM4, CD163L1, CD163, APOBEC1, GDF3, DPPA3, CLEC4C, NANOGNB, NANOG, SLC2A14, SLC2A3, FOXJ2, C3AR1, NECAP1, CLEC4A, POU5F1P3, ZNF705A, FAM66C, FAM90A1, FAM86FP, LOC389634, CLEC6A, CLEC4D, CLEC4E, AICDA, MFAP5, RIMKLB, A2ML1, PHC1, M6PR, KLRG1, LINC00612, A2M-AS1, A2M, PZP, A2MP1, MIR1244-3, LOC100499405, LOC642846, LOC100653000, LOC728715, DDX12P, OVOS, KLRB1, LOC374443, CLEC2D, CLECL1, CD69, KLRF1, CLEC2B, KLRF2, CLEC2A, CLEC12A, CLEC1B, CLEC12B, CLEC9A, CLEC1A, CLEC7A, OLR1, TMEM52B, GABARAPL1, KLRD1, KLRC4-KLRK1, KLRK1, KLRC4, KLRC3, KLRC2, KLRC1, KLRAP1, MAGOHB, STYK1, CSDA, LOC100506226, TAS2R7, TAS2R8, TAS2R9, TAS2R10, PRH1-PRR4, PRR4, PRH1, TAS2R13, PRH2, TAS2R14, TAS2R50, TAS2R20, TAS2R19, TAS2R31, TAS2R46, TAS2R43, TAS2R30, TAS2R42, PRB3, PRB4, PRB1, PRB2, LOC338817, ETV6, BCL2L14, LOC100506248, LRP6, MANSC1, LOH12CR2, LOH12CR1, DUSP16, CREBL2, GPR19, CDKN1B, APOLD1, MIR613, DDX47, RPL13AP20, GPRC5A, MIR614, GPRC5D, HEBP1, LOC100506314, HTR7P1, KIAA1467, GSG1, EMP1, C12orf36, GRIN2B, ATF7IP, PLBD1, GUCY2C, HIST4H4, H2AFJ, WBP11, C12orf60, C12orf69, ART4, MGP, ERP27, ARHGDIB, PDE6H, RERG, PTPRO, EPS8, STRAP, DERA, SLC15A5, MGST1, LMO3, SKPIP2, MIR3974, RERGL, PIK3C2G, PLCZ1, CAPZA3, PLEKHA5, AEBP2, LOC100506393, PDE3A, SLCO1C1, SLCO1B3, SLCO1B7, SLCO1B1, SLCO1A2, IAPP, PYROXD1, RECQL, GOLT1B, C12orf39, GYS2, LDHB, KCNJ8, ABCC9, CMAS, ST8SIA1, KIAA0528, LOC100996472, ETNK1, SOX5, MIR920, LINC00477, BCAT1, C12orf77, LOC645177, LRMP, CASC1, LYRM5, KRAS, IFLTD1, MIR4302, LOC100506451, RASSF8, LOC100996477, BHLHE41, SSPN, ITPR2, ASUN, FGFRIOP2, TM7SF3, MED21, C12orf71, STK38L, ARNTL2, C12orf70, PPFIBP1, REP15, MRPS35, MANSC4, KLHDC5, PTHLH, CCDC91, FAR2, LOC100506606, ERGIC2, LOC101055625, OVCH1, TMTC1, IPO8, CAPRIN2, LOC100287314, TSPAN11, DDX11-AS1, DDX11, FAM60A, FLJ13224, DENND5B, DENND5B-AS1, METTL20, AMN1, H3F3C, KIAA1551, BICD1, FGD4, DNM1L, YARS2, PKP2, SYT10, ALG10, ALG10B, CPNE8, KIF21A, ABCD2, C12orf40, SLC2A13, LRRK2, MUC19, CNTN1, PDZRN4, GXYLT1, YAF2, ZCRB1, PPHLN1, PRICKLE1, LOC100506684, ADAMTS20, PUS7L, IRAK4, TWF1, TMEM117, NELL2, DBX2, RACGAP1P, PLEKHA8P1, ANO6, LOC400027, ARID2, SCAF11, SLC38A1, SLC38A2, LOC100288798, SLC38A4, AMIGO2, MIR4698, PCED1B-AS1, PCED1B, MIR4494, RPAP3, ENDOU, RAPGEF3, SLC48A1, HDAC7, VDR, TMEM106C, COL2A1, SENP1, PFKM, ASB8, C12orf68, OR10AD1, H1FNT, ZNF641, LOC100505923, ANP32D, C12orf54, OR8S1, LALBA, KANSL2, SNORA34, SNORA2A, SNORA2B, CCNT1, LOC255411, ADCY6, MIR4701, LOC100506125, CACNB3, DDX23, RND1, CCDC65, FKBP11, ARF3, WNT10B, WNT1, DDN, PRKAG1, MLL2, RHEBL1, DHH, LMBR1L, TUBA1B, TUBA1A, LOC100293962, TUBA1C, PRPH, TROAP, CIQL4, DNAJC22, SPATS2, LOC100335030, KCNH3, MCRSI, FAM186B, PRPF40B, FMNL3, TMBIM6, NCKAP5L, BCDIN3D-AS1, BCDIN3D, FAIM2, LOC283332, AQP2, AQP5, AQP6, RACGAP1, ASIC1, SMARCD1, GPD1, COX14, CERS5, LIMA1, MIR1293, FAM186A, LARP4, DIP2B, ATF1, TMPRSS12, METTL7A, HIGD1C, SLC11A2, LETMD1, CSRNP2, TFCP2, POU6F1, DAZAP2, SMAGP, BIN2, CELA1, GALNT6, SLC4A8, SCN8A, FIGNL2, LOC728503, ANKRD33, ACVRL1, ACVR1B, GRASP, NR4A1, C12orf44, KRT80, LOC283403, LINC00592, KRT7, KRT81, KRT86, KRT83, KRT85, KRT84, KRT82, KRT75, KRT6B, KRT6C, KRT6A, KRT5, KRT71, KRT74, KRT72, KRT73, KRT2, KRT1, KRT77, KRT76, KRT3, KRT4, KRT79, KRT78, KRT8, KRT18, EIF4B, LOC283335, TENC1, SPRYD3, IGFBP6, SOAT2, CSAD, ZNF740, ITGB7, RARG, MFSD5, ESPL1, PFDN5, C12orf10, AAAS, SP7, SP1, AMHR2, PRR13, PCBP2, MAP3K12, TARBP2, NPFF, ATF7, LOC100652999, ATP5G2, CALCOCO1, HOXC-AS5, HOXC13, HOXC12, HOTAIR, HOXC11, HOXC10, MIR196A2, HOXC9, HOXC8, HOXC5, HOXC6, HOXC4, MIR615, FLJ12825, LOC100240735, LOC100240734, LOC400043, SMUG1, CBX5, MIR3198-2, HNRNPA1, NFE2, COPZ1, MIR148B, GPR84, ZNF385A, ITGA5, GTSF1, NCKAP1L, PDE1B, PPP1R1A, GLYCAM1, LACRT, DCD, MUCL1, TESPA1, NEUROD4, OR9K2, OR10A7, OR6C74, OR6C6, OR6C1, OR6C3, OR6C75, OR6C65, OR6C76, OR6C2, OR6C70, OR6C68, OR6C4, OR2AP1, OR10P1, METTL7B, ITGA7, BLOCIS1-RDH5, BLOC1S1, RDH5, CD63, GDF11, SARNP, ORMDL2, DNAJC14, TMEM198B, MMP19, WIBG, DGKA, PMEL, CDK2, RAB5B, SUOX, IKZF4, RPS26, ERBB3, PA2G4, RPL41, ZC3H10, ESYT1, MYL6B, MYL6, SMARCC2, RNF41, NABP2, SLC39A5, ANKRD52, COQ10A, CS, CNPY2, PAN2, IL23A, STAT2, APOF, TIMELESS, MIP, SPRYD4, GLS2, RBMS2, BAZ2A, ATP5B, SNORD59B, SNORD59A, PTGES3, NACA, PRIM1, HSD17B6, SDR9C7, RDH16, GPR182, HBCBP, ZBTB39, TAC3, MYO1A, TMEM194A, NAB2, STAT6, LRP1, MIR1228, NXPH4, SHMT2, NDUFA4L2, STAC3, R3HDM2, INHBC, INHBE, GLI1, ARHGAP9, MARS, DDIT3, MIR616, MBD6, DCTN2, KIF5A, PIP4K2C, DTX3, ARHGEF25, SLC26A10, B4GALNT1, OS9, AGAP2, LOC100130776, TSPAN31, CDK4, MARCH9, CYP27B1, METTL1, METTL21B, TSFM, AVIL, CTDSP2, MIR26A2, LOC100506844, XRCC6BP1, LOC100506869, LRIG3, SLC16A7, FAM19A2, USP15, MON2, C12orf61, MIRLET7I, PPMIH, AVPRIA, DPY19L2, TMEM5, SRGAP1, C12orf66, C12orf56, XPOT, TBK1, RASSF3, MIR548Z, MIR548C, GNS, TBC1D30, FLJ41278, WIF1, LEMD3, MSRB3, LOC100507065, RPSAP52, HMGA2, LLPH, TMBIM4, IRAK3, HELB, GRIP1, CAND1, LOC100507175, DYRK2, IFNG, IL26, IL22, MDM1, LOC100507195, RAP1B, SNORA70G, LOC100507250, NUP107, SLC35E3, MDM2, CPM, CPSF6, MIR1279, LYZ, YEATS4, FRS2, MIR3913-1, MIR3913-2, CCT2, LRRC10, BEST3, RAB3IP, C12orf28, CNOT2, KCNMB4, PTPRB, LOC100507330, PTPRR, TSPAN8, LGR5, ZFC3H1, THAP2, TMEM19, RAB21, TBCID15, MRS2P2, TPH2, TRHDE-AS1, TRHDE, LOC100507363, LOC100507377, ATXN7L3B, KCNC2, CAPS2, GLIPR1L1, GLIPR1L2, GLIPR1, KRR1, PHLDA1, NAPIL1, BBS10, OSBPL8, ZDHHC17, CSRP2, E2F7, LOC100507484, NAV3, LOC100507498, SYT1, MIR1252, PAWR, PPPIR12A, OTOGL, PTPRQ, MYF6, MYF5, LIN7A, MIR617, MIR618, ACSS3, MIR4699, PPFIA2, CCDC59, METTL25, TMTC2, SLC6A15, TSPAN19, LRRIQ1, ALX1, RASSF9, NTS, MGAT4C, LOC100507559, MKRN9P, C12orf50, C12orf29, CEP290, TMTC3, KITLG, LOC728084, DUSP6, POC1B, POC1B-GALNT4, GALNT4, ATP2B1, LOC338758, LOC100507594, LINC00615, CCER1, EPYC, KERA, LUM, DCN, LOC256021, BTG1, CLLU1OS, CLLU1, C12orf74, PLEKHG7, EEA1, LOC643339, NUDT4, UBE2N, MRPL42, SOCS2-AS1, SOCS2, CRADD, PLXNC1, CCDC41, LOC144486, MIR5700, TMCC3, MIR492, KRT19P2, NDUFA12, NR2C1, FGD6, VEZT, MIR331, MIR3685, METAP2, USP44, NTN4, LOC100505645, SNRPF, CCDC38, AMDHD1, HAL, LTA4H, ELK3, CDK17, C12orf55, LOC100996254, NEDD1, RMST, MIR1251, MIR135A2, RNU6-36, MIR4495, MIR4303, SLC9A7P1, LOC643770, TMPO-AS1, TMPO, SLC25A3, SNORA53, IKBIP, APAF1, ANKS1B, FAM71C, UHRF1BP1L, GOLGA2P5, MIR1827, ACTR6, DEPDC4, SCYL2, SLC17A8, NR1H4, GAS2L3, ANO4, SLC5A8, UTP20, ARL1, SPIC, MYBPC1, CHPT1, SYCP3, GNPTAB, DRAM1, CCDC53, NUP37, PARPBP, PMCH, IGF1, LINC00485, PAH, ASCL1, C12orf42, STAB2, NT5DC3, GNN, HSP90B1, MIR3652, C12orf73, TDG, GLT8D2, HCFC2, NFYB, TXNRD1, EID3, CHST11, IGANRP, MIR3922, SLC41A2, C12orf45, ALDH1L2, KIAA1033, APPL2, C12orf75, NUAK1, CKAP4, TCP11L2, POLR3B, LOC100287944, RFX4, LOC100505978, RIC8B, C12orf23, MTERFD3, CRY1, BTBD11, PWP1, PRDM4, ASCL4, LOC728739, WSCD2, CMKLR1, FICD, SART3, ISCU, TMEM119, SELPLG, MIR4496, COROIC, SSH1, MIR619, DAO, SVOP, USP30-AS1, USP30, ALKBH2, UNG, ACACB, FOXN4, MYO1H, KCTD10, UBE3B, MMAB, MVK, FAM222A, FAM222A-AS1, TRPV4, MIR4497, GLTP, TCHP, GIT2, ANKRD13A, C12orf76, IFT81, ATP2A2, ANAPC7, ARPC3, GPN3, FAM216A, VPS29, RAD9B, PPTC7, TCTN1, HVCN1, PPP1CC, CCDC63, MYL2, LOC100131138, CUX2, FAM109A, SH2B3, ATXN2, BRAP, ACAD10, ALDH2, MAPKAPK5-AS1, MAPKAPK5, ADAM1A, TMEM116, ERP29, NAA25, MIR3657, TRAFD1, HECTD4, RPL6, PTPN11, MIR1302-1, RPH3A, OAS1, OAS3, OAS2, DTX1, RASAL1, CCDC42B, DDX54, C12orf52, IQCD, TPCN1, SLC24A6, PLBD2, SDS, SDSL, LHX5, LOC100506465, RBM19, TBX5, TBX5-AS1, TBX3, MED13L, MIR620, MIR4472-2, LINC00173, MAP1LC3B2, C12orf49, RNFT2, HRK, FBXW8, TESC, FBXO21, NOS1, KSR2, RFC5, WSB2, LOC100128895, VSIG10, PEBP1, TAOK3, SUDS3, SRRM4, HSPB8, LOC144742, CCDC60, TMEM233, PRKAB1, CIT, MIR1178, CCDC64, RAB35, GCN1L1, MIR4498, RPLP0, PXN-AS1, PXN, LOC100996317, RNU4-2, RNU4-1, SIRT4, PLA2G1B, MSI1, COX6A1, TRIAP1, GATC, SRSF9, DYNLL1, LOC100506668, COQ5, RNF10, POP5, CABP1, MLEC, UNC119B, MIR4700, ACADS, SPPL3, HNF1A-AS1, HNF1A, C12orf43, OASL, P2RX7, P2RX4, CAMKK2, ANAPC5, RNF34, KDM2B, ORAI1, MORN3, TMEM120B, RHOF, LOC338799, SETDIB, HPD, PSMD9, WDR66, BCL7A, LOC100506691, MLXIP, LRRC43, IL31, B3GNT4, DIABLO, VPS33A, CLIP1, LOC100507066, ZCCHC8, RSRC2, KNTC1, HCAR2, HCAR3, HCAR1, DENR, CCDC62, HIP1R, VPS37B, ABCB9, OGFOD2, ARL6IP4, PITPNM2, MIR4304, LOC100507091, MPHOSPH9, C12orf65, CDK2AP1, SBNO1, LOC100293704, SETD8, RILPL2, SNRNP35, RILPL1, MIR3908, TMED2, DDX55, EIF2B1, GTF2H3, TCTN2, ATP6V0A2, DNAH10, CCDC92, ZNF664, ZNF664-FAM101A, FAM101A, NCOR2, SCARB1, UBC, MIR5188, DHX37, BRI3BP, AACS, TMEM132B, LOC400084, LOC100128554, LOC100996671, LOC387895, LOC100507206, LOC440117, FLJ37505, LINC00507, MIR4419B, TMEM132C, MIR3612, SLC15A4, LOC100128276, GLTID1, TMEM132D, LOC100190940, FLJ31485, FZD10, PIWIL1, RIMBP2, STX2, RAN, GPR133, LOC100128840, LOC116437, LOC100128002, LOC338797, LOC100996701, SFSWAP, MMP17, ULK1, PUS1, EP400, SNORA49, EP400NL, DDX51, NOC4L, LOC100996246, GALNT9, LOC100130238, LOC100506978, FBRSL1, LOC100996573, LRCOL1, P2RX2, POLE, PXMP2, PGAM5, ANKLE2, GOLGA3, CHFR, ZNF605, ZNF26, ZNF84, ZNF140, ZNF10, ZNF268, ANHX, ANKRD20A9P, RNU6-55, RNU6-76, LOC100652856, LINC00442, RNU6-52, TUBA3C, ANKRD26P3, LINC00421, TPTE2, MPHOSPH8, PSPC1, ZMYM5, ZMYM2, GJA3, GJB2, GJB6, CRYL1, MIR4499,
IFT88, IL17D, N6AMT2, XPO4, LATS2, SAP18, SKA3, MRP63, MIPEPP3, LINC00539, ZDHHC20, EFHA1, RNU6-59, FGF9, LINC00424, LINC00540, BASP1P1, SGCG, RNU6-58, SACS, SACS-AS1, LINC00327, TNFRSF19, MIPEP, CIQTNF9B-AS1, CIQTNF9B, ANKRD20A19P, SPATA13, MIR2276, SPATA13-AS1, CIQTNF9, PARP4, TPTE2P6, ATP12A, RNF17, CENPJ, TPTE2P1, LOC100996470, PABPC3, FAM123A, LOC100996347, MTMR6, NUPL1, ATP8A2, RNU6-78, SHISA2, RNF6, CDK8, WASF3, GPR12, USP12, RPL21, SNORD102, SNORA27, RASL11A, GTF3A, MTIF3, RNU6-63, LNX2, POLRID, LOC100506997, GSX1, PDX1, ATPSEP2, LINC00543, CDX2, PRHOXNB, FLT3, PAN3-AS1, PAN3, RNU6-82, FLT1, POMP, SLC46A3, RNU6-53, MTUS2, MTUS2-AS1, SLC7A1, UBL3, LINC00297, LINC00544, KATNAL1, RNU6-64, LINC00427, LINC00426, HMGB1, USPL1, ALOX5AP, LINC00398, LINC00545, TEX26-AS1, MEDAG, TEX26, HSPH1, B3GALTL, RXFP2, EEF1DP3, FRY-AS1, FRY, ZAR1L, BRCA2, N4BP2L1, N4BP2L2, MINOS1P1, N4BP2L2-IT2, PDS5B, LINC00423, KL, STARD13, STARD13-AS2, RFC3, LINC00457, NBEA, MAB21L1, LINC00445, DCLK1, SOHLH2, CCDC169-SOHLH2, CCDC169, RNU6-71, SPG20, SPG20OS, CCNA1, SERTM1, RFXAP, SMAD9, ALG5, EXOSC8, FAM48A, CSNK1A1L, LINC00547, POSTN, TRPC4, LINC00571, UFM1, LINC00366, FREM2, RNU6-56, STOML3, PROSER1, NHLRC3, LHFP, COG6, MIR4305, LINC00332, LINC00548, LINC00598, FOXO1, MIR320D1, MRPS31, SLC25A15, TPTE2P5, MIR621, SUGTIP3, ELF1, WBP4, MIR3168, KBTBD6, KBTBD7, MTRF1, NAA16, RNU6-57, OR7E37P, RGCC, VWA8, MIR5006, VWA8-AS1, DGKH, AKAP11, TNFSF11, FAM216B, EPSTII, DNAJC15, ENOX1, CCDC122, LACCI, LINC00284, SMIM2, SMIM2-IT1, SERP2, TSC22D1, TSC22D1-AS1, LINC00330, NUFIP1, KIAA1704, LOC100996395, GTF2F2, RNU6-69, KCTD4, TPT1, SNORA31, TPT1-AS1, SLC25A30, SLC25A30-AS1, COG3, FAM194B, SPERT, SIAH3, ZC3H13, CPB2-AS1, CPB2, LCP1, LINC00563, KIAA0226L, RNU6-68, LOC731932, LRCH1, ESD, HTR2A, SUCLA2, NUDT15, MED4, MED4-AS1, ITM2B, LINC00441, RB1, LPAR6, RCBTB2, LOC100996412, LOC100996416, LINC00462, CYSLTR2, FNDC3A, MLNR, CDADC1, CAB39L, SETDB2, PHF11, RCBTB1, ARL11, EBPL, KPNA3, CTAGE10P, SPRYD7, DLEU2, MIR3613, TRIM13, KCNRG, MIR16-1, MIR15A, DLEU1, FLJ31945, ST13P4, DLEU7, DLEU7-AS1, RNASEH2B-AS1, RNASEH2B, GUCY1B2, LINC00371, FAM124A, SERPINE3, MIR5693, INTS6, INTS6-AS1, MIR4703, WDFY2, DHRS12, LINC00282, CCDC70, ATP7B, ALG11, UTP14C, LOC100506859, NEK5, NEK3, MRPS31P5, TPTE2P2, THSD1, VPS36, CKAP2, TPTE2P3, HNRNPAIL2, SUGTI, LECT1, MIR759, PCDH8, OLFM4, LINC00558, LINC00458, MIR1297, MIR5007, PRR20A, PRR20B, PRR20C, PRR20D, PRR20E, PCDH17, DIAPH3, DIAPH3-AS1, DIAPH3-AS2, TDRD3, MIR3169, PCDH20, OR7E156P, LOC647264, RNU6-81, MIR548X2, MIR4704, PCDH9, PCDH9-AS2, PCDH9-AS3, LINC00550, KLHL1, ATXN8OS, LINC00348, DACH1, MZT1, BORA, DIS3, PIBF1, RNU6-79, KLF5, RNU6-66, KLF12, LINC00402, LOC100288208, LINC00381, LINC00347, CTAGE11P, TBC1D4, COMMD6, UCHL3, LMO7, C13orf45, KCTD12, BTF3P11, IRG1, CLN5, FBXL3, MYCBP2, MYCBP2-AS1, SCEL, LOC100129307, SLAIN1, MIR3665, LOC100505518, EDNRB, LINC00439, LINC00446, POU4F1-AS1, POU4F1, RNF219, LINC00331, RBM26, RBM26-AS1, NDFIP2-AS1, NDFIP2, SPRY2, RNU6-67, SLITRK1, LINC00333, LINC00351, RNU6-72, SLITRK6, MIR4500HG, MIR4500, SLITRK5, LINC00433, LINC00353, LINC00559, MIR622, RNU6-75, LINC00410, LINC00379, MIR17HG, MIR17, MIR18A, MIR19A, MIR20A, MIR19B1, MIR92A1, GPC5, MIR548AS, GPC5-AS1, GPC6, GPC6-AS2, DCT, TGDS, GPR180, SOX21, ABCC4, CLDN10, CLDN10-AS1, DZIP1, DNAJC3, UGGT2, HS6ST3, MIR4501, LINC00359, OXGR1, MBNL2, RAP2A, IPO5, FARP1, RNF113B, MIR3170, STK24, SLC15A1, DOCK9, RNU6-83, UBAC2-AS1, UBAC2, GPR18, GPR183, FKSG29, MIR623, TM9SF2, CLYBL, MIR4306, ZIC5, ZIC2, PCCA, PCCA-AS1, GGACT, LOC100507654, TMTC4, LOC100996276, NALCN-AS1, NALCN, ITGBL1, FGF14, MIR2681, MIR4705, FGF14-IT1, FGF14-AS2, TPP2, METTL21C, CCDC168, TEX30, KDELC1, BIVM, BIVM-ERCC5, ERCC5, METTL21EP, SLC10A2, DAOA-AS1, DAOA, LINC00343, LINC00460, EFNB2, ARGLU1, LINC00551, LINC00443, FAM155A, MIR1267, LIG4, ABHD13, TNFSF13B, MYO16, MYO16-AS1, IRS2, COL4A1, COL4A2, COL4A2-AS2, COL4A2-AS1, RAB20, CARKD, CARS2, ING1, LINC00346, ANKRD10, ANKRD10-IT1, LOC100996267, ARHGEF7, TEX29, SOX1, LINC00403, SPACA7, TUBGCP3, C13orf35, ATP11A, LOC100506063, MCF2L-AS1, MCF2L, F7, F10, PROZ, PCID2, CUL4A, LAMP1, GRTP1, ADPRHL1, DCUNID2, TMCO3, TFDP1, ATP4B, GRK1, LINC00552, FAM70B, GAS6-AS1, GAS6, LOC100506394, LINC00452, LINC00565, RASA3, CDC16, MIR548AR, MIR4502, UPF3A, CHAMP1, OR11H12, LOC642426, POTEG, LOC100506303, FLJ39632, POTEM, OR11H2, OR4Q3, OR4M1, OR4N2, OR4K2, OR4K5, OR4K1, OR4K15, OR4K14, OR4K13, OR4L1, OR4K17, OR4N5, OR11G2, OR11H6, OR11H4, TTC5, CCNB1IP1, SNORD126, RPPH1, PARP2, TEP1, KLHL33, OSGEP, APEX1, TMEM55B, PNP, RNASE10, RNASE9, RNASE11, RNASE12, OR6S1, ANG, RNASE4, EDDM3A, EDDM3B, RNASE6, RNASE1, LOC100507513, RNASE3, ECRP, RNASE2, METTL17, SLC39A2, NDRG2, TPPP2, RNASE13, RNASE7, RNASE8, ARHGEF40, ZNF219, TMEM253, OR5AU1, LINC00641, HNRNPC, RPGRIP1, SUPT16H, CHD8, SNORD9, SNORD8, RAB2B, TOX4, METTL3, SALL2, OR10G3, OR10G2, OR4E2, DAD1, ABHD4, OXA1L, SLC7A7, MRPL52, MMP14, LRP10, REM2, RBM23, PRMT5-AS1, PRMT5, HAUS4, MIR4707, AJUBA, C14orf93, PSMB5, PSMB11, CDH24, ACINI, C14orf119, LOC100128908, CEBPE, SLC7A8, C14orf164, HOMEZ, PPPIR3E, BCL2L2-PABPN1, BCL2L2, PABPN1, SLC22A17, EFS, IL25, CMTM5, MYH6, MIR208A, MYH7, MIR208B, NGDN, THTPA, ZFHX2, AP1G2, JPH4, DHRS2, DHRS4-AS1, DHRS4, DHRS4L2, DHRS4L1, LRRC16B, CPNE6, NRL, PCK2, DCAF11, FITM1, PSME1, EMC9, PSME2, RNF31, IRF9, REC8, IPO4, TM9SF1, TSSK4, CHMP4A, MDP1, NEDD8-MDP1, NEDD8, GMPR2, TINF2, TGM1, RABGGTA, DHRS1, NOP9, CIDEB, LTB4R2, LTB4R, ADCY4, RIPK3, NFATC4, NYNRIN, CBLN3, KHNYN, SDR39U1, CMA1, CTSG, GZMH, GZMB, STXBP6, NOVA1, MIR4307, LOC728755, LINC00645, FOXG1, C14orf23, LOC100506004, LOC100996589, PRKD1, G2E3, SCFD1, COCH, LOC100506071, STRN3, MIR624, AP4S1, HECTD1, HEATRSA, DTD2, GPR33, NUBPL, LOC100506110, ARHGAP5-AS1, ARHGAP5, AKAP6, NPAS3, EGLN3, SPTSSA, EAPP, RNU1-7, RNU1-8, SNX6, CFL2, BAZIA, IGBP1P1, LOC100506157, SRP54, FAM177A1, PPP2R3C, KIAA0391, PSMA6, NFKBIA, INSM2, RALGAPA1, BRMS1L, PTCSC3, MBIP, SFTA3, NKX2-1, NKX2-1-AS1, NKX2-8, PAX9, SLC25A21, MIR4503, LOC100129794, MIPOL1, FOXA1, TTC6, SSTR1, CLEC14A, LINC00639, SEC23A, GEMIN2, TRAPPC6B, PNN, MIA2, CTAGE5, LOC100288846, FBXO33, LRFN5, FSCB, C14orf28, KLHL28, FAM179B, LOC100996613, PRPF39, SNORD127, FKBP3, FANCM, MIS18BP1, RPL10L, MDGA2, MIR548Y, LINC00648, RPS29, RN7SL1, LRR1, RPL36AL, MGAT2, DNAAF2, POLE2, KLHDC1, KLHDC2, NEMF, RN7SL2, ARF6, C14orf182, LOC100506499, C14orf183, METTL21D, SOS2, L2HGDH, MIR4504, ATP5S, CDKL1, MAP4K5, ATL1, SAV1, NIN, ABHD12B, PYGL, TRIM9, TMX1, LINC00640, FRMD6-AS2, FRMD6, FRMD6-AS1, GNG2, C14orf166, NID2, PTGDR, PTGER2, TXNDC16, GPR137C, ERO1L, PSMC6, STYX, GNPNAT1, FERMT2, DDHD1, MIR5580, BMP4, CDKN3, CNIH, GMFB, CGRRF1, SAMD4A, GCH1, MIR4308, WDHD1, SOCS4, MAPK1IP1L, LGALS3, DLGAP5, FBXO34, ATG14, TBPL2, KTN1-AS1, KTN1, RPL13AP3, LINC00520, PELI2, C14orf101, OTX2, OTX2-AS1, EXOC5, AP5M1, NAA30, C14orf105, SLC35F4, C14orf37, ACTR10, PSMA3, FLJ31306, ARID4A, TOMM20L, TIMM9, KIAA0586, DACT1, DAAM1, GPR135, L3HYPDH, JKAMP, CCDC175, RTN1, MIR5586, LRRC9, PCNXL4, DHRS7, PPMIA, C14orf39, SIX6, SIX1, SIX4, MNAT1, TRMT5, SLC38A6, TMEM30B, PRKCH, FLJ22447, HIF1A, HIF1A-AS2, SNAPC1, SYT16, LINC00643, KCNH5, RHOJ, GPHB5, PPP2R5E, WDR89, SGPP1, SYNE2, MIR548H1, ESR2, TEX21P, MTHFD1, AKAP5, ZBTB25, ZBTB1, HSPA2, PPPIR36, PLEKHG3, SPTB, CHURC1, CHURC1-FNTB, GPX2, RAB15, FNTB, MAX, MIR4706, LOC100506321, MIR4708, FUT8, FUT8-AS1, MIR625, LINC00238, GPHN, FAM71D, MPP5, ATP6V1D, EIF2S1, PLEK2, MIR5694, TMEM229B, PLEKHH1, PIGH, ARG2, VTI1B, RDH11, RDH12, ZFYVE26, RAD51B, LOC100996664, ZFP36L1, ACTN1, DCAF5, EXD2, GALNTL1, ERH, SLC39A9, PLEKHD1, CCDC177, KIAA0247, LOC100289511, SRSF5, SLC10A1, LOC100506358, SMOC1, SLC8A3, ADAM21P1, SYNJ2BP-COX16, COX16, SYNJ2BP, ADAM21, ADAM20P1, ADAM20, MED6, TTC9, MAP3K9, PCNX, SNORD56B, LOC145474, SIPA1L1, RGS6, DPF3, DCAF4, ZFYVE1, RBM25, PSEN1, PAPLN, NUMB, HEATR4, C14orf169, ACOT1, ACOT2, ACOT4, ACOT6, DNAL1, PNMA1, ELMSAN1, MIR4505, LOC100506476, LOC100506498, PTGR2, ZNF410, FAM161B, COQ6, ENTPD5, CCDC176, ALDH6A1, LIN52, VSX2, ABCD4, VRTN, SYNDIG1L, NPC2, MIR4709, ISCA2, LTBP2, KIAA0317, FCF1, YLPM1, PROX2, DLST, RPS6KL1, PGF, EIF2B2, MLH3, ACYP1, ZC2HC1C, NEK9, TMED10, FOS, LOC731223, JDP2, BATF, FLVCR2, C14orf1, TTLL5, TGFB3, IFT43, GPATCH2L, ESRRB, VASH1, ANGEL1, C14orf166B, IRF2BPL, KIAA1737, ZDHHC22, TMEM63C, NGB, MIR1260A, POMT2, GSTZ1, TMED8, SAMD15, NOXRED1, VIPAS39, AHSA1, ISM2, SPTLC2, ALKBH1, SLIRP, SNW1, C14orf178, ADCK1, NRXN3, DIO2, DIO2-AS1, CEP128, TSHR, GTF2A1, SNORA79, STON2, LOC100506700, SEL1L, LOC100996280, FLRT2, LOC100506718, LOC283585, GALC, GPR65, LOC283587, KCNK10, SPATA7, PTPN21, ZC3H14, EML5, TTC8, FOXN3, LOC100128075, FOXN3-AS1, FOXN3-AS2, LOC100506792, EFCAB11, TDP1, KCNK13, PSMC1, NRDE2, CALM1, LINC00642, TTC7B, LOC283588, RPS6KA5, C14orf159, SNORA11B, GPR68, CCDC88C, SMEK1, CATSPERB, TC2N, FBLN5, TRIP11, ATXN3, NDUFB1, CPSF2, SLC24A4, RIN3, LGMN, GOLGA5, CHGA, ITPK1, ITPK1-AS1, MOAP1, TMEM251, C14orf142, UBR7, BTBD7, UNC79, COX8C, PRIMA1, FAM181A-AS1, FAM181A, ASB2, MIR4506, LINC00521, OTUB2, DDX24, IFI27L1, IFI27, IFI27L2, PPP4R4, SERPINA10, SERPINA6, SERPINA1, SERPINA11, SERPINA9, SERPINA12, SERPINA4, SERPINA5, SERPINA3, SERPINA13P, GSC, DICER1, MIR3173, DICER1-AS1, CLMN, LINC00341, SYNE3, LOC100506972, SNHG10, SCARNA13, GLRX5, LOC100506999, TCL6, TCL1B, TCL1A, LOC100133207, LINC00617, C14orf132, BDKRB2, BDKRB1, LOC100130815, ATG2B, GSK1P, AK7, PAPOLA, VRK1, LOC100129345, C14orf64, C14orf177, BCL11B, SETD3, CCNK, CCDC85C, LOC100507108, HHIPL1, CYP46A1, EML1, EVL, MIR151B, MIR342, DEGS2, YY1, SLC25A29, MIR345, SLC25A47, WARS, WDR25, BEGAIN, LINC00523, DLK1, MIR2392, MEG3, MIR770, MIR493, MIR337, MIR665, RTL1, MIR431, MIR433, MIR127, MIR432, MIR136, LOC100288160, MEG8, SNORD112, MIR370, SNORD113-1, SNORD113-2, SNORD113-3, SNORD113-4, SNORD113-5, SNORD113-6, SNORD113-7, SNORD113-8, SNORD113-9, LOC100507242, SNORD114-1, SNORD114-2, SNORD114-3, SNORD114-4, SNORD114-5, SNORD114-6, SNORD114-7, SNORD114-8, SNORD114-9, SNORD114-10, SNORD114-11, SNORD114-12, SNORD114-13, SNORD114-14, SNORD114-15, SNORD114-16, SNORD114-17, SNORD114-18, SNORD114-19, SNORD114-20, SNORD114-21, SNORD114-22, SNORD114-23, SNORD114-24, SNORD114-25, SNORD114-26, SNORD114-27, SNORD114-28, SNORD114-29, SNORD114-30, SNORD114-31, MIR379, MIR411, MIR299, MIR380, MIR1197, MIR323A, MIR758, MIR329-1, MIR329-2, MIR494, MIR1193, MIR543, MIR495, MIR376C, MIR376A2, MIR654, MIR376B, MIR376A1, MIR300, MIR1185-1, MIR1185-2, MIR381, MIR487B, MIR539, MIR889, MIR544A, MIR655, MIR487A, MIR382, MIR134, MIR668, MIR485, MIR323B, MIR154, MIR496, MIR377, MIR541, MIR409, MIR412, MIR369, MIR410, MIR656, MEG9, LOC100507277, DIO3OS, MIR1247, DIO3, LINC00239, PPP2R5C, LOC100653021, DYNC1H1, HSP90AA1, WDR20, MOK, ZNF839, CINP, TECPR2, ANKRD9, MIR4309, RCOR1, TRAF3, AMN, CDC42BPB, EXOC3L4, TNFAIP2, LINC00605, EIF5, SNORA28, MARK3, CKB, TRMT61A, BAG5, APOPT1, KLC1, XRCC3, ZFYVE21, PPP1R13B, LINC00637, C14orf2, TDRD9, RD3L, ASPG, MIR203, MIR3545, KIF26A, C14orf180, LOC100288144, TMEM179, MIR4710, INF2, ADSSL1, SIVA1, AKT1, ZBTB42, LINC00638, KIAA0284, PLD4, AHNAK2, C14orf79, CDCA4, GPR132, JAG2, NUDT14, BRF1, BTBD6, PACS2, TEX22, LOC100507437, MTA1, LOC100128343, CRIP2, CRIP1, C14orf80, TMEM121, MIR4507, KIAA0125, ADAM6, LINC00226, LINC00221, CHEK2P2, HERC2P3, GOLGA6L6, GOLGA8CP, NBEAP1, MIR3118-4, MIR5701-1, LOC348120, LOC646214, CXADRP2, MIR3118-6, NF1P2, MIR5701-2, LOC727924, OR4M2, OR4N4, OR4N3P, MIR1268A, REREP3, MIR4509-1, GOLGA8DP, GOLGA6L1, TUBGCP5, CYFIP1, NIPA2, NIPA1, LOC283683, WHAMMP3, GOLGA8I, HERC2P2, HERC2P7, GOLGA8EP, LOC100996599, LOC440243, GOLGA8S, GOLGA6L2, MIR4508, MKRN3, MAGEL2, NDN, PWRN2, PWRN1, NPAP1, SNRPN, SNURF, SNORD107, PAR-SN, PAR5, SNORD64, SNORD108, LOC100506948, SNORD109A, SNORD116-1, SNORD116-2, SNORD116-3, SNORD116-4, SNORD116-5, SNORD116-6, SNORD116-7, SNORD116-8, SNORD116-9, SNORD116-10, SNORD116-11, SNORD116-12, SNORD116-13, SNORD116-14, SNORD116-15, SNORD116-16, SNORD116-17, SNORD116-18, SNORD116-19, SNORD116-20, SNORD116-21, SNORD116-22, SNORD116-23, SNORD116-24, SNORD116-25, SNORD116-26, SNORD116-27, SNORD116-28, SNORD116-29, IPW, PAR1, SNORD115-1, SNORD115-2, SNORD115-3, SNORD115-4, SNORD115-5, SNORD115-6, SNORD115-7, SNORD115-8, SNORD115-9, SNORD115-10, SNORD115-11, SNORD115-12, SNORD115-13, SNORD115-14, SNORD115-15, SNORD115-16, SNORD115-17, SNORD115-18, SNORD115-19, SNORD115-20, SNORD115-21, SNORD115-22, PAR4, SNORD115-23, SNORD115-24, SNORD115-25, SNORD115-26, SNORD115-27, SNORD115-28, SNORD115-29, SNORD115-30, SNORD115-31, SNORD115-32, SNORD115-33, SNORD115-34, SNORD115-35, SNORD115-36, SNORD115-37, SNORD115-38, SNORD115-39, SNORD115-40, SNORD115-41, SNORD115-42, SNORD115-43, SNORD115-44, SNORD115-45, SNORD115-47, SNORD115-48, SNORD109B, UBE3A, ATP10A, MIR4715, LOC100128714, LOC503519, GABRB3, GABRA5, GABRG3, OCA2, HERC2, LOC100996625, LOC645202, GOLGA8F, MIR4509-2, MIR4509-3, GOLGA8G, LOC100132202, LOC100996644, HERC2P9, WHAMMP2, LOC100289656, LOC646278, GOLGA6L7P, APBA2, FAM189A1, NDNL2, LOC100130111, TJP1, GOLGA8J, ULK4P3, GOLGA8T, DKFZP434L187, CHRFAM7A, LOC100996413, ULK4P2, GOLGA8H, ARHGAP11B, LOC100288637, HERC2P10, FAN1, MTMR10, TRPM1, MIR211, LOC283710, KLF13, OTUD7A, CHRNA7, LOC100996675, GOLGA8K, ULK4P1, GOLGA8O, WHAMMP1, LOC100996255, ARHGAP11A, SCG5, GREM1, FMN1, TMCO5B, RYR3, AVEN, CHRM5, EMC7, PGBD4, KATNBL1, EMC4, SLC12A6, NOP10, C15orf55, LPCAT4, GOLGA8A, MIR1233-1, GOLGA8B, MIR1233-2, GJD2, ACTC1, AQR, ZNF770, ANP32AP1, ATPBD4, MIR3942, ATPBD4-AS1, MIR4510, LOC100507480, C15orf41, CSNK1A1P1, LOC145845, MEIS2, TMCO5A, SPRED1, FAM98B, RASGRP1, C15orf53, C15orf54, THBS1, FSIP1, GPR176, LOC100505534, EIF2AK4, SRP14, LOC100131089, BMF, BUB1B, PAK6, C15orf56, ANKRD63, PLCB2, C15orf52, PHGR1, DISP2, C15orf23, IVD, BAHD1, CHST14, MRPL42P5, C15orf57, RPUSD2, CASC5, LOC100505648, RAD51, FAM82A2, GCHFR, DNAJC17, C15orf62, ZFYVE19, PPP1R14D, SPINT1, RHOV, VPS18, DLL4, CHAC1, INO80, EXD1, CHP1, OIP5-AS1, OIP5, NUSAP1, NDUFAF1, RTF1, ITPKA, LTK, RPAP1, TYRO3, MGA, MIR626, MAPKBP1, JMJD7, JMJD7-PLA2G4B, PLA2G4B, SPTBN5, MIR4310, LOC100289090, EHD4, PLA2G4E, PLA2G4D, PLA2G4F, VPS39, MIR627, TMEM87A, GANC, CAPN3, ZFP106, SNAP23, LRRC57, HAUS2, STARD9, CDAN1, TTBK2, UBR1, TMEM62, CCNDBP1, EPB42, TGM5, TGM7, LCMT2, ADAL, ZSCAN29, TUBGCP4, TP53BP1, MAP1A, PPIP5K1, CKMT1B, STRC, CATSPER2, CKMT1A, CATSPER2P1, PDIA3, ELL3, SERF2, SERF2-C15ORF63, MIR1282, SERINC4, HYPK, MFAP1, WDR76, FRMD5, PIN4P1, CASC4, CTDSPL2, LOC645212, EIF3J, SPG11, PATL2, B2M, TRIM69, C15orf43, SORD, DUOX2, DUOXA2, DUOXA1, DUOX1, SHF, SLC28A2, GATM, GATM-AS1, SPATA5L1, C15orf48, MIR147B, SLC30A4, HMGN2P46, BLOCIS6, SQRDL, SEMA6D, SLC24A5, MYEF2, CTXN2, SLC12A1, DUT, FBN1, LOC100506059, CEP152, SHC4, EID1, SECISBP2L, COPS2, GALK2, NDUFAF4P1, MIR4716, FAM227B, FGF7, DTWD1, ATP8B4, SLC27A2, HDC, GABPB1, FLJ10038, GABPB1-AS1, MIR4712, USP8, USP50, TRPM7, SPPL2A, AP4E1, DCAF13P3, TNFAIP8L3, CYP19A1, MIR4713, LOC100652954, LOC100996299, GLDN, DMXL2, SCG3, LYSMD2, TMOD2, TMOD3, LEO1, MAPK6, BCL2L10, GNB5, LOC100129973, MYO5C, MIR1266, MYO5A, ARPP19, FAM214A, ONECUT1, WDR72, UNC13C, RSL24D1, RAB27A, PIGB, DYX1C1-CCPG1, CCPG1, MIR628, FLJ27352, DYX1C1, PYGO1, PRTG, NEDD4, RFX7, TEX9, MNS1, ZNF280D, LOC145783, TCF12, LOC283663, CGNL1, GCOM1, MYZAP, POLR2M, ALDH1A2, AQP9, LIPC, ADAM10, HSP90AB4P, FAM63B, SLTM, RNF111, CCNB2, MYO1E, MIR2116, LDHAL6B, FAM81A, GCNT3, GTF2A2, BNIP2, FOXB1, ANXA2, NARG2, RORA, LOC100506530, VPS13C, C2CD4A, C2CD4B, MGC15885, TLN2, MIR190A, TPM1, LOC100128979, LACTB, RPS27L, RAB8B, APH1B, CA12, USP3, LOC100130855, FBXL22, HERC1, MIR422A, DAPK2, FAM96A, SNX1, SNX22, PPIB, CSNK1G1, KIAA0101, TRIP4, ZNF609, OAZ2, RBPMS2, MIR1272, PIF1, PLEKHO2, ANKDD1A, SPG21, MTFMT, SLC51B, RASL12, KBTBD13, UBAP1L, PDCD7, CLPX, CILP, PARP16, RNU5A-1, RNU5B-1, IGDCC3, IGDCC4, DPP8, PTPLAD1, RNU6-19, VWA9, SLC24A1, DENND4A, MIR4511, RAB11A, MEGF11, MIR4311, DIS3L, TIPIN, SCARNA14, MAP2K1, SNAPC5, MIR4512, RPL4, SNORD18C, SNORD18B, SNORD16, SNORD18A, ZWILCH, LCTL, SMAD6, SMAD3, AAGAB, IQCH, IQCH-AS1, C15orf61, MAP2K5, SKOR1, RNU6-1, PIAS1, CALML4, CLN6, FEM1B, ITGA11, CORO2B, ANP32A, MIR4312, ANP32A-IT1, SPESP1, NOX5, LINC00277, GLCE, PAQR5, LOC145694, KIF23, RPLP1, LOC145837, LINC00593, TLE3, MIR629, UACA, LARP6, THAP10, LRRC49, CT62, THSD4, NR2E3, MYO9A, SENP8, GRAMD2, PKM, PARP6, CELF6, HEXA, HEXA-AS1, TMEM202, ARIH1, MIR630, LOC646670, GOLGA6B, HIGD2B, BBS4, ADPGK, ADPGK-AS1, NEO1, HCN4, C15orf60, NPTN, CD276, C15orf59, TBC1D21, LOXL1-AS1, LOXL1, STOML1, PML, GOLGA6A, LOC732265, LOC283731, ISLR2, ISLR, STRA6, CCDC33, CYP11A1, LOC729739, SEMA7A, UBL7, LOC440288, ARID3B, CLK3, EDC3, CYP1A1, CYP1A2, CSK, MIR4513, LMAN1L, CPLX3, ULK3, SCAMP2, MPI, FAM219B, COX5A, RPP25, SCAMP5, PPCDC, C15orf39, GOLGA6C, GOLGA6D, COMMD4, NEIL1, MIR631, MAN2C1, SIN3A, PTPN9, SNUPN, IMP3, SNX33, CSPG4, ODF3L1, DNM1P35, MIR4313, LOC441728, LOC730058, UBE2Q2, FBXO22, FBXO22-AS1, NRG4, C15orf27, ETFA, TYRO3P, ISL2, SCAPER, MIR3713, RCN2, PSTPIP1, TSPAN3, PEAK1, LINC00597, HMG20A, LINGO1, LOC253044, LOC645752, LOC440292, LOC91450, TBC1D2B, SH2D7, CIB2, IDH3A, ACSBG1, DNAJA4, WDR61, CRABP1, IREB2, AGPHD1, PSMA4, CHRNA5, CHRNA3, CHRNB4, LOC646938, ADAMTS7, MORF4L1, CTSH, RASGRF1, LOC100129540, LOC729911, MIR184, ANKRD34C, TMED3, KIAA1024, MTHFS, ST20-MTHFS, ST20, C15orf37, BCL2A1, ZFAND6, FAH, LOC100996492, LOC283688, ARNT2, LOC100133746, FAM108C1, KIAA1199, MIR549, MESDC2, MIR4514, MESDC1, C15orf26, IL16, STARD5, TMC3, MEX3B, EFTUD1, FAM154B, LOC390660, GOLGA6L10, UBE2Q2P2, GOLGA6L9, LOC440297, AGSK1, RPS17, LOC643696, UBE2Q2P3, LOC727849, RPS17L, CPEB1, LOC283692, AP3B2, LOC338963, LOC283693, LOC100505616, SCARNA15, FSD2, WHAMM, HOMER2, FAM103A1, C15orf40, BTBD1, MIR4515, TM6SF1, HDGFRP3, BNC1, SH3GL3, ADAMTSL3, LOC648809, DNM1P41, LOC100505679, LOC440300, LOC388152, GOLGA6L4, GOLGA6L5, UBE2Q2P1, LOC100506874, ZSCAN2, SCAND2, WDR73, NMB, SEC11A, ZNF592, ALPK3, SLC28A1, PDE8A, LOC642423, GOLGA6L3, AKAP13, KLHL25, MIR1276, MIR548AP, AGBL1, LOC727915, LINC00052, NTRK3, NTRK3-AS1, MRPL46, MRPS11, DET1, MIR1179, MIR7-2, MIR3529, AEN, ISG20, ACAN, HAPLN3, MFGE8, ABHD2, RLBP1, FANCI, POLG, MIR9-3, LOC254559, RHCG, LOC283761, TICRR, KIF7, PLIN1, PEX11A, WDR93, MESP1, MESP2, ANPEP, AP3S2, C15orf38-AP3S2, MIR5094, MIR5009, C15orf38, ZNF710, MIR3174, IDH2, SEMA4B, CIB1, GDPGP1, TTLL13, NGRN, GABARAPL3, ZNF774, IQGAP1, CRTC3, LOC100507079, BLM, FURIN, FES, MAN2A2, UNC45A, HDDC3, RCCD1, PRC1, LOC100507118, VPS33B, SV2B, SLCO3A1, ST8SIA2, LOC100507166, C15orf32, LOC100144604, FAM174B, LOC643797, ASB9P1, LOC100507217, LOC100996653, CHD2, MIR3175, RGMA, UNQ9370, LOC100996663, MCTP2, LOC400456, LOC145820, LOC100507311, LOC100507288, NR2F2-AS1, NR2F2, MIR1469, LOC100507325, LOC100652749, SPATA8, LOC91948, ARRDC4, FAM169B, IGF1R, MIR4714, PGPEP1L, SYNM, TTC23, LRRC28, MEF2A, LYSMD4, DNM1P46, ADAMTS17, FLJ42289, CERS3, LINS, ASB7, LOC440313, ALDHIA3, LRRK1, CHSY1, VIMP, SNRPA1, PCSK6, LOC100507472, TM2D3, TARSL2, LOC100128108, OR4F6, OR4F15, OR4F13P, OR4F4, FAM138E, MIR1302-10, WASH3P, DDX11L9, DDX11L10, POLR3K, SNRNP25, RHBDF1, MPG, NPRL3, HBZ, HBM, HBA2, HBA1, HBQ1, LUC7L, ITFG3, RGS11, ARHGDIG, PDIA2, AXIN1, MRPL28, TMEM8A, LOC100134368, NME4, DECR2, RAB11FIP3, LINC00235, SOLH, MIR5587, MIR3176, C16orf11, NHLRC4, PIGQ, RAB40C, WFIKKN1, C16orf13, LOC100287175, FAM195A, WDR90, RHOT2, RHBDL1, STUB1, JMJD8, WDR24, FBXL16, GS52, METRN, FAM173A, CCDC78, HAGHL, NARFL, MSLN, MIR662, RPUSD1, CHTF18, GNG13, PRR25, LMF1, SOX8, SSTR5-AS1, SSTR5, C1QTNF8, CACNA1H, TPSG1, TPSB2, TPSAB1, TPSD1, UBE2I, BAIAP3, TSR3, GNPTG, UNKL, C16orf91, CCDC154, CLCN7, PTX4, TELO2, IFT140, TMEM204, CRAMP1L, HN1L, MAPK8IP3, MIR3177, NME3, MRPS34, EME2, SPSB3, NUBP2, IGFALS, HAGH, FAHD1, MEIOB, LINC00254, HS3ST6, MSRB1, RPL3L, NDUFB10, RPS2, SNORA10, SNORA64, SNHG9, SNORA78, RNF151, TBL3, NOXO1, GFER, SYNGR3, ZNF598, NPW, SLC9A3R2, NTHL1, TSC2, PKD1, MIR1225, MIR4516, MIR3180-5, RAB26, LOC100507303, SNORD60, TRAF7, CASKIN1, MLST8, BRICD5, PGP, E4F1, DNASE1L2, ECI1, RNPS1, MIR3677, MIR940, MIR4717, ABCA3, ABCA17P, CCNF, C16orf59, NTN3, TBC1D24, ATP6V0C, AMDHD2, CEMP1, MIR3178, PDPK1, LOC652276, FLJ42627, ERVK13-1, KCTD5, PRSS27, SRRM2-AS1, SRRM2, TCEB2, PRSS33, PRSS41, PRSS21, ZG16B, PRSS30P, PRSS22, FLYWCH2, FLYWCH1, KREMEN2, PAQR4, PKMYT1, LINC00514, LOC100507378, CLDN9, CLDN6, TNFRSF12A, HCFC1R1, THOC6, CCDC64B, LOC100128770, MMP25, LOC100996528, LOC100507419, IL32, ZSCAN10, ZNF205-AS1, ZNF205, LOC100507458, ZNF213, CASP16, OR1F1, OR1F2P, ZNF200, MEFV, FLJ39639, ZNF263, TIGD7, ZNF75A, OR2C1, MTRNR2L4, ZNF434, ZNF174, ZNF597, NAA60, C16orf90, CLUAP1, NLRC3, SLX4, DNASE1, TRAP1, CREBBP, ADCY9, SRL, LOC100507501, TFAP4, GLIS2, PAM16, CORO7-PAM16, CORO7, VASN, DNAJA3, NMRAL1, HMOX2, CDIP1, C16orf96, FAM100A, MGRN1, NUDT16L1, ANKS3, C16orf71, ZNF500, SEPT12, LOC440335, ROGD1, GLYR1, UBN1, PPL, SEC14L5, NAGPA, NAGPA-AS1, C16orf89, ALG1, FAM86A, LOC100287538, RBFOX1, LOC440337, TMEM114, METTL22, ABAT, TMEM186, PMM2, CARHSP1, USP7, C16orf72, GRIN2A, ATF7IP2, LOC100287628, EMP2, TEKT5, NUBP1, FAM18A, CIITA, DEXI, LOC100505564, CLEC16A, SOCS1, TNP2, PRM3, PRM2, PRM1, MIR548H2, RMI2, LOC388210, LOC400499, LITAF, SNN, TXNDC11, ZC3H7A, BCAR4, RSL1D1, GSPT1, TNFRSF17, SNX29, FLJ32790, CPPED1, MIR4718, SHISA9, ERCC4, MKL2, LOC100129781, MIR193B, MIR365A, PARN, BFAR, PLA2G10, LOC642778, LOC100652777, LOC642799, ABCC6P2, NOMO1, MIR3179-1, MIR3670-1, MIR3180-1, NPIP, PDXDC1, MIR 1972-1, NTAN1, RRN3, MIR3180-4, LOC100288332, MPV17L, C16orf45, KIAA0430, NDE1, MIR484, MYH11, FOPNL, ABCC1, ABCC6, NOMO3, MIR3179-2, MIR3670-2, MIR3180-2, PKD1P1, XYLT1, LOC100996242, MIR3180-3, MIR3179-3, NOMO2, ABCC6P1, RPS15A, ARL6IP1, SMG1, TMC7, COQ7, ITPRIPL2, SYT17, CLEC19A, TMC5, GDE1, CCP110, C16orf62, C16orf88, IQCK, GPRC5B, GPR139, GP2, UMOD, PDILT, ACSM5, ACSM2A, ACSM2B, ACSM1, THUMPD1, ACSM3, ERI2, LOC81691, DCUN1D3, LYRM1, DNAH3, TMEM159, ZP2, ANKS4B, CRYM, CRYM-AS1, SNX29P1, NPIPL3, LOC100190986, LOC100271836, MIR3680-1, SLC7A5P2, METTL9, IGSF6, OTOA, RRN3P1, LOC100996277, UQCRC2, PDZD9, C16orf52, VWA3A, EEF2K, POLR3E, CDR2, RRN3P3, SMG1P1, LOC100132247, LOC653786, HS3ST2, USP31, SCNN1G, SCNN1B, COG7, GGA2, EARS2, UBFD1, NDUFAB1, PALB2, DCTN5, PLK1, ERN2, CHP2, PRKCB, CACNG3, RBBP6, FLJ45256, TNRC6A, SLC5A11, ARHGAP17, LOC554206, LOC283887, LCMT1, LOC100506655, AQP8, ZKSCAN2, HS3ST4, MIR548W, C16orf82, KDM8, NSMCE1, FLJ21408, IL4R, IL21R, IL21R-AS1, GTF3C1, KIAA0556, GSG1L, XPO6, LOC100506705, SBK1, LOC728741, EIF3CL, CLN3, APOBR, IL27, NUPR1, CCDC101, SULT1A2, SULT1A1, LOC728734, EIF3C, LOC100507607, ATXN2L, TUFM, MIR4721, SH2B1, ATP2A1, LOC100289092, RABEP2, CD19, NFATC2IP, MIR4517, SPNS1, LAT, RRN3P2, SNX29P2, LOC728888, LOC606724, BOLA2, SLX1B, SLX1B-SULT1A4, SULT1A4, LOC388242, LOC440354, MIR3680-2, SLC7A5P1, SPN, QPRT, C16orf54, ZG16, KIF22, MAZ, LOC100289283, PRRT2, PAGR1, MVP, CDIPT, LOC440356, SEZ6L2, ASPHD1, KCTD13, TMEM219, TAOK2, HIRIP3, INO80E, DOC2A, C16orf92, FAM57B, LOC100996332, ALDOA, PPP4C, TBX6, YPEL3, GDPD3, MAPK3, CORO1A, BOLA2B, SLX1A, SLX1A-SULT1A3, SULT1A3, LOC613038, LOC613037, LOC595101, CD2BP2, TBC1D10B, MYLPF, SEPT1, ZNF48, ZNF771, DCTPP1, SEPHS2, ITGAL, LOC100506928, MIR4518, ZNF768, ZNF747, LOC100996344, ZNF764, ZNF688, ZNF785, ZNF689, PRR14, FBRS, LOC730183, SRCAP, SNORA30, LOC100862671, PHKG2, C16orf93, RNF40, ZNF629, MIR4519, BCL7C, MIR762, CTF1, FBXL19-AS1, FBXL19, ORAI3, SETD1A, HSD3B7, STX1B, STX4, ZNF668, ZNF646, PRSS53, VKORC1, BCKDK, KAT8, LOC100507092, LOC100996366, PRSS8, PRSS36, FUS, PYCARD, LOC100652740, TRIM72, PYDC1, ITGAM, ITGAX, ITGAD, COX6A2, ZNF843, ARMC5, TGFB1I1, SLC5A2, C16orf58, LOC100128371, AHSP, CSDAP1, KIAA0664L3, ZNF720, ZNF267, LOC729264, LOC100507221, LOC390705, TP53TG3, SLC6A10P, TP53TG3C, TP53TG3B, LOC653562, LINC00273, LOC100505948, UBE2MP1, LOC283914, LOC146481, LOC100130700, RNA5SP411, FLJ26245, ANKRD26P1, SHCBP1, VPS35, ORC6, MYLK3, C16orf87, GPT2, DNAJA2, NETO2, ITFG1, PHKB, LOC100507534, ABCC12, ABCC11, LONP2, LOC100507577, SIAH1, N4BP1, CBLN1, C16orf78, ZNF423, CNEP1R1, HEATR3, PAPD5, ADCY7, BRD7, NKD1, LOC100996329, SNX20, NOD2, CYLD, SALL1, LOC388276, LOC100505619, TOX3, LOC643714, CHD9, LOC643802, RBL2, AKTIP, RPGRIP1L, FTO, FTO-IT1, LOC100996338, IRX3, LOC100996345, CRNDE, IRX5, LOC100132339, IRX6, MMP2, LPCAT2, CAPNS2, SLC6A2, CES1P2, CES1P1, CES1, CES5A, LOC283856, GNAO1, DKFZP434H168, MIR3935, LOC100505722, AMFR, NUDT21, OGFOD1, BBS2, MT4, MT3, MT2A, MT1L, MT1E, MT1M, MT1JP, MT1A, MT1DP, MT1B, MT1F, MT1G, MT1H, MT1IP, MT1X, LOC100996353, NUP93, MIR138-2, SLC12A3, HERPUD1, CETP, NLRC5, CPNE2, FAM192A, RSPRY1, ARL2BP, PLLP, CCL22, CX3CL1, CCL17, CIAPIN1, COQ9, POLR2C, DOK4, CCDC102A, GPR114, GPR56, GPR97, CCDC135, KATNB1, KIFC3, LOC388282, CNGB1, TEPP, ZNF319, USB1, MMP15, C16orf80, CSNK2A2, CCDC113, PRSS54, GINS3, NDRG4, SETD6, CNOT1, SNORA46, SNORA50, SLC38A7, GOT2, LOC644649, LOC729159, CDH8, RNU6-21, CDH11, LOC283867, CDH5, LOC100505865, BEAN1, TK2, CKLF, CKLF-CMTM1, CMTM1, CMTM2, CMTM3, CMTM4, DYNC1LI2, CCDC79, NAE1, CA7, PDP2, CDH16, RRAD, FAM96B, CES2, CES3, CES4A, CBFB, C16orf70, B3GNT9, TRADD, FBXL8, HSF4, NOL3, KIAA0895L, EXOC3L1, E2F4, ELMO3, MIR328, LRRC29, TMEM208, FHOD1, SLC9A5, PLEKHG4, KCTD19, LRRC36, TPPP3, ZDHHC1, HSD11B2, ATP6V0D1, AGRP, LOC100505942, FAM65A, CTCF, RLTPR, ACD, PARD6A, ENKD1, C16orf86, GFOD2, RANBP10, TSNAXIP1, CENPT, THAP11, NUTF2, EDC4, NRN1L, PSKH1, CTRL, PSMB10, LCAT, SLC12A4, DPEP3, DPEP2, DDX28, DUS2L, NFATC3, ESRP2, PLA2G15, SLC7A6, SLC7A6OS, PRMT7, SMPD3, ZFP90, CDH3, CDH1, TMCO7, HAS3, CHTF8, CIRH1A, SNTB2, VPS4A, COG8, PDF, NIP7, TMED6, TERF2, CYB5B, MIR1538, NFAT5, NQO1, NOB1, WWP2, MIR140, CLEC18A, PDXDC2P, MIR1972-2, PDPR, CLEC18C, LOC100506060, EXOSC6, AARS, DDX19B, LOC100506083, DDX19A, ST3GAL2, RNU6-23, FUK, COG4, SF3B3, SNORD111B, SNORD111, IL34, MTSS1L, VAC14, LOC100130894, HYDIN, FTSJD1, CALB2, ZNF23, LOC100506105, ZNF19, CHST4, LOC100132529, TAT, MARVELD3, PHLPP2, SNORA70D, LOC100996499, AP1G1, SNORD71, ATXN1L, ZNF821, IST1, PKD1L3, DHODH, HP, HPR, TXNL4B, DHX38, PMFBP1, ZFHX3, HTA, C16orf47, LOC100506172, PSMD7, LOC283922, CLEC18B, GLG1, RFWD3, MLKL, FA2H, WDR59, ZNRF1, LDHD, ZFP1, CTRB2, CTRB1, BCAR1, CFDP1, TMEM170A, CHST6, CHST5, TMEM231, GABARAPL2, ADAT1, KARS, TERF2IP, CNTNAP4, MIR4719, MON1B, SYCE1L, ADAMTS18, NUDT7, VAT1L, CLEC3A, WWOX, MAF, DYNLRB2, CDYL2, LOC100996425, CMC2, CENPN, ATMIN, C16orf46, GCSH, PKD1L2, BCMO1, GAN, MIR4720, CMIP, LOC100129617, PLCG2, SDR42E1, HSD17B2, MPHOSPH6, CDH13, MIR3182, HSBP1, MLYCD, OSGIN1, NECAB2, SLC38A8, MBTPS1, HSDL1, DNAAF1, TAF1C, ADAD2, LOC654780, KCNG4, WFDC1, ATP2C2, KIAA1609, COTL1, KLHL36, USP10, CRISPLD2, ZDHHC7, KIAA0513, FAM92B, LOC400548, LINC00311, MIR5093, GSE1, GINS2, C16orf74, MIR1910, EMC8, COX4I1, IRF8, LOC100506542, LOC146513, LOC732275, FOXF1-AS1, FOXF1, MTHFSD, FLJ30679, FOXC2, FOXL1, C16orf95, FBXO31, MAP1LC3B, ZCCHC14, JPH3, LOC100129215, KLHDC4, SLC7A5, CASA, BANP, LOC400553, LOC100506735, ZNF469, ZFPM1, MIR5189, ZC3H18, IL17C, CYBA, MVD, SNAI3-AS1, SNAI3, RNF166, CTU2, PIEZO1, MIR4722, LOC100289580, FLJ40448, CDT1, APRT, GALNS, TRAPPC2L, PABPN1L, CBFA2T3, LOC642452, LOC100129697, LOC100506183, ACSF3, LINC00304, LOC400558, CDH15, SLC22A31, ZNF778, LOC642533, ANKRD11, LOC100287036, SPG7, RPL13, SNORD68, CPNE7, DPEP1, CHMP1A, C16orf55, CDK10, SPATA2L, VPS9D1, LOC100128881, ZNF276, FANCA, SPIRE2, TCF25, MC1R, TUBB3, DEF8, CENPBD1, AFG3L1P, DBNDD1, GAS8, C16orf3, LOC100130015, PRDM7, LOC100996541, LOC100506347, DOC2B, LOC100506371, RPH3AL, LOC100506388, C17orf97, FAM101B, VPS53, FAM57A, GEMIN4, DBIL5P, GLOD4, RNMTL1, NXN, TIMM22, ABR, MIR3183, BHLHA9, TUSC5, YWHAE, CRK, MYO1C, INPP5K, PITPNA-AS1, PITPNA, SLC43A2, SCARF1, RILP, PRPF8, TLCD2, MIR22HG, MIR22, WDR81, SERPINF2, SERPINF1, SMYD4, RPA1, RTN4RL1, DPH1, OVCA2, MIR132, MIR212, HIC1, SMG6, SRR, TSR1, SNORD91B, SNORD91A, SGSM2, MNT, LOC284009, METTL16, PAFAH1B1, KIAA0664, MIR1253, RAP1GAP2, OR1D5, OR1D2, OR1G1, LOC100288728, OR1A2, OR1A1, OR1D4, OR3A2, OR3A1, OR3A4P, OR1E1, OR3A3, OR1E2, SPATA22, ASPA, TRPV3, TRPV1, SHPK, CTNS, TAX1BP3, P2RX5-TAX1BP3, EMC6, P2RX5, ITGAE, GSG2, C17orf85, CAMKK1, P2RX1, ATP2A3, ZZEF1, CYB5D2, ANKFY1, UBE2G1, SPNS3, SPNS2, MYBBP1A, GGT6, SMTNL2, ALOX15, PELP1, ARRB2, MED11, CXCL16, ZMYND15, TM4SF5, VMO1, GLTPD2, PSMB6, PLD2, MINK1, CHRNE, C17orf107, GP1BA, SLC25A11, RNF167, PFN1, ENO3, SPAG7, CAMTA2, INCA1, KIF1C, SLC52A1, ZFP3, ZNF232, USP6, ZNF594, LOC100130950, SCIMP, RABEP1, NUP88, RPAIN, C1QBP, DHX33, DERL2, MIS12, LOC728392, NLRP1, LOC339166, WSCD1, AIPL1, FAM64A, PITPNM3, KIAA0753, TXNDC17, MED31, C17orf100, MIR4520A, MIR4520B, ALOX15P1, SLC13A5, XAF1, FBXO39, TEKT1, ALOX12P2, LOC100506713, ALOX12, RNASEK, RNASEK-C17orf49, C17orf49, MIR497HG, MIR195, MIR497, BCL6B, SLC16A13, SLC16A11, CLEC10A, ASGR2, ASGR1, DLG4, ACADVL, MIR324, DVL2, PHF23, GABARAP, CTDNEP1, ELP5, CLDN7, SLC2A4, YBX2, EIF5A, GPS2, NEURL4, ACAP1, KCTD11, TMEM95, TNK1, PLSCR3, C17orf61-PLSCR3, C17orf61, NLGN2, SPEM1, C17orf74, LOC100996282, TMEM102, FGF11, CHRNB1, ZBTB4, SLC35G6, POLR2A, TNFSF12, TNFSF12-TNFSF13, TNFSF13, SENP3, SENP3-EIF4A1, EIF4A1, SNORA48, SNORD10, SNORA67, CD68, MPDU1, SOX15, FXR2, SHBG, SAT2, ATP1B2, TP53, WRAP53, EFNB3, DNAH2, RPL29P2, KDM6B, TMEM88, LSMD1, CYB5D1, CHD3, SCARNA21, LOC284023, KCNAB3, TRAPPC1, CNTROB, GUCY2D, ALOX15B, ALOX12B, MIR4314, ALOXE3, HES7, PER1, VAMP2, TMEM107, SNORD118, MIR4521, MIR3676, C17orf59, AURKB, LINC00324, CTC1, PFAS, SLC25A35, RANGRF, ARHGEF15, ODF4, LOC100128288, KRBA2, RPL26, RNF222, NDEL1, MYH10, CCDC42, SPDYE4, MFSD6L, PIK3R6, PIK3R5, NTN1, STX8, WDR16, USP43, DHRS7C, GLP2R, RCVRN, GAS7, MYH13, MYH8, MYH4, MYH1, MYH2, MYH3, SCO1, ADPRM, TMEM220, MAGOH2, LINC00675, PIRT, SHISA6, DNAH9, ZNF18, MAP2K4, MIR744, LINC00670, MYOCD, ARHGAP44, MIR1269B, ELAC2, HS3ST3A1, MIR548H3, CDRT15P1, COX10-AS1, COX10, CDRT15, HS3ST3B1, MGC12916, FLJ45831, CDRT7, PMP22, MIR4731, TEKT3, FAM18B2-CDRT4, CDRT4, FAM18B2, CDRT1, TRIM16, ZNF286A, TBC1D26, CDRT15P2, MEIS3P1, ADORA2B, ZSWIM7, TTC19, NCOR1, PIGL, MIR1288, CENPV, UBB, TRPV2, C17orf76-AS1, SNORD49B, SNORD49A, SNORD65, FAM211A, ZNF287, ZNF624, CCDC144A, USP32P1, FAM106CP, KRT16P2, TBC1D27, TNFRSF13B, MPRIP, PLD6, FLCN, COPS3, NT5M, SMCR9, MED9, RASD1, PEMT, RAI1, SMCR5, SREBF1, MIR33B, TOMIL2, LOC100507131, LRRC48, ATPAF2, GID4, DRG2, MYO15A, ALKBH5, LLGL1, FLII, SMCR7, TOP3A, SMCR8, SHMT1, EVPLL, LOC339240, LGALS9C, USP32P2, FAM106A, CCDC144B, TBC1D28, ZNF286B, FOXO3B, TRIM16L, FBXW10, FAM18B1, PRPSAP2, SLC5A10, FAM83G, GRAP, SNORD3B-1, SNORD3B-2, SNORD3D, GRAPL, LOC79999, SNORD3A, SNORD3C, LOC388436, EPN2, EPN2-IT1, EPN2-AS1, B9D1, MIR1180, MAPK7, MFAP4, RNF112, SLC47A1, SNORA59B, ALDH3A2, SLC47A2, ALDH3A1, ULK2, AKAP10, SPECC1, LOC100131943, CCDC144C, LOC100996259, LGALS9B, KRT16P3, CDRT15L2, CCDC144NL, LOC339260, USP22, DHRS7B, TMEM11, C17orf103, MAP2K3, KCNJ12, C17orf51, FAM27L, FLJ36000, MTRNR2L1, LOC100506418, MIR4522, WSB1, TBC1D3P5, KSR1, LGALS9, NOS2, LYRM9, NLK, PYY2, PPY2, KRT18P55, TMEM97, IFT20, TNFAIP1, POLDIP2, TMEM199, MIR4723, SEBOX, VTN, SARM1, SLC46A1, SLC13A2, FOXN1, UNC119, PIGS, ALDOC, SPAG5, SPAG5-AS1, SGK494, KIAA0100, SDF2, SUPT6H, PROCA1, RAB34, NARR, RPL23A, SNORD42B, SNORD4A, SNORD42A, SNORD4B, TLCD1, NEK8, TRAF4, FAM222B, ERAL1, MIR451A, MIR451B, MIR144, MIR4732, FLOT2, DHRS13, PHF12, SEZ6, PIPOX, MYO18A, TIAF1, CRYBA1, NUFIP2, MIR4523, TAOK1, ABHD15, TP53113, GIT1, ANKRD13B, CORO6, SSH2, EFCAB5, NSRP1, MIR423, MIR3184, SLC6A4, BLMH, TMIGD1, CPD, GOSR1, TBC1D29, LRRC37BP1, SH3GL1P2, SUZ12P1, CRLF3, ATAD5, TEFM, ADAP2, RNF135, DPRXP4, LOC646021, MIR4733, NF1, OMG, EVI2B, EVI2A, RAB11FIP4, MIR4724, MIR193A, MIR4725, MIR365B, COPRS, UTP6, SUZ12, LRRC37B, SH3GL1P1, RHOT1, ARGFXP2, LOC100506596, RHBDL3, C17orf75, MIR632, ZNF207, PSMD11, CDK5R1, MYO1D, LOC100506629, LOC100506643, TMEM98, SPACA3, ASIC2, AA06, CCL2, CCL7, CCL11, CCL8, CCL13, CCL1, C17orf102, TMEM132E, CCT6B, ZNF830, LIG3, RAD51L3-RFFL, RFFL, RAD51D, FNDC8, NLE1, UNC45B, SLC35G3, SLFN5, SLFN11, SLFN12, SLFN13, SLFN12L, SLFN14, SNORD7, PEX12, AP2B1, RASL10B, GAS2L2, C17orf50, MMP28, TAF15, C17orf66, CCL5, RDM1, LYZL6, CCL16, CCL15-CCL14, CCL14, CCL15, CCL23, CCL18, CCL3, CCL4, TBC1D3B, CCL3L3, CCL4L1, TBC1D3C, CCL3L1, CCL4L2, TBC1D3H, TBC1D3G, ZNHIT3, MYO19, PIGW, GGNBP2, DHRS11, MRM1, LHX1, AATF, MIR2909, ACACA, C17orf78, TADA2A, DUSP14, SYNRG, DDX52, HNF1B, LOC284100, TBC1D3F, TBC1D3, LOC440434, MRPL45, GPR179, SOCS7, ARHGAP23, SRCIN1, C17orf96, MIR4734, MLLT6, MIR4726, CISD3, PCGF2, PSMB3, PIP4K2B, CWC25, MIR4727, C17orf98, RPL23, SNORA21, LASP1, LINC00672, FBXO47, LOC100996526, LRRC37A11P, LOC100131347, PLXDC1, ARL5C, CACNB1, RPL19, STAC2, FBXL20, MED1, CDK12, NEUROD2, PPP1R1B, STARD3, TCAP, PNMT, PGAP3, ERBB2, MIR4728, MIEN1, GRB7, IKZF3, ZPBP2, GSDMB, ORMDL3, LRRC3C, GSDMA, PSMD3, LOC100505620, CSF3, MED24, SNORD124, THRA, NR1D1, MSL1, CASC3, RAPGEFL1, WIPF2, CDC6, RARA, GJD3, TOP2A, IGFBP4, TNS4, CCR7, SMARCE1, KRT222, KRT24, KRT25, KRT26, KRT27, KRT28, KRT10, TMEM99, KRT12, KRT20, KRT23, KRT39, KRT40, KRTAP3-3, KRTAP3-2, KRTAP3-1, KRTAP1-5, KRTAP1-4, KRTAP1-3, KRTAP1-1, KRTAP2-1, KRTAP2-2, KRTAP2-3, KRTAP2-4, KRTAP4-7, KRTAP4-8, KRTAP4-9, KRTAP4-11, KRTAP4-12, KRTAP4-6, KRTAP4-5, KRTAP4-4, KRTAP4-3, KRTAP4-2, KRTAP4-1, KRTAP9-1, KRTAP9-2, KRTAP9-3, KRTAP9-8, KRTAP9-4, KRTAP9-9, KRTAP9-6, KRTAP9-7, KRTAP16-1, KRTAP17-1, KRT33A, KRT33B, KRT34, KRT31, LOC100505782, KRT37, KRT38, KRT32, KRT35, KRT36, KRT13, KRT15, KRT19, LOC147093, KRT9, KRT14, KRT16, KRT17, KRT42P, EIF1, GAST, HAP1, JUP, LEPREL4, FKBP10, NT5C3L, KLHL10, KLHL11, ACLY, TTC25, CNP, DNAJC7, NKIRAS2, ZNF385C, LOC100507656, DHX58, KAT2A, HSPB9, RAB5C, KCNH4, HCRT, GHDC, STAT5B, STAT5A, STAT3, PTRF, ATP6V0A1, MIR548AT, MIR5010, NAGLU, HSD17B1, COASY, MLX, PSMC3IP, FAM134C, TUBG1, TUBG2, PLEKHH3, CCR10, CNTNAP1, EZH1, RAMP2-AS1, RAMP2, VPS25, WNK4, COA3, CNTD1, BECN1, PSME3, AOC2, AOC3, AOC4, LINC00671, G6PC, PTGES3L-AARSD1, AARSD1, PTGES3L, RUNDC1, RPL27, IFI35, VAT1, RND2, BRCA1, NBR2, NBR1, TMEM106A, TMEM106A-AS1, LOC100130581, ARL4D, MIR2117, DHX8, ETV4, MEOX1, SOST, DUSP3, C17orf105, MPP3, CD300LG, MPP2, FAM215A, LOC100996563, PPY, PYY, NAGS, TMEM101, LSM12, G6PC3, HDAC5, C17orf53, ASB16, ASB16-AS1, TMUB2, ATXN7L3, UBTF, SLC4A1, RUNDC3A, SLC25A39, GRN, FAM171A2, ITGA2B, GPATCH8, FZD2, C17orf104, CCDC43, DBF4B, ADAM11, GJC1, HIGD1B, EFTUD2, CCDC103, GFAP, KIF18B, C1QL1, DCAKD, NMT1, PLCD3, ACBD4, HEXIM1, HEXIM2, FMNL1, MAP3K14-AS1, SPATA32, MAP3K14, ARHGAP27, PLEKHM1, MIR4315-1, LRRC37A4P, LOC644172, CRHR1, MGC57346, CRHR1-IT1, MAPT-AS1, SPPL2C, MAPT, MAPT-IT1, STH, KANSL1, KANSL1-AS1, LRRC37A, ARL17B, NSFP1, LRRC37A2, ARL17A, NSF, WNT3, WNT9B, GOSR2, MIR5089, RPRML, CDC27, MYL4, ITGB3, EFCAB13, MRPL45P2, NPEPPS, KPNB1, TBKBP1, TBX21, OSBPL7, MRPL10, LRRC46, SCRN2, SP6, LOC100506295, SP2, LOC100506325, PNPO, PRR15L, CDK5RAP3, COPZ2, MIR152, NFE2L1, CBX1, SNX11, SKAP1, MIR1203, HOXB1, HOXB2, HOXB-AS1, HOXB3, HOXB4, MIR10A, HOXB-AS3, HOXB5, HOXB6, HOXB7, HOXB8, HOXB9, MIR196A1, LOC100506373, PRAC, HOXB-AS5, MIR3185, HOXB13, TTLL6, CALCOCO2, ATP5G1, UBE2Z, SNF8, GIP, IGF2BP1, B4GALNT2, GNGT2, ABI3, PHOSPHO1, FLJ40194, ZNF652, PHB, NGFR, LOC100288866, NXPH3, SPOP, SLC35B1, FAM117A, KAT7, TAC4, FLJ45513, DLX4, DLX3, LOC284080, ITGA3, PDK2, SAMD14, PPPIR9B, SGCA, HILS1, COL1A1, TMEM92, XYLT2, MRPL27, EME1, LRRC59, ACSF2, CHAD, RSAD1, MYCBPAP, EPN3, SPATA20, CACNA1G-AS1, CACNA1G, ABCC3, ANKRD40, LUC7L3, LINC00483, WFIKKN2, TOB1, TOB1-AS1, LOC100506609, SPAG9, NME1-NME2, NME1, NME2, MBTD1, UTP18, FLJ42842, CA10, C17orf112, KIF2B, TOMIL1, COX11, STXBP4, HLF, MMD, TMEM100, PCTP, ANKFN1, NOG, C17orf67, DGKE, MTVR2, TRIM25, MIR3614, COIL, SCPEP1, RNF126P1, AKAP1, MSI2, MRPS23, CUEDC1, VEZF1, FLJ44342, SRSF1, DYNLL2, OR4D1, MSX2P1, OR4D2, EPX, MKS1, LPO, MPO, BZRAP1, BZRAP1-AS1, MIR142, MIR4736, SUPT4H1, RNF43, HSF5, MTMR4, SEPT4, C17orf47, TEX14, RAD51C, PPM1E, TRIM37, SKA2, MIR454, MIR301A, PRR11, SMG8, GDPD1, YPEL2, MIR4729, DHX40, CLTC, CLTC-IT1, PTRH2, VMP1, MIR21, TUBD1, RPS6KB1, RNFT1, TBC1D3P1-DHX40P1, MIR4737, HEATR6, LOC645638, LOC653653, LOC100996660, CA4, USP32, SCARNA20, LOC100506882, C17orf64, APPBP2, PPM1D, BCAS3, TBX2, C17orf82, TBX4, NACA2, BRIP1, INTS2, MED13, TBC1D3P2, EFCAB3, METTL2A, TLK2, MRC2, MARCH10, MIR633, TANC2, CYB561, ACE, KCNH6, DCAF7, TACO1, MAP3K3, LIMD2, LOC729683, STRADA, CCDC47, DDX42, FTSJ3, PSMC5, SMARCD2, TCAM1P, CSH2, GH2, CSH1, CSHL1, GH1, CD79B, SCN4A, C17orf72, ICAM2, ERN1, SNORD104, SNORA76, TEX2, PECAM1, MILR1, POLG2, DDX5, MIR3064, MIR5047, CEP95, SMURF2, LOC146880, PLEKHM1P, MIR4315-2, LRRC37A3, AMZ2P1, GNA13, LOC100507002, RGS9, AXIN2, CEP112, APOH, PRKCA, MIR634, CACNG5, CACNG4, CACNG1, HELZ, LOC100996368, PSMD12, PITPNC1, MIR548D2, MIR548AA2, NOL11, SNORA38B, BPTF, C17orf58, KPNA2, LINC00674, LOC440461, AMZ2, ARSG, SLC16A6, WIPI1, MIR635, PRKAR1A, FAM20A, ABCA8, ABCA9, ABCA6, MIR4524B, MIR4524A, ABCA10, ABCA5, MAP2K6, KCNJ16, KCNJ2-AS1, KCNJ2, FLJ37644, SOX9, LINC00673, LINC00511, SLC39A11, SSTR2, COG1, FAM104A, C17orf80, CPSF4L, CDC42EP4, SDK2, LOC100134391, LINC00469, LOC400620, RPL38, MGC16275, TTYH2, DNAI2, KIF19, BTBD17, GPR142, GPRC5C, CD300A, CD300LB, CD300C, CD300LD, C17orf77, CD300E, RAB37, CD300LF, SLC9A3R1, MIR3615, NAT9, TMEM104, GRIN2C, FDXR, FADS6, USH1G, OTOP2, OTOP3, HID1, CDR2L, ICT1, ATP5H, KCTD2, LOC100996374, SLC16A5, ARMC7, NT5C, HN1, SUMO2, NUP85, GGA3, MRPS7, MIF4GD, LOC100287042, SLC25A19, GRB2, MIR3678, KIAA0195, CASKIN2, TSEN54, LLGL2, MYO15B, RECQL5, SMIM5, SMIM6, SAP30BP, ITGB4, GALK1, H3F3B, MIR4738, UNK, LOC100507191, UNC13D, WBP2, TRIM47, TRIM65, MRPL38, FBF1, ACOX1, TEN1-CDK3, TEN1, CDK3, EVPL, SRP68, GALR2, ZACN, EXOC7, FOXJ1, RNF157-AS1, RNF157, FAM100B, QRICH2, PRPSAP1, SPHK1, UBE20, AANAT, RHBDF2, CYGB, PRCD, SNHG16, SNORD1C, SNORD1B, SNORD1A, ST6GALNAC2, ST6GALNAC1, MXRA7, JMJD6, METTL23, SRSF2, MIR636, MFSD11, MGAT5B, SEC14L1, LINC00338, SCARNA16, SEPT9, MIR4316, LOC100507351, LOC100132174, FLJ45079, TNRC6C, LOC100131096, TMC6, TMC8, C17orf99, SYNGR2, TK1, AFMID, BIRC5, TMEM235, LOC100996291, SOCS3, PGS1, DNAH17, LOC100996295, CYTH1, USP36, TIMP2, LOC100653515, LGALS3BP, CANT1, LOC100507410, CIQTNF1, ENGASE, RBFOX3, MIR4739, HP09025, ENPP7, CBX2, CBX8, LOC100507425, CBX4, TBC1D16, CCDC40, MIR1268B, GAA, EIF4A3, CARD14, SGSH, SLC26A11, RNF213, LOC100294362, ENDOV, LOC100507440, MIR4730, NPTX1, RPTOR, LOC100128105, FLJ46026, CHMP6, PP13, BAIAP2-AS1, BAIAP2, AATK, MIR657, MIR3065, MIR338, MIR1250, AATK-AS1, AZI1, ENTHD2, C17orf89, SLC38A10, LINC00482, TMEM105, LOC100130370, LOC100507520, BAHCC1, MIR4740, MIR3186, ACTG1, FSCN2, C17orf70, NPLOC4, TSPAN10, PDE6G, OXLD1, CCDC137, ARL16, HGS, MRPL12, SLC25A10, GCGR, FAM195B, PPP1R27, P4HB, ARHGDIA, ALYREF, ANAPC11, NPB, PCYT2, SIRT7, MAFG, MAFG-AS1, PYCR1, MYADML2, NOTUM, ASPSCR1, STRA13, LRRC45, RAC3, DCXR, RFNG, GPS1, DUS1L, FASN, CCDC57, SLC16A3, CSNK1D, CD7, SECTM1, TEX19, UTS2R, OGFOD3, HEXDC, HEXDC-IT1, C17orf62, NARF, FOXK2, WDR45L, RAB40B, MIR4525, FN3KRP, FN3K, TBCD, ZNF750, B3GNTL1, METRNL, LOC100505909, FLJ43681, ROCK1P1, USP14, THOC1, COLEC12, CETN1, CLUL1, C18orf56, TYMS, ENOSF1, YES1, ADCYAP1, LINC00470, LOC100652823, METTL4, NDC80, CBX3P2, SMCHD1, EMILIN2, LPIN2, LOC727896, MYOM1, MYL12A, MYL12B, TGIF1, LOC100505592, DLGAP1, DLGAP1-AS1, DLGAP1-AS2, DLGAP1-AS3, DLGAP1-AS5, C18orf42, LINC00526, LINC00667, ZFP161, EPB41L3, LOC645355, MIR3976, TMEM200C, L3MBTL4, MIR4317, LOC100130480, ARHGAP28, LINC00668, LAMA1, LRRC30, PTPRM, LOC100192426, RAB12, LOC100287082, SOGA2, NDUFV2, ANKRD12, TWSG1, RALBP1, PPP4R1, RAB31, TXNDC2, VAPA, APCDD1, NAPG, PIEZO2, SLC35G4, GNAL, CHMP1B, MPPE1, IMPA2, C18orf61, CIDEA, TUBB6, AFG3L2, SLMO1, SPIRE1, PSMG2, CEP76, LOC100996324, PTPN2, SEH1L, CEP192, LDL-RAD4, LOC100288122, MIR5190, MIR4526, FAM210A, RNMT, MC5R, MC2R, ZNF519, ANKRD20A5P, CYP4F35P, CXADRP3, POTEC, ANKRD30B, MIR3156-2, LOC644669, ROCK1, GREB1L, ESCO1, SNRPD1, ABHD3, MIR320C1, MIB1, MIR133A1, MIR1-2, LOC100128893, GATA6, CTAGE1, RBBP8, MIR4741, CABLES1, TMEM241, RIOK3, C18orf8, NPC1, ANKRD29, *LAMA*3, TTC39C, CABYR, OSBPL1A, MIR320C2, LOC100996382, IMPACT, HRH4, LOC729950, ZNF521, SS18, PSMA8, TAF4B, LOC100506787, KCTD1, LOC728606, AQP4, AQP4-AS1, CHST9, CDH2, MIR302F, DSC3, DSC2, DSC1, DSG1, DSG4, DSG3, DSG2, LOC100652770, TTR, B4GALT6, LOC646778, SLC25A52, TRAPPC8, RNF125, RNF138, MEP1B, FAM59A, WBP11P1, KLHL14, CCDC178, ASXL3, NOL4, LOC100996400, DTNA, MAPRE2, ZNF397, ZSCAN30, ZNF271, ZNF24, ZNF396, INO80C, MIR3975, GALNT1, MIR187, MIR3929, C18orf21, RPRD1A, SLC39A6, ELP2, MOCOS, FHOD3, TPGS2, KIAA1328, LOC100506821, CELF4, LOC100506837, MIR4318, LINC00669, MIR924, MIR5583-2, MIR5583-1, KC6, PIK3C3, LOC284260, RIT2, SYT4, SETBP1, MIR4319, SLC14A2, LOC100652778, SLC14A1, SIGLEC15, EPG5, PSTPIP2, ATP5A1, HAUS1, C18orf25, RNF165, LOXHD1, ST8SIA5, PIAS2, KATNAL2, TCEB3CL2, TCEB3CL, TCEB3C, TCEB3B, HDHD2, IER3IP1, SKOR2, MIR4527, SMAD2, ZBTB7C, LOC100127909, C18orf12, CTIF, MIR4743, SMAD7, DYM, MIR4744, RPL17-C18ORF32, C18orf32, MIR1539, RPL17, SNORD58C, SNORD58A, SNORD58B, LIPG, ACAA2, SCARNA17, MYO5B, MIR4320, CCDC11, MBD1, CXXC1, SKA1, MAPK4, MRO, ME2, ELAC1, SMAD4, MEX3C, LOC100287225, DCC, MBD2, SNORA37, POLI, STARD6, C18orf54, DYNAP, RAB27B, CCDC68, TCF4, MIR4529, LOC100132501, FLJ45743, LOC100505474, TXNL1, WDR7, LINC-ROR, BOD1L2, ST8SIA3, ONECUT2, FECH, NARS, LOC100505549, ATP8B1, NEDD4L, MIR122, MIR3591, ALPK2, MALT1, ZNF532, OACYLP, SEC11C, GRP, RAX, CPLX4, LMAN1, CCBE1, PMAIP1, MC4R, CDH20, LOC100130938, LOC100996669, RNF152, PIGN, KIAA1468, TNFRSF11A, ZCCHC2, PHLPP1, BCL2, KDSR, VPS4B, SERPINB5, SERPINB12, SERPINB13, SERPINB4, SERPINB3, SERPINB11, SERPINB7, SERPINB2, SERPINB10, HMSD, SERPINB8, LINC00305, LOC284294, LOC400654, CDH7, CDH19, MIR5011, DSEL, LOC643542, TMX3, CCDC102B, RNU6-39, DOK6, CD226, RTTN, SOCS6, LOC100505776, CBLN2, NETO1, MIR548AV, LOC100505797, LOC400655, LOC100505817, FBXO15, TIMM21, CYB5A, C18orf63, FAM69C, CNDP2, CNDP1, LOC400657, ZNF407, ZADH2, TSHZ1, C18orf62, LOC339298, ZNF516, FLJ44313, LOC284276, LINC00683, FLJ44881, LOC100131655, ZNF236, MBP, GALR1, LOC645321, SALL3, ATP9B, LOC100996274, NFATC1, FLJ25715, CTDP1, KCNG2, PQLC1, HSBPIL1, TXNL4A, RBFA, LOC100506070, ADNP2, PARD6G-AS1, PARD6G, LOC100506089, WASH5P, MIR1302-11, FAM138F, OR4F17, FLJ45445, LOC100996328, PPAP2C, MIER2, THEG, C2CD4C, SHC2, ODF3L2, MADCAM1, TPGS1, CDC34, GZMM, BSG, HCN2, POLRMT, FGF22, RNF126, FSTL3, PRSS57, PALM, C19orf21, PTBP1, MIR4745, LPPR3, MIR3187, AZU1, PRTN3, ELANE, CFD, MED16, R3HDM4, KISS1R, ARID3A, WDR18, GRIN3B, C19orf6, CNN2, ABCA7, HMHA1, POLR2E, GPX4, SBNO2, STK11, C19orf26, ATP5D, MIDN, CIRBP-AS1, CIRBP, C19orf24, EFNA2, MUM1, NDUFS7, GAMT, DAZAP1, RPS15, APC2, C19orf25, PCSK4, REEP6, ADAMTSL5, PLK5, MEX3D, MBD3, UQCR11, TCF3, ONECUT3, ATP8B3, REXO1, MIR1909, LOC100288123, KLF16, FAM108A1, ADAT3, SCAMP4, CSNKIG2, CSNK1G2-AS1, BTBD2, MKNK2, MOB3A, IZUMO4, AP3D1, DOT1L, PLEKHJ1, MIR1227, SF3A2, AMH, MIR4321, JSRP1, OAZ1, C19orf35, LINGO3, LOC100129831, LSM7, SPPL2B, TMPRSS9, TIMM13, LMNB2, GADD45B, GNG7, DIRAS1, SLC39A3, SGTA, THOP1, ZNF554, ZNF555, ZNF556, ZNF57, ZNF77, TLE6, TLE2, AES, GNA11, GNA15, SIPR4, NCLN, CELF5, NFIC, C19orf77, DOHH, FZR1, MFSD12, C19orf71, HMG20B, GIPC3, TBXA2R, CACTIN-AS1, CACTIN, PIP5K1C, TJP3, APBA3, MRPL54, RAX2, MATK, ZFR2, ATCAY, NMRK2, DAPK3, MIR637, EEF2, SNORD37, PIAS4, ZBTB7A, MAP2K2, CREB3L3, SIRT6, ANKRD24, EBI3, CCDC94, SHD, TMIGD2, FSD1, STAP2, MPND, SH3GL1, CHAF1A, UBXN6, MIR4746, HDGFRP2, PLIN4, PLIN5, LRG1, SEMA6B, TNFAIP8L1, C19orf10, DPP9, LOC100131094, MIR7-3HG, MIR7-3, FEM1A, TICAM1, PLIN3, ARRDC5, UHRF1, MIR4747, KDM4B, PTPRS, ZNRF4, PLAC2, SAFB2, SAFB, C19orf70, HSD11B1L, RPL36, LONP1, CATSPERD, PRR22, DUS3L, NRTN, FUT6, FUT3, FUT5, NDUFA11, VMAC, CAPS, RANBP3, LOC100128568, RFX2, ACSBG2, MLLT1, ACER1, CLPP, ALKBH7, PSPN, GTF2F1, KHSRP, MIR3940, SLC25A41, SLC25A23, CRB3, DENND1C, TUBB4A, TNFSF9, CD70, TNFSF14, C3, GPR108, TRIP10, SH2D3A, VAV1, EMR1, EMR4P, FLJ25758, LOC729458, MBD3L5, MBD3L4, MBD3L2, MBD3L3, ZNF557, INSR, LOC100996405, LOC100996504, ARHGEF18, LOC100128573, PEX11G, C19orf45, ZNF358, MCOLN1, PNPLA6, CAMSAP3, XAB2, PET100, PCP2, STXBP2, RETN, C19orf59, TRAPPC5, FCER2, CLEC4G, CD209, CLEC4M, CLEC4GP1, EVI5L, FLJ22184, LOC388499, LRRC8E, MAP2K7, TGFBR3L, SNAPC2, CTXN1, TIMM44, ELAVL1, CCL25, FBN3, CERS4, CD320, NDUFA7, RPS28, KANK3, ANGPTL4, RAB11B-AS1, MIR4999, RAB11B, MARCH2, HNRNPM, PRAM1, ZNF414, MYO1F, ADAMTS10, ACTL9, OR2Z1, ZNF558, MBD3L1, MUC16, OR1M1, OR7G2, OR7G1, OR7G3, ZNF317, OR7D2, OR7D4, OR7E24, ZNF699, ZNF559, ZNF559-ZNF177, ZNF177, ZNF266, ZNF560, ZNF426, ZNF121, ZNF561, LOC284385, ZNF562, ZNF812, ZNF846, LOC100505555, FBXL12, UBL5, LOC100996288, PIN1, OLFM2, COL5A3, RDH8, MIR5589, C3P1, C19orf66, ANGPTL6, PPAN-P2RY11, PPAN, SNORD105, SNORD105B, P2RY11, EIF3G, DNMT1, SIPR2, MIR4322, MRPL4, ICAM1, ICAM4, ICAM5, ZGLP1, FDX1L, RAVER1, ICAM3, TYK2, CDC37, MIR1181, PDE4A, KEAP1, SIPR5, ATG4D, MIR1238, KRI1, CDKN2D, AP1M2, SLC44A2, ILF3-AS1, ILF3, QTRT1, DNM2, MIR638, MIR4748, MIR199A1, TMED1, C19orf38, CARM1, YIPF2, C19orf52, SMARCA4, LDLR, SPC24, KANK2, DOCK6, C19orf80, TSPAN16, RAB3D, TMEM205, CCDC159, LPPR2, SWSAP1, EPOR, RGL3, CCDC151, PRKCSH, ELAVL3, ZNF653, ECS1T, CNN1, ELOF1, ACP5, ZNF627, HNRNPA1P10, ZNF833P, ZNF823, ZNF441, ZNF491, ZNF440, ZNF439, ZNF69, ZNF700, ZNF763, ZNF433, ZNF878, ZNF844, ZNF788, LOC100996289, ZNF20, ZNF625-ZNF20, ZNF625, ZNF136, ZNF44, ZNF563, ZNF442, ZNF799, ZNF443, ZNF709, ZNF564, ZNF490, ZNF791, MAN2B1, WDR83, WDR83OS, DHPS, FBXW9, TNPO2, SNORD41, C19orf43, ASNA1, BEST2, HOOK2, MIR5684, JUNB, PRDX2, RNASEH2A, RTBDN, MAST1, DNASE2, KLF1, GCDH, SYCE2, MIR5695, FARSA, CALR, RAD23A, GADD45GIP1, DAND5, NFIX, LYL1, TRMT1, NACC1, STX10, IER2, CACNA1A, LOC100507353, CCDC130, MRI1, C19orf53, ZSWIM4, LOC284454, MIR24-2, MIR27A, MIR23A, LOC100996314, MIR181C, MIR181D, NANOS3, C19orf57, CC2D1A, PODNL1, DCAF15, RFX1, RLN3, IL27RA, PALM3, LOC113230, C19orf67, SAMD1, PRKACA, ASF1B, LOC100507373, LPHN1, CD97, DDX39A, PKN1, PTGER1, GIPC1, DNAJB1, MIR639, TECR, NDUFB7, CLEC17A, EMR3, ZNF333, EMR2, OR7C1, OR7A5, OR7A10, OR7A17, OR7C2, SLC1A6, CCDC105, CASP14, OR1I1, SYDE1, ILVBL, NOTCH3, EPHX3, BRD4, AKAP8, AKAP8L, WIZ, MIR1470, RASAL3, PGLYRP2, CYP4F22, CYP4F8, CYP4F3, CYP4F12, OR10H2, OR10H3, CYP4F24P, OR10H5, OR10H1, UCA1, CYP4F2, CYP4F11, OR10H4, LINC00661, FLJ25328, TPM4, RAB8A, HSH2D, CIB3, FAM32A, AP1M1, KLF2, EPS15L1, CALR3, C19orf44, CHERP, SLC35E1, MED26, SMIM7, TMEM38A, NWD1, SIN3B, F2RL3, CPAMD8, HAUS8, MYO9B, USE1, OCEL1, NR2F6, USHBP1, BABAM1, ANKLE1, ABHD8, MRPL34, DDA1, ANO8, GTPBP3, PLVAP, BST2, LOC100507535, FAM125A, TMEM221, NXNL1, SLC27A1, PGLS, FAM129C, GLT25D1, UNC13A, MAPIS, FCHO1, B3GNT3, INSL3, JAK3, RPL18A, SNORA68, SLC5A5, CCDC124, KCNN1, ARRDC2, IL12RB1, MAST3, PIK3R2, IFI30, MPV17L2, RAB3A, PDE4C, LOC729966, KIAA1683, JUND, MIR3188, LSM4, PGPEP1, GDF15, MIR3189, LRRC25, SSBP4, ISYNA1, ELL, FKBP8, KXD1, UBA52, C19orf60, CRLF1, TMEM59L, KLHL26, CRTC1, COMP, UPF1, CERS1, GDF1, COPE, DDX49, HOMER3, SUGP2, ARMC6, SLC25A42, TMEM161A, MEF2BNB-MEF2B, MEF2B, MEF2BNB, RFXANK, NR2C2AP, NCAN, HAPLN4, TM6SF2, SUGP1, MAU2, GATAD2A, MIR640, TSSK6, NDUFA13, YJEFN3, CILP2, PBX4, LPAR2, GMIP, ATP13A1, ZNF101, ZNF14, LINC00663, ZNF506, ZNF253, ZNF93, ZNF682, ZNF90, ZNF486, MIR1270-1, ZNF826P, MIR1270-2, ZNF737, ZNF626, ZNF85, ZNF430, ZNF714, ZNF431, ZNF708, ZNF738, ZNF493, LOC400680, ZNF429, LOC100505594, ZNF100, LOC641367, ZNF43, ZNF208, ZNF257, ZNF676, ZNF729, ZNF98, LOC100128139, LOC440518, LOC100996349, LOC374890, ZNF492, ZNF99, ZNF728, ZNF724P, LOC100132815, ZNF91, ZNF675, ZNF681, RPSAP58, ZNF726, LOC100505851, LOC100996381, ZNF254, HAVCR1P1, LINC00662, LOC148145, LOC100505835, UQCRFS1, LOC284395, VSTM2B, POP4, PLEKHF1, C19orf12, CCNE1, URI1, ZNF536, DKFZp566F0947, TSHZ3, THEG5, LOC100996440, LOC100996665, ZNF507, LOC400684, DPY19L3, PDCD5, ANKRD27, RGS9BP, NUDT19, TDRD12, SLC7A9, CEP89, C19orf40, RHPN2, GPATCH1, WDR88, LRP3, SLC7A10, CEBPA, CEBPA-AS1, CEBPG, PEPD, LOC100996672, LOC100996681, CHST8, KCTD15, LSM14A, KIAA0355, FLJ21369, GPI, PDCD2L, UBA2, WTIP, ZNF807, SCGB1B2P, SCGB2B2, SCGB2B3P, ZNF302, ZNF181, ZNF599, LOC400685, LOC100652909, LOC100652911, ZNF30, ZNF792, GRAMD1A, SCN1B, HPN, LOC100128675, FXYD3, LGI4, FXYD1, FXYD7, FXYD5, FAM187B, LSR, USF2, HAMP, MAG, CD22, MIR5196, FFAR1, FFAR3, LOC100128682, FFAR2, KRTDAP, DMKN, SBSN, GAPDHS, LOC100506469, TMEM147, ATP4A, HAUS5, RBM42, ETV2, COX6B1, UPK1A, UPK1A-AS1, ZBTB32, MLL4, IGFLR1, U2AF1L4, PSENEN, LIN37, HSPB6, C19orf55, ARHGAP33, PRODH2, NPHS1, KIRREL2, APLP1, NFK-BID, HCST, TYROBP, LRFN3, SDHAF1, SYNE4, ALKBH6, CLIP3, THAP8, WDR62, OVOL3, POLR2I, TBCB, CAPNS1, COX7A1, ZNF565, ZNF146, LOC100134317, LINC00665, ZFP14, ZFP82, LOC644189, ZNF566, LOC728752, ZNF260, ZNF529, ZNF382, ZNF461, ZNF567, ZNF850, ZNF790-AS1, ZNF790, ZNF345, ZNF829, ZNF568, ZNF420, ZNF585A, ZNF585B, ZNF383, LOC284412, LOC100507342, HKR1, ZNF527, ZNF569, ZNF570, ZNF793, LOC400692, LOC100507433, ZNF540, ZNF571, ZFP30, ZNF781, ZNF607, LOC100507486, ZNF573, LOC644554, LOC100631378, WDR87, SIPA1L3, DPF1, PPP1R14A, SPINT2, YIF1B, C19orf33, KCNK6, CATSPERG, PSMD8, GGN, SPRED3, FAM98C, RASGRP4, RYR1, MAP4K1, EIF3K, ACTN4, CAPN12, LGALS7, LGALS7B, LGALS4, ECH1, HNRNPL, RINL, SIRT2, NFKBIB, LOC643669, SARS2, MRPS12, FBXO17, FBXO27, PAPL, PAK4, NCCRP1, SYCN, IL28B, IL28A, IL29, LRFN1, GMFG, SAMD4B, PAF1, MED29, ZFP36, MIR4530, PLEKHG2, RPS16, LOC723805, SUPT5H, TIMM50, DLL3, SELV, EID2B, EID2, LGALS13, LOC100129935, LGALS16, LGALS17A, LGALS14, CLC, LEUTX, DYRK1B, FBL, FCGBP, PSMC4, ZNF546, ZNF780B, ZNF780A, MAP3K10, TTC9B, CNTD2, AKT2, LOC100507646, MIR641, C19orf47, PLD3, HIPK4, PRX, SERTAD1, SERTAD3, BLVRB, SPTBN4, SHKBP1, LTBP4, NUMBL, ADCK4, ITPKC, C19orf54, SNRPA, MIA, MIA-RAB4B, RAB4B, RAB4B-EGLN2, EGLN2, CYP2A6, CYP2A7, CYP2G1P, CYP2B7P1, CYP2B6, CYP2A13, CYP2F1, CYP2S1, AXL, HNRNPUL1, CCDC97, TGFB1, B9D2, TMEM91, EXOSC5, BCKDHA, B3GNT8, ATP5SL, C19orf69, LOC100505495, CEACAM21, CEACAM4, CEACAM7, CEACAM5, CEACAM6, CEACAM3, LYPD4, DMRTC2, RPS19, CD79A, ARHGEF1, LOC100505585, RABAC1, ATP1A3, GRIK5, ZNF574, POU2F2, LOC100505622, MIR4323, DEDD2, ZNF526, GSK3A, LOC100132272, ERF, LOC100652741, CIC, PAFAH1B3, PRR19, TMEM145, MEGF8, CNFN, LOC100996307, LIPE, CXCL17, CEACAM1, CEACAM8, PSG3, PSG8, LOC100289650, PSG10P, PSG1, PSG6, PSG7, PSG11, PSG2, PSG5, PSG4, LOC284344, PSG9, PRG1, CD177, TEX101, LYPD3, PHLDB3, ETHE1, ZNF575, XRCC1, PINLYP, IRGQ, ZNF576, ZNF428, SRRM5, CADM4, PLAUR, IRGC, SMG9, KCNN4, LYPD5, ZNF283, ZNF404, LOC100505715, ZNF45, ZNF221, ZNF155, ZNF230, ZNF222, ZNF223, ZNF284, ZNF224, LOC100379224, ZNF225, ZNF234, ZNF226, ZNF227, ZNF233, ZNF235, ZFP112, ZNF285, ZNF229, ZNF180, CEACAM20, CEACAM22P, IGSF23, PVR, MIR4531, CEACAM19, CEACAM16, BCL3, CBLC, BCAM, PVRL2, TOMM40, APOE, APOC1, APOC1P1, APOC4-APOC2, APOC4, APOC2, CLPTM1, RELB, CLASRP, ZNF296, GEMIN7, PPP1R37, NKPD1, TRAPPC6A, BLOC1S3, EXOC3L2, MARK4, CKM, KLC3, ERCC2, PPP1R13L, CD3EAP, ERCC1, FOSB, RTN2, PPM1N, VASP, OPA3, GPR4, EML2, MIR330, LOC100287177, GIPR, MIR642A, MIR642B, SNRPD2, QPCTL, FBXO46, LOC388553, SIX5, DMPK, DMWD, RSPH6A, SYMPK, FOXA3, IRF2BP1, MYPOP, NANOS2, NOVA2, CCDC61, MIR769, PGLYRP1, IGFL4, IGFL3, IGFL2, DKFZp434J0226, IGFL1, HIF3A, PPP5C, CCDC8, PNMAL1, PPP5D1, PNMAL2, CALM3, PTGIR, GNG8, DACT3, DACT3-AS1, PRKD2, MIR320E, STRN4, FKRP, SLC1A5, SNAR-E, AP2S1, ARHGAP35, NPAS1, TMEM160, ZC3H4, SAE1, BBC3, MIR3190, MIR3191, CCDC9, PRR24, C5AR1, GPR77, DHX34, MEIS3, SLC8A2, KPTN, NAPA-AS1, NAPA, ZNF541, GLTSCR1, EHD2, GLTSCR2, SNORD23, SEPW1, TPRX1, CRX, SULT2A1, SNAR-A12, SNAR-C5, SNAR-A1, SNAR-A3, SNAR-C2, SNAR-A2, SNAR-C4, SNAR-A13, SNAR-C3, SNAR-C1, BSPH1, ELSPBP1, CABP5, PLA2G4C, LOC100505754, LIG1, C19orf68, CARD8, LOC100505812, ZNF114, CCDC114, EMP3, TMEM143, SYNGR4, KDELR1, GRIN2D, GRWD1, KCNJ14, CYTH2, LMTK3, SULT2B1, FAM83E, SPACA4, RPL18, SPHK2, DBP, CA11, SEC1P, NTN5, FUT2, MAMSTR, RASIP1, IZUMO1, FUT1, FGF21, BCAT2, HSD17B14, PLEKHA4, PPP1R15A, TULP2, NUCB1, DHDH, BAX, FTL, GYS1, RUVBL2, LHB, CGB, SNAR-G2, CGB2, CGB1, SNAR-G1, CGB5, CGB8, CGB7, NTF4, KCNA7, SNRNP70, LIN7B, C19orf73, PPFIA3, HRC, TRPM4, SLC6A16, MIR4324, CD37, TEAD2, DKKL1, CCDC155, PTH2, LOC100507003, SLC17A7, PIH1D1, ALDH16A1, FLT3LG, RPL13A, SNORD32A, SNORD33, SNORD34, SNORD35A, RPS11, SNORD35B, MIR150, FCGRT, RCN3, NOSIP, PRRG2, PRR12, RRAS, SCAF1, IRF3, BCL2L12, PRMT1, MIR5088, ADM5, CPT1C, TSKS, AP2A1, FUZ, MED25, PTOV1-AS1, PTOV1, MIR4749, PNKP, AKT1S1, TBC1D17, MIR4750, IL411, NUP62, ATF5, MIR4751, SIGLEC11, SIGLEC16, VRK3, ZNF473, FLJ26850, SNAR-A4, SNAR-A14, SNAR-A5, SNAR-A6, SNAR-A7, SNAR-A8, SNAR-A9, SNAR-A10, SNAR-A11, SNAR-B1, SNAR-B2, SNAR-D, IZUMO2, MYH14, KCNC3, NAPSB, NAPSA, NR1H2, POLD1, SPIB, MYBPC2, FAM71E1, EMC10, LOC100506114, JOSD2, ASPDH, LRRC4B, SNAR-F, SYT3, C19orf81, SHANK1, CLEC11A, GPR32, ACPT, C19orf48, SNORD88B, SNORD88A, SNORD88C, MGC45922, KLK1, KLK15, KLK3, KLK2, KLKP1, KLK4, LOC390956, KLK5, KLK6, KLK7, KLK8, KLK9, KLK10, KLK11, KLK12, KLK13, KLK14, CTU1, SIGLEC9, SIGLEC7, SIGLEC17P, CD33, SIGLECL1, IGLON5, VSIG10L, ETFB, CLDND2, NKG7, LIM2, LOC147646, SIGLEC10, LOC100129083, SIGLEC8, CEACAM18, SIGLEC12, SIGLEC6, ZNF175, FLJ30403, SIGLEC5, SIGLEC14, MIR99B, MIRLET7E, MIR125A, LINC00085, HAS1, FPR1, FPR2, FPR3, ZNF577, ZNF649, ZNF613, ZNF350, ZNF615, ZNF614, ZNF432, ZNF841, ZNF616, ZNF83, ZNF836, PPP2R1A, ZNF766, MIR643, ZNF480, ZNF610, ZNF880, ZNF528, ZNF534, ZNF578, ZNF808, ZNF701, ZNF137P, ZNF611, ZNF600, ZNF28, ZNF468, ZNF320, ZNF816-ZNF321P, ZNF321P, ZNF816, ZNF702P, ERVV-1, ERVV-2, ZNF160, ZNF415, ZNF347, ZNF665, ZNF677, VN1R2, VN1R4, FAM90A27P, BIRC8, ZNF845, ZNF525, ZNF765, TPM3P9, ZNF761, ZNF813, ZNF331, LOC284379, DPRX, MIR512-1, MIR512-2, MIR1323, MIR498, MIR520E, MIR515-1, MIR519E, MIR520F, MIR515-2, MIR519C, MIR1283-1, MIR520A, MIR526B, MIR519B, MIR525, MIR523, MIR518F, MIR520B, MIR518B, MIR526A1, MIR520C, MIR518C, MIR524, MIR517A, MIR519D, MIR521-2, MIR520D, MIR517B, MIR520G, MIR516B2, MIR526A2, MIR518E, MIR518A1, MIR518D, MIR516B1, MIR518A2, MIR517C, MIR520H, MIR521-1, MIR522, MIR519A1, MIR527, MIR516A1, MIR1283-2, MIR516A2, MIR519A2, MIR371A, MIR371B, MIR372, MIR373, NLRP12, MYADM, PRKCG, CACNG7, CACNG8, MIR935, CACNG6, VSTM1, TARM1, OSCAR, NDUFA3, TFPT, PRPF31, CNOT3, LENG1, TMC4, MBOAT7, TSEN34, RPS9, LILRB3, LILRA6, LILRB5, LILRB2, MIR4752, LILRA3, LILRA5, LILRA4, LAIR1, TTYH1, LENG8, LENG9, CDC42EP5, LAIR2, KIR3DX1, LILRA2, LILRA1, LILRB1, LILRB4, LILRP2, KIR3DL3, KIR2DL3, KIR2DL1, KIR2DL4, KIR3DL1, KIR2DS4, KIR3DL2, FCAR, NCR1, NLRP7, NLRP2, GP6, RDH13, EPS8L1, PPP1R12C, TNNT1, TNNI3, DNAAF3, SYT5, PTPRH, TMEM86B, PPP6R1, HSPBP1, BRSK1, TMEM150B, SUV420H2, COX6B2, FAM71E2, IL11, TMEM190, TMEM238, RPL28, UBE2S, SHISA7, ISOC2, ZNF628, NAT14, SSC5D, SBK2, SGK110, ZNF579, FIZ1, ZNF524, ZNF865, ZNF784, ZNF580, ZNF581, CCDC106, U2AF2, EPN1, NLRP9, RFPL4A, LOC729974, NLRP11, NLRP4, NLRP13, NLRP8, NLRP5, ZNF787, ZNF444, GALP, ZSCAN5B, ZSCAN5A, ZSCAN5D, LOC100506374, ZNF542, ZNF582, ZNF582-AS1, ZNF583, ZNF667, LOC100128252, ZNF471, ZFP28, ZNF470, ZNF71, LOC147670, ZNF835, ZIM2, PEG3, PEG3-AS1, MIMT1, USP29, ZIM3, DUXA, ZNF264, AURKC, ZNF805, LOC100996417, ZNF460, ZNF543, ZNF304, TRAPPC2P1, ZNF547, ZNF548, ZNF17, ZNF749, VN1R1, ZNF772, ZNF419, ZNF773, ZNF549, ZNF550, ZNF416, ZIK1, ZNF530, ZNF134, ZNF211, ZSCAN4, ZNF551, ZNF154, ZNF671, ZNF776, ZNF586, ZNF552, FKBP1AP1, ZNF587B, ZNF587, ZNF814, ZNF417, ZNF418, ZNF256, C19orf18, ZNF606, LOC100128398, ZSCAN1, ZNF135, ZSCAN18, ZNF329, ZNF274, ZNF544, ZNF8, ZSCAN22, A1BG, A1BG-AS1, ZNF497, ZNF837, MIR4754, RPS5, LOC646862, LOC100506634, ZNF584, ZNF132, ZNF324B, ZNF324, ZNF446, SLC27A5, ZBTB45, TRIM28, CHMP2A, UBE2M, LOC100131691, MZF1, MGC2752, FAM110C, SH3YL1, ACP1, FAM150B, LOC727944, LOC100996637, TMEM18, LOC339822, SNTG2, TPO, PXDN, MYT1L, LOC730811, TSSC1, TRAPPC12, ADI1, LOC100506014, RNASEH1, LOC100506054, RPS7, COLEC11, ALLC, DCDC2C, LOC100505964, LOC100996394, LOC727982, SOX11, LOC150622, LOC400940, LOC100506216, LINC00487, CMPK2, RSAD2, RNF144A-AS1, RNF144A, LOC100506274, LOC339788, LINC00299, LOC100506299, LOC100996537, ID2, KIDINS220, MBOAT2, LOC100506317, ASAP2, ITGB1BP1, CPSF3, IAH1, ADAM17, YWHAQ, LOC100996549, TAF1B, GRHL1, KLF11, CYS1, RRM2, C2orf48, MIR4261, HPCAL1, ODC1, SNORA80B, LOC100996551, NOL10, ATP6V1C2, PDIA6, KCNF1, FLJ33534, C2orf50, PQLC3, ROCK2, LINC00570, E2F6, GREB1, MIR4429, NTSR2, LPIN1, LOC100506405, MIR548S, MIR4262, LOC100506457, MIR3681, TRIB2, MIR3125, LOC100506474, FAM84A, NBAS, DDX1, MYCNOS, MYCN, FAM49A, RAD51AP2, VSNL1, SMC6, GEN1, MSGN1, KCNS3, RDH14, NT5C1B-RDH14, NT5C1B, MIR4757, OSR1, FLJ12334, TTC32, WDR35, MATN3, LAPTM4A, SDC1, LOC100131373, PUM2, RHOB, HS1BP3, GDF7, C2orf43, APOB, LOC100507562, LOC645949, KLHL29, ATAD2B, UBXN2A, MFSD2B, C2orf44, FKBP1B, SF3B14, TP53I3, PFN4, FAM228B, FAM228A, ITSN2, LOC100507630, NCOA1, PTRHD1, CENPO, ADCY3, DNAJC27, DNAJC27-AS1, EFR3B, POMC, DNMT3A, MIR1301, LOC100131510, DTNB, ASXL2, KIF3C, RAB10, FAM59B, HADHA, HADHB, GPR113, EPT1, CCDC164, OTOF, C2orf70, CIB4, KCNK3, C2orf18, CENPA, DPYSL5, MAPRE3, TMEM214, AGBL5, OST4, EMILIN1, KHK, CGREF1, ABHD1, PREB, C2orf53, TCF23, SLC5A6, ATRAID, CAD, SLC30A3, DNAJC5G, TRIM54, UCN, MPV17, GTF3C2, LOC100505624, EIF2B4, SNX17, ZNF513, PPM1G, FTH1P3, NRBP1, KRTCAP3, IFT172, FNDC4, GCKR, C2orf16, ZNF512, CCDC121, GPN1, SUPT7L, SLC4A1AP, MRPL33, RBKS, BRE-AS1, BRE, MIR4263, LOC100505716, FLJ31356, FOSL2, PLB1, LOC100505774, PPP1CB, SPDYA, TRMT61B, WDR43, SNORD92, SNORD53, FAM179A, C2orf71, CLIP4, ALK, YPEL5, LBH, LCLAT1, CAPN13, GALNT14, LOC100652774, CAPN14, EHD3, XDH, SRD5A2, MEMO1, DPY30, HP11026, SPAST, SLC30A6, NLRC4, YIPF4, BIRC6, MIR558, TTC27, MIR4765, LINC00486, LOC100271832, LTBP1, MIR4430, RASGRP3, FAM98A, MYADML, MIR548AD, LOC100288911, CRIM1, FEZ2, VIT, STRN, HEATR5B, CCDC75, EIF2AK2, SULT6B1, LOC100505876, CEBPZ, NDUFAF7, PRKD3, QPCT, CDC42EP3, FAM82A1, CYP1B1, CYP1B1-AS1, ATL2, HNRPLL, GALM, SRSF7, GEMIN6, DHX57, MORN2, ARHGEF33, LOC375196, SOS1, CDKL4, MAP4K3, LOC728730, TMEM178A, THUMPD2, SLC8A1-AS1, SLC8A1, LOC388942, C2orf91, PKDCC, EML4, COX7A2L, KCNG3, LOC100130921, MTA3, OXER1, HAAO, LOC100506047, ZFP36L2, LOC100129726, THADA, PLEKHH2, LOC728819, DYNC2LI1, ABCG5, ABCG8, LRPPRC, PPM1B, SLC3A1, PREPL, CAMKMT, LOC100130502, LOC100506088, SIX3-AS1, SIX3, SIX2, UNQ6975, SRBD1, PRKCE, EPAS1, TMEM247, ATP6V1E2, RHOQ, PIGF, CRIPT, SOCS5, LOC388948, LOC100134259, MCFD2, TTC7A, C2orf61, CALM2, BCYRN1, EPCAM, MIR559, MSH2, KCNK12, MSH6, FBXO11, LOC100506235, FOXN2, PPP1R21, STON1-GTF2A1L, STON1, GTF2A1L, LHCGR, FSHR, NRXN1, LOC100506300, MIR4431, ASB3, GPR75-ASB3, CHAC2, ERLEC1, MIR3682, GPR75, PSME4, ACYP2, TSPYL6, C2orf73, SPTBN1, RPL23AP32, EML6, RTN4, CLHC1, RPS27A, MTIF2, PRORSD1P, CCDC88A, CCDC104, SMEK2, PNPT1, EFEMP1, MIR217, MIR216A, MIR216B, CCDC85A, VRK2, FANCL, FLJ30838, MIR4432, LOC100506891, BCL11A, LOC100506934, PAPOLG, FLJ16341, REL, PUS10, PEX13, KIAA1841, LOC339803, C2orf74, AHSA2, USP34, SNORA70B, XPO1, FAM161A, CCT4, COMMD1, B3GNT2, MIR5192, TMEM17, EHBP1, LOC100132215, OTX1, DBIL5P2, WDPCP, MDH1, UGP2, VPS54, PELI1, LINC00309, MIR4433, LGALSL, AFTPH, MIR4434, LOC339807, SERTAD2, LOC400958, SLC1A4, CEP68, RAB1A, ACTR2, SPRED2, MIR4778, MEIS1-AS3, MEIS1, LOC100507073, LOC644838, ETAA1, CID, WDR92, PNO1, PPP3R1, CNRIP1, PLEK, FBXO48, APLF, PROKR1, ARHGAP25, LOC100996448, BMP10, GKN2, GKN1, ANTXR1, MIR3126, GFPT1, NFU1, AAK1, SNORA36C, ANXA4, GMCL1, SNRNP27, MXD1, ASPRV1, PCBP1-AS1, PCBP1, LOC100133985, C2orf42, TIA1, MIR1285-2, PCYOX1, SNRPG, FAM136A, TGFA, ADD2, FIGLA, CLEC4F, CD207, VAX2, ATP6V1B1, ANKRD53, TEX261, OR7E91P, NAGK, MCEE, MPHOSPH10, PAIP2B, ZNF638, ZNF638-IT1, DYSF, CYP26B1, EXOC6B, SPR, EMX1, SFXN5, RAB11FIP5, NOTO, SMYD5, PRADC1, CCT7, FBXO41, EGR4, ALMS1, NAT8, ALMS1P, NAT8B, TPRKB, DUSP11, C2orf78, STAMBP, LOC100652991, ACTG2, DGUOK, DGUOK-AS1, TET3, BOLA3, BOLA3-AS1, MOB1A, MTHFD2, SLC4A5, DCTN1, DCTN1-AS1, C2orf81, WDR54, RTKN, INO80B-WBP1, INO80B, WBP1, MOGS, MRPL53, CCDC142, TTC31, LBX2, LBX2-AS1, PCGF1, TLX2, DQX1, AUP1, HTRA2, LOXL3, DOK1, C2orf65, SEMA4F, HK2, POLE4, TACR1, MIR5000, EVA1A, MRPL19, GCFC2, LRRTM4, SNAR-H, REG3G, REG1B, REG1A, REG1P, REG3A, CTNNA2, MIR4264, LRRTM1, LOC100507201, LOC1720, FUNDC2P2, SUCLG1, DNAH6, TRABD2A, TMSB10, KCMF1, LOC100996478, TCF7L1, TGOLN2, RETSAT, ELMOD3, CAPG, SH2D6, LOC100630918, MAT2A, GGCX, VAMP8, VAMP5, RNF181, TMEM150A, USP39, C2orf68, SFTPB, GNLY, ATOH8, LOC284950, ST3GAL5, LOC90784, POLR1A, PTCD3, SNORD94, IMMT, MIR4779, MRPL35, REEP1, KDM3A, CHMP3, RNF103-CHMP3, RNF103, RMND5A, CD8A, CD8B, ANAPC1P1, RGPD1, PLGLB1, LOC285074, MIR4771-1, LINC00152, MIR4435-1, LOC730268, PLGLB2, RGPD2, KRCC1, SMYD1, MIR4780, FABP1, THNSL2, FOXI3, TEX37, EIF2AK3, RPIA, ANKRD36BP2, MIR4436A, LOC654342, LOC100506191, GGT8P, ACTR3BP2, LOC90499, ANKRD20A8P, LOC442028, TEKT4, MAL, MRPS5, ZNF514, ZNF2, PROM2, KCNIP3, FAHD2A, TRIM43B, TRIM43, LINC00342, FAHD2CP, GPAT2, ADRA2B, ASTL, DUSP2, STARD7, LOC285033, TMEM127, CIAO1, SNRNP200, ITPRIPL1, NCAPH, NEURL3, ARID5A, LOC100996535, KANSL3, FER1L5, LMAN2L, CNNM4, MIR3127, LOC100506036, CNNM3, ANKRD23, ANKRD39, SEMA4C, FAM178B, FAHD2B, ANKRD36, LOC100506076, LOC100506123, ANKRD36B, COX5B, ACTR1B, LOC728537, ZAP70, TMEM131, VWA3B, CNGA3, INPP4A, COA5, UNC50, MGAT4A, KIAA1211L, TSGA10, C2orf15, LIPT1, MITD1, MRPL30, LYG2, LYG1, TXNDC9, EIF5B, REV1, AFF3, LOC150577, LONRF2, CHST10, NMS, PDCL3, NPAS2, RPL31, TBC1D8, LOC100506286, C2orf29, SNORD89, RNF149, MIR5696, CREG2, RFX8, MAP4K4, LOC100506328, IL1R2, LOC100131131, IL1R1, IL1RL2, IL1RL1, IL18R1, IL18RAP, MIR4772, SLC9A4, SLC9A2, MFSD9, TMEM182, LOC100287010, LOC150568, LOC284998, LOC100506421, POU3F3, LOC100128131, MRPS9, GPR45, TGFBRAP1, LOC100506473, C2orf49, FHL2, LOC285000, NCK2, C2orf40, UXS1, PLGLA, RGPD3, ST6GAL2, LOC729121, RGPD4, SLC5A7, SULT1C3, SULT1C2, SULT1C2P1, SULT1C4, GCC2, LIMS1, RANBP2, CCDC138, EDAR, SH3RF3-AS1, SH3RF3, MIR4265, MIR4266, LOC729164, SEPT10, SOWAHC, LOC100506563, RGPD5, LIMS3, LIMS3-LOC440895, LOC440895, LOC440894, MIR4267, MALL, MIR4436B1, NPHP1, LINC00116, LOC100507334, MIR4436B2, LOC151009, LOC100288570, LIMS3L, RGPD6, LOC100507581, BUB1, ACOXL, FLJ44006, BCL2L11, LOC100505634, LOC100128130, MIR4435-2, LOC541471, ANAPC1, MIR4771-2, MERTK, TMEM87B, FBLN7, ZC3H8, ZC3H6, RGPD8, TTL, POLR1B, CHCHD5, FLJ42351, SLC20A1, CKAP2L, IL1A, IL1B, IL37, IL36G, IL36A, IL36B, IL36RN, IL1F10, IL1RN, PSD4, PAX8, LOC654433, CBWD2, FOXD4L1, FAM138B, MIR1302-3, WASH2P, DDX11L2, RPL23AP7, RABL2A, LOC100506748, SLC35F5, MIR4782, ACTR3, LOC100499194, LOC440900, DPP10, LOC389023, DDX18, CCDC93, INSIG2, LOC100506797, EN1, MARCO, CIQL2, STEAP3, C2orf76, DBI, TMEM37, SCTR, PCDP1, TMEM177, PTPN4, EPB41L5, TMEM185B, RALB, INHBB, LOC84931, GLI2, TFCP2L1, CLASP1, RNU4ATAC, LOC254128, MKI67IP, TSN, CNTNAP5, GYPC, LOC339760, BIN1, CYP27C1, ERCC3, MAP3K2, LOC100506922, PROC, MIR4783, LOC100131492, IWS1, MYO7B, LIMS2, GPR17, SFT2D3, WDR33, POLR2D, AMMECR1L, SAP130, UGGT1, HS6ST1, LOC151121, LOC389033, LOC100131320, RAB6C, LOC440905, POTEF, CCDC74B-AS1, CCDC74B, SMPD4, MZT2B, TUBA3E, CCDC115, IMP4, PTPN18, LOC100216479, CYP4F43P, POTEI, CFC1B, LOC646743, TISP43, CFC1, POTEJ, CYP4F30P, LOC100288897, GPR148, FAM123C, ARHGEF4, FAM168B, PLEKHB2, POTEE, LOC440910, WTH3DI, LOC389043, LOC401010, TUBA3D, MZT2A, MIR4784, LOC150776, CCDC74A, POTEKP, LOC100507474, LOC100507460, C2orf27A, C2orf27B, ANKRD30BL, MIR663B, ZNF806, AZFP, FAM201B, GPR39, LYPD1, NCKAP5, LOC100996685, MIR3679, MGAT5, TMEM163, ACMSD, MIR5590, LOC100129961, CCNT2, MAP3K19, RAB3GAP1, ZRANB3, R3HDM1, MIR128-1, UBXN4, LCT, LOC100507600, MCM6, DARS, CXCR4, THSD7B, HNMT, SPOPL, NXPH2, LOC647012, LRP1B, KYNU, ARHGAP15, GTDC1, ZEB2, ZEB2-AS1, DKFZp68601327, LOC100505498, PABPC1P2, ACVR2A, ORC4, MBD5, EPC2, KIF5C, LYPD6B, LYPD6, MMADHC, FLJ32955, RND3, RBM43, NMI, TNFAIP6, MIR4773-1, MIR4773-2, RIF1, NEB, ARL5A, CACNB4, STAM2, FMNL2, PRPF40A, ARL6IP6, RPRM, GALNT13, LOC100144595, KCNJ3, NR4A2, GPD2, GALNT5, ERMN, FAM133DP, CYTIP, ACVR1C, ACVR1, UPP2, CCDC148-AS1, CCDC148, PKP4, DAPL1, TANC1, WDSUB1, BAZ2B, MARCH7, LY75-CD302, CD302, LY75, PLA2R1, ITGB6, RBMS1, MIR4785, TANK, LOC100996579, PSMD14, TBR1, SLC4A10, DPP4, GCG, FAP, IFIH1, GCA, KCNH7, FIGN, GRB14, COBLL1, SNORA70F, SLC38A11, SCN3A, SCN2A, CSRNP3, GALNT3, LOC100506124, TTC21B, LOC100506134, SCN1A, SCN9A, SCN7A, XIRP2, B3GALT1, STK39, CERS6, MIR4774, CERS6-AS1, NOSTRIN, SPC25, G6PC2, ABCB11, DHRS9, LRP2, BBS5, KBTBD10, FASTKD1, PPIG, CCDC173, PHOSPHO2, PHOSPHO2-KLHL23, KLHL23, SSB, METTL5, UBR3, MYO3B, LOC440925, SP5, LOC100505695, ERICH2, GAD1, GORASP2, TLK1, METTL8, DCAF17, CYBRD1, DYNC1I2, SLC25A12, HAT1, METAP1D, DLX1, DLX2, ITGA6, PDK1, RAPGEF4-AS1, RAPGEF4, ZAK, MLK7-AS1, CDCA7, SP3, LOC100128905, OLA1, LOC285084, SP9, CIR1, SCRN3, GPR155, WIPF1, H3F3AP4, CHRNA1, CHN1, ATF2, MIR933, ATP5G3, KIAA1715, EVX2, HOXD13, HOXD12, HOXD11, HOXD10, HOXD9, HOXD8, HOXD-AS2, MIR10B, HOXD4, HOXD3, HOXD-AS1, HOXD1, MTX2, MIR1246, LOC375295, HNRNPA3, MIR4444-1, NFE2L2, MIR3128, LOC100130691, AGPS, TTC30B, TTC30A, PDE11A, RBM45, OSBPL6, PRKRA, DFNB59, FKBP7, PLEKHA3, TTN-AS1, TTN, CCDC141, SESTD1, ZNF385B, MIR1258, CWC22, UBE2E3, MIR4437, ITGA4, CERKL, NEUROD1, SSFA2, PPP1R1C, PDE1A, DNAJC10, FRZB, NCKAP1, DUSP19, NUP35, MIR548AE1, ZNF804A, LOC100506923, FSIP2, ZC3H15, ITGAV, FAM171B, ZSWIM2, CALCRL, TFPI, GULP1, MIR561, DIRC1, COL3A1, MIR1245A, MIR1245B, MIR3606, COL5A2, MIR3129, WDR75, SLC40A1, ASNSD1, ANKAR, OSGEPL1, ORMDL1, PMS1, MSTN, C2orf88, HIBCH, INPP1, MFSD6, TMEM194B, NAB1, GLS, STAT1, STAT4, MYO1B, NABP1, SDPR, TMEFF2, LOC100506993, PCGEM1, SLC39A10, DNAH7, STK17B, HECW2, CCDC150, LOC100130452, GTF3C3, C2orf66, PGAP1, ANKRD44, SF3B1, COQ10B, HSPD1, HSPE1, HSPE1-MOB4, MOB4, RFTN2, MARS2, BOLL, PLCL1, SATB2, SATB2-AS1, FONG, C2orf69, TYW5, C2orf47, SPATS2L, KCTD18, SGOL2, AOX1, AOX2P, LOC100507140, BZW1, RNU6-6, CLK1, PPIL3, NIF3L1, ORC2, FAM126B, NDUFB3, CFLAR, CFLAR-AS1, CASP10, CASP8, ALS2CR12, TRAK2, STRADB, ALS2CR11, TMEM237, MPP4, ALS2, CDK15, FZD7, LOC100652824, LOC729224, SUMO1, NOP58, SNORD70, SNORD11B, SNORD11, BMPR2, FAM117B, ICA1L, WDR12, ALS2CR8, NBEAL1, CYP20A1, ABI2, RAPH1, CD28, CTLA4, ICOS, PARD3B, NRP2, INO80D, GCSHP3, NDUFS1, EEF1B2, SNORD51, SNORA41, GPR1, ZDBF2, ADAM23, LOC200726, DYTN, MDH1B, FASTKD2, MIR3130-1, MIR3130-2, CPO, KLF7, MIR2355, MIR 1302-4, CREB1, METTL21A, CCNYL1, MIR4775, FZD5, PLEKHM3, LOC100507443, CRYGD, CRYGC, CRYGB, CRYGA, C2orf80, IDH1, IDH1-AS1, PIKFYVE, PTH2R, MAP2, UNC80, RPE, KANSL1L, ACADL, MYL1, LANCL1, CPS1, CPS1-IT1, ERBB4, MIR548F2, MIR4776-1, MIR4776-2, IKZF2, LOC100130451, SPAG16, MIR4438, VWC2L, VWC2L-IT1, BARD1, ABCA12, ATIC, FN1, LINC00607, MREG, PECR, TMEM169, XRCC5, PKI55, MARCH4, SMARCAL1, LOC100507554, RPL37A, IGFBP2, IGFBP5, TNP1, DIRC3, TNS1, RUFY4, CXCR2P1, CXCR2, CXCR1, ARPC2, GPBAR1, AAMP, PNKD, TMBIM1, C2orf62, SLC11A1, CTDSP1, MIR26B, VIL1, USP37, RQCD1, PLCD4, ZNF142, BCS1L, RNF25, STK36, TTLL4, CYP27A1, PRKAG3, WNT6, WNT10A, CDK5R2, LINC00608, FEV, CRYBA2, MIR375, LOC100129175, CCDC108, IHH, MIR3131, NHEJ1, SLC23A3, CNPPD1, FAM134A, ZFAND2B, ABCB6, ATG9A, ANKZF1, GLB1L, STK16, TUBA4A, TUBA4B, DNAJB2, PTPRN, MIR153-1, RESP18, DNPEP, DES, SPEG, LOC100996693, GMPPA, ASIC4, CHPF, TMEM198, MIR3132, OBSL1, INHA, STK11IP, SLC4A3, MIR4268, EPHA4, LOC729770, PAX3, CCDC140, LOC440934, SGPP2, FARSB, MOGAT1, ACSL3, KCNE4, SCG2, AP1S3, WDFY1, MRPL44, SERPINE2, FAM124B, CUL3, DOCK10, MIR4439, NYAP2, LOC646736, MIR5702, IRS1, RHBDD1, COL4A4, COL4A3, MFF, TM4SF20, MIR5703, AGFG1, C2orf83, SLC19A3, CCL20, WDR69, SPHKAP, PID1, DNER, TRIP12, FBXO36, SLC16A14, SP110, SP140, SP140L, SP100, LOC151475, CAB39, ITM2C, LOC151484, GPR55, LOC348761, SPATA3, C2orf72, PSMD1, HTR2B, ARMC9, MIR4777, B3GNT7, NCL, LOC100996253, SNORA75, SNORD20, SNORD82, LINC00471, NMUR1, C2orf57, PTMA, MIR1244-1, PDE6D, COPS7B, MIR1471, NPPC, DIS3L2, MIR562, ALPP, ECEL1P2, ALPPL2, ALPI, ECEL1, PRSS56, CHRND, CHRNG, TIGD1, MIR5001, EIF4E2, EFHD1, GIGYF2, KCNJ13, C2orf82, NGEF, NEU2, INPP5D, ATG16L1, SCARNA5, SCARNA6, SAG, DGKD, USP40, UGT1A8, UGT1A10, UGT1A9, UGT1A7, UGT1A6, UGT1A5, UGT1A4, UGT1A3, DNAJB3, LOC100286922, UGT1A1, HEATR7B1, HJURP, MSL3P1, TRPM8, SPP2, ARL4C, SH3BP4, AGAP1, AGAP1-IT1, GBX2, ASB18, IQCA1, CXCR7, LOC93463, COPS8, COL6A3, MLPH, PRLH, RAB17, LRRFIP1, RBM44, RAMP1, UBE2F, UBE2F-SCLY, SCLY, ESPNL, KLHL30, FAM132B, LOC100996584, ILKAP, LOC151174, LOC643387, HES6, PER2, TRAF3IP1, ASB1, LOC151171, LOC100287387, TWIST2, FLJ43879, HDAC4, MIR4440, MIR4441, MGC16025, MIR4269, LOC100128563, MIR2467, FLJ45964, LOC150935, MIR4786, NDUFA10, OR6B2, PRR21, OR6B3, MYEOV2, OTOS, GPC1, PP14571, MIR149, ANKMY1, DUSP28, RNPEPL1, CAPN10, GPR35, AQP12B, AQP12A, KIF1A, AGXT, C2orf54, LOC728763, LOC200772, LOC728208, SNED1, MTERFD2, PASK, PPP1R7, ANO7, HDLBP, SEPT2, FARP2, MIR3133, STK25, BOK-AS1, BOK, THAP4, ATG4B, DTYMK, ING5, D2HGDH, GAL3ST2, NEU4, PDCD1, CXXC11, FLJ38379, LOC100996616, LOC728323, DEFB125, DEFB126, DEFB127, DEFB128, DEFB129, DEFB132, C20orf96, ZCCHC3, LOC100507459, SOX12, NRSN2, TRIB3, RBCK1, TBC1D20, CSNK2A1, TCF15, SRXN1, SCRT2, SLC52A3, FAM110A, ANGPT4, RSPO4, PSMF1, TMEM74B, C20orf202, RAD21L1, SNPH, SDCBP2, FKBP1A-SDCBP2, SDCBP2-AS1, FKBP1A, NSFL1C, SIRPB2, SIRPD, SIRPB1, SIRPG, LOC100289473, SIRPA, PDYN, STK35, LOC388780, TGM3, TGM6, SNRPB, SNORD119, ZNF343, TMC2, NOP56, MIR1292, SNORD110, SNORA51, SNORD86, SNORD56, SNORD57, IDH3B, EBF4, CPXM1, C20orf141, TMEM239, PCED1A, VPS16, PTPRA, GNRH2, MRPS26, OXT, AVP, UBOX5-AS1, UBOX5, FASTKD5, PROSAPIP1, DDRGK1, ITPA, SLC4A11, C20orf194, ATRN, GFRA4, ADAM33, SIGLEC1, HSPA12B, C20orf27, SPEF1, CENPB, CDC25B, AP5S1, MAVS, PANK2, MIR103A2, MIR103B2, RNF24, SMOX, LOC728228, ADRA1D, PRNP, PRND, PRNT, RASSF2, SLC23A2, TMEM230, PCNA, PCNA-AS1, CDS2, PROKR2, LINC00658, LOC643406, LINC00654, GPCPD1, C20orf196, CHGB, TRMT6, MCM8, CRLS1, LRRN4, FERMT1, BMP2, HAO1, TMX4, PLCB1, RNU105B, PLCB4, LAMP5, PAK7, SNAP25-AS1, ANKRD5, SNAP25, MKKS, SLX4IP, JAG1, LOC339593, LINC00687, BTBD3, LOC100996658, LOC100505515, SPTLC3, ISM1, ISM1-AS1, TASP1, ESF1, NDUFAF5, SEL1L2, MACROD2, FLRT3, MACROD2-AS1, KIF16B, SNRPB2, OTOR, PCSK2, BFSP1, DSTN, RRBP1, BANF2, SNX5, SNORD17, C20orf72, LOC100996673, OVOL2, PET117, CSRP2BP, ZNF133, DZANK1-AS1, DZANK1, POLR3F, MIR3192, RBBP9, SEC23B, LINC00493, DTD1, LINC00652, LOC100270804, C20orf78, SCP2D1, SLC24A3, LOC100130264, LOC100287166, RIN2, NAA20, CRNKL1, C20orf26, INSM1, RALGAPA2, PLK1S1, XRN2, NKX2-4, NKX2-2, PAX1, LOC100652902, LOC100270679, LOC100505651, LOC284788, LINC00261, FOXA2, SSTR4, THBD, CD93, LINC00656, LOC100505664, NXT1, LOC100505683, GZF1, NAPB, CSTL1, CST11, CST8, CST13P, CST9L, CST9, CST3, CST4, CST1, CST2, CST5, GGTLC1, FLJ33581, SYNDIG1, CST7, APMAP, ACSS1, VSX1, LOC284798, ENTPD6, PYGB, ABHD12, GINS1, NINL, NANP, ZNF337, FAM182B, LOC100289375, LOC100134868, FAM182A, NCOR1P1, LOC284801, MIR663A, FLJ45832, FRG1B, MLLT10P1, DEFB115, DEFB116, DEFB118, DEFB119, DEFB121, DEFB122, DEFB123, DEFB124, REM1, LINC00028, HM13, PSIMCT-1, HM13-AS1, ID1, MIR3193, COX412, BCL2L1, TPX2, MYLK2, FOXS1, DUSP15, TTLL9, PDRG1, XKR7, CCM2L, HCK, TM9SF4, TSPY26P, PLAGL2, POFUT1, MIR1825, KIF3B, ASXL1, C20orf112, LOC149950, C20orf203, COMMD7, DNMT3B, MAPRE1, EFCAB8, SUN5, BPIFB2, BPIFB6, BPIFB3, BPIFB4, BPIFA2, BPIFA4P, BPIFA3, BPIFA1, BPIFB1, CDK5RAP1, SNTA1, CBFA2T2, NECAB3, C20orf144, ACTL10, E2F1, PXMP4, ZNF341, CHMP4B, RALY, MIR4755, EIF2S2, ASIP, AHCY, ITCH, MIR644A, DYNLRB1, MAP1LC3A, PIGU, TP53INP2, NCOA6, HMGB3P1, GGT7, ACSS2, GSS, MYH7B, MIR499A, MIR499B, TRPC4AP, EDEM2, PROCR, MMP24, EIF6, FAM83C, UQCC, GDF5OS, GDF5, MIR1289-1, CEP250, C20orf173, ERGIC3, FER1L4, SPAG4, CPNE1, RBM12, NFS1, ROMO1, RBM39, PHF20, SCAND1, CNBD2, LINC00657, EPB41L1, AAR2, DLGAP4, MYL9, TGIF2, TGIF2-C20orf24, C20orf24, SLA2, NDRG3, DSN1, SOGA1, C20orf118, SAMHD1, RBL1, C20orf132, RPN2, GHRH, MANBAL, SRC, BLCAP, NNAT, LINC00489, LOC100287792, CTNNBL1, VSTM2L, TTI1, RPRD1B, TGM2, KIAA1755, BP1, LBP, LOC388796, SNORA71B, SNORA7IA, SNORA71C, SNORA71D, SNHG11, SNORA39, SNORA60, RALGAPB, MIR54802, ADIG, ARHGAP40, SLC32A1, ACTR5, PPPIR16B, FAM83D, DHX35, LOC339568, LOC100505663, MAFB, LOC100128988, TOP1, LOC100996518, PLCG1, ZHX3, LPIN3, EMILIN3, CHD6, PTPRS, SRSF6, L3MBTL1, SGK2, IFT52, MYBL2, GTSF1L, TOX2, JPH2, C20orf111, LOC100505783, GDAP1L1, FITM2, R3HDML, HNF4A, MIR3646, TTPAL, SERINC3, PKIG, ADA, LOC79015, WISP2, KCNK15, RIMS4, YWHAB, PABPC1L, TOMM34, STK4-AS1, STK4, KCNS1, WFDC5, WFDC12, PI3, SEMG1, SEMG2, SLPI, MATN4, RBPJL, SDC4, SYS1, SYS1-DBNDD2, TP53TG5, DBNDD2, PIGT, LOC100130157, WFDC2, SPINT3, WFDC6, EPPIN-WFDC6, EPPIN, WFDC8, WFDC9, WFDC10A, WFDC11, WFDC10B, WFDC13, MIR3617, SPINT4, WFDC3, DNTTIP1, UBE2C, TNNC2, SNX21, ACOT8, ZSWIM3, ZSWIM1, SPATA25, NEURL2, CTSA, PLTP, PCIF1, ZNF335, MMP9, LOC100128028, SLC12A5, NCOA5, CD40, CDH22, SLC35C2, ELMO2, ZNF663, MKRN7P, ZNF334, OCSTAMP, SLC13A3, TP53RK, SLC2A10, EYA2, MIR3616, ZMYND8, LOC100131496, NCOA3, SULF2, LOC100505983, LOC100506053, LINC00494, LOC100506069, PREX1, ARFGEF2, CSE1L, STAU1, DDX27, ZNFX1, ZNFX1-AS1, SNORD12C, SNORD12B, SNORD12, KCNB1, PTGIS, LOC728671, B4GALT5, SLC9A8, SPATA2, RNF114, SNAI1, LINC00651, UBE2V1, TMEM189-UBE2V1, TMEM189, CEBPB, LOC100506115, LOC284751, PTPN1, MIR645, FAM65C, MIR1302-5, LOC100506175, PARD6B, BCAS4, ADNP, DPM1, MOCS3, KCNG1, NFATC2, MIR3194, ATP9A, SALL4, ZFP64, TSHZ2, ZNF217, SUMO1P1, BCAS1, MIR4756, CYP24A1, PFDN4, DOK5, CBLN4, MC3R, FAM210B, AURKA, CSTF1, CASS4, RTFDC1, GCNT7, LOC100130156, FAM209A, FAM209B, TFAP2C, BMP7, MIR4325, SPO11, RAE1, MTRNR2L3, LOC100291105, RBM38, CTCFL, PCK1, ZBP1, PMEPA1, MIR4532, LOC100996602, C20orf85, ANKRD60, PPP4R1L, RAB22A, VAPB, APCDD1L, APCDD1L-AS1, MGC4294, STX16, STX16-NPEPL1, NPEPL1, LOC100652930, LOC100506348, MIR296, MIR298, GNAS-AS1, GNAS, TH1L, CTSZ, TUBB1, SLMO2-ATP5E, ATPSE, SLMO2, ZNF831, EDN3, PHACTR3, LOC100506384, SYCP2, FAM217B, PPPIR3D, CDH26, C20orf197, LOC729296, LOC284757, MIR646, MIR4533, MIR548AG2, LOC100506470, CDH4, LOC100128310, MIR1257, TAF4, LSM14B, PSMA7, SS18L1, GTPBP5, HRH3, FLJ44790, OSBPL2, ADRM1, LAMA5, MIR4758, RPS21, CABLES2, RBBP8NL, GATA5, C20orf166-AS1, C20orf166, MIR1-1, MIR133A2, LOC100131174, LOC100505735, SLCO4A1, LOC100127888, NTSR1, LINC00659, MRGBP, OGFR, COL9A3, TCFL5, DPH3P1, DIDO1, GID8, SLC17A9, BHLHE23, LOC63930, LINC00029, LOC100144597, HAR1B, HAR1A, MIR124-3, YTHDF1, BIRC7, MIR3196, NKAIN4, FLJ16779, ARFGAP1, MIR4326, COL20A1, CHRNA4, KCNQ2, EEF1A2, PPDPF, PTK6, SRMS, C20orf195, HELZ2, GMEB2, LOC100505771, STMN3, RTEL1, RTEL1-TNFRSF6B, TNFRSF6B, ARFRP1, ZGPAT, LIME1, SLC2A4RG, ZBTB46, C20orf181, ABHD16B, TPD52L2, DNAJC5, MIR941-1, MIR941-2, MIR941-3, MIR941-4, UCKL1, MIR1914, MIR647, UCKL1-AS1, ZNF512B, SAMD10, PRPF6, LINC00176, SOX18, TCEA2, RGS19, OPRL1, C20orf201, NPBWR2, MYT1, PCMTD2, LINC00266-1, MIR3648, MIR3687, TEKT4P2, TPTE, BAGE2, ANKRD30BP2, MIR3156-3, POTED, MIR3118-5, LOC441956, C21orf15, ANKRD20A11P, LIPI, RBM11, ABCC13, HSPA13, SAMSN1, SAMSN1-AS1, LOC388813, NRIP1, USP25, LINC00478, MIR99A, MIRLET7C, MIR125B2, C21orf37, CXADR, BTG3, C21orf91-OT1, C21orf91, CHODL-AS1, CHODL, TMPRSS15, MIR548X, LOC100505973, LINC00320, NCAM2, LINC00317, LINC00308, D21S2088E, LOC339622, LINC00158, MIR155HG, MIR155, LINC00515, MRPL39, JAM2, ATP5J, GABPA, APP, LOC100996571, CYYR1, ADAMTS1, ADAMTS5, MIR4759, LINC00113, LINC00314, LINC00161, N6AMT1, LTN1, RWDD2B, USP16, CCT8, C21orf7, LINC00189, BACH1, GRIK1, GRIK1-AS2, GRIK1-AS1, CLDN17, LINC00307, CLDN8, KRTAP24-1, KRTAP25-1, KRTAP26-1, KRTAP27-1, KRTAP23-1, KRTAP13-2, MIR4327, KRTAP13-1, KRTAP13-3, KRTAP13-4, KRTAP15-1, KRTAP19-1, KRTAP19-2, KRTAP19-3, KRTAP19-4, KRTAP19-5, KRTAP19-6, KRTAP19-7, KRTAP22-2, KRTAP6-3, KRTAP6-2, KRTAP22-1, KRTAP6-1, KRTAP20-1, KRTAP20-4, KRTAP20-2, KRTAP20-3, KRTAP21-3, KRTAP21-2, KRTAP21-1, KRTAP8-1, KRTAP7-1, KRTAP11-1, KRTAP19-8, TIAM1, LOC150051, SOD1, SCAF4, HUNK, LINC00159, MIS18A, MRAP, URB1, SNORA80, C21orf119, EVA1C, TCP10L, C21orf59, SYNJ1, GCFC1-AS1, GCFC1, C21orf49, C21orf62, OLIG2, OLIG1, C21orf54, IFNAR2, LOC100288432, IL10RB, IFNAR1, IFNGR2, TMEM50B, DNAJC28, GART, SON, DONSON, CRYZL1, ITSN1, ATP50, LINC00649, LINC00650, MRPS6, SLC5A3, LINC00310, KCNE2, FAM165B, LOC388820, KCNE1, RCAN1, LOC100506369, CLIC6, LINC00160, LOC100506385, RUNX1, RUNX1-IT1, LOC100506403, MIR802, LOC100996609, SETD4, LOC100133286, CBR1, CBR3-AS1, CBR3, DOPEY2, MORC3, CHAF1B, CLDN14, SIM2, HLCS, DSCR6, PIGP, TTC3, DSCR9, DSCR3, DYRK1A, KCNJ6, DSCR4, DSCR8, DSCR10, KCNJ15, ERG, LINC00114, ETS2, FLJ45139, PSMG1, BRWD1, BRWD1-IT2, BRWD1-AS1, HMGN1, WRB, LCA5L, SH3BGR, C21orf88, B3GALT5, IGSF5, PCP4, DSCAM, MIR4760, DSCAM-AS1, DSCAM-IT1, LINC00323, MIR3197, BACE2, PLAC4, FAM3B, MX2, MX1, TMPRSS2, LINC00111, LINC00479, LINC00112, RIPK4, PRDM15, C2CD2, ZNF295, ZNF295-AS1, UMODL1, C21orf128, ABCG1, TFF3, TFF2, TFF1, TMPRSS3, UBASH3A, RSPH1, SLC37A1, PDE9A, WDR4, NDUFV3, MIR5692B, PKNOX1, CBS, U2AF1, LOC100288336, CRYAA, LINC00322, FLJ41733, SIK1, LINC00319, LINC00313, HSF2BP, RRP1B, PDXK, CSTB, RRP1, LOC284837, AGPAT3, TRAPPC10, PWP2, C21orf33, ICOSLG, DNMT3L, AIRE, PFKL, C21orf2, TRPM2, LRRC3-AS1, LRRC3, LRRC3DN, LOC100505727, TSPEAR, C21orf90, KRTAP10-1, KRTAP10-2, KRTAP10-3, KRTAP10-4, KRTAP10-5, KRTAP10-6, KRTAP10-7, KRTAP10-8, KRTAP10-9, KRTAP10-10, KRTAP10-11, KRTAP12-4, KRTAP12-3, KRTAP12-2, KRTAP12-1, KRTAP10-12, UBE2G2, SUMO3, PTTG1IP, ITGB2, ITGB2-AS1, C21orf67, FAM207A, LINC00163, LINC00162, SSR4P1, ADARB1, POFUT2, LOC642852, LINC00315, LINC00316, LOC100505827, COL18A1, COL18A1-AS2, COL18A1-AS1, SLC19A1, LOC100129027, PCBP3, COL6A1, COL6A2, FTCD, SPATC1L, LSS, MCM3AP-AS1, MCM3AP, YBEY, C21orf58, PCNT, DIP2A, DIP2A-IT1, S100B, PRMT2, LOC400879, POTEH, OR11H1, CCT8L2, TPTEP1, ANKRD62P1-PARP4P3, XKR3, HSFY1P1, GAB4, CECR7, IL17RA, CECR6, LOC100996342, CECR5, CECR5-AS1, CECR1, CECR3, CECR2, SLC25A18, ATP6V1E1, BCL2L13, BID, MIR3198-1, LINC00528, MICAL3, MIR648, FLJ41941, PEX26, TUBA8, USP18, LOC642643, GGT3P, LOC100132900, LOC727983, DGCR6, PRODH, DGCR5, LOC100996369, LOC100287576, LOC100506454, DGCR9, DGCR10, DGCR2, DGCR11, DGCR14, TSSK2, GSC2, LOC100652736, SLC25A1, CLTCL1, HIRA, MRPL40, C22orf39, UFD1L, CDC45, CLDN5, LOC150185, SEPT5, SEPT5-GP1BB, GP1BB, TBX1, GNB1L, C22orf29, TXNRD2, COMT, MIR4761, ARVCF, C22orf25, MIR185, DGCR8, MIR3618, MIR1306, TRMT2A, RANBP1, ZDHHC8, LOC388849, LOC284865, LOC150197, RTN4R, MIR1286, DGCR6L, LOC729444, LOC100996401, TMEM191B, PI4KAP1, RIMBP3, ZNF74, SCARF2, KLHL22, MED15, POM121L4P, TMEM191A, PI4KA, SERPIND1, SNAP29, CRKL, AIFM3, LZTR1, THAP7, THAP7-AS1, TUBA3FP, P2RX6, SLC7A4, MIR649, P2RX6P, LOC400891, BCRP2, LOC284861, GGT2, LOC100132705, POM121L8P, LOC100996335, CA15P3, RIMBP3B, HIC2, LOC100996337, TMEM191C, PI4KAP2, RIMBP3C, UBE2L3, YDJC, CCDC116, SDF2L1, MIR301B, MIR130B, PPIL2, YPEL1, MAPK1, PPM1F, LOC100286925, TOP3B, PRAMEL, VPREB1, LOC96610, ZNF280B, ZNF280A, PRAME, LOC648691, POM121L1P, GGTLC2, MIR650, IGLL5, RTDR1, GNAZ, RAB36, BCR, FBXW4P1, CES5AP1, ZDHHC8P1, LOC388882, IGLL1, C22orf43, GUSBP11, RGL4, ZNF70, VPREB3, C22orf15, CHCHD10, MMP11, SMARCB1, DERL3, SLC2A11, LOC284889, MIF, LOC100652871, GSTT2B, DDTL, DDT, GSTT2, GSTTP1, LOC100996594, LOC391322, GSTT1, GSTTP2, CABIN1, LOC100652894, SUSD2, GGT5, POM121L9P, SPECC1L, ADORA2A, ADORA2A-AS1, UPB1, GUCD1, SNRPD3, GGT1, FAM211B, BCRP3, POM121L10P, PIWIL3, TOP1P2, SGSM1, TMEM211, KIAA1671, LOC100128531, CRYBB3, CRYBB2, IGLL3P, LOC100652901, LRP5L, CRYBB2P1, LOC100507580, LOC100996404, ADRBK2, MYO18B, SEZ6L, ASPHD2, HPS4, SRRD, TFIP11, LOC100507599, TPST2, MIR548J, CRYBB1, CRYBA4, MIAT, LOC100507657, MN1, PITPNB, TTC28-AS1, MIR3199-1, MIR3199-2, TTC28, CHEK2, HSCB, CCDC117, XBP1, ZNRF3, ZNRF3-AS1, C22orf31, KREMEN1, EMID1, RHBDD3, EWSR1, GAS2L1, RASL10A, AP1B1, MIR3653, SNORD125, RFPL1-AS1, RFPL1, NEFH, THOC5, NIPSNAP1, NF2, CABP7, ZMAT5, UQCR10, ASCC2, MTMR3, HORMAD2, LIF, OSM, GATSL3, TBC1D10A, SF3A1, CCDC157, KIAA1656, RNF215, SEC14L2, MTFP1, LOC646513, SEC14L3, SDC4P, SEC14L4, SEC14L6, GAL3ST1, PES1, TCN2, SLC35E4, LOC100506075, DUSP18, OSBP2, MIR3200, MORC2-AS1, MORC2, TUG1, SMTN, SELM, INPP5J, PLA2G3, MIR3928, RNF185, LIMK2, PIK3IP1, PATZ1, MGC15705, FLJ20464, DRG1, EIF4ENIF1, RNU6-28, SFI1, PISD, PRR14L, DEPDC5, C22orf24, YWHAH, SLC5A1, AP1B1P1, C22orf42, RFPL2, SLC5A4, RFPL3, RFPL3-AS1, LOC339666, C22orf28, BPIFC, FBXO7, SYN3, TIMP3, LARGE, MIR4764, LOC100506195, ISX, HMGXB4, TOM1, MIR3909, HMOX1, MCM5, RASD2, MB, APOL6, APOL5, RBFOX2, LOC100131802, APOL3, APOL4, APOL2, APOL1, MYH9, TXN2, FOXRED2, EIF3D, CACNG2, IFT27, PVALB, NCF4, CSF2RB, LOC100506241, TEX33, TST, MPST, KCTD17, TMPRSS6, IL2RB, CIQTNF6, SSTR3, RAC2, CYTH4, LOC100506271, ELFN2, MFNG, CARD10, CDC42EP1, LGALS2, GGA1, SH3BP1, PDXP, LGALS1, NOL12, TRI-OBP, H1F0, GCAT, GALR3, ANKRD54, MIR658, MIR659, EIF3L, MICALL1, C22orf23, POLR2F, SOX10, MIR4534, PICK1, SLC16A8, BAIAP2L2, PLA2G6, MAFF, TMEM184B, CSNK1E, LOC100996460, LOC400927, KCNJ4, KDELR3, DDX17, DMC1, FAM227A, CBY1, TOMM22, JOSD1, GTPBP1, SUN2, DNAL4, NPTXR, CBX6, APOBEC3A, APOBEC3B, APOBEC3C, APOBEC3D, APOBEC3F, APOBEC3G, APOBEC3H, CBX7, PDGFB, RPL3, SNORD83B, SNORD83A, RNU86, SNORD43, SYNGR1, TAB1, LOC100506472, MGAT3, SMCR7L, ATF4, RPS19BP1, CACNA1I, ENTHD1, GRAP2, FAM83F, LOC100130899, TNRC6B, ADSL, SGSM3, MKL1, MCHR1, SLC25A17, MIR4766, ST13, XPNPEP3, DNAJB7, RBX1, MIR1281, EP300, L3MBTL2, LOC100506544, CHADL, RANGAP1, ZC3H7B, TEF, LOC100996598, TOB2, PHF5A, ACO2, POLR3H, CSDC2, PMM1, DESI1, XRCC6, NHP2L1, LOC100506562, C22orf46, MEI1, CCDC134, SREBF2, MIR33A, SHISA8, MIR378I, TNFRSF13C, CENPM, LINC00634, SEPT3, WBP2NL, NAGA, FAM109B, C22orf32, NDUFA6, LOC100132273, CYP2D6, CYP2D7P1, TCF20, LOC388906, LOC100134361, NFAM1, SERHL, RRP7A, SERHL2, RRP7B, POLDIP3, RNU12, CYBER3, ATP5L2, A4GALT, ARFGAP3, PAC-SIN2, LOC100506679, TTLL1, BIK, MCAT, TSPO, TTLL12, SCUBE1, MPPED1, EFCAB6-AS1, EFCAB6, SULT4A1, PNPLA5, PNPLA3, SAMM50, PARVB, PARVG, KIAA1644, LDOC1L, LINC00207, LINC00229, PRR5, PRR5-ARHGAP8, ARHGAP8, PHF21B, LOC100506695, LOC100506714, NUP50, KIAA0930, MIR1249, UPK3A, FAM118A, SMC1B, RIBC2, FBLN1, LOC100506737, ATXN10, MIR4762, WNT7B, LOC730668, LOC100271722, C22orf26, LOC150381, MIRLET7BHG, MIR3619, MIRLET7A3, MIR4763, MIRLET7B, PPARA, CDPF1, PKDREJ, TTC38, CN5H6.4, GTSE1, TRMU, CELSR1, GRAMD4, CERK, TBC1D22A, LOC100128818, FLJ46257, MIR3201, LOC100506877, FAM19A5, LOC284933, MIR4535, LOC100128946, MIR3667, C22orf34, BRD1, LOC90834, ZBED4, ALG12, CRELD2, PIM3, IL17REL, TTLL8, MLC1, MOV10L1, PANX2, TRABD, SELO, TUBGCP6, HDAC10, MAPK12, MAPK11, PLXNB2, DENND6B, PPP6R2, SBF1, ADM2, MIOX, LMF2, NCAPH2, SCO2, TYMP, ODF3B, KLHDC7B, SYCE3, CPT1B, CHKB-CPT1B, CHKB, LOC100144603, MAPK8IP2, ARSA, SHANK3, ACR, RPL23AP82, RABL2B, CHL1-AS2, CHL1, CNTN6, CNTN4, CNTN4-AS2, IL5RA, TRNT1, CRBN, LRRN1, SETMAR, SUMF1, ITPR1-AS1, ITPR1, EGOT, BHLHE40-AS1, BHLHE40, ARL8B, EDEM1, MIR4790, GRM7, LOC100996542, LMCD1-AS1, LMCD1, LINC00312, SSUH2, CAV3, OXTR, RAD18, SRGAP3, THUMPD3, SETD5-AS1, LOC100996546, SETD5, LHFPL4, MTMR14, CPNE9, BRPF1, OGG1, CAMK1, TADA3, ARPC4, ARPC4-TTLL3, TTLL3, RPUSD3, CIDEC, JAGN1, IL17RE, IL17RC, CRELD1, PRRT3, PRRT3-AS1, EMC3, LOC442075, LOC401052, CIDECP, FANCD2, FANCD2OS, BRK1, VHL, IRAK2, TATDN2, GHRLOS2, GHRL, GHRLOS, SEC13, ATP2B2, MIR378B, MIR885, LINC00606, SLC6A11, SLC6A1, SLC6A1-AS1, HRH1, ATG7, VGLL4, TAMM41, SYN2, TIMP4, PPARG, TSEN2, LOC100129480, MKRN2, RAF1, TMEM40, CAND2, RPL32, SNORA7A, IQSEC1, LOC100128644, NUP210, HDAC11, FBLN2, LOC100293612, LINC00620, WNT7A, FGD5P1, TPRXL, CHCHD4, TMEM43, XPC, LSM3, SLC6A6, GRIP2, CCDC174, C3orf20, FGD5, FGD5-AS1, NR2C2, MRPS25, ZFYVE20, COL6A4P1, CAPN7, SH3BP5-AS1, SH3BP5, METTL6, EAF1, COLQ, MIR4270, HACL1, BTD, ANKRD28, MIR3134, MIR563, GALNTL2, DPH3, OXNAD1, RFTN1, LINC00690, DAZL, PLCL2, MIR3714, TBC1D5, LOC100505786, LOC339862, SATB1, KCNH8, MIR4791, EFHB, RAB5A, PP2D1, KAT2B, MIR3135A, SGOL1, SGOL1-AS1, VENTXP7, ZNF385D, LOC100505836, UBE2E2-AS1, UBE2E2, UBE2E1, NKI-RAS1, RPL15, NR1D2, LINC00691, THRB, THRB-AS1, MIR4792, LOC100505947, RARB, TOP2B, MIR4442, NGLY1, OXSM, LINC00692, LRRC3B, NEK10, SLC4A7, EOMES, LOC100996624, CMC1, AZI2, ZCWPW2, LINC00693, LOC100652807, RBMS3, TGFBR2, GADL1, STT3B, OSBPL10, OSBPL10-AS1, ZNF860, GPD1L, CMTM8, CMTM7, CMTM6, DYNC1L11, CNOT10, YPLR6490, TRIM71, CCR4, GLB1, TMPPE, CRTAP, SUSD5, FBXL2, UBP1, CLASP2, PDCD6IP, ARPP21, MIR128-2, STAC, DCLK3, TRANK1, EPM2AIP1, MLH1, LRRFIP2, GOLGA4, C3orf35, ITGA9, CTDSPL, MIR26A1, VILL, PLCD1, DLEC1, ACAA1, MYD88, OXSR1, SLC22A13, SLC22A14, XYLB, ACVR2B-AS1, ACVR2B, EXOG, SCN5A, SCN10A, SCN11A, WDR48, GORASP1, TTC21A, CSRNP1, XIRP1, LOC729454, CX3CR1, CCR8, SLC25A38, RPSA, SNORA6, SNORA62, MOBP, MYRIP, EIF1B-AS1, EIF1B, ENTPD3, ENTPD3-AS1, RPL14, ZNF619, ZNF620, ZNF621, CTNNB1, ULK4, TRAK1, CCK, LYZL4, VIPR1, SEC22C, SS18L2, NKTR, ZBTB47, KBTBD5, HHATL, CCDC13, CCDC13-AS1, HIGD1A, CCBP2, CYP8B1, ZNF662, KRBOX1-AS1, KRBOX1, FAM198A, GTDC2, SNRK, SNRK-AS1, ANO10, ABHD5, MIR138-1, TOPAZ1, TCAIM, LOC100506301, LOC100506319, ZNF445, ZNF852, ZNF167, ZNF660, ZNF197, ZNF35, ZNF502, ZNF501, KIAA1143, KIF15, MIR564, TMEM42, TGM4, ZDHHC3, EXOSC7, CLEC3B, CDCP1, TMEM158, LARS2, LARS2-AS1, LIMD1, LIMD1-AS1, SACM1L, SLC6A20, LZTFL1, CCR9, FYCO1, CXCR6, XCR1, CCR1, CCR3, CCR2, CCR5, CCRL2, LTF, RTP3, LRRC2, TDGF1, LOC100132146, ALS2CL, TMIE, PRSS50, PRSS46, PRSS45, PRSS42, MYL3, LOC100996656, PTH1R, CCDC12, NBEAL2, NRADDP, SETD2, FLJ39534, KIF9, KLHL18, PTPN23, SCAP, ELP6, CSPG5, SMARCC1, LOC100996661, DHX30, MIR1226, MAP4, CDC25A, MIR4443, CAMP, ZNF589, NME6, SPINK8, MIR2115, FBXW12, PLXNB1, CCDC51, TMA7, ATRIP, TREX1, SHISA5, PFKFB4, UCN2, COL7A1, MIR711, UQCRC1, TMEM89, SLC26A6, CELSR3, MIR4793, NCKIPSD, IP6K2, PRKAR2A, PRKAR2A-AS1, SLC25A20, ARIH2OS, ARIH2, LOC100506651, P4HTM, WDR6, DALRD3, MIR425, NDUFAF3, MIR 191, IMPDH2, QRICH1, QARS, USP19, LAMB2, LAMB2P1, CCDC71, KLHDC8B, LOC646498, CCDC36, STGC3, C3orf62, MIR4271, USP4, GPX1, RHOA, TCTA, AMT, NICN1, DAG1, BSN-AS2, BSN, APEH, MST1, RNF123, AMIGO3, GMPPB, IP6K1, CDHR4, FAM212A, UBA7, MIR5193, TRAIP, CAMKV, MST1R, MON1A, RBM6, RBM5, LUST, LOC100129060, SEMA3F, MIR566, GNAT1, SLC38A3, GNAI2, SEMA3B, C3orf45, IFRD2, HYAL3, NAT6, HYAL1, HYAL2, TUSC2, RASSF1, ZMYND10, NPRL2, CYB561D2, TMEM115, CACNA2D2, C3orf18, HEMK1, CISH, MAPKAPK3, MIR4787, DOCK3, MANF, RBM15B, VPRBP, RAD54L2, TEX264, GRM2, IQCF6, IQCF4, IQCF3, IQCF2, IQCF5, IQCF1, RRP9, PARP3, GPR62, PCBP4, ABHD14B, ABHD14A-ACY1, ABHD14A, ACY1, RPL29, DUSP7, C3orf74, POC1A, ALAS1, TLR9, TWF2, PPM1M, WDR82, MIRLET7G, GLYCTK, MIR135A1, DNAH1, BAP1, PHF7, SEMA3G, TNNC1, NISCH, STAB1, NT5DC2, SMIM4, PBRM1, GNL3, SNORD19, SNORD19B, SNORD69, GLT8D1, SPCS1, NEK4, ITIH1, ITIH3, ITIH4, TMEM110-MUSTN1, MUSTN1, TMEM110, SFMBT1, RFT1, PRKCD, TKT, DCP1A, CACNA1D, CHDH, IL17RB, ACTR8, SELK, CACNA2D3, ESRG, CACNA2D3-AS1, LRTM1, WNT5A, ERC2, ERC2-IT1, MIR3938, CCDC66, FAM208A, ARHGEF3, ARHGEF3-AS1, SPATA12, IL17RD, HESX1, APPL1, ASB14, DNAH12, PDE12, ARF4, DENND6A, SLMAP, FLNB, DNASE1L3, ABHD6, RPP14, PXK, PDHB, KCTD6, ACOX2, FAM107A, FAM3D, C3orf67, FHIT, NPCDR1, PTPRG, LOC100506994, C3orf14, FEZF2, CADPS, LOC285401, SYNPR, SYNPR-AS1, SNTN, C3orf49, THOC7, ATXN7, PSMD6-AS2, PSMD6, PRICKLE2-AS1, LOC100287879, PRICKLE2, PRICKLE2-AS2, PRICKLE2-AS3, ADAMTS9, ADAMTS9-AS2, MAGI1, MAGI1-IT1, MAGI1-AS1, LOC100508226, SLC25A26, LRIG1, LOC100996321, KBTBD8, MIR4272, SUCLG2, FAM19A1, FAM19A4, EOGT, TMF1, MIR3136, UBA3, ARL6IP5, LMOD3, FRMD4B, MITF, FOXP1, MIR1284, FOXP1-IT1, EIF4E3, GPR27, PROK2, LOC201617, RYBP, LOC100506865, SHQ1, GXYLT2, PPP4R2, EBLN2, PDZRN3, CNTN3, FAM86DP, MIR1324, FRG2C, LOC100996350, LOC401074, ZNF717, MIR4273, ROBO2, ROBO1, MIR3923, LOC728290, GBE1, LOC440970, CADM2, MIR5688, CADM2-AS2, VGLL3, MIR4795, CHMP2B, POU1F1, HTR1F, CGGBP1, ZNF654, C3orf38, LOC100506944, EPHA3, PROS1, ARL13B, STX19, DHFRL1, NSUN3, LOC255025, EPHA6, ARL6, CRYBG3, MINA, GABRR3, OR5AC2, OR5H1, OR5H14, OR5H15, OR5H6, OR5H2, OR5K4, OR5K3, OR5K1, OR5K2, CLDND1, GPR15, CPOX, ST3GAL6-AS1, ST3GAL6, DCBLD2, RNU6-8, LOC100506377, COL8A1, CMSS1, FILIP1L, MIR3921, TMEM30C, TBC1D23, NIT2, TOMM70A, LNP1, TMEM45A, GPR128, TFG, ABI3BP, IMPG2, SENP7, LOC100287852, FAM172BP, TRMT10C, PCNP, ZBTB11, LOC100009676, RPL24, PDCL3P4, CEP97, NXPE3, NFKBIZ, LOC152225, ZPLD1, MIR548AB, ALCAM, CBLB, LOC100302640, LOC344595, CCDC54, BBX, LINC00635, LINC00636, CD47, IFT57, HHLA2, MYH15, KIAA1524, DZIP3, RETNLB, TRAT1, GUCA1C, MORC1, FLJ22763, LINC00488, DPPA2, DPPA4, FLJ25363, MIR4445, LOC151760, PVRL3-AS1, PVRL3, CD96, ZBED2, PLCXD2, PHLDB2, ABHD10, TAGLN3, TMPRSS7, C3orf52, MIR567, GCSAM, SLC9C1, CD200, BTLA, ATG3, SLC35A5, CCDC80, CD200R1L, CD200R1, GTPBP8, C3orf17, BOC, WDR52, WDR52-AS1, SPICE1, SIDT1, MIR4446, KIAA2018, NAA50, ATP6V1A, GRAMD1C, ZDHHC23, KIAA1407, QTRTD1, DRD3, ZNF80, TIGIT, MIR568, ZBTB20, ZBTB20-AS1, MIR4796, GAP43, LSAMP, LSAMP-AS3, MIR4447, LSAMP-AS4, IGSF11, IGSF11-AS1, C3orf30, UPK1B, B4GALT4, ARHGAP31, TMEM39A, POGLUT1, TIMMDC1, CD80, ADPRH, PLA1A, POPDC2, COX17, MAATS1, NR112, GSK3B, LOC100996310, GPR156, LRRC58, FSTL1, MIR198, NDUFB4, HGD, RABL3, GTF2E1, STXBP5L, MIR5682, POLQ, ARGFX, FBXO40, HCLS1, GOLGB1, IQCB1, EAF2, SLC15A2, ILDR1, CD86, CASR, CSTA, CCDC58, FAM162A, WDR5B, KPNA1, PARP9, DTX3L, PARP15, PARP14, HSPBAP1, DIRC2, LOC100129550, SEMA5B, PDIA5, SEC22A, ADCY5, PTPLB, MYLK-AS1, MYLK, CCDC14, ROPN1, KALRN, MIR5002, UMPS, MIR544B, ITGB5, MUC13, HEG1, SLC12A8, MIR5092, ZNF148, SNX4, OSBPL11, MIR54811, FAM86JP, ALG1L, ROPN1B, SLC41A3, ALDH1L1, ALDH1L1-AS1, ALDH1L1-AS2, KLF15, LOC100506907, CCDC37, ZXDC, UROC1, CHST13, C3orf22, TXNRD3NB, TXNRD3, NUP210P1, CHCHD6, LOC100132481, PLXNA1, C3orf56, TPRA1, MCM2, PODXL2, ABTB1, MGLL, KBTBD12, SEC61A1, RUVBL1, EEFSEC, DNAJB8, DNAJB8-AS1, GATA2, LOC90246, C3orf27, RPN1, RAB7A, LOC653712, ACAD9, KIAA1257, CCDC48, GP9, RAB43, ISY1-RAB43, ISY1, CNBP, COPG1, C3orf37, HIFX, HIFX-AS1, RPL32P3, SNORA7B, EFCAB12, MBD4, IFT122, RHO, H1FOO, PLXND1, TMCC1, LOC100507032, TRH, ARVP6125, ALG1L2, FAM86HP, COL6A4P2, COL6A5, COL6A6, PIK3R4, ATP2C1, ASTE1, NEK11, LOC339874, NUDT16P1, NUDT16, MRPL3, SNORA58, LOC100507134, CPNE4, MIR5704, ACPP, LOC100996371, DNAJC13, NPHP3-ACAD11, ACAD11, CCRL1, UBA5, NPHP3, NPHP3-AS1, TMEM108, BFSP2, CDV3, TOPBP1, TF, SRPRB, RAB6B, C3orf36, SLCO2A1, LOC100507210, RYK, AMOTL2, LOC100507224, MIR4788, ANAPC13, CEP63, KY, EPHB1, PPP2R3A, MSL2, PCCB, STAG1, SLC35G2, NCK1, IL20RB, SOX14, LOC100507274, CLDN18, DZIP1L, A4GNT, DBR1, ARMC8, NME9, MRAS, ESYT3, CEP70, FAIM, PIK3CB, FOXL2, C3orf72, PRR23A, PRR23B, PRR23C, BPESC1, PISRT1, MRPS22, COPB2, LOC100507291, RBP2, RBP1, NMNAT3, CLSTN2, TRIM42, SLC25A36, SPSB4, ACPL2, ZBTB38, RASA2, LOC646730, RNF7, GRK7, ATP1B3, TFDP2, GK5, XRN1, ATR, PLS1, TRPC1, PCOLCE2, LOC100507389, PAQR9, LOC100289361, U2SURP, CHST2, SLC9A9, SLC9A9-AS1, C3orf58, PLOD2, PLSCR4, LOC440981, PLSCR2, PLSCR1, PLSCR5, ZIC4, ZIC1, LOC100507447, LOC100507461, AGTR1, CPB1, CPA3, GYG1, HLTF, HLTF-AS1, HPS3, CP, TM4SF18, TM4SF1, TM4SF4, WWTR1, WWTR1-AS1, COMMD2, ANKUB1, RNF13, PFN2, LOC646903, TMEM183B, TSC22D2, SERP1, EIF2A, SELT, FAM194A, SIAH2, CLRN1, CLRN1-AS1, MED12L, GPR171, P2RY14, GPR87, P2RY13, P2RY12, IGSF10, MIR5186, AADACL2, LOC201651, AADAC, SUCNR1, LOC401093, MBNL1, TMEM14E, P2RY1, RAP2B, C3orf79, ARHGEF26-AS1, ARHGEF26, DHX36, GPR149, MME, LOC100507537, PLCH1, LOC100507556, C3orf33, SLC33A1, GMPS, KCNAB1, KCNAB1-AS2, KCNAB1-AS1, SSR3, TIPARP-AS1, TIPARP, LOC730091, PA2G4P4, LEKR1, LOC339894, LOC100498859, CCNL1, VEPH1, PTX3, C3orf55, SHOX2, RSRC1, LOC100996447, MLF1, GFM1, LXN, RARRES1, LOC100287290, MFSD1, IQCJ-SCHIP1, IQCJ, SCHIP1, MIR3919, IL12A, C3orf80, IFT80, SMC4, MIR15B, MIR16-2, TRIM59, KPNA4, SCARNA7, ARL14, PPM1L, B3GALNT1, NMD3, SPTSSB, OTOL1, LOC647107, MIR1263, SI, SLITRK3, BCHE, ZBBX, SERPINI2, WDR49, PDCD10, SERPINI1, LOC100996456, LOC646168, GOLIM4, EGFEM1P, MIR551B, LOC100507661, MECOM, TERC, ACTR3, MYNN, LRRC34, LRRIQ4, LRRC31, SAMD7, LOC100128164, SEC62, GPR160, PHC3, PRKCI, SKIL, CLDN11, SLC7A14, RPL22L1, EIF5A2, SLC2A2, TNIK, MIR569, PLD1, TMEM212, FNDC3B, GHSR, TNFSF10, NCEH1, ECT2, SPATA16, NLGN1, NAALADL2, NAALADL2-AS3, MIR4789, LOC100505547, TBL1XR1, LINC00578, KCNMB2-IT1, KCNMB2, ZMAT3, PIK3CA, KCNMB3, ZNF639, MFN1, GNB4, ACTL6A, MRPL47, NDUFB5, USP13, PEX5L, LOC100505609, TTC14, CCDC39, FXR1, DNAJC19, SOX2-OT, SOX2, LOC100996490, FLJ46066, ATP11B, DCUN1D1, MCCC1, LAMP3, MCF2L2, B3GNT5, LOC100505687, KLHL6, KLHL24, YEATS2, MAP6D1, PARL, MIR4448, ABCC5, ABCC5-AS1, HTR3D, HTR3C, HTR3E, EIF2B5, DVL3, AP2M1, ABCF3, VWA5B2, MIR1224, ALG3, ECE2, CAMK2N2, PSMD2, EIF4G1, SNORD66, FAM131A, CLCN2, POLR2H, THPO, CHRD, EPHB3, MAGEF1, LOC100505710, VPS8, LOC100505729, C3orf70, EHHADH-AS1, EHHADH, MAP3K13, TMEM41A, LIPH, SENP2, IGF2BP2, C3orf65, MIR548AQ, TRA2B, LOC344887, ETV5, DGKG, LOC253573, CRYGS, TBCCD1, DNAJB11, AHSG, FETUB, HRG, KNG1, EIF4A2, SNORD2, SNORA81, SNORA63, SNORA4, RFC4, ADIPOQ, ADIPOQ-AS1, ST6GAL1, LOC100508227, RPL39L, RTP1, MASP1, RTP4, SST, RTP2, LOC100131635, BCL6, LPP-AS2, LPP, FLJ42393, MIR28, TPRG1, TPRG1-AS2, TP63, MIR944, LEPREL1, CLDN1, CLDN16, TMEM207, IL1RAP, GMNC, SNAR-I, OSTN, UTS2D, CCDC50, PYDC2, FGF12, MB21D2, HRASLS, MGC2889, ATP13A5, ATP13A4, OPA1, OPA1-AS1, LOC647323, LOC100128023, LOC100505902, HES1, LOC100505920, LOC100131551, CPN2, LRRC15, GP5, ATP13A3, FLJ34208, LOC100507033, TMEM44-AS1, TMEM44, LSG1, FAM43A, LOC100507391, XXYLT1, MIR3137, ACAP2, PPPIR2, APOD, SDHAP2, MIR570, LOC440993, MUC20, MUC4, TNK2, LOC100128262, SDHAP1, TFRC, LOC401109, ZDHHC19, SLC51A, PCYT1A, TCTEX1D2, TM4SF19-TCTEX1D2, TM4SF19, UBXN7, RNF168, C3orf43, WDR53, FBXO45, LRRC33, CEP19, PIGX, PAK2, RNU6-42, SENP5, NCBP2, LOC152217, PIGZ, MFI2, MFI2-AS1, DLG1, MIR4797, DLG1-AS1, LOC100129516, BDH1, LOC220729, KIAA0226, MIR922, FYTTD1, LRCH3, IQCG, RPL35A, LMLN, ANKRD18DP, FAM157A, ZNF595, ZNF718, ZNF876P, ZNF732, LOC100996363, ZNF141, MIR571, ABCA11P, ZNF721, PIGG, PDE6B, ATP5I, MYL5, MFSD7, PCGF3, LOC100129917, CPLX1, GAK, TMEM175, DGKQ, SLC26A1, IDUA, FGFRL1, RNF212, TMED11P, FLJ35816, SPON2, LOC100130872, LOC285463, CTBP1, CTBP1-AS1, MAEA, UVSSA, CRIPAK, LOC100507054, FAM53A, SLBP, TMEM129, TACC3, FGFR3, LETM1, WHSC1, SCARNA22, WHSC2, MIR943, C4orf48, NAT8L, POLN, HAUS3, MXD4, MIR4800, ZFYVE28, LOC402160, RNF4, FAM193A, TNIP2, SH3BP2, ADD1, MFSD10, NOP14-AS1, NOP14, GRK4, HTT-AS1, HTT, MSANTD1, RGS12, HGFAC, DOK7, LRPAP1, FLJ35424, LOC100133461, LOC100507150, ADRA2C, FAM86EP, OTOP1, TMEM128, LYAR, ZBTB49, NSG1, STX18, LOC100507266, MSX1, CYTL1, STK32B, C4orf6, EVC2, EVC, CRMP1, MIR378D1, C4orf50, JAKMIP1, LOC285484, WFS1, PPP2R2C, MAN2B2, MRFAP1, LOC100507376, LOC93622, S100P, MRFAP1L1, BLOCIS4, KIAA0232, TBC1D14, LOC100129931, CCDC96, TADA2B, GRPEL1, FLJ36777, SORCS2, MIR4798, PSAPL1, MIR4274, AFAP1-AS1, AFAP1, ABLIM1, MIR95, SH3TC1, HTRA3, ACOX3, TRMT44, GPR78, CPZ, HMX1, LOC650293, USP17L10, USP17L11, USP17L12, USP17L13, USP17L15, USP17L17, USP17L18, USP17L19, USP17L20, USP17L21, USP17L22, USP17L24, USP17L25, USP17L26, USP17L5, USP17L27, USP17L28, USP17L29, USP17L9P, USP17L30, USP17L6P, DEFB131, MIR54812, DRD5, SLC2A9, WDR1, MIR3138, ZNF518B, CLNK, MIR572, HS3ST1, HSP90AB2P, RAB28, LOC285547, NKX3-2, LOC285548, BOD1L1, MIR5091, LOC152742, LOC441009, CPEB2, CIQTNF7, CC2D2A, FBXL5, LOC100996623, FAM200B, BST1, CD38, FGFBP1, FGFBP2, PROM1, TAPT1, TAPT1-AS1, LDB2, QDPR, CLRN2, LAP3, MED28, FAM184B, DCAF16, NCAPG, LCORL, SLIT2, SLIT2-IT1, MIR218-1, PACRGL, KCNIP4, KCNIP4-IT1, LOC100505912, GPR125, GBA3, PPARGC1A, LOC729175, MIR573, DHX15, SOD3, CCDC149, LGI2, SEPSECS, LOC285540, PI4K2B, ZCCHC4, ANAPC4, SLC34A2, LOC100996632, SEL1L3, C4orf52, RBPJ, CCKAR, TBC1D19, LOC100506048, STIM2, MIR4275, PCDH7, ARAP2, DTHD1, MIR1255B1, MIR4801, KIAA1239, C4orf19, RELL1, PGM2, TBC1D1, PTTG2, FLJ13197, KLF3, TLR10, TLR1, TLR6, FAM114A1, MIR574, TMEM156, KLHL5, WDR19, RFC1, KLB, MIR5591, RPL9, LIAS, LOC401127, UGDH, UGDH-AS1, C4orf34, UBE2K, PDS5A, LOC344967, N4BP2, RHOH, CHRNA9, RBM47, MIR4802, NSUN7, APBB2, UCHL1, LIMCH1, PHOX2B, TMEM33, DCAF4L1, SLC30A9, BEND4, SHISA3, ATP8A1, GRXCR1, LOC100506827, KCTD8, YIPF7, GUF1, GNPDA2, GABRG1, GABRA2, COX7B2, GABRA4, GABRB1, COMMD8, ATP10D, COR1N, NFXL1, CNGA1, NIPAL1, TXK, TEC, SLAIN2, SLC10A4, ZAR1, FRYL, OCIAD1, OCIAD2, CWH43, DCUN1D4, LRRC66, SGCB, SPATA18, USP46, USP46-AS1, DANCR, MIR4449, SNORA26, ERVMER34-1, LOC152578, RASL11B, SCFD2, FIP1L1, LNX1, LNX1-AS1, LNX1-AS2, RPL21P44, CHIC2, GSX2, PDGFRA, KIT, KDR, SRD5A3, SRD5A3-AS1, TMEM165, CLOCK, PDCL2, NMU, LOC644145, EXOC1, CEP135, KIAA1211, AASDH, PPAT, PAICS, SRP72, ARL9, THEGL, HOPX, SPINK2, REST, NOA1, POLR2B, IGFBP7, LOC255130, LOC100507160, MIR548AG1, LPHN3, TECRL, LOC401134, EPHA5, LOC100144602, MIR1269A, CENPC1, STAP1, UBA6, LOC550112, GNRHR, TMPRSS11D, TMPRSS11A, TMPRSS11GP, TMPRSS11F, LOC550113, SYT14L, FTLP10, TMPRSS11BNL, TMPRSS11B, YTHDC1, TMPRSS11E, UGT2B17, UGT2B15, UGT2B10, UGT2A3, UGT2B7, UGT2B11, UGT2B28, UGT2B4, UGT2A1, UGT2A2, SULT1B1, SULT1E1, CSN1S1, CSN2, STATH, HTN3, HTN1, CSNIS2AP, CSN1S2BP, C4orf40, ODAM, FDCSP, CSN3, CABS1, SMR3A, SMR3B, PROL1, MUC7, AMTN, AMBN, ENAM, IGJ, UTP3, RUFY3, GRSF1, MOB1B, DCK, SLC4A4, GC, NPFFR2, ADAMTS3, COX18, ANKRD17, ALB, AFP, AFM, LOC728040, RASSF6, IL8, CXCL6, PF4V1, CXCL1, PF4, PPBP, CXCL5, CXCL3, PPBPP2, CXCL2, MTHFD2L, EPGN, EREG, AREG, AREGB, BTC, PARM1, LOC100507388, LOC100505946, LOC100506253, LOC441025, RCHY1, THAP6, C4orf26, CDKL2, G3BP2, USO1, PPEF2, NAAA, SDAD1, CXCL9, ART3, CXCL10, CXCL11, NUP54, SCARB2, FAM47E, FAM47E-STBD1, STBD1, CCDC158, SHROOM3, MIR4450, MIR548AH, LOC100996628, SOWAHB, SEPT11, LOC100131826, CCNI, CCNG2, CXCL13, CNOT6L, MRPL1, FRAS1, ANXA3, LOC100505702, BMP2K, MIR5096, PAQR3, LOC100505875, NAA11, GK2, LOC100506035, GDEP, ANTXR2, PRDM8, FGF5, C4orf22, BMP3, PRKG2, RASGEF1B, HNRNPD, HNRPDL, ENOPH1, TMEM150C, LINC00575, SCD5, MIR575, SEC31A, THAP9-AS1, THAP9, LIN54, COPS4, PLAC8, COQ2, HPSE, HELQ, MRPS18C, FAM175A, AGPAT9, NKX6-1, CDS1, WDFY3, WDFY3-AS2, ARHGAP24, MIR4451, MAPK10, MIR4452, PTPN13, SLC10A6, C4orf36, LOC100506746, AFF1, KLHL8, MIR5705, HSD17B13, HSD17B11, NUDT9, SPARCL1, DSPP, DMP1, IBSP, MEPE, HSP90AB3P, SPP1, PKD2, ABCG2, PPM1K, HERC6, HERC5, PYURF, PIGY, HERC3, RNU6-33, NAP1L5, FAM13A-AS1, FAM13A, TIGD2, GPRIN3, SNCA, LOC644248, MMRN1, FAM190A, GRID2, ATOH1, SMARCAD1, HPGDS, PDLIM5, LOC100507012, BMPR1B, UNC5C, PDHA2, RNU6-34, STPG2, RAP1GDS1, TSPAN5, EIF4E, METAP1, MIR3684, ADH5, LOC100507053, ADH4, PCNAP1, ADH6, ADH1A, ADH1B, ADH1C, ADH7, C4orf17, TRMT10A, MTTP, LOC285556, DAPP1, LAMTOR3, DNAJB14, H2AFZ, LOC256880, DDIT4L, EMCN, EMCN-IT3, PPP3CA, MIR1255A, FLJ20021, BANK1, SLC39A8, NFKB1, MANBA, UBE2D3, CISD2, SLC9B1, SLC9B2, BDH2, CENPE, TACR3, CXXC4, TET2, PPA2, ARHGEF38, ARHGEF38-IT1, INTS12, GSTCD, NPNT, TBCK, AIMP1, GIMD1, DKK2, PAPSS1, SGMS2, CYP2U1, HADH, LEF1, LEF1-AS1, RPL34-AS1, RPL34, OSTC, AGXT2L1, COL25A1, SEC24B-AS1, SEC24B, MIR576, CCDC109B, CASP6, PLA2G12A, CFI, GAR1, RRH, LRIT3, EGF, RNU6-35, ELOVL6, ENPEP, PITX2, MIR297, C4orf32, AP1AR, TIFA, ALPK1, NEUROG2, C4orf21, LARP7, MIR367, MIR302D, MIR302A, MIR302C, MIR302B, ANK2, MIR1243, CAMK2D, LOC100507209, ARSJ, UGT8, MIR577, NDST4, MIR1973, TRAM1L1, NDST3, SNHG8, SNORA24, PRSS12, CEP170P1, METTL14, SEC24D, SYNPO2, MYOZ2, USP53, C4orf3, FABP2, FLJ14186, LOC100507306, LOC645513, PDE5A, LOC100996694, MAD2L1, PRDM5, NDNF, TNIP3, QRFPR, ANXA5, TMEM155, PP12613, EXOSC9, CCNA2, BBS7, TRPC3, KIAA1109, ADAD1, IL2, IL21, CETN4P, BBS12, FGF2, NUDT6, SPATA5, SPRY1, LOC285419, ANKRD50, FAT4, MIR2054, INTU, SLC25A31, HSPA4L, PLK4, MFSD8, C4orf29, LARP1B, PGRMC2, LOC100507487, PHF17, SCLT1, C4orf33, PCDH10, PABPC4L, LINC00613, PCDH18, LINC00616, SLC7A11-AS1, SLC7A11, LINC00499, CCRN4L, ELF2, MGARP, NDUFC1, NAA15, RAB33B, SETD7, MGST2, MAML3, SCOC, LOC100129858, CLGN, ELMOD2, UCP1, TBC1D9, RNF150, ZNF330, LOC100507639, IL15, INPP4B, USP38, GAB1, MIR3139, SMARCA5, SMARCA5-AS1, GUSBP5, FREM3, GYPE, GYPB, GYPA, HHIP-AS1, HHIP, LOC100505491, ANAPC10, ABCE1, OTUD4, SMAD1, MMAA, C4orf51, ZNF827, LOC100505545, LSM6, LOC345051, SLC10A7, POU4F2, TTC29, LOC100505596, MIR548G, EDNRA, TMEM184C, PRMT10, ARHGAP10, MIR4799, NR3C2, LOC285423, DCLK2, LRBA, MAB21L2, RPS3A, SNORD73A, SH3D19, PRSS48, FAM160A1, PET112, LOC100505685, LOC100996286, FBXW7, MIR3140, DKFZP434I0714, MIR4453, TMEM154, TIGD4, ARFIP1, FHDC1, TRIM2, ANXA2P1, MND1, KIAA0922, TLR2, RNF175, SFRP2, DCHS2, PLRG1, FGB, FGA, FGG, LRAT, RBM46, NPY2R, MAP9, GUCY1A3, GUCY1B3, ASIC5, TDO2, CTSO, LOC100505784, PDGFC, GLRB, GRIA2, LOC340017, FAM198B, TMEM144, RXFP1, C4orf46, ETFDH, PPID, FNIP2, C4orf45, MIR3688-1, MIR3688-2, RAPGEF2, FSTL5, MIR4454, NAF1, NPY1R, NPY5R, TKTL2, TMA16, MARCH1, ANP32C, LOC100505989, LOC100506013, TRIM61, FAM218A, TRIM60, TMEM192, KLHL2, GK3P, MSMO1, CPE, MIR578, TLL1, SPOCK3, ANXA10, DDX60, DDX60L, PALLD, CBR4, SH3RF1, NEK1, CLCN3, C4orf27, LOC100506085, MFAP3L, AADAT, HSP90AA6P, LOC100506107, LOC100506122, GALNTL6, GALNT7, MIR548T, HMGB2, SAP30, SCRG1, HAND2, NBLA00301, LOC100506154, FBXO8, CEP44, MIR4276, HPGD, GLRA3, ADAM29, GPM6A, WDR17, SPATA4, ASB5, SPCS3, VEGFC, NEIL3, AGA, LOC285501, LINC00290, MGC45800, MIR1305, TENM3, DCTD, FAM92A1P2, WWC2-AS2, WWC2, CLDN22, CLDN24, CDKN2AIP, LOC389247, ING2, RWDD4, TRAPPC11, STOX2, ENPP6, LOC391722, LOC728175, IRF2, LOC100996305, CASP3, CCDC111, MLF1IP, ACSL1, SLED1, LOC731424, MIR3945, LOC100506229, MIR4455, HELT, SLC25A4, KIAA1430, SNX25, LRP2BP, ANKRD37, UFSP2, C4orf47, CCDC110, PDLIM3, SORBS2, TLR3, FAM149A, FLJ38576, CYP4V2, KLKB1, F11, LOC285441, MTNR1A, FAT1, LOC339975, LOC100506272, ZFP42, TRIML2, TRIML1, LOC401164, HSP90AA4P, FRG1, DUX4L9, FRG2, DUX2, DUX4L7, DUX4L6, DUX4L5, DUX4L4, DUX4, DUX4L3, DUX4L2, PLEKHG4B, LRRC14B, CCDC127, SDHA, PDCD6, AHRR, C5orf55, EXOC3, PP7080, SLC9A3, LOC100288152, MIR4456, LOC100996325, CEP72, TPPP, LOC100996452, ZDHHC11, BRD9, TRIP13, LOC100506688, NKD2, SLC12A7, LOC100506766, MIR4635, SLC6A19, SLC6A18, TERT, MIR4457, CLPTM1L, LOC100506791, SLC6A3, LPCAT1, SDHAP3, LOC728613, MIR4277, MRPL36, NDUFS6, IRX4, LOC100506858, IRX2, C5orf38, LOC285577, IRX1, LOC340094, ADAMTS16, KIAA0947, FLJ33360, MED10, UBE2QL1, LOC255167, NSUN2, SRD5A1, PAPD7, MIR4278, LOC442132, ADCY2, C5orf49, FASTKD3, MTRR, LOC729506, LOC100505738, MIR4458, SEMA5A, MIR4636, LOC100505806, SNORD123, TAS2R1, LOC285692, FAM173B, CCT5, CMBL, MARCH6, ROPN1L-AS1, ROPN1L, ANKRD33B, DAP, CTNND2, TAG, DNAH5, TRIO, LOC100133299, FAM105A, FAM105B, ANKH, LOC100130744, LOC100128508, MIR4637, FBXL7, MIR887, MARCH11, LOC401176, ZNF622, FAM134B, MYO10, LOC285696, BASP1, LOC401177, CDH18, GUSBP1, LOC100506217, CDH12, PMCHL1, PRDM9, C5orf17, CDH10, LOC340107, CDH9, LOC643401, LSP1P3, CDH6, DROSHA, C5orf22, PDZD2, MIR4279, GOLPH3, MTMR12, ZFR, MIR579, SUB1, NPR3, LOC340113, TARS, ADAMTS12, RXFP3, SLC45A2, AMACR, CIQTNF3-AMACR, CIQTNF3, LOC646652, LOC401180, RAI14, TTC23L, RAD1, BRIX1, DNAJC21, LOC100996421, AGXT2, PRLR, SPEF2, IL7R, CAPSL, LOC100506406, UGT3A1, UGT3A2, LMBRD2, MIR580, SKP2, NADKD1, RANBP3L, SLC1A3, LOC646719, NIPBL, C5orf42, NUP155, WDR70, GDNF, GDNF-AS1, EGFLAM, EGFLAM-AS4, EGFLAM-AS2, LIFR, LIFR-AS1, MIR3650, OSMR, RICTOR, FYB, C9, DAB2, PTGER4, TTC33, PRKAA1, LOC100506548, RPL37, SNORD72, CARD6, C7, HEATR7B2, C6, PLCXD3, OXCT1, C5orf51, FBXO4, GHR, CCDC152, SEPP1, LOC648987, ANXA2R, LOC153684, LOC100132356, ZNF131, NIM1, HMGCS1, CCL28, C5orf28, C5orf34, PAIP1, LOC100652772, NNT, FGF10, LOC100996444, LOC100506674, MRPS30, HCN1, EMB, PARP8, LOC100287592, LOC642366, ISL1, LOC100506329, PELO, ITGA1, ITGA2, MOCS2, LOC257396, FST, NDUFS4, ARL15, MIR581, MIR4459, HSPB3, SNX18, ESM1, GZMK, GZMA, CDC20B, GPX8, MIR449A, MIR449B, MIR449C, MCIN, CCNO, DHX29, SKIV2L2, PPAP2A, MIR5687, RNF138P1, SLC38A9, DDX4, IL31RA, IL6ST, FLJ31104, ANKRD55, LOC100509780, MAP3K1, SETD9, MIER3, GPBP1, ACTBL2, LOC100996645, PLK2, GAPT, MIR548AE2, RAB3C, PDE4D, MIR582, PART1, DEPDC1B, ELOVL7, ERCC8, NDUFAF2, C5orf43, ZSWIM6, C5orf64, LOC100506526, KIF2A, DIMT1, IPO11, LRRC70, HTR1A, RNF180, RGS7BP, FAM159B, SREK1IP1, CWC27, ADAMTS6, CENPK, PPWD1, TRIM23, C5orf44, SGTB, NLN, ERBB2IP, LOC100303749, SREK1, MAST4, CD180, PIK3R1, SLC30A5, CCNB1, CENPH, MRPS36, CDK7, CCDC125, TAF9, RAD17, MARVELD2, OCLN, GTF2H2C, LOC100272216, LOC100652783, GUSBP3, LOC728093, SERF1B, SMN2, LOC100170939, SMA4, GTF2H2B, SMA5, LOC100652799, SERF1A, SMN1, NAIP, GTF2H2, LOC647859, GUSBP9, PMCHL2, BDP1, MCCC2, CARTPT, MAP1B, MIR4803, MRPS27, PTCD2, ZNF366, TNPO1, MIR4804, FCHO2, TMEM171, TMEM174, FOXD1, BTF3, ANKRA2, UTP15, ARHGEF28, ENC1, HEXB, GFM2, NSA2, FAM169A, LOC100996319, GCNT4, ANKRD31, HMGCR, COL4A3BP, POLK, ANKDD1B, POC5, SV2C, IQGAP2, F2RL2, NCRUPAR, F2R, F2RL1, S100Z, CRHBP, AGGF1, ZBED3, SNORA47, ZBED3-AS1, PDE8B, WDR41, OTP, TBCA, AP3B1, LOC728769, SCAMP1, LHFPL2, ARSB, DMGDH, BHMT2, BHMT, JMY, HOMER1, PAPD4, CMYA5, MTX3, THBS4, SERINC5, LOC644936, SPZ1, CRSP8P, ZFYVE16, FAM151B, ANKRD34B, DHFR, MTRNR2L2, MSH3, RASGRF2, CKMT2, LOC100131067, ZCCHC9, ACOT12, SSBP2, ATG10, RPS23, ATP6AP1L, FLJ41309, MIR3977, TMEM167A, SCARNA18, XRCC4, VCAN, HAPLN1, EDIL3, NBPF22P, COX7C, MIR3607, LOC100505878, MIR 4280, RASA1, CCNH, TMEM161B, TMEM161B-AS1, LINC00461, MIR9-2, LOC100505949, MEF2C, MIR3660, CETN3, MBLAC2, POLR3G, LYSMD3, GPR98, LOC729040, LOC100505994, ARRDC3, ARRDC3-AS1, LOC100505822, FLJ42709, NR2F1, FAM172A, MIR2277, POU5F2, KIAA0825, ANKRD32, MCTP1, FAM81B, TTC37, ARSK, GPR150, RFESD, SPATA9, RHOBTB3, GLRX, C5orf27, ELL2, MIR583, PCSK1, CAST, ERAP1, ERAP2, LNPEP, LIX1, RIOK2, RGMB, FLJ35946, CHD1, LOC100289230, LOC100133050, FAM174A, ST8SIA4, MIR548P, SLCO4C1, SLCO6A1, PAM, GINI, PPIP5K2, C5orf30, NUDT12, RAB9BP1, EFNA5, LOC100129233, FBXL17, HP07349, FER, PJA2, MAN2A1, LOC100289673, TMEM232, MIR548F3, SLC25A46, TSLP, WDR36, CAMK4, STARD4, STARD4-AS1, NREP, NREP-AS1, EPB41L4A-AS1, SNORA13, EPB41L4A, FLJ11235, APC, SRP19, REEP5, DCP2, MCC, TSSK1B, YTHDC2, KCNN2, TRIM36, PGGT1B, CCDC112, FEM1C, TMED7-TICAM2, TICAM2, TMED7, CDO1, ATG12, AP3S1, AQPEP, ARL14EPL, COMMD10, SEMA6A, LOC728342, LOC100505811, DTWD2, MIR1244-2, DMXL1, MIR5706, TNFAIP8, HSD17B4, FAM170A, PRR16, FTMT, SRFBP1, LOX, ZNF474, LOC100505841, SNCAIP, MGC32805, SNX2, SNX24, PPIC, PRDM6, CEP120, CSNKIG3, ZNF608, GRAMD3, ALDH7A1, PHAX, C5orf48, LMNB1, MARCH3, C5orf63, MEGF10, PRRC1, CTXN3, LOC728586, FLJ33630, SLC12A2, FBN2, SLC27A6, ISOC1, MIR4633, MIR4460, ADAMTS19, KIAA1024L, CHSY3, HINT1, LYRM7, CDC42SE2, RAPGEF6, FNIP1, LOC728637, ACSL6, IL3, CSF2, P4HA2, PDLIM4, SLC22A4, LOC553103, MIR3936, SLC22A5, C5orf56, IRF1, IL5, RAD50, IL13, IL4, KIF3A, CCNI2, SEPT8, SOWAHA, SHROOM1, GDF9, UQCRQ, LEAP2, AFF4, ZCCHC10, HSPA4, LOC100506102, FSTL4, MIR1289-2, C5orf15, VDAC1, TCF7, SKP1, PPP2CA, MIR3661, CDKL3, UBE2B, CDKN2AIPNL, PHF15, SAR1B, SEC24A, CAMLG, DDX46, C5orf24, TXNDC15, PCBD2, MIR4461, CATSPER3, PITX1, LOC100996485, LOC340073, H2AFY, C5orf20, TIFAB, NEUROG1, CXCL14, LOC340074, MIR5692C1, SLC25A48, IL9, FBXL21, LECT2, TGFB1, VTRNA2-1, SMAD5-AS1, SMAD5, LOC389332, LOC100506219, TRPC7, SPOCK1, KLHL3, MIR874, HNRNPA0, NPY6R, MYOT, PKD2L2, FAM13B, LOC100130172, WNT8A, NME5, BRD8, KIF20A, CDC23, GFRA3, CDC25C, FAM53C, KDM3B, REEP2, EGR1, ETF1, HSPA9, SNORD63, CTNNA1, LRRTM2, SIL1, MATR3, SNHG4, SNORA74A, PAIP2, SLC23A1, MZB1, PROB1, SPATA24, DNAJC18, ECSCR, TMEM173, UBE2D2, CXXC5, PSD2, NRG2, LOC100505636, PURA, IGIP, CYSTM1, PFDN1, HBEGF, SLC4A9, ANKHD1, ANKHD1-EIF4EBP3, EIF4EBP3, SRA1, APBB3, SLC35A4, CD14, TMCO6, NDUFA2, IK, MIR3655, WDR55, DND1, HARS, HARS2, ZMAT2, VTRNA1-1, VTRNA1-2, VTRNA1-3, PCDHA1, PCDHA2, PCDHA3, PCDHA4, PCDHA5, PCDHA6, PCDHA7, PCDHA8, PCDHA9, PCDHA10, PCDHA11, PCDHA12, PCDHA13, PCDHAC1, PCDHAC2, PCDHB1, PCDHB2, PCDHB3, PCDHB4, PCDHB5, PCDHB6, PCDHB17, PCDHB7, PCDHB8, PCDHB16, PCDHB9, PCDHB10, PCDHB11, PCDHB12, PCDHB13, PCDHB14, PCDHB18, PCDHB19P, PCDHB15, SLC25A2, TAF7, PCDHGA1, PCDHGA2, PCDHGA3, PCDHGB1, PCDHGA4, PCDHGB2, PCDHGA5, PCDHGB3, PCDHGA6, PCDHGA7, PCDHGB4, PCDHGA8, PCDHGB5, PCDHGA9, PCDHGB6, PCDHGA10, PCDHGB7, PCDHGA11, PCDHGB8P, PCDHGA12, PCDHGC3, PCDHGC4, PCDHGC5, DIAPH1, LOC100505658, HDAC3, RELL2, FCHSD1, ARAP3, PCDH1, LOC729080, KIAA0141, PCDH12, RNF14, GNPDA1, NDFIP1, SPRY4, FGF1, ARHGAP26, ARHGAP26-AS1, NR3C1, MIR5197, HMHB1, YIPF5, KCTD16, PRELID2, GRXCR2, SH3RF2, PLAC8L1, LARS, RBM27, POU4F3, TCERG1, GPR151, PPP2R2B, PPP2R2B-IT1, STK32A, DPYSL3, JAKMIP2-AS1, JAKMIP2, SPINK1, SCGB3A2, C5orf46, SPINK5, SPINK14, SPINK6, SPINK13, SPINK7, SPINK9, FBXO38, HTR4, ADRB2, SH3TC2, MIR584, LOC255187, ABLIM3, AFAP1L1, GRPEL2, PCYOX1L, IL17B, MIR143HG, MIR143, MIR145, CSNK1A1, ARHGEF37, PPARGC1B, MIR378A, PDE6A, SLC26A2, TIGD6, HMGXB3, CSF1R, PDGFRB, CDX1, SLC6A7, CAMK2A, ARSI, TCOF1, CD74, RPS14, NDST1, SYNPO, MYOZ3, RBM22, DCTN4, SMIM3, IRGM, ZNF300, ZNF300P1, GPX3, TNIP1, ANXA6, CCDC69, GM2A, SLC36A3, SLC36A2, SLC36A1, FAT2, SPARC, ATOX1, LOC100652758, G3BP1, GLRA1, NMUR2, GRIA1, FAM114A2, MFAP3, GALNT10, MIR1294, FLJ38109, SAP30L, HAND1, MIR3141, MIR1303, LARP1, C5orf4, MIR378H, CNOT8, GEMIN5, MRPL22, KIF4B, SGCD, PPP1R2P3, TIMD4, HAVCR1, HAVCR2, MED7, FAM71B, ITK, CYFIP2, FNDC9, NIPAL4, ADAM19, SOX30, C5orf52, THG1L, LSM11, CLINT1, LOC100507161, EBF1, RNF145, UBLCP1, IL12B, LOC285626, LOC285627, ADRA1B, TTC1, PWWP2A, FABP6, CCNJL, CIQTNF2, C5orf54, SLU7, PTTG1, MIR3142, MIR146A, ATP10B, LOC285629, GABRB2, GABRA6, GABRA1, GABRG2, CCNG1, NUDCD2, HMMR, MAT2B, TENM2, WWC1, RARS, FBLL1, PANK3, MIR103A1, MIR103B1, SLIT3, MIR218-2, LOC728095, MIR585, SPDL1, DOCK2, FAM196B, LOC100133106, MIR378E, FOXI1, LOC100507267, C5orf58, LCP2, LOC100128059, LOC257358, KCNIP1, KCNMB1, GABRP, RANBP17, LOC728145, TLX3, MIR3912, NPM1, FGF18, FBXW11, STK10, EFCAB9, UBTD2, SH3PXD2B, NEURL1B, MIR5003, DUSP1, ERGIC1, LOC100268168, RPL26L1, ATP6V0E1, SNORA74B, CREBRF, BNIP1, NKX2-5, STC2, LOC285593, BOD1, CPEB4, C5orf47, HMP19, MSX2, MIR4634, FLJ16171, DRD1, SFXN1, HRH2, CPLX2, THOC3, LOC100996385, FAM153B, LOC100507387, LOC643201, SIMC1, KIAA1191, ARL10, MIR1271, NOP16, HIGD2A, CLTB, AFF2, RNF44, CDHR2, GPRIN1, SNCB, MIR4281, EIF4E1B, TSPAN17, UNC5A, HK3, UIMC1, ZNF346, FGFR4, NSD1, RAB24, PRELID1, MXD3, LMAN2, RGS14, SLC34A1, PFN3, F12, GRK6, PRR7-AS1, PRR7, DBN1, PDLIM7, DOK3, DDX41, FAM193B, TMED9, B4GALT7, LOC202181, LOC100507427, FAM153A, LOC728554, LOC100128340, PROP1, FAM153C, N4BP3, RMND5B, NHP2, GMCL1P1, HNRNPAB, AGXT2L2, COL23A1, CLK4, ZNF354A, AACSP1, ZNF354B, ZFP2, ZNF454, GRM6, ZNF879, ZNF354C, ADAMTS2, RUFY1, HNRNPH1, C5orf60, CBY3, CANX, MAML1, LTC4S, MGAT4B, MIR1229, SQSTM1, C5orf45, LOC100996419, TBC1D9B, RNF130, MIR340, RASGEF1C, MAPK9, LOC100996424, GFPT2, CNOT6, SCGB3A1, FLT4, OR2Y1, MGAT1, LOC100859930, LOC729678, ZFP62, BTNL8, BTNL3, BTNL9, OR2V1, OR2V2, TRIM7, LOC100507546, MIR4638, TRIM41, GNB2L1, SNORD96A, SNORD95, TRIM52, LOC100507602, LOC100996446, LOC100132062, LOC100286914, OR4F3, FLJ43763, DUSP22, IRF4, EXOC2, HUS1B, LOC285768, FOXQ1, FOXF2, FOXC1, GMDS, LOC100508120, C6orf195, MYLK4, WRNIP1, SERPINB1, MIR4645, MGC39372, SERPINB9, SERPINB6, DKFZP686I15217, NQO2, HTATSF1P2, RIPK1, BPHL, TUBB2A, LOC100507194, TUBB2B, PSMG4, SLC22A23, PXDC1, FAM50B, PRPF4B, FAM217A, C6orf201, ECI2, LOC100507506, KU-MEL-3, CDYL, RPP40, LOC100129461, LOC100129033, PPP1R3G, LYRM4, MIR3691, FARS2, NRN1, F13A1, MIR5683, LY86-AS1, LY86, RREB1, SSR1, CAGE1, RIOK1, DSP, SNRNP48, BMP6, TXNDC5, BLOC1S5-TXNDC5, PIP5K1P1, BLOC1S5, EEF1E1-MUTED, EEF1E1, SCARNA27, LOC100506091, SLC35B3, LOC100506207, HULC, LOC100506288, OFCC1, TFAP2A, LOC100130275, LINC00518, MIR5689, GCNT2, C6orf52, PAK1IP1, TMEM14C, LOC100506379, TMEM14B, MAK, GCM2, SYCP2L, ELOVL2, ELOVL2-AS1, C6orf228, ERVFRD-1, NEDD9, LOC100506431, TMEM170B, ADTRP, HIVEP1, EDN1, PHACTR1, LOC100130357, TBC1D7, GFOD1, SIRT5, NOL7, RANBP9, CCDC90A, RNF182, CD83, LOC100506631, LOC100506647, JARID2, JARID2-AS1, DTNBP1, MYLIP, MIR4639, GMPR, ATXN1, FLJ23152, RBM24, CAP2, FAM8A1, NUP153, KIF13A, LOC100996300, NHLRC1, TPMT, KDM1B, DEK, RNF144B, MIR548A1, LOC100506885, ID4, MBOAT1, E2F3, CDKAL1, SOX4, LINC00340, LOC729177, PRL, HDGFL1, NRSN1, DCDC2, KAAG1, MRS2, GPLD1, ALDH5A1, KIAA0319, TDP2, ACOT13, C6orf62, GMNN, FAM65B, CMAHP, LRRC16A, SCGN, HIST1H2AA, HIST1H2BA, HIST1H2APS1, SLC17A4, SLC17A1, SLC17A3, SLC17A2, TRIM38, HIST1H1A, HIST1H3A, HIST1H4A, HIST1H4B, HIST1H3B, HIST1H2AB, HIST1H2BB, HIST1H3C, HIST1H1C, HFE, HIST1H4C, HIST1H1T, HIST1H2BC, HIST1H2AC, HIST1H1E, HIST1H2BD, HIST1H2BE, HIST1H4D, HIST1H3D, HIST1H2AD, HIST1H2BF, HIST1H4E, HIST1H2BG, HIST1H2AE, HIST1H3E, HIST1H1D, HIST1H4F, HIST1H4G, HIST1H3F, HIST1H2BH, HIST1H3G, HIST1H2BI, HIST1H4H, BTN3A2, BTN2A2, BTN3A1, BTN2A3P, BTN3A3, BTN2A1, LOC285819, BTN1A1, HCG11, HMGN4, ABT1, ZNF322, GUSBP2, LINC00240, LOC100270746, HIST1H2BJ, HIST1H2AG, HIST1H2BK, HIST1H4I, HIST1H2AH, MIR3143, PRSS16, POM121L2, VN1R10P, ZNF204P, ZNF391, ZNF184, LOC100507173, LOC100131289, HIST1H2BL, HIST1H2AI, HIST1H3H, HIST1H2AJ, HIST1H2BM, HIST1H4J, HIST1H4K, HIST1H2AK, HIST1H2BN, HIST1H2AL, HIST1H1B, HIST1H3I, HIST1H4L, HIST1H3J, HIST1H2AM, HIST1H2BO, OR2B2, OR2B6, ZNF165, ZSCAN12P1, ZSCAN16, ZNF192, TOB2P1, ZNF193, ZKSCAN4, NKAPL, ZNF187, PGBD1, ZNF323, ZKSCAN3, ZSCAN12, ZSCAN23, GPX6, GPX5, SCAND3, LOC401242, TRIM27, ZNF311, LOC100129636, OR2W1, OR2B3, OR2J3, OR2J2, OR14J1, OR5V1, OR12D3, OR12D2, OR11A1, OR10C1, OR2H1, MAS1L, LOC100507362, UBD, SNORD32B, OR2H2, GABBR1, MOG, ZFP57, HLA-F, HLA-F-AS1, IFITM4P, HCG4, LOC554223, HLA-G, HLA-H, HCG4B, HLA-A, HCG9, ZNRD1-AS1, HLA-J, HCG8, ZNRD1, PPPIR11, RNF39, TRIM31, TRIM40, TRIM10, TRIM15, TRIM26, HCG17, HLA-L, HCG18, TRIM39, TRIM39-RPP21, RPP21, HLA-E, GNL1, PRR3, ABCF1, MIR877, PPPIR10, MRPS18B, ATAT1, C6orf136, DHX16, PPPIR18, NRM, MDC1, TUBB, FLOT1, IER3, LINC00243, DDR1, MIR4640, GTF2H4, VARS2, SFTA2, DPCR1, MUC21, MUC22, HCG22, C6orf15, PSORS1C1, CDSN, PSORS1C2, CCHCR1, TCF19, POU5F1, PSORS1C3, HCG27, LOC100996357, HLA-C, HLA-B, MICA, HCP5, HCG26, MICB, MCCD1, ATP6V1G2-DDX39B, DDX39B, SNORD117, SNORD84, ATP6V1G2, NFKBIL1, LOC100287329, LTA, TNF, LTB, LST1, NCR3, AIF1, PRRC2A, SNORA38, BAG6, APOM, C6orf47, GPANK1, CSNK2B, LY6G5B, LY6G5C, ABHD16A, MIR4646, LY6G6F, LY6G6E, LY6G6D, LY6G6C, C6orf25, DDAH2, CLIC1, MSH5, MSH5-SAPCD1, SAPCD1, VWA7, VARS, LSM2, HSPA1L, HSPA1A, HSPA1B, C6orf48, SNORD48, SNORD52, NEU1, SLC44A4, EHMT2, C2, ZBTB12, CFB, RDBP, MIR1236, SKIV2L, DOM3Z, STK19, C4A, CYP21A1P, TNXA, C4B, CYP21A2, TNXB, ATF6B, FKBPL, PRRT1, LOC100507547, PPT2, PPT2-EGFL8, EGFL8, AGPAT1, RNF5, AGER, PBX2, GPSM3, NOTCH4, C6orf10, HCG23, BTNL2, HLA-DRA, HLA-DRB5, HLA-DRB6, HLA-DRB1, HLA-DQA1, HLA-DQB1, HLA-DQA2, MIR3135B, HLA-DQB2, HLA-DOB, TAP2, PSMB8, LOC100507463, TAP1, PSMB9, LOC100294145, HLA-DMB, HLA-DMA, BRD2, HLA-DOA, HLA-DPA1, HLA-DPB1, HLA-DPB2, COL11A2, RXRB, SLC39A7, HSD17B8, MIR219-1, RING1, HCG25, VPS52, RPS18, B3GALT4, WDR46, PFDN6, RGL2, TAPBP, ZBTB22, DAXX, KIFC1, PHF1, CUTA, SYNGAP1, MIR5004, ZBTB9, BAK1, GGNBP1, LINC00336, ITPR3, MNF1, MIR3934, IP6K3, LEMD2, MLN, LOC100507584, LOC100653005, MIR1275, GRM4, HMGA1, C6orf1, NUDT3, RPS10-NUDT3, RPS10, PACSIN1, SPDEF, C6orf106, SNRPC, UHRF1BP1, TAF11, ANKS1A, TCP11, SCUBE3, ZNF76, DEF6, PPARD, LOC100507672, FANCE, RPL10A, TEAD3, TULP1, FKBP5, MIR5690, LOC285847, ARMC12, CLPSL2, CLPSL1, CLPS, LHFPL5, SRPK1, SLC26A8, MAPK14, MAPK13, BRPF3, PNPLA1, C6orf222, ETV7, PXT1, KCTD20, STK38, SRSF3, MIR3925, CDKN1A, RAB44, CPNE5, PPIL1, C6orf89, PI16, MTCH1, FGD2, PIM1, TMEM217, TBC1D22B, RNF8, FTSJD2, CCDC167, FLJ45825, LOC100505550, MIR4462, MDGA1, ZFAND3, BTBD9, GLO1, DNAH8, LOC100131047, GLP1R, SAYSD1, KCNK5, KCNK17, KCNK16, KIF6, DAAM2, LOC100505635, MOCS1, FLJ41649, TDRG1, LRFN2, LOC100505697, UNC5CL, TSPO2, APOBEC2, OARD1, NFYA, ADCY10P1, TREML1, TREM2, TREML2, TREML3P, TREML4, TREML5P, TREM1, NCR2, LOC100505711, FOXP4, MIR4641, MDFI, TFEB, PGC, FRS3, PRICKLE4, TOMM6, USP49, MED20, BYSL, CCND3, TAF8, C6orf132, GUCA1A, GUCA1B, MRPS10, TRERF1, UBR2, PRPH2, ATP6V0CP3, TBCC, KIAA0240, RPL7L1, C6orf226, PTCRA, CNPY3, GNMT, PEX6, PPP2R5D, MEA1, KLHDC3, RRP36, CUL7, MRPL2, KLC4, PTK7, SRF, CUL9, C6orf108, TTBK1, SLC22A7, CRIP3, ZNF318, ABCC10, DLK2, TJAP1, LRRC73, YIPF3, POLR1C, XPO5, POLH, GTPBP2, MAD2L1BP, RSPH9, MRPS18A, VEGFA, LOC100132354, C6orf223, MRPL14, TMEM63B, CAPN11, SLC29A1, HSP90AB1, SLC35B2, MIR4647, NFKBIE, TMEM151B, TCTE1, AARS2, SPATS1, CDC5L, MIR4642, LOC100505862, SUPT3H, MIR586, RUNX2, CLIC5, ENPP4, ENPP5, RCAN2, CYP39A1, SLC25A27, TDRD6, PLA2G7, LOC100287718, MEP1A, GPR116, GPR110, TNFRSF21, CD2AP, GPR111, GPR115, OPN5, PTCHD4, MUT, CENPQ, GLYATL3, C6orf141, RHAG, CRISP2, CRISP3, PGK2, CRISP1, DEFB133, DEFB114, DEFB113, DEFB110, DEFB112, LOC100505985, TFAP2D, TFAP2B, PKHD1, MIR206, MIR133B, IL17A, IL17F, MCM3, PAQR8, EFHC1, TRAM2, FLJ37798, LOC730101, TMEM14A, GSTA7P, GSTA2, GSTA1, GSTA5, GSTA3, GSTA4, RN7SK, ICK, FBX09, GCM1, ELOVL5, MIR5685, RPS16P5, GCLC, KLHL31, LRRC1, MLIP-IT1, MLIP, TINAG, FAM83B, HCRTR2, GFRAL, HMGCLL1, BMP5, COL21A1, DST, LOC100652766, BEND6, KIAA1586, ZNF451, BAG2, RAB23, LOC100506188, MIR548U, GUSBP4, LOC100996497, KHDRBS2, LGSN, PTP4A1, PHF3, EYS, SLC25A51P1, LOC100996552, BAI3, LMBRD1, COL19A1, COL9A1, LOC100507172, FAM135A, C6orf57, SMAP1, B3GAT2, OGFRL1, LOC100507367, MIR30C2, MIR30A, LINC00472, RIMS1, KCNQ5, KCNQ5-IT1, MIR4282, KCNQ5-AS1, KHDC1L, KHDC1, C6orf147, DPPA5, KHDC3L, OOEP, DDX43, MB21D1, MTO1, EEF1A1, SLC17A5, CD109, COL12A1, COX7A2, TMEM30A, LOC100506804, FILIP1, MIR4463, SENP6, MYO6, IMPG1, HTR1B, IRAK1BP1, PHIP, HMGN3, LOC100288198, LOC100506851, LCA5, SH3BGRL2, C6orf7, ELOVL4, TTK, BCKDHB, FAM46A, IBTK, TPBG, UBE3D, DOPEY1, PGM3, RWDD2A, ME1, PRSS35, SNAP91, RIPPLY2, CYB5R4, LOC100506908, MRAP2, KIAA1009, LOC100506926, TBX18, NT5E, SNX14, SYNCRIP, SNHG5, SNORD50A, SNORD50B, HTR1E, CGA, ZNF292, GJB7, C6orf162, C6orf163, C6orf164, C6orf165, SLC35A1, RARS2, ORC3, AKIRIN2, SPACA1, CNR1, RNGTT, PNRC1, SRSF12, PM20D2, GABRR1, GABRR2, UBE2J1, RRAGD, ANKRD6, LYRM2, MDN1, CASP8AP2, GJA10, LOC100507024, BACH2, MIR4464, MAP3K7, MIR4643, EPHA7, TSG1, MANEA, FUT9, UFL1, FHL5, GPR63, NDUFAF4, KLHL32, MMS22L, MIR2113, POU3F2, FBXL4, MIR548AI, FAXC, COQ3, PNISR, USP45, TSTD3, CCNC, PRDM13, MCHR2, LOC728012, SIM1, ASCC3, GRIK2, HACE1, LINC00577, LIN28B, BVES, BVES-AS1, POPDC3, PREP, PRDM1, ATG5, LOC100506165, AIM1, RTN4IP1, QRSL1, LOC100422737, MIR587, C6orf203, BEND3, PDSS2, SOBP, SCML4, SEC63, OSTM1, OSTM1-AS1, NR2E1, SNX3, LACE1, FOXO3, LINC00222, ARMC2, LOC100506276, SESN1, CEP57L1, C6orf183, LOC100996634, CCDC162P, LOC100996641, CD164, PPIL6, SMPD2, MICAL1, ZBTB24, AKD1, FIG4, GPR6, WASF1, CDC40, METTL24, DDO, SLC22A16, CDK19, AMD1, GTF3C6, RPF2, GSTM2P1, SLC16A10, KIAA1919, REV3L, TRAF3IP2-AS1, TRAF3IP2, FYN, LOC100506389, WISP3, TUBE1, C6orf225, LAMA4, RFPL4B, LOC100287612, LOC100652953, MARCKS, LOC285758, FLJ34503, HDAC2, HS3ST5, LOC441167, FRK, TPI1P3, NT5DC1, COL10A1, TSPYL4, LOC100506496, TSPYL1, DSE, FAM26F, BET3L, FAM26E, FAM26D, RWDD1, RSPH4A, ZUFSP, KPNA5, FAM162B, GPRC6A, RFX6, VGLL2, ROS1, DCBLD1, GOPC, NUS1, SLC35F1, CEP85L, BRD7P3, PLN, LOC100287632, MCM9, ASF1A, FAM184A, MIR548B, MAN1A1, LOC285762, MIR3144, C6orf170, GJA1, HSF2, SERINC1, PKIB, FABP7, SMPDL3A, CLVS2, TRDN, NKAIN2, STL, RNF217, TPD52L1, HDDC2, LOC643623, HEY2, NCOA7, HINT3, TRMT11, LOC100507136, CENPW, MIR588, RSPO3, RNF146, ECHDC1, SOGA3, KIAA0408, C6orf58, THEMIS, PTPRK, LAMA2, ARHGAP18, TMEM244, L3MBTL3, SAMD3, TMEM200A, LOC100507203, EPB41L2, AKAP7, ARG1, MED23, ENPP3, OR2A4, CTAGE9, MIR548H5, ENPP1, CTGF, MIR548AJ1, LOC100507254, MOXD1, STX7, TAAR9, TAAR8, TAAR6, TAAR5, TAAR3, TAAR2, TAAR1, VNN1, VNN3, VNN2, SLC18B1, RPS12, SNORD101, SNORD100, SNORA33, LINC00326, EYA4, LOC100507308, MGC34034, TCF21, TBPL1, SLC2A12, HMGA1P7, SGK1, LOC154092, ALDH8A1, HBS1L, MIR3662, MYB, MIR548A2, AHI1, LINC00271, PDE7B, LOC644135, FAM54A, BCLAF1, MAP7, MAP3K5, PEX7, SLC35D3, NHEG1, IL20RA, IL22RA2, IFNGR1, OLIG3, LOC100507406, LOC100130476, TNFAIP3, PERP, KIAA1244, PBOV1, HEBP2, NHSL1, MIR3145, FLJ46906, LOC100507462, CCDC28A, ECT2L, REPS1, ABRACL, HECA, TXLNB, CITED2, LOC645434, LOC100132735, LOC100507477, MIR3668, MIR4465, NMBR, VTA1, GPR126, LOC153910, HIVEP2, LOC100507489, AIG1, ADAT2, PEX3, FUCA2, LOC285740, PHACTR2, LTV1, ZC2HC1B, PLAGL1, HYMAI, SF3B5, STX11, UTRN, EPM2A, LOC100507557, FBXO30, SHPRH, GRM1, RAB32, ADGB, LOC729176, STXBP5-AS1, STXBP5, SAMD5, SASH1, UST, LOC100128176, TAB2, SUMO4, ZC3H12D, PPIL4, GINM1, KATNA1, LATS1, NUP43, PCMT1, LRP11, LOC100652739, RAET1E, RAET1G, ULBP2, ULBP1, RAET1L, ULBP3, PPPIR14C, IYD, PLEKHG1, MTHFD1L, AKAP12, ZBTB2, RMND1, C6orf211, CCDC170, ESR1, SYNE1, SYNE1-AS1, MYCT1, VIP, FBX05, MTRF1L, RGS17, LOC100996290, OPRM1, IPCEF1, CNKSR3, SCAF8, MIR1273C, LOC100505519, TIAM2, TFB1M, CLDN20, NOX3, MIR1202, ARID1B, MIR4466, TMEM242, ZDHHC14, MIR3692, SNX9, SYNJ2, SYNJ2-IT1, SERAC1, GTF2H5, TULP4, TMEM181, DYNLT1, SYTL3, MIR3918, EZR, OSTCP1, C6orf99, RSPH3, TAGAP, FNDC1, FLJ27255, SOD2, WTAP, LOC100129518, ACAT2, TCP1, SNORA20, SNORA29, MRPL18, PNLDC1, MAS1, IGF2R, AIRN, LOC729603, SLC22A1, SLC22A2, SLC22A3, LPAL2, LPA, PLG, MAP3K4, AGPAT4, AGPAT4-IT1, PARK2, PACRG, LOC729658, PACRG-AS1, DKFZp451B082, CAHM, QKI, C6orf118, PDE10A, SDIM1, LINC00473, LINC00602, T, PRR18, SFT2D1, LOC100289495, MPC1, RPS6KA2, RPS6KA2-IT1, MIR1913, RNASET2, MIR3939, FGFR1OP, CCR6, GPR31, TCP10L2, UNC93A, TTLL2, TCP10, LOC729995, LOC401286, C6orf123, LOC441179, MLLT4-AS1, MLLT4, HGC6.3, KIF25-AS1, KIF25, FRMD1, DACT2, SMOC2, THBS2, WDR27, C6orf120, PHF10, TCTE3, C6orf70, LINC00242, LINC00574, LOC100505903, LOC154449, DLL1, FAM120B, MIR4644, PSMB1, TBP, PDCD2, LOC100132858, LOC100507642, FAM20C, LOC100996433, LOC100288524, LOC442497, LOC100131372, PDGFA, FLJ44511, PRKAR1B, HEATR2, SUN1, GET4, ADAP1, COX19, CYP2W1, C7orf50, MIR339, GPR146, GPER, ZFAND2A, UNCX, MICALL2, LOC100996269, INTS1, MAFK, LOC100128653, TMEM184A, PSMG3, PSMG3-AS1, TFAMP1, LOC401296, ELFN1, MAD1L1, LOC100128374, MIR4655, FTSJ2, NUDT1, SNX8, EIF3B, CHST12, LOC100288594, LFNG, MIR4648, BRAT1, IQCE, TTYH3, AMZ1, GNA12, CARD11, SDK1, FOXK1, AP5Z1, MIR4656, RAD1L, PAPOLB, MMD2, RNF216P1, RBAK, RBAK-LOC389458, LOC389458, ZNF890P, WIPI2, SLC29A4, TNRC18, LOC100129484, FBXL18, MIR589, ACTB, FSCN1, RNF216, RNF216-IT1, ZNF815P, OCM, CCZ1, RSPH10B, PMS2, AIMP2, EIF2AK1, USP42, CYTH3, FAM220A, RAC1, DAGLB, KDELR2, GRID2IP, ZDHHC4, C7orf26, ZNF853, ZNF, LOC100505863, PMS2CL, RSPH10B2, CCZ1B, MIR3683, LOC100131257, C1GALT1, LOC100505904, COL28A1, MIOS, RPA3, LOC729852, LOC100505921, GLCCI1, ICA1, LOC100505938, NXPH1, PER4, NDUFA4, PHF14, THSD7A, TMEM106B, VWDE, SCIN, ARL4A, ETV1, DGKB, AGMO, MEOX2, ISPD, LOC100506025, SOSTDC1, LRRC72, ANKMY2, BZW2, TSPAN13, AGR2, AGR3, AHR, SNX13, PRPS1L1, HDAC9, MIR1302-6, TWIST1, FERD3L, TWISTNB, MIR3146, TMEM196, MACC1, MACC1-AS1, LOC100506098, ITGB8, ABCB5, SP8, RPL23P8, SP4, MIR1183, DNAH11, CDCA7L, RAPGEF5, STEAP1B, LOC100506178, LOC401312, LOC541472, IL6, TOMM7, SNORD93, FAM126A, KLHL7-AS1, KLHL7, NUPL2, GPNMB, MALSU1, IGF2BP3, RPS2P32, TRA2A, CLK2P, CCDC126, FAM221A, STK31, NPY, MPP6, DFNA5, OSBPL3, CYCS, C7orf31, NPVF, LOC100506236, LOC100996355, MIR148A, NFE2L3, HNRNPA2B1, CBX3, SNX10, LOC441204, KIAA0087, LOC100506289, C7orf71, SKAP2, HOXA1, HOTAIRM1, HOXA2, HOXA3, HOXA-AS2, HOXA4, HOXA-AS3, HOXA5, HOXA6, HOXA7, HOXA9, HOXA10-HOXA9, HOXA-AS4, MIR196B, HOXA10, HOXA11, HOXA11-AS, HOXA13, HOTTIP, EVX1, HIBADH, TAXIBP1, JAZF1, JAZF1-AS1, CREB5, LOC401317, TRIL, LOC100506497, CPVL, CHN2, PRR15, LOC646762, MIR550A3, ZNRF2P2, DPY19L2P3, WIPF3, SCRN1, FKBP14, PLEKHA8, C7orf41, ZNRF2, MIR550A1, MIR550B1, DKFZP586I1420, LOC100506516, NOD1, GGCT, LOC401320, GARS, CRHR2, INMT, INMT-FAM188B, FAM188B, AQP1, GHRHR, ADCYAP1R1, NEUROD6, CCDC129, PPPIR17, PDE1C, LOC100130673, LSM5, AVL9, DPY19L1P1, ZNRF2P1, MIR550B2, MIR550A2, LOC401321, KBTBD2, RP9P, FKBP9, NT5C3, RP9, BBS9, FLJ20712, BMPER, NPSR1-AS1, NPSR1, DPY19L1, MIR548N, DPY19L2P1, TBX20, LOC401324, HERPUD2, LOC100506725, SEPT7, PP13004, EEPD1, KIAA0895, ANLN, AOAH, AOAH-IT1, ELMO1, MIR1200, GPR141, NME8, SFRP4, EPDR1, STARD3NL, TARP, LOC100506776, AMPH, FAM183B, VPS41, POU6F2, POU6F2-AS1, YAE1D1, LOC100996411, LOC646999, RALA, LINC00265, CDK13, MPLKIP, C7orf10, INHBA, INHBA-AS1, GLI3, C7orf25, PSMA2, MRPL32, HECW1, HECW1-IT1, MIR3943, LOC100506895, STK17A, COA1, BLVRA, URGCP-MRPS24, MRPS24, URGCP, UBE2D4, POLR2J4, SPDYE1, RASA4CP, FLJ35390, DBNL, PGAM2, POLM, AEBP1, MIR4649, POLD2, MYL7, GCK, YKT6, CAMK2B, NUDCD3, NPC1L1, DDX56, TMED4, OGDH, ZMIZ2, PPIA, H2AFV, PURB, MIR4657, MYO1G, SNHG15, SNORA9, CCM2, NACAD, TBRG4, SNORA5A, SNORA5C, SNORA5B, RAMP3, ADCY1, SEPT7P2, IGFBP1, IGFBP3, TNS3, C7orf65, LINC00525, PKD1L1, C7orf69, HUS1, SUN3, C7orf57, UPP1, ABCA13, CDC14C, VWC2, ZPBP, C7orf72, IKZF1, FIGNL1, DDC, LOC100129427, GRB10, COBL, LOC730378, POM121L12, FLJ45974, HPVC1, VSTM2A, LOC285878, SEC61G, LOC100996654, EGFR, EGFR-AS1, LANCL2, VOPP1, FKBP9L, LOC730376, LOC100128326, SEPT14, ZNF713, MRPS17, GBAS, PSPH, CCT6A, SNORA15, SUMF2, PHKG1, CHCHD2, NUPR1L, LOC100507369, LOC650226, DKFZp434L192, LOC100996261, LOC100996271, LOC100996278, LOC100130849, LOC100287294, MIR4283-1, ZNF479, GUSBP10, MIR3147, ZNF716, LOC100287633, ZNF733P, LOC100287704, LOC100287834, MIR4283-2, LOC402269, LOC100287894, LOC100996408, LOC100996423, LOC100996380, LOC100506050, ZNF727, ZNF735, ZNF679, ZNF736, LOC649395, ZNF680, LOC641746, ZNF107, ZNF138, ZNF273, ZNF117, ERV3-1, CCT6P3, ZNF92, LOC441242, INTS4L2, LOC100996422, CCT6P1, SNORA22, DKFZP434F142, VKORC1L1, GUSB, ASL, CRCP, TPST1, LINC00174, LOC100289098, LOC493754, KCTD7, LOC100996437, RABGEF1, GTF2IRD1P1, LOC644794, TMEM248, SBDS, TYW1, MIR4650-1, PMS2P4, STAG3L4, LOC100507468, AUTS2, WBSCR17, MIR3914-1, MIR3914-2, CALN1, TYW1B, MIR4650-2, SBDSP1, SPDYE7P, POM121, NSUN5P2, TRIM74, STAG3L3, SPDYE8P, LOC100093631, NCF1B, GTF2IRD2P1, NSUN5, TRIM50, FKBP6, FZD9, BAZ1B, BCL7B, TBL2, MLXIPL, VPS37D, DNAJC30, WBSCR22, STX1A, MIR4284, ABHD11-AS1, ABHD11, CLDN3, CLDN4, LOC100996451, WBSCR27, WBSCR28, ELN, LIMK1, EIF4H, MIR590, LAT2, RFC2, CLIP2, GTF2IRD1, GTF2I, NCF1, GTF2IRD2, STAG3L2, PMS2P5, GATSL1, LOC100505669, WBSCR16, GTF2IRD2B, NCF1C, GTF2IP1, GATSL2, PMS2L2, STAG3L1, LOC541473, TRIM73, NSUN5P1, POM121C, SPDYE5, PMS2P3, HIP1, CCL26, CCL24, RHBDD2, POR, MIR4651, SNORA14A, TMEM120A, STYXL1, MDH2, SRRM3, HSPB1, YWHAG, SRCRB4D, ZP3, DTX2, FDPSL2A, UPK3B, LOC100288807, LOC100133091, POMZP3, DTX2P1-UPK3BP1-PMS2P11, LOC100132832, LOC100505767, CCDC146, FGL2, PION, PTPN12, RSBN1L-AS1, RSBN1L, TMEM60, PHTF2, MAGI2, RPL13AP17, MAGI2-AS2, MAGI2-AS3, GNA11, GNAT3, CD36, SEMA3C, HGF, CACNA2D1, PCLO, SEMA3E, SEMA3A, SEMA3D, LOC100505913, GRM3, KIAA1324L, DMTF1, C7orf23, TP53TG1, CROT, ABCB4, ABCB1, RUNDC3B, SLC25A40, DBF4, ADAM22, SRI, STEAP4, ZNF804B, C7orf62, DPY19L2P4, STEAP1, STEAP2, C7orf63, GTPBP10, CLDN12, LOC100996527, CDK14, FZD1, MTERF, AKAP9, CYP51A1, LOC613126, LRRD1, KRIT1, MIR1285-1, ANKIB1, GATAD1, ERVW-1, PEX1, RBM48, MGC16142, FAM133B, CDK6, RNU6-10, SAMD9, SAMD9L, HEPACAM2, CCDC132, CALCR, MIR653, MIR489, MIR4652, TFPI2, GNGT1, GNG11, BET1, COL1A2, CASD1, SGCE, PEG10, PPP1R9A, PON1, PON3, PON2, ASB4, LOC100996577, PDK4, DYNC1I1, SLC25A13, MIR591, FLJ42280, LOC100506136, SHFM1, DLX6-AS1, DLX6, DLX5, ACN9, TAC1, ASNS, MIR5692A1, MIR5692C2, MGC72080, OCM2, LMTK2, BHLHA15, TECPR1, BRI3, BAIAP2L1, FLJ30064, NPTX2, TMEM130, TRRAP, MIR3609, SMURF1, KPNA7, MYH16, ARPC1A, ARPC1B, PDAP1, BUD31, PTCD1, ATP5J2-PTCD1, CPSF4, ATP5J2, ZNF789, ZNF394, ZKSCAN5, FAM200A, ZNF655, LOC100289187, ZNF498, CYP3A5, CYP3A7-CYP3AP1, CYP3A7, CYP3A4, CYP3A43, OR2AE1, TRIM4, GJC3, AZGP1, AZGP1P1, ZKSCAN1, ZSCAN21, ZNF3, COPS6, MCM7, MIR25, MIR93, MIR106B, AP4M1, TAF6, CNPY4, MBLAC1, LAMTOR4, C7orf43, MIR4658, GAL3ST4, GPC2, STAG3, GATS, PVRIG, SPDYE3, PMS2P1, PILRB, PILRA, ZCWPW1, MEPCE, PPP1R35, C7orf61, TSC22D4, NYAP1, AGFG2, SAP25, LRCH4, FBXO24, PCOLCE-AS1, PCOLCE, MOSPD3, TFR2, ACTL6B, GNB2, GIGYF1, POP7, EPO, ZAN, EPHB4, SLC12A9, TRIP6, SRRT, UFSP1, ACHE, MUC12, MUC17, TRIM56, SERPINE1, AP1S1, MIR4653, VGF, NAT16, MOGAT3, PLOD3, ZNHIT1, CLDN15, FIS1, RABL5, EMID2, LOC100506527, MYL10, CUX1, SH2B2, MIR4285, SPDYE6, LOC100630923, LOC100289561, PRKRIP1, MIR5480, ORAI2, ALKBH4, LRWD1, MIR5090, MIR4467, POLR2J, RASA4B, POLR2J3, SPDYE2, RASA4, POLR2J2, UPK3BL, SPDYE2L, FAM185A, FBXL13, LRRC17, NFE4, ARMC10, NAPEPLD, RPL19P12, DPY19L2P2, PMPCB, DNAJC2, PSMC2, SLC26A5, RELN, ORC5, LHFPL3, LHFPL3-AS1, LHFPL3-AS2, LOC100216546, LOC100216545, MLL5, SRPK2, PUS7, RINT1, EFCAB10, ATXN7L1, CDHR3, SYPL1, NAMPT, CCDC71L, PIK3CG, PRKAR2B, HBP1, COG5, GPR22, DUS4L, BCAP29, SLC26A4-AS1, SLC26A4, CBLL1, SLC26A3, DLD, LAMB1, LAMB4, NRCAM, PNPLA8, THAP5, DNAJB9, C7orf66, EIF3IP1, IMMP2L, LRRN3, DOCK4, LOC100506413, ZNF277, IFRD1, C7orf53, LOC100996249, TMEM168, C7orf60, GPR85, LOC401397, TSRM, PPP1R3A, FOXP2, MIR3666, MDFIC, LOC100506489, TFEC, TES, CAV2, CAV1, LOC100996266, MET, CAPZA2, ST7-AS1, ST7, ST7-OT4, ST7-AS2, ST7-OT3, WNT2, ASZ1, CFTR, CTTNBP2, NAA38, ANKRD7, KCND2, TSPAN12, ING3, CPED1, WNT16, FAM3C, PTPRZ1, AASS, FEZF1, FEZF1-AS1, CADPS2, RNF133, RNF148, TAS2R16, SLC13A1, IQUB, NDUFA5, ASB15, LMOD2, WASL, HYALP1, HYAL4, SPAM1, TMEM229A, GPR37, LOC154872, POT1, LOC100506664, GRM8, MIR592, ZNF800, LOC100506682, GCC1, ARF5, FSCN3, PAX4, SND1, SND1-IT1, LRRC4, MIR593, MIR129-1, LEP, MGC27345, RBM28, PRRT4, IMPDH1, HILPDA, METTL2B, FLJ45340, FAM71F2, FAM71F1, CALU, OPN1SW, CCDC136, FLNC, ATP6V1F, LOC100130705, KCP, IRF5, TNPO3, TPI1P2, LOC407835, TSPAN33, SMO, AHCYL2, STRIP2, LOC100287482, NRF1, RNA5SP244, MIR182, MIR96, MIR183, UBE2H, ZC3HC1, KLHDC10, TMEM209, C7orf45, CPA2, CPA4, CPA5, CPA1, CEP41, MEST, MESTIT1, MIR335, COPG2, TSGA13, KLF14, MIR29A, MIR29B1, LOC646329, LOC100506860, FLJ43663, MKLN1, LOC100506881, PODXL, PLXNA4, FLJ40288, LOC100506937, CHCHD3, MIR3654, EXOC4, LRGUK, SLC35B4, AKR1B1, AKR1B10, AKR1B15, BPGM, CALD1, AGBL3, LOC653739, TMEM140, C7orf49, WDR91, STRA8, CNOT4, NUP205, C7orf73, SLC13A4, FAM180A, LUZP6, MTPN, CHRM2, LOC349160, MIR490, PTN, DGKI, NAG20, CREB3L2, LOC100130880, AKR1D1, MIR4468, TRIM24, SVOPL, ATP6V0A4, TMEM213, KIAA1549, ZC3HAV1L, ZC3HAV1, TTC26, UBN2, LUC7L2, C7orf55, C7orf55-LUC7L2, PP12,708, LOC100129148, KLRG2, CLEC2L, HIPK2, TBXAS1, PARP12, JHDM1D, LOC100134229, SLC37A3, RAB19, MKRN1, DENND2A, ADCK2, NDUFB2-AS1, NDUFB2, BRAF, MRPS33, TMEM178B, LOC100130169, AGK, KIAA1147, FLJ40852, WEE2, SSBP1, TAS2R3, TAS2R4, TAS2R5, PRSS37, OR9A4, CLEC5A, TAS2R38, MGAM, LOC93432, MOXD2P, PRSS58, MTRNR2L6, PRSS1, PRSS3P2, EPHB6, TRPV6, TRPV5, C7orf34, KEL, OR9A2, OR6V1, OR6W1P, PIP, TAS2R39, TAS2R40, GSTK1, TMEM139, CASP2, CLCN1, FAM131B, LOC100507507, ZYX, EPHA1, EPHA1-AS1, TAS2R60, TAS2R41, CTAGE15P, FAM115C, CTAGE6P, LOC154761, FAM115A, OR2F2, OR2F1, OR6B1, OR2A5, OR2A25, OR2A12, OR2A2, OR2A14, CTAGE4, ARHGEF35, OR2A42, OR2A20P, OR2A7, LOC728377, OR2A9P, OR2A1, ARHGEF5, NOBOX, TPK1, CNTNAP2, MIR548F4, LOC100507538, C7orf33, CUL1, EZH2, RNY5, RNY4, RNY3, RNY1, PDIA4, ZNF786, ZNF425, ZNF398, ZNF282, ZNF212, ZNF783, LOC155060, ZNF777, ZNF746, ZNF767, KRBA1, ZNF467, SSPO, ZNF862, ATP6V0E2-AS1, ATP6V0E2, LOC100996256, LOC100134040, ACTR3C, LRRC61, C7orf29, RARRES2, REPIN1, ZNF775, LOC728743, LOC285972, GIMAP8, GIMAP7, GIMAP4, GIMAP6, GIMAP2, GIMAP1, GIMAP1-GIMAP5, GIMAP5, TMEM176B, TMEM176A, ABP1, KCNH2, NOS3, ATG9B, ABCB8, ASIC3, CDK5, SLC4A2, LOC100996677, FASTK, TMUB1, AGAP3, GBX1, ASB10, ABCF2, CHPF2, MIR671, SMARCD3, NUB1, WDR86, WDR86-AS1, CRYGN, MIR3907, RHEB, PRKAG2, LOC644090, PRKAG2-AS1, GALNTL5, GALNT11, MLL3, FABP5P3, LOC100128822, XRCC2, ACTR3B, DPP6, LOC100996700, LOC100132707, PAXIP1, LOC202781, LOC100128264, HTR5A, LOC100996388, INSIG1, EN2, CNPY1, LOC100506302, RBM33, SHH, LOC100996445, LOC389602, LOC285889, LOC100506380, LINC00244, C7orf13, RNF32, LMBR1, NOM1, MNX1, LOC645249, LOC100996426, UBE3C, LOC100506458, DNAJB6, LOC100506534, LOC100506557, PTPRN2, MIR153-2, LOC100506585, MIR595, MIR5707, NCAPG2, ESYT2, WDR60, LINC00689, VIPR2, OR4F21, RPL23AP53, ZNF596, FAM87A, FBXO25, C8orf42, LOC100996633, LOC389607, ERICH1, LOC401442, LOC286083, DLGAP1, LOC100507435, CLN8, MIR3674, MIR596, ARHGEF10, LOC100131395, KBTBD11, MYOM2, CSMD1, LOC100287015, MCPH1, ANGPT2, LOC100507530, AGPAT5, MIR4659A, MIR4659B, XKR5, LOC100652791, DEFB1, DEFA6, DEFA4, DEFA10P, DEFA1, DEFT1P, DEFA1B, DEFT1P2, DEFA3, DEFA5, LOC349196, FAM66B, DEFB109P1B, USP17L1P, USP17L4, ZNF705G, DEFB4B, DEFB103B, SPAG11B, DEFB104B, DEFB106B, DEFB105B, DEFB107B, LOC100131608, FAM90A7P, FAM90A10P, LOC100133251, DEFB107A, DEFB105A, DEFB106A, DEFB104A, SPAG11A, DEFB103A, DEFB4A, ZNF705B, FAM66E, USP17L8, USP17L3, LOC100132046, MIR54813, FAM86B3P, SGK223, CLDN23, MFHAS1, ERI1, MIR4660, PPPIR3B, LOC157273, TNKS, MIR597, LINC00599, MIR124-1, MSRA, PRSS55, RP1L1, MIR4286, C8orf74, SOX7, PINX1, MIR1322, XKR6, MIR598, MTMR9, SLC35G5, TDH, C8orf12, FAM167A, BLK, LINC00208, GATA4, C8orf49, NEIL2, FDFT1, CTSB, DEFB136, DEFB135, DEFB134, LOC100133267, ZNF705D, FAM66D, LOC392196, USP17L7, USP17L2, FAM90A2P, FAM86B1, FAM85A, DEFB130, FAM66A, LOC649352, DEFB109P1, FAM86B2, LOC100506990, LOC729732, MIR5692A2, LONRF1, MIR3926-1, MIR3926-2, LOC340357, KIAA1456, DLC1, C8orf48, SGCZ, MIR383, TUSC3, MSR1, FGF20, EFHA2, ZDHHC2, CNOT7, VPS37A, MTMR7, SLC7A2, PDG-FRL, MTUS1, MIR548V, FGL1, PCM1, ASAH1, NAT1, NAT2, PSD3, NSAP11, LOC100128993, SH2D4A, CSGALNACT1, INTS10, LPL, SLC18A1, ATP6V1B2, LZTS1, LZTS1-AS1, LOC286114, GFRA2, DOK2, XPO7, NPM2, FGF17, EPB49, FAM160B2, NUDT18, HR, REEP4, LGI3, SFTPC, BMP1, PHYHIP, MIR320A, POLR3D, LOC100507071, PIWIL2, SLC39A14, PPP3CC, SORBS3, PDLIM2, C8orf58, KIAA1967, BIN3, FLJ14107, EGR3, PEBP4, RHOBTB2, TNFRSF10B, LOC286059, LOC254896, TNFRSF10C, TNFRSF10D, TNFRSF10A, LOC389641, CHMP7, R3HCC1, LOXL2, LOC100507156, ENTPD4, SLC25A37, NKX3-1, NKX2-6, STC1, ADAM28, ADAMDEC1, ADAM7, LOC100507207, NEFM, NEFL, DOCK5, GNRH1, KCTD9, CDCA2, LOC100507222, EBF2, PPP2R2A, BNIP3L, PNMA2, DPYSL2, ADRA1A, MIR548H4, STMN4, TRIM35, PTK2B, CHRNA2, EPHX2, CLU, SCARA3, MIR3622B, MIR3622A, CCDC25, ESCO2, PBK, SCARA5, MIR4287, NUGGC, ELP3, PNOC, ZNF395, FBXO16, FZD3, MIR4288, EXTL3, INTS9, HMBOX1, KIF13B, DUSP4, LINC00589, LOC286135, MIR3148, TMEM66, LEPROTL1, MBOAT4, DCTN6, LOC100128750, RBPMS, GTF2E2, LOC100507341, GSR, UBXN8, PPP2CB, TEX15, PURG, WRN, NRG1, NRG1-IT3, FUT10, MAK16, TTI2, SNORD13, RNF122, DUSP26, UNC5D, KCNU1, LOC100507403, LOC100507420, LOC100507439, ZNF703, ERLIN2, LOC728024, PROSC, GPR124, BRF2, RAB11FIP1, GOT1L1, ADRB3, EIF4EBP1, ASH2L, STAR, LSM1, BAG4, DDHD2, PPAPDC1B, WHSC1L1, LETM2, FGFR1, C8orf86, RNF5P1, TACC1, PLEKHA2, HTRA4, TM2D2, ADAM9, ADAM32, ADAM5, ADAM3A, LOC100130964, ADAM18, ADAM2, IDO1, IDO2, C8orf4, LOC100507481, LOC100996474, ZMAT4, SFRP1, MIR548AO, GOLGA7, GINS4, AGPAT6, NKX6-3, ANK1, MIR486, KAT6A, AP3M2, PLAT, IKBKB, POLB, DKK4, VDAC3, SLC20A2, C8orf40, CHRNB3, CHRNA6, THAP1, RNF170, MIR4469, HOOK3, FNTA, SGK196, HGSNAT, POTEA, LINC00293, LOC100505775, LOC100287846, KIAA0146, CEBPD, PRKDC, MCM4, UBE2V2, EFCAB1, SNAI2, C8orf22, LOC100507464, SNTG1, PXDNL, PCMTD1, LOC100287313, ST18, FAM150A, RB1CC1, NPBWR1, OPRK1, ATP6V1H, RGS20, TCEA1, LYPLA1, MRPL15, RNU105C, SOX17, LOC100129098, RP1, LOC100996304, LOC100287651, XKR4, SBF1P1, TMEM68, TGS1, LYN, RPS20, SNORD54, MOS, PLAG1, CHCHD7, SDR16C5, SDR16C6P, PENK, LOC100507632, IMPAD1, LOC100507651, LOC286177, LINC00588, LOC286178, FAM110B, UBXN2B, CYP7A1, SDCBP, NSMAF, TOX, LOC100505501, CA8, LOC100505532, RAB2A, CHD7, LOC100130298, CLVS1, ASPH, MIR4470, NKAIN3, UG0898H09, GGH, TTPA, YTHDF3, LOC286184, LOC100130155, MIR124-2, LOC401463, BHLHE22, CYP7B1, LOC100505613, LINC00251, LOC286186, ARMC1, MTFR1, PDE7A, DNAJC5B, TRIM55, CRH, LOC100505659, LOC100505676, RRS1, ADHFE1, C8orf46, MYBL1, VCPIP1, C8orf44-SGK3, C8orf44, SGK3, PTTG3P, MCMDC2, SNHG6, SNORD87, TCF24, PPPIR42, COPS5, CSPP1, ARFGEF1, CPA6, PREX2, LOC286189, C8orf34, LOC100505718, LOC100505739, SULF1, SLCO5A1, PRDM14, NCOA2, TRAM1, LOC286190, LACTB2, XKR9, EYA1, MSC, LOC100132891, TRPA1, LOC392232, KCNB2, LOC100288310, TERF1, SBSPON, LOC100130301, RPL7, RDH10, STAU2-AS1, STAU2, UBE2W, TCEB1, TMEM70, LY96, JPH1, GDAP1, MIR5681A, MIR5681B, FLJ39080, MIR2052, PI15, CRISPLD1, HNF4G, ZFHX4-AS1, ZFHX4, PEX2, PKIA, ZC2HC1A, IL7, STMN2, HEY1, MRPS28, TPD52, MIR5708, ZBTB10, ZNF704, PAG1, FABP5, PMP2, FABP9, FABP4, FABP12, IMPA1, SLC10A5, ZFAND1, CHMP4C, SNX16, RALYL, LRRCC1, E2F5, C8orf59, LOC100507258, CA13, CA1, CA3, LOC100996348, CA2, REXO1L1, REXO1L2P, LOC100288562, PSKH2, ATP6V0D2, SLC7A13, WWP1, FAM82B, CPNE3, CNGB3, CNBD1, DCAF4L2, MMP16, LOC100996398, LOC100506342, RIPK2, OSGIN2, NBN, DECR1, CALB1, LINC00534, TMEM64, LOC100506351, NECAB1, LOC100127983, TMEM55A, LOC100506365, OTUD6B, LRRC69, MIR4661, SLC26A7, RUNX1T1, FLJ46284, TRIQK, C8orf87, LINC00535, FAM92A1, FP6628, RBM12B, RBM12B-AS1, TMEM67, MIR378D2, PDP1, CDH17, GEM, RAD54B, FSBP, KIAA1429, LOC100288748, ESRP1, DPY19L4, INTS8, CCNE2, TP53INP1, LOC100506538, NDUFAF6, LOC286149, MIR3150B, MIR3150A, PLEKHF2, C8orf69, C8orf37, LOC100616530, LOC100500773, GDF6, UQCRB, MTERFD1, PTDSS1, SDC2, CPQ, TSPYL5, MTDH, LAPTM4B, MATN2, LOC100506558, RPL30, SNORA72, C8orf47, HRSP12, POP1, NIPAL2, KCNS2, STK3, OSR2, VPS13B, MIR599, MIR875, COX6C, RGS22, MIR1273A, FBXO43, POLR2K, SPAG1, RNF19A, MIR4471, ANKRD46, SNX31, PABPC1, YWHAZ, FLJ42969, ZNF706, LOC100506652, NACAP1, GRHL2, NCALD, MIR5680, RRM2B, UBR5, ODF1, KLF10, AZIN1, LOC100506753, LOC100996457, ATP6V1C1, C8orf56, BAALC, MIR3151, LOC100499183, FZD6, CTHRC1, SLC25A32, DCAF13, LOC100996462, RIMS2, DCSTAMP, DPYS, LOC100130232, MIR548A3, LRP12, ZFPM2, OXR1, ABRA, ANGPT1, RSPO2, EIF3E, EMC2, TMEM74, TRHR, NUDCD1, ENY2, PKHD1L1, EBAG9, SYBU, KCNV1, CSMD3, MIR2053, TRPS1, LINC00536, EIF3H, UTP23, RAD21, RAD21-AS1, MIR3610, AARD, SLC30A8, MED30, EXT1, SAMD12, SAMD12-AS1, TNFRSF11B, COLEC10, MAL2, NOV, ENPP2, TAF2, DSCC1, DEPTOR, COL14A1, MRPL13, MTBP, SNTB1, HAS2, HAS2-AS1, ZHX2, DERL1, WDR67, FAM83A, LOC100131726, MIR4663, C8orf76, ZHX1-C8ORF76, ZHX1, ATAD2, MIR548D1, MIR548AA1, WDYHV1, FBXO32, KLHL38, ANXA13, FAM91A1, FER1L6, FER1L6-AS1, TMEM65, TRMT12, LOC100507018, RNF139, TATDN1, NDUFB9, MTSS1, MIR4662B, MIR4662A, LOC157381, ZNF572, SQLE, KIAA0196, NSMCE2, TRIB1, LOC100130231, FAM84B, PCAT1, LOC100507056, POU5F1B, LOC727677, MYC, MIR1204, PVT1, LOC100507101, TMEM75, MIR1205, MIR1206, MIR1207, MIR1208, LOC728724, MIR3686, GSDMC, FAM49B, MIR5194, ASAP1, LOC100507117, ASAP1-IT1, ADCY8, EFR3A, OC90, HHLA1, KCNQ3, HPYR1, LRRC6, TMEM71, PHF20L1, TG, SLA, WISP1, NDRG1, ST3GAL1, LOC100507162, ZFAT, ZFAT-AS1, MIR30B, MIR30D, LOC286094, KHDRBS3, FLJ45872, FAM135B, COL22A1, KCNK9, TRAPPC9, LOC100131910, CHRAC1, EIF2C2, PTK2, MIR151A, DENND3, SLC45A4, LOC731779, GPR20, PTP4A3, FLJ43860, MIR1302-7, MIR4472-1, LINC00051, TSNARE1, BAI1, ARC, JRK, PSCA, LY6K, LOC100288181, THEM6, SLURP1, LYPD2, LYNX1, LY6D, GML, CYP11B1, CYP11B2, LOC100133669, LY6E, C8orf31, LY6H, GPIHBP1, ZFP41, GLI4, LOC100507316, ZNF696, TOP1MT, RHPN1-AS1, RHPN1, MAFA, ZC3H3, GSDMD, C8orf73, NAPRT1, EEF1D, TIGD5, PYCRL, TSTA3, ZNF623, ZNF707, BREA2, CCDC166, MAPK15, FAM83H, MIR4664, LOC100128338, SCRIB, MIR937, PUF60, NRBP2, EPPK1, PLEC, MIR661, PARP10, GRINA, SPATC1, SMPD5, OPLAH, EXOSC4, GPAA1, CYC1, SHARPIN, MAF1, KIAA1875, FAM203A, HEATR7A, SCXB, FAM203B, LOC377711, BOP1, SCXA, HSF1, DGAT1, SCRT1, TMEM249, FBXL6, SLC52A2, ADCK5, CPSF1, MIR939, MIR1234, SLC39A4, VPS28, TONSL, LOC100287098, CYHR1, KIFC2, FOXH1, PPPIR16A, GPT, MFSD3, RECQL4, LRRC14, LRRC24, C8orf82, ARHGAP39, LOC100996662, ZNF251, ZNF34, RPL8, ZNF517, LOC100129596, ZNF7, COMMD5, ZNF250, ZNF16, ZNF252P, TMED10P1, ZNF252P-AS1, C8orf33, DDX11L5, WASH1, MIR1302-9, FAM138C, FOXD4, CBWD1, C9orf66, DOCK8, KANK1, DMRT1, DMRT3, DMRT2, SMARCA2, FLJ35024, VLDLR, KCNV2, KIAA0020, RFX3, DSERG1, GLIS3, GLIS3-AS1, SLC1A1, SPATA6L, PPAPDC2, CDC37L1, AK3, RCL1, MIR101-2, JAK2, INSL6, INSL4, RLN2, RLN1, PLGRKT, CD274, PDCD1LG2, KIAA1432, ERMP1, MLANA, KIAA2026, MIR4665, RANBP6, LOC100506189, IL33, TPD52L3, UHRF2, C9orf38, GLDC, KDM4C, C9orf123, PTPRD, TYRP1, LURAP1L, MPDZ, FLJ41200, LOC100506304, LINC00583, NFIB, ZDHHC21, CER1, FREM1, LOC389705, TTC39B, SNAPC3, PSIP1, CCDC171, RNU6-14, LOC100506331, BNC2, LOC648570, CNTLN, SH3GL2, ADAMTSL1, MIR3152, FAM154A, RRAGA, HAUS6, SCARNA8, PLIN2, DENND4C, RPS6, ACER2, LOC392288, SLC24A2, MLLT3, MIR4473, MIR4474, FOCAD, MIR491, PTPLAD2, IFNB1, IFNW1, IFNA21, IFNA4, IFNA7, IFNA10, IFNA16, IFNA17, IFNA14, IFNA22P, IFNA5, KLHL9, IFNA6, IFNA13, IFNA2, IFNA8, IFNA1, MIR31HG, IFNE, MIR31, MTAP, C9orf53, CDKN2A, CDKN2B-AS1, CDKN2B, DMRTA1, FLJ35282, ELAVL2, IZUMO3, TUSC1, LOC100506422, CAAP1, PLAA, IFT74, LRRC19, TEK, LINC00032, EQTN, MOB3B, IFNK, C9orf72, LINGO2, MIR876, MIR873, LOC401497, ACO1, DDX58, TOPORS, LOC100129250, NDUFB6, C9orf133, TAF1L, TMEM215, APTX, DNAJA1, SMU1, B4GALT1, SPINK4, BAG1, CHMP5, NFX1, AQP7, AQP3, NOL6, SUGT1P1, ANKRD18B, ANXA2P2, PTENP1, PRSS3, UBE2R2, UBAP2, SNORD121B, SNORD121A, DCAF12, UBAP1, KIF24, NUDT2, KIAA1161, C9orf24, FAM219A, DNAI1, ENHO, CNTFR, LOC415056, RPP25L, DCTN3, ARID3C, SIGMAR1, GALT, IL11RA, CCL27, LOC730098, CCL19, CCL21, FAM205A, FAM205B, KIAA1045, DNAJB5, C9orf131, VCP, FANCG, PIGO, STOML2, FAM214B, UNC13B, LOC100509263, ATP8B5P, RUSC2, FAM166B, TESK1, MIR4667, CD72, SIT1, RMRP, CCDC107, ARHGEF39, CA9, TPM2, TLN1, CREB3, GBA2, RGP1, MSMP, NPR2, SPAG8, HINT2, FAM221B, TMEM8B, FP588, OR13J1, HRCT1, LOC158376, OR2S2, RECK, GLIPR2, CCIN, CLTA, GNE, RNF38, MELK, MIR4475, PAX5, MIR4540, MIR4476, LOC100130458, LOC100506710, ZCCHC7, GRHPR, ZBTB5, POLR1E, FBXO10, TOMM5, FRMPD1, TRMT10B, EXOSC3, DCAF10, SLC25A51, SHB, ALDH1B1, IGFBPL1, FAM220BP, LOC100289137, ANKRD18A, FAM201A, CNTNAP3, SPATA31A1, LOC653501, SPATA31A2, FAM74A1, LOC441402, SPATA31A3, FAM74A3, ZNF658, FAM74A2, SPATA31A4, SPATA31A5, ZNF658B, MGC21881, KGFLP2, ANKRD20A2, FAM95B1, LOC100996667, CBWD7, FOXD4L2, LOC100996312, AQP7P3, ANKRD20A3, LOC642929, SPATA31A6, CNTNAP3B, LOC100505781, FAM27C, FAM27E4P, FAM27A, FAM27E2, LOC100287368, LOC100507284, FAM27E1, FAM27D1, LOC100996612, KGFLP1, LOC643648, LOC100126582, FAM74A4, SPATA31A7, LOC100996689, LOC100132249, PTGER4P2, LOC100132004, LOC286297, AQP7P1, LOC100996643, FAM27E3, FAM27B, LOC100132859, ANKRD20A1, MIR4477A, MIR4477B, LOC642236, LOC100132352, MIR1299, PGM5P2, LOC440896, FOXD4L6, CBWD6, ANKRD20A4, LOC100132154, LOC100996489, FOXD4L5, LOC100996547, FOXD4L4, CBWD5, CBWD3, FOXD4L3, PGM5-AS1, PGM5, TMEM252, PIP5K1B, FAM122A, LOC100996482, PRKACG, FXN, TJP2, BANCR, FAM189A2, APBA1, PTAR1, LOC494558, C9orf135, MAMDC2, LOC100507244, LOC100507299, SMC5, KLF9, TRPM3, MIR204, LOC100996487, TMEM2, FAM108B1, C9orf85, C9orf57, GDA, ZFAND5, TMC1, ALDH1A1, ANXA1, RORB, TRPM6, C9orf40, C9orf41, NMRK1, OSTF1, PCSK5, RFK, RPSAP9, GCNT1, PRUNE2, PCA3, FOXB2, VPS13A-AS1, VPS13A, GNA14, GNAQ, CEP78, PSAT1, LOC100506414, TLE4, TLE1, SPATA31D5P, SPATA31D4, SPATA31D3, SPATA31D1, SPATA31B1, RASEF, FRMD3, IDNK, UBQLN1, GKAP1, KIF27, C9orf64, HNRNPK, MIR7-1, RMI1, SLC28A3, NTRK2, AGTPBP1, LOC389765, NAA35, GOLM1, C9orf153, ISCA1, ZCCHC6, GAS1, LOC100506834, LOC440173, LOC494127, C9orf170, DAPK1, CTSL1, CTSL3, CTSL1P8, LOC392364, LOC100506912, SPATA31E1, SPATA31C1, LOC100996508, CDK20, LOC100653206, SPATA31C2, SPIN1, NXNL2, LOC286238, MIR4289, C9orf47, SIPR3, SHC3, LOC100507009, CKS2, MIR3153, SECISBP2, SEMA4D, GADD45G, UNQ6494, LOC286370, MIR4290, LOC340515, DIRAS2, SYK, LOC100129316, LOC100507103, LOC100128909, FP2234, AUH, NFIL3, MIR3910-1, MIR3910-2, ROR2, SPTLC1, LOC100128076, LINC00475, IARS, MIR3651, SNORA84, NOL8, CENPP, OGN, OMD, ASPN, ECM2, MIR4670, IPPK, LOC100128361, BICD2, ANKRD19P, ZNF484, FGD3, SUSD3, C9orf89, NINJ1, WNK2, C9orf129, FAM120AOS, FAM120A, PHF2, MIR548AU, MIR4291, BARX1, PTPDC1, LOC100996250, MIRLET7A1, MIRLET7F1, MIRLET7DHG, MIRLET7D, ZNF169, FAM22F, LOC100132077, LOC728026, HIATL1, FBP2, FBP1, C9orf3, MIR2278, MIR23B, MIR27B, MIR3074, MIR24-1, FANCC, PTCH1, LOC100507346, LOC100506667, LINC00476, ERCC6L2, LINC00092, LOC158435, LOC158434, HSD17B3, SLC35D2, ZNF367, HABP4, CDC14B, LOC100507364, AAED1, LOC441455, ZNF510, ZNF782, LOC100132781, LOC441454, FAM22G, HIATL2, CTSL2, LOC340508, ANKRD18CP, LOC100499484-C9ORF174, LOC100499484, C9orf174, MIR1302-8, LOC286359, TDRD7, TMOD1, TSTD2, NCBP1, XPA, FOXE1, C9orf156, HEMGN, ANP32B, NANS, TRIM14, CORO2A, TBC1D2, GABBR2, ANKS6, GALNT12, COL15A1, TGFBR1, ALG2, SEC61B, LOC100996569, LOC100507438, NR4A3, LOC441461, STX17, ERP44, INVS, TEX10, LOC100507449, MSANTD3, MSANTD3-TMEFF1, TMEFF1, MURC, LPPR1, BAAT, MRPL50, ZNF189, ALDOB, TMEM246, RNF20, GRIN3A, PPP3R2, CYLC2, SMC2, LOC100996287, OR13F1, OR13C4, OR13C3, OR13C8, OR13C5, OR13C2, OR13C9, OR13D1, NIPSNAP3A, NIPSNAP3B, LOC286367, ABCA1, SLC44A1, FSD1L, FKTN, TAL2, TMEM38B, ZNF462, RAD23B, KLF4, ACTL7B, ACTL7A, IKBKAP, FAM206A, CTNNAL1, TMEM245, MIR32, FRRS1L, EPB41L4B, PTPN3, MIR3927, PALM2, PALM2-AKAP2, AKAP2, C9orf152, TXN, TXNDC8, SVEP1, MUSK, LPAR1, OR2K2, KIAA0368, ZNF483, PTGR1, LRRC37A5P, DNAJC25-GNG10, DNAJC25, GNG10, C9orf84, UGCG, MIR4668, SUSD1, PTBP3, HSDL2, C9orf147, KIAA1958, INIP, SNX30, SLC46A2, ZNF883, ZFP37, FAM225B, FAM225A, SLC31A2, FKBP15, SLC31A1, CDC26, PRPF4, RNF183, WDR31, BSPRY, HDHD3, ALAD, POLE3, C9orf43, RGS3, ZNF618, AMBP, KIF12, COL27A1, MIR455, ORM1, ORM2, AKNA, DFNB31, ATP6V1G1, C9orf91, LOC100996601, LOC100505478, TNFSF15, TNFSF8, TNC, DEC1, LINC00474, PAPPA, ASTN2, LOC100128505, TRIM32, SNORA70C, TLR4, DBC1, MIR147A, CDK5RAP2, MEGF9, FBXW2, LOC100288842, PSMD5, LOC253039, PHF19, TRAF1, C5, CNTRL, RAB14, GSN, STOM, GGTA1P, DAB2IP, TTLL11, TTLL11-IT1, MIR4478, NDUFA8, MORN5, LHX6, RBM18, MRRF, PTGS1, OR1J1, OR1J2, OR1J4, OR1N1, OR1N2, OR1L8, OR1Q1, OR1B1, OR1L1, OR1L3, OR1L4, OR1L6, OR5C1, OR1K1, PDCL, RC3H2, SNORD90, ZBTB6, ZBTB26, RABGAP1, GPR21, MIR600HG, MIR600, STRBP, CRB2, DENND1A, MIR601, LOC100505588, LHX2, NEK6, PSMB7, LOC100129034, GPR144, NR5A1, NR6A1, MIR181A2HG, MIR181A2, MIR181B2, OLFML2A, WDR38, RPL35, ARPC5L, GOLGA1, SCAI, PPP6C, RABEPK, HSPA5, GAPVD1, MAPKAP1, LOC51145, PBX3, FAM125B, NRON, LMX1B, LOC100505986, ZBTB43, ZBTB34, RALGPS1, ANGPTL2, GARNL3, SLC2A8, ZNF79, RPL12, SNORA65, LRSAM1, FAM129B, STXBP1, MIR3911, C9orf117, PTRH1, TTC16, TOR2A, SH2D3C, MIR3960, MIR2861, CDK9, FPGS, ENG, AK1, MIR4672, ST6GALNAC6, ST6GALNAC4, PIP5KL1, DPM2, FAM102A, NAIF1, SLC25A25, LOC100289019, PTGES2, LOC389791, LCN2, C9orf16, CIZ1, DNM1, MIR199B, MIR3154, GOLGA2, SWI5, TRUB2, COQ4, SLC27A4, URM1, MIR219-2, MIR2964A, CERCAM, ODF2, GLE1, SPTAN1, WDR34, SET, PKN3, ZDHHC12, LOC100506100, ZER1, TBC1D13, ENDOG, C9orf114, CCBL1, LRRC8A, PHYHD1, DOLK, NUP188, SH3GLB2, FAM73B, DOLPP1, CRAT, PPP2R4, IER5L, C9orf106, LOC100506119, LOC100506190, LOC100128077, C9orf50, NTMT1, ASB6, PRRX2, PTGES, TOR1B, TOR1A, C9orf78, USP20, FNBP1, GPR107, FLJ46836, NCS1, HMCN2, ASS1, LOC100272217, FUBP3, PRDM12, EXOSC2, ABL1, QRFP, FIBCD1, LAMC3, AIF1L, NUP214, FAM78A, PPAPDC3, PRRC2B, SNORD62A, SNORD62B, POMT1, UCK1, RAPGEF1, MED27, NTNG2, SETX, TTF1, C9orf171, BARHL1, DDX31, GTF3C4, AK8, C9orf9, TSC1, MIR548AW, GFI1B, GTF3C5, LOC100996574, CEL, CELP, RALGDS, GBGT1, OBP2B, ABO, SURF6, MED22, RPL7A, SNORD24, SNORD36B, SNORD36A, SNORD36C, SURF1, SURF2, SURF4, C9orf96, REXO4, ADAMTS13, CACFD1, SLC2A6, TMEM8C, ADAMTSL2, FAM163B, DBH, DBH-AS1, SARDH, VAV2, LINC00094, BRD3, LOC100130548, WDR5, RNU6ATAC, RXRA, MIR4669, LOC100506532, COL5A1, MIR3689C, MIR3689A, MIR3689D1, MIR3689B, MIR3689D2, MIR3689E, MIR3689F, FCN2, FCN1, OLFM1, LOC401557, C9orf62, LOC100506599, PPPIR26, C9orf116, MRPS2, LCN1, OBP2A, PAEP, LOC100130954, GLT6D1, LCN9, SOHLH1, KCNT1, CAMSAP1, LOC100506620, UBAC1, NACC2, C9orf69, LOC100129999, RBSG2, LHX3, QSOX2, ESP33, DKFZP434A062, GPSM1, DNLZ, CARD9, SNAPC4, SDCCAG3, PMPCA, INPP5E, SEC16A, C9orf163, NOTCH1, MIR4673, MIR4674, LOC401561, EGFL7, MIR126, AGPAT2, FAM69B, SNHG7, SNORA43, SNORA17, LCN10, LCN6, LOC100128593, LCN8, LCN15, TMEM141, KIAA1984, KIAA1984-AS1, RABL6, MIR4292, C9orf172, PHPT1, MAMDC4, EDF1, TRAF2, MIR4479, FBXW5, C8G, LCN12, PTGDS, LCNL1, C9orf142, CLIC3, ABCA2, C9orf139, FUT7, NPDC1, ENTPD2, SAPCD2, UAP1L1, LOC100289341, MAN1B1, DPP7, GRIN1, LRRC26, MIR3621, TMEM210, ANAPC2, SSNA1, TPRN, TMEM203, NDOR1, RNF208, LOC100130547, C9orf169, RNF224, SLC34A3, TUBB4B, FAM166A, LOC100129722, C9orf173, COBRA1, TOR4A, NRARP, EXD3, NOXA1, ENTPD8, NELF, PNPLA7, MRPL41, WDR85, ZMYND19, ARRDC1, C9orf37, EHMT1, FLJ40292, LOC651337, MIR602, LOC100133077, CACNA1B, TUBBP5, FAM157B, PLCXD1, GTPBP6, LINC00685, PPP2R3B, SHOX, CRLF2, CSF2RA, MIR3690, IL3RA, SLC25A6, ASMTL-AS1, ASMTL, P2RY8, AKAP17A, ASMT, DHRSX, ZBED1, CD99P1, LINC00102, CD99, XG, GYG2, ARSD, ARSE, ARSH, ARSF, CXorf28, MXRA5, PRKX, LOC389906, LOC441528, LOC100506453, LOC729162, NLGN4X, MIR4770, VCX3A, HDHD1, MIR4767, STS, VCX, PNPLA4, LOC100506502, MIR651, VCX2, VCX3B, KAL1, FAM9A, FAM9B, TBL1X, GPR143, SHROOM2, LOC100288814, WWC3, CLCN4, MID1, HCCS, ARHGAP6, AMELX, MIR548AX, MSL3, FRMPD4, PRPS2, TLR7, TLR8-AS1, TLR8, TMSB4X, FAM9C, LOC100093698, ATXN3L, LOC100133123, EGFL6, TCEANC, RAB9A, TRAPPC2, OFD1, GPM6B, GEMIN8, GLRA2, FANCB, MOSPD2, ASB9, ASB11, PIGA, PIR-FIGF, FIGF, PIR, BMX, ACE2, LOC100506630, TMEM27, CA5BP1, LOC100506661, CA5B, INE2, ZRSR2, AP1S2, GRPR, MAGEB17, CTPS2, MIR548AM, S100G, SYAP1, TXLNG, RBBP7, REPS2, NHS, MIR4768, SCML1, RAI2, BEND2, SCML2, CDKL5, RS1, PPEF1, PHKA2-AS1, PHKA2, GPR64, PDHA1, MAP3K15, SH3KBP1, CXorf23, LOC729609, MAP7D2, MIR23C, EIF1AX, SCARNA9L, RPS6KA3, CNKSR2, KLHL34, SMPX, MBTPS2, YY2, SMS, PHEX, PHEX-AS1, LOC100873065, ZNF645, DDX53, PTCHD1, PRDX4, ACOT9, SAT1, APOO, CXorf58, KLHL15, EIF2S3, ZFX-AS1, ZFX, FAM48B2, FAM48B1, PDK3, PCYT1B, POLA1, SCARNA23, ARX, MAGEB18, MAGEB6, VENTXP1, SMEK3P, DCAF8L2, MAGEB10, DCAF8L1, IL1RAPL1, MIR4666B, MAGEB2, MAGEB3, MAGEB4, MAGEB1, NR0B1, CXorf21, GK, TAB3, FTHL17, DMD, MIR3915, MIR548F5, FAM47A, TMEM47, FAM47B, MAGEB16, CXorf22, CXorf59, CXorf30, FAM47C, PRRG1, LANCL3, XK, CYBB, DYNLT3, CXorf27, SYTL5, MIR548AJ2, SRPX, RPGR, OTC, TSPAN7, MID1IP1, LOC286442, MIR3937, MIR1587, LOC100506641, BCOR, ATP6AP2, MPC1L, CXorf38, MED14, LOC100132831, USP9X, DDX3X, NYX, CASK, GPR34, GPR82, PPP1R2P9, MAOA, MAOB, NDP, EFHC2, FUNDC1, DUSP21, KDM6A, CXorf36, MIR221, MIR222, ZNF673, ZNF674, ZNF674-AS1, CHST7, SLC9A7, RP2, CXorf31, PHF16, RGN, NDUFB11, RBM10, UBA1, INE1, CDK16, USP11, ZNF157, SNORA11C, ZNF41, CXorf24, ARAF, SYN1, TIMP1, MIR4769, CFP, ELK1, UXT, LOC100133957, CXXC1P1, LOC441493, ZNF81, ZNF182, SPACA5, ZNF630, SSX6, SPACA5B, SSX5, SSX1, SSX3, SSX4, SSX4B, SLC38A5, FTSJ1, PORCN, EBP, TBC1D25, RBM3, WDR13, WAS, SUV39H1, GLOD5, GATA1, HDAC6, ERAS, PCSK1N, TIMM17B, PQBP1, SLC35A2, PIM2, OTUD5, KCND1, GRIPAP1, TFE3, CCDC120, PRAF2, WDR45, GPKOW, MAGIX, PLP2, PRICKLE3, SYP, CACNA1F, CCDC22, FOXP3, PPP1R3F, GAGE10, GAGE12J, GAGE13, GAGE2E, GAGE2D, GAGE12I, GAGE2C, GAGE2B, GAGE12C, GAGE12D, GAGE12E, GAGE12F, GAGE12G, GAGE12H, GAGE2A, GAGE1, PAGE1, PAGE4, LOC158572, USP27X, CLCN5, MIR532, MIR188, MIR500A, MIR362, MIR501, MIR500B, MIR660, MIR502, AKAP4, CCNB3, DGKK, SHROOM4, BMP15, NUDT10, CXorf67, NUDT11, CENPVP2, CENPVP1, GSPT2, MAGED1, MAGED4B, SNORA11E, MAGED4, SNORA1ID, LOC100129860, XAGE2, XAGE1B, XAGE1A, XAGE1C, XAGE1D, XAGE1E, SSX8, SSX7, SSX2, SSX2B, SPANXN5, XAGE5, XAGE3, FAM156B, FAM156A, GPR173, TSPYL2, KDM5C, IQSEC2, SMC1A, RIBC1, HSD17B10, HUWE1, MIR98, MIRLET7F2, PHF8, FAM120C, WNK3, TSR2, FGD1, GNL3L, ITIH6, MAGED2, SNORA11, TRO, PFKFB1, APEX2, ALAS2, PAGE2B, PAGE2, FAM104B, MTRNR2L10, PAGE5, PAGE3, MIR4536-1, MAGEH1, USP51, FOXR2, XAGE-4, RRAGB, KLF8, UBQLN2, LOC550643, UQCRBP1, SPIN3, SPIN2B, SPIN2A, FAAH2, ZXDB, ZXDA, SPIN4, LOC92249, ARHGEF9, MIR1468, FAM123B, ASB12, MTMR8, ZC4H2, ZC3H12B, LAS1L, FRMD8P1, MSN, MIR223, VSIG4, HEPH, EDA2R, AR, OPHN1, YIPF6, STARD8, EFNB1, PJA1, LOC100996279, FAM155B, EDA, MIR676, AWAT2, OTUD6A, IGBP1, DGAT2L6, AWAT1, P2RY4, ARR3, RAB41, PDZD11, KIF4A, GDPD2, DLG3, TEX11, SLC7A3, SNX12, FOXO4, CXorf65, IL2RG, MED12, NLGN3, GJB1, ZMYM3, NONO, ITGB1BP2, TAF1, INGX, OGT, ACRC, CXCR3, LOC100129291, FLJ46446, CXorf49, CXorf49B, LOC100132741, NHSL2, RPS26P11, RGAG4, FLJ44635, PIN4, ERCC6L, RPS4X, CITED1, HDAC8, PHKA1, FAM226B, LOC100132304, DMRTC1B, DMRTC1, LINC00684, FAM226A, PABPC1L2B, PABPC1L2A, NAP1L6, NAP1L2, CDX4, MAP2K4P1, CHIC1, TSIX, XIST, JPX, FTX, LOC100506745, MIR421, MIR374B, MIR374C, MIR545, MIR374A, ZCCHC13, SLC16A2, RLIM, KIAA2022, ABCB7, UPRT, ZDHHC15, TTC3P1, MAGEE2, CXorf26, MAGEE1, MIR384, MIR325, FGF16, ATRX, MAGT1, COX7B, ATP7A, PGAM4, PGK1, TAF9B, CYSLTR1, ZCCHC5, LPAR4, MIR4328, P2RY10, GPR174, ITM2A, TBX22, FAM46D, BRWD3, HMGN5, SH3BGRL, POU3F4, CYLC1, RPS6KA6, MIR54814, HDX, UBE2DNL, APOOL, SATL1, ZNF711, POF1B, MIR1321, CHM, MIR361, DACH2, KLHL4, CPXCR1, TGIF2LX, PABPC5, PCDH11X, NAP1L3, FAM133A, MIR548M, LOC643486, DIAPH2, RPA4, LOC442459, PCDH19, TNMD, TSPAN6, SRPX2, SYTL4, CSTF2, NOX1, XKRX, ARL13A, TRMT2B, TMEM35, CENPI, DRP2, TAF7L, TIMM8A, BTK, RPL36A-HNRNPH2, RPL36A, GLA, HNRNPH2, ARMCX4, ARMCX1, ARMCX6, ARMCX3-AS1, ARMCX3, RNU6-30, ARMCX2, NXF5, ZMAT1, TCEAL2, TCEAL6, BEX5, LOC100996631, NXF2, NXF2B, LOC100996648, TMSB15A, NXF4, ARMCX5, ARMCX5-GPRASP2, GPRASP1, GPRASP2, BHLHB9, LINC00630, RAB40AL, BEX1, NXF3, BEX4, TCEAL8, TCEAL5, BEX2, TCEAL7, WBP5, NGFRAP1, LOC100506901, RAB40A, TCEAL4, TCEAL3, TCEAL1, MORF4L2, MORF4L2-AS1, GLRA4, TMEM31, PLP1, RAB9B, TMSB15B, H2BFXP, H2BFWT, H2BFM, SLC25A53, ZCCHC18, LOC286437, FAM199X, ESX1, IL1RAPL2, TEX13A, NRK, SERPINA7, MUM1L1, CXorf57, MIR548AN, RNF128, TBC1D8B, RIPPLY1, CLDN2, MORC4, RBM41, NUP62CL, PIH1D3, FRMPD3, PRPS1, TSC22D3, MID2, TEX13B, VSIG1, PSMD10, ATG4A, COL4A6, COL4A5, IRS4, GUCY2F, NXT2, KCNE1L, ACSL4, TMEM164, MIR652, MIR3978, AMMECR1, SNORD96B, RGAG1, TDGF1P3, CHRDL1, PAK3, CAPN6, DCX, DKFZp686D0853, ALG13, TRPC5, TRPC5OS, ZCCHC16, LHFPL1, AMOT, MIR4329, HTR2C, SNORA35, MIR764, MIR1912, MIR1264, MIR1298, MIR1911, MIR448, IL13RA2, LRCH2, RBMXL3, LUZP4, PLS3, AGTR2, SLC6A14, CXorf61, LOC100126447, KLHL13, WDR44, MIR1277, DOCK11, IL13RA1, ZCCHC12, LONRF3, KIAA1210, PGRMC1, SLC25A43, SLC25A5-AS1, SLC25A5, CXorf56, UBE2A, NKRF, SEPT6, MIR766, SOWAHD, RPL39, SNORA69, UPF3B, RNF113A, NDUFA1, AKAP14, NKAP, RHOXF2B, RHOXF1, RHOXF2, NKAPP1, ZBTB33, FAM70A, ATP1B4, LAMP2, CUL4B, MCTS1, C1GALT1C1, CT47B1, CT47A12, CT47A11, CT47A10, CT47A9, CT47A8, CT47A7, CT47A6, CT47A5, CT47A4, CT47A3, CT47A2, CT47A1, GLUD2, MIR3672, GRIA3, THOC2, XIAP, STAG2, SH2D1A, TENM1, LOC100129520, DCAF12L2, DCAF12L1, CXorf64, ACTRT1, SMARCA1, OCRL, APLN, XPNPEP2, SASH3, ZDHHC9, UTP14A, BCORL1, ELF4, AIFM1, RAB33A, ZNF280C, SLC25A14, GPR119, RBMX2, FAM45B, ENOX2, ARHGAP36, IGSF1, OR13H1, LOC286467, MST4, FRMD7, RAP2C, MBNL3, HS6ST2, HS6ST2-AS1, USP26, TFDP3, GPC4, GPC3, MIR363, MIR92A2, MIR19B2, MIR20B, MIR18B, MIR106A, CCDC160, PHF6, HPRT1, MIR450B, MIR450A1, MIR450A2, MIR542, MGC16121, MIR503, MIR424, LINC00629, PLAC1, FAM122B, FAM122C, MOSPD1, CXorf69, FAM127C, FAM127A, FAM127B, LINC00087, LINC00633, LOC100287728, CXorf48, ZNF75D, ZNF449, LOC100506790, LINC00086, DDX26B, CT45A1, CT45A2, CT45A3, CT45A4, CT45A5, CT45A6, SAGE1, MMGT1, SLC9A6, FHL1, MAP7D3, GPR112, BRS3, HTATSF1, VGLL1, MIR934, LOC100128420, CD40LG, ARHGEF6, RBMX, SNORD61, GPR101, LOC100996525, ZIC3, LOC158696, FGF13, MIR504, FGF13-AS1, SRD5A1P1, F9, MCF2, ATP11C, MIR505, CXorf66, LOC389895, SOX3, RP1-177G6.2, CDR1, MIR320D2, SPANXB2, SPANXB1, LDOC1, SPANXC, SPANXA2-OT1, SPANXA1, SPANXA2, LOC645188, SPANXD, MAGEC3, MAGEC1, MAGEC2, SPANXN4, SPANXN3, SLITRK4, SPANXN2, UBE2NL, SPANXN1, SLITRK2, CXorf1, MIR890, MIR888, MIR892A, MIR892B, MIR891B, MIR891A, CXorf51B, CXorf51A, MIR513C, MIR513B, MIR513A1, MIR513A2, MIR506, MIR507, MIR508, MIR514B, MIR509-2, MIR509-3, MIR509-1, MIR510, MIR514A1, MIR514A2, MIR514A3, FMR1-AS1, FMR1, FMR1NB, AFF2, IDS, LOC100131434, CXorf40A, MAGEA9B, HSFX2, TMEM185A, MAGEA11, HSFX1, MAGEA9, MAGEA8, CXorf40B, LOC100272228, MIR2114, MAMLD1, MTM1, MTMR1, CD99L2, HMGB3, MIR4330, GPR50, VMA21, PASD1, PRRG3, FATE1, CNGA2, LOC100507199, MAGEA4, GABRE, MIR224, MIR452, MAGEA5, MAGEA10-MAGEA5, MAGEA10, GABRA3, MIR105-1, MIR767, MIR105-2, GABRQ, MAGEA6, CSAG3, MAGEA2B, MAGEA12, CSAG1, MAGEA2, CSAG2, MAGEA3, CETN2, NSDHL, ZNF185, PNMA5, PNMA3, PNMA6C, PNMA6D, PNMA6A, PNMA6B, MAGEA1, ZNF275, LOC649238, ZFP92, TREX2, HAUS7, BGN, ATP2B3, FAM58A, DUSP9, PNCK, SLC6A8, BCAP31, ABCD1, PLXNB3, SRPK3, IDH3G, SSR4, PDZD4, L1CAM, LOC100996465, AVPR2, ARHGAP4, NAA10, RENBP, HCFC1, TMEM187, MIR3202-1, MIR3202-2, IRAK1, MIR718, MECP2, OPN1LW, OPN1MW, OPN1MW2, TEX28, TKTL1, FLNA, EMD, RPL10, SNORA70, DNASE1L1, TAZ, ATP6AP1, GDI1, FAM50A, PLXNA3, LAGE3, UBL4A, SLC10A3, FAM3A, G6PD, IKBKG, FAM223A, CTAG1A, CTAG1B, FAM223B, CTAG2, GAB3, DKC1, SNORA36A, MIR644B, SNORA56, MPP1, CXorf68, F8, H2AFB1, F8A1, MIR1184-1, FUNDC2, CMC4, MTCP1, BRCC3, VBP1, RAB39B, CLIC2, H2AFB2, F8A2, MIR1184-2, F8A3, MIR1184-3, H2AFB3, TMLHE-AS1, TMLHE, SPRY3, VAMP7, IL9R, XGPY2, SRY, RPS4Y1, ZFY, LINC00278, TGIF2LY, PCDH11Y, TTTY23B, TSPY2, FAM197Y9, TTTY1B, TTTY2B, TTTY21B, TTTY7, TTTY8B, AMELY, TBL1Y, PRKY, TTTY16, TTTY12, TTTY18, TTTY19, TTTY11, RBMY1A3P, TTTY20, TSPY4, FAM197Y8, TSPY8, FAM197Y7, FAM197Y6, TSPY3, FAM197Y5, TSPY1, FAM197Y4, FAM197Y3, FAM197Y2, TSPY10, FAM197Y1, RBMY3AP, TTTY8, TTTY7B, TTTY21, TTTY2, TTTY1, TTTY22, TTTY23, GYG2P1, TTTY15, USP9Y, DDX3Y, UTY, TMSB4Y, VCY, VCY1B, NLGN4Y, NLGN4Y-AS1, FAM41AY1, FAM224B, XKRY, CDY2B, CDY2A, XKRY2, FAM224A, FAM41AY2, HSFY1, TTTY9B, TTTY9A, HSFY2, NCRNA00185, TTTY14, BCORP1, TXLNG2P, KDM5D, TTTY10, EIF1AY, RPS4Y2, CYorf17, RBMY2EP, RBMY1B, RBMY1A1, TTTY13, RBMY1D, RBMY1E, PRY2, TTTY6B, RBMY1F, TTTY5, RBMY2FP, RBMY1J, TTTY6, PRY, TTTY17A, TTTY4, BPY2, DAZ1, DAZ2, TTTY3B, CDY1B, GOLGA2P2Y, TTTY17B, TTTY4B, BPY2B, DAZ3, DAZ4, BPY2C, TTTY4C, TTTY17C, GOLGA2P3Y, CSPG4P1Y, CDY1, TTTY3

What is claimed is:

1. A radio wave absorber comprising:
a powder of a hexagonal ferrite; and
a binder,
wherein the radio wave absorber has a thickness of 2 mm or more, a squareness ratio as measured in a randomly selected measurement direction A in a range of 0.40 to 0.60, and a squareness ratio in the same range as measured in a measurement direction B which is perpendicular to the measurement direction A, each measurement direction being the direction in which a magnetic field is applied at the time of measurement, the squareness ratios being measured in an oscillating sample magnetometer, with the intensity of magnetization of a measurement sample being measured with respect to an applied magnetic field under a maximum applied magnetic field of 50 kOe and a magnetic field sweep rate of 104 Oe/s (seconds) in an environment with an ambient temperature of 23° C., and the measurement sample being the radio wave absorber itself or a sample cut out therefrom.

2. The radio wave absorber according to claim 1, wherein the radio wave absorber has a squareness ratio as measured in measurement direction A in a range of 0.45 to 0.55, and a squareness ratio as measured in measurement direction B in the same range.

3. The radio wave absorber according to claim 1, wherein the hexagonal ferrite has a composition represented by Formula 1, $$AFe_{(12-x)}Al_xO_{19} \quad \text{Formula 1}$$

in Formula 1, A represents at least one kind of atom selected from the group consisting of Sr, Ba, Ca, and Pb, and x satisfies 1.50≤x≤8.00.

4. The radio wave absorber according to claim 3, wherein an atom represented by A in Formula 1 includes Sr.

5. The radio wave absorber according to claim 2, wherein the hexagonal ferrite has a composition represented by Formula 1, $$AFe_{(12-x)}Al_xO_{19} \quad \text{Formula 1}$$

in Formula 1, A represents at least one kind of atom selected from the group consisting of Sr, Ba, Ca, and Pb, and x satisfies 1.50≤x≤8.00.

6. The radio wave absorber according to claim 5, wherein an atom represented by A in Formula 1 includes Sr.

7. The radio wave absorber according to claim 1, wherein the radio wave absorber is a molded product obtained by molding a composition containing the powder of a hexagonal ferrite and the binder.

8. The radio wave absorber according to claim 7, wherein the radio wave absorber is a plate-shaped molded product.

9. The radio wave absorber according to claim 2,
wherein the radio wave absorber is a molded product obtained by molding a composition containing the powder of a hexagonal ferrite and the binder.
10. The radio wave absorber according to claim 9,
wherein the radio wave absorber is a plate-shaped molded product.
11. The radio wave absorber according to claim 3,
wherein the radio wave absorber is a molded product obtained by molding a composition containing the powder of a hexagonal ferrite and the binder.
12. The radio wave absorber according to claim 11,
wherein the radio wave absorber is a plate-shaped molded product.
13. The radio wave absorber according to claim 4,
wherein the radio wave absorber is a molded product obtained by molding a composition containing the powder of a hexagonal ferrite and the binder.
14. The radio wave absorber according to claim 13,
wherein the radio wave absorber is a plate-shaped molded product.
15. The radio wave absorber according to claim 5,
wherein the radio wave absorber is a molded product obtained by molding a composition containing the powder of a hexagonal ferrite and the binder.
16. The radio wave absorber according to claim 15,
wherein the radio wave absorber is a plate-shaped molded product.
17. The radio wave absorber according to claim 6,
wherein the radio wave absorber is a molded product obtained by molding a composition containing the powder of a hexagonal ferrite and the binder.
18. The radio wave absorber according to claim 17,
wherein the radio wave absorber is a plate-shaped molded product.
19. The radio wave absorber according to claim 1,
wherein the hexagonal ferrite is a substitution-type magnetoplumbite-type hexagonal ferrite in which a part of iron atoms of the magnetoplumbite-type hexagonal ferrite is substituted with an aluminum atom.

* * * * *